United States Patent
Eto et al.

(10) Patent No.: US 7,281,155 B1
(45) Date of Patent: Oct. 9, 2007

(54) SEMICONDUCTOR MEMORY DEVICE AND METHOD FOR EXECUTING SHIFT REDUNDANCY OPERATION

(75) Inventors: Satoshi Eto, Kawasaki (JP); Masato Matsumiya, Kawasaki (JP); Toshimi Ikeda, Kawasaki (JP); Yuki Ishii, Kawasaki (JP); Akira Kikutake, Kawasaki (JP); Kuninori Kawabata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/359,767

(22) Filed: Jul. 22, 1999

(30) Foreign Application Priority Data

| | | |
|---|---|---|
| Jul. 23, 1998 | (JP) | 10-208440 |
| Nov. 9, 1998 | (JP) | 10-318164 |
| Jun. 17, 1999 | (JP) | 11-171303 |

(51) Int. Cl.
H02H 3/05 (2006.01)

(52) U.S. Cl. .......................... 714/5; 365/200
(58) Field of Classification Search .......... 714/5, 714/6, 7, 8, 42, 54, 718, 763, 764, 773; 365/200, 365/201

See application file for complete search history.

(56) References Cited

U.S. PATENT DOCUMENTS

| | | | | |
|---|---|---|---|---|
| 4,538,245 A | * | 8/1985 | Smarandoiu et al. | 365/200 |
| 5,260,902 A | | 11/1993 | Pilling et al. | |
| 5,270,975 A | * | 12/1993 | McAdams | 365/200 |
| 5,323,348 A | | 6/1994 | Mori et al. | |
| 5,771,194 A | | 6/1998 | Maeno | |
| 5,959,903 A | * | 9/1999 | Chen et al. | 365/200 |

FOREIGN PATENT DOCUMENTS

| | | |
|---|---|---|
| EP | 0 795 825 A2 | 9/1997 |
| JP | 8-8344 | 1/1996 |
| JP | 8-335399 | 12/1996 |
| JP | 9-231790 | 9/1997 |
| JP | 10-500527 | 1/1998 |
| WO | WO 96/41264 | 12/1996 |

* cited by examiner

*Primary Examiner*—Dieu-Minh Le
(74) *Attorney, Agent, or Firm*—Arent Fox LLP

(57) ABSTRACT

A semiconductor memory device having a shift redundancy function includes a switch circuit for changeably connecting a plurality of decode signal lines decoding an address signal to a plurality of selecting lines and redundancy selecting lines, and executes a switch operation for shifting at least one of a plurality of decode lines in the direction of a first redundancy selecting line positioned at one of the ends among a plurality of selecting lines or a second switch operation for shifting at least one of the decode lines in the direction of a second redundancy selecting line positioned at the other end among the selecting lines or both of the first and second operations when any fault occurs in a plurality of selecting lines. The semiconductor memory device preferably includes two or more first redundancy selecting lines positioned at one of the ends of a plurality of selecting lines, two or more second redundancy selecting lines positioned at the other end, and first and second switch units disposed in two stages. When any fault selecting line occurs, the first switch unit executes a first switch operation for shifting at least one of the decode signal lines in the direction of the first redundancy selecting line or a second switch operation for shifting the same in the direction of the second redundancy selecting line, or the second switch unit executes a third switch operation for shifting at least one decode signal line in the direction of the first redundancy selecting line or a fourth switch operation for shifting it in the direction of the second redundancy selecting line.

98 Claims, 87 Drawing Sheets

Fig.5a

| SHIFT | NS | | | | | | | | | |
|---|---|---|---|---|---|---|---|---|---|---|
| uout | L | L | L | L | ----- | L | L | L | L |
| lout | L | L | L | L | ----- | L | L | L | L |
| OUTPUT OF SHIFT REDUNDANCY FUSE CIRCUIT UNIT | L | H | H | H | ----- | H | H | H | L |

| SHIFT | NON-SELECTION SL | | NS | | | | | | | |
|---|---|---|---|---|---|---|---|---|---|---|
| uout | H | H | L | L | ----- | L | L | L | L |
| lout | L | L | L | L | ----- | L | L | L | L |
| OUTPUT OF SHIFT REDUNDANCY FUSE CIRCUIT UNIT | H | H | L | H | ----- | H | H | H | L |

| SHIFT | NON-SELECTION SL | | NS | | | | NON-SELECTION SR | | | |
|---|---|---|---|---|---|---|---|---|---|---|
| uout | H | H | L | L | ----- | L | L | L | L |
| lout | L | L | L | L | ----- | L | H | H | H |
| OUTPUT OF SHIFT REDUNDANCY FUSE CIRCUIT UNIT | H | H | L | H | ----- | L | H | H | H |

↑fj0  ↑f0  ↑f1  ↑f2  -----  ↑f61  ↑f62  ↑f63  ↑fj1

(USED FOR SELECTING LINES cℓ0, cℓ2 TO cℓ61 AND cℓ63)

(USED FOR REDUNDANCY SELECTING LINES cℓj0, cℓj1)

Fig.105

| SELECTING LINES | JL1 | JL0 | R0 | R1 | R2 | R3 | R4 | R5 | R6 | R7 | JR0 | JR1 |
|---|---|---|---|---|---|---|---|---|---|---|---|---|
| OUTPUT OF SECOND SHIFT REDUNDANCY CONTROL CIRCUIT UNIT {uout1 / lout1 / SHIFT} | H / L / ↓ | H / L / ↓ | H / L / ↓ | H / L / ↓ | L / L / ← | L / L / x | L / L / ← | L / L / x | L / L / ← | L / L / x | L / H / ↑ | L / H / ↑ |
| OUTPUT OF FIRST SHIFT REDUNDANCY CONTROL CIRCUIT UNIT {uout0 / lout0 / SHIFT} | | H / L / ↓ | H / L / ↓ | H / L / ↓ | H / L / ↓ | L / L / ← | L / L / x | L / H / ↑ | L / H / ↑ | L / H / ↑ | L / H / ↑ | |
| OUTPUT OF SHIFT REDUNDANCY FUSE CIRCUIT UNIT | H | H | H | L | H | L | H | L | H | L | H | H |
| FUSE | CUT | CUT | CUT | | | | | | | CUT | CUT | CUT |

Fig.106

| SELECTING LINES | JL1 | JL0 | R0 | R1 | R2 | R3 | R4 | R5 | R6 | R7 | JR0 | JR1 |
|---|---|---|---|---|---|---|---|---|---|---|---|---|
| OUTPUT OF SECOND SHIFT REDUNDANCY CONTROL CIRCUIT UNIT — uout1 | H | H | H | L | L | L | L | L | L | L | L | L |
|     lout1 | L | L | L | L | L | L | L | L | L | L | L | L |
|     SHIFT | ↓ | ↓ | ↓ | ← | × | ← | ← | × | ← | ← | ← | |
| OUTPUT OF FIRST SHIFT REDUNDANCY CONTROL CIRCUIT UNIT — uout0 | | H | H | H | H | L | L | L | L | L | L | L |
|     lout0 | | L | L | L | L | L | L | L | L | H | H | L |
|     SHIFT | | ↓ | ↓ | ↓ | ↓ | ← | × | ← | × | ↑ | ↑ | |
| OUTPUT OF SHIFT REDUNDANCY FUSE CIRCUIT UNIT — FUSE | H | H | H | H | H | L | H | L | H | H | H | L |
| | CUT | CUT | CUT | CUT | CUT | | CUT | | CUT | CUT | CUT | |

SEMICONDUCTOR MEMORY DEVICE AND METHOD FOR EXECUTING SHIFT REDUNDANCY OPERATION

BACKGROUND OF THE INVENTION

1. Field of the Invention

This invention relates to a semiconductor memory device having the function of relieving (or overcoming) faults by using redundancy selecting lines when the faults occur in some of a plurality of selecting lines for writing or reading data by selecting a specific memory cell from among a plurality of memory cells, and also to a method for executing this shift redundancy operation.

When large capacity semiconductor memory devices such as the latest dynamic random access memories (DRAMS), static random access memories (SRAMs), flash memories, ferromagnetic random access memories (FRAMs), etc., are massproduced, it is practically difficult to manufacture semiconductor chips (semiconductor integrated circuits) perfectly free from faults in selecting lines, and the like. Because the possibility of the occurrence of faults is particularly high at the initial stage of mass production, the semiconductor chips must be discarded in the worst case and the production yield of the chips is likely to drop. To minimize the drop of the yield, countermeasures for relieving the faults by utilizing redundancy circuit elements such as redundancy selecting lines, that are disposed in advance in the semiconductor chip, must be essentially employed.

On the other hand, high operation speed and low power consumption have been required for the recent large capacity semiconductor memory devices. Therefore, the redundancy system described above that utilizes the redundancy circuit elements must have a high shift redundancy speed and accomplish a high-speed access, and must have low power consumption, and must be able to efficiently relieve (or overcome) the faults on the semiconductor chip.

2. Description of the Related Art

Various systems have been employed as the redundancy system utilizing the redundancy circuit elements in the semiconductor chip, and a shift redundancy system among them has the features such as a high access speed and a small consumed current (consumed power), and is believed to be an effective means for recent large capacity semiconductor memory devices.

Here, the construction of a typical semiconductor memory device according to the prior art, and its operation, will be explained with reference to FIG. 1 of later-appearing "BRIEF DESCRIPTION OF THE is DRAWINGS" in order to have the problems of conventional semiconductor memory devices having the redundancy function more easily understood.

FIG. 1 is a block diagram showing the construction of an ordinary semiconductor memory device having a redundancy function. In the semiconductor memory device such as a DRAM, a row decoder 800 and a column decoder 700 operating on the basis of the address signals supplied from external are provided to a plurality of memory cells 600 arranged in a matrix, as shown in FIG. 1. These row decoder 700 and column decoder 700 are connected to row selecting lines WL and column selecting lines CL, respectively, and are used for writing or reading data by selecting a specific memory cell from among a plurality of memory cells on the basis of the address signals Add (A0 to An) of the decode signal.

In the ordinary redundancy systems, the redundancy operation is executed by replacing the row selecting line or column selecting line (hereinafter referred to merely as the "selecting lines" unless specified otherwise), in which a fault occurs, by redundancy selecting lines for relieving the fault that are prepared in advance.

In practice, a redundancy decision circuit 840 compares the input address with the address of the fault selecting line, that is in advance detected and stored, whenever the address of the address signal Add is inputted, and judges whether or not the input address is in conformity with the address of the fault selecting line (conformity/inconformity). On the other hand, the address of the address signal Add is serially inputted to the row decoder 800 without passing through the redundancy decision circuit 840. When the redundancy decision circuit 840 judges that a certain input address is not coincident with the address of the fault selecting line, the row decoder 800 receives this judgement result and selects the selecting line (row selecting line) corresponding to the input address. When a certain input address is judged as being coincident with the address of the fault selecting line, the row decoder 800 does not select the selecting line corresponding to the input address but selects the redundancy selecting line. In this way, the redundancy decision circuit 840 judges conformity/inconformity between the input address and the fault selecting lines for all the input addresses.

Furthermore, the redundancy decision circuit 740 compares the input address with the address of the fault selecting line that is in advance detected and stored, whenever the address of the address signal Add is inputted, and judges whether or not the input address coincides with the address of the fault selecting line (conformity/inconformity). On the other hand, the address of the address signal Add is serially inputted to the column decoder 700 without passing through the redundancy decision circuit 740. When the redundancy decision circuit 740 judges that a certain input address does not coincide with the address of the fault selecting line, the column decoder 700 receives this judgement result and selects the selecting line (column selecting line) corresponding to this input address. When a certain input address is judged as being coincident with the address of the fault selecting line, the column decoder 700 does not select the selecting line corresponding to the input address but selects the redundancy selecting line. In this way, the redundancy decision circuit 740 judges conformity/inconformity between the input address and the fault selecting line for all the input addresses.

The explanation will be given hereby in further detail on the operation when the fault occurs in the column selecting lines CL (selecting lines s0 to sn and in redundancy selecting line sj0) with reference to FIG. 1. When a redundancy enable (activation) signal JEN outputted from the redundancy decision circuit 740 is at the "L (Low)" level (that is, when the input address and the address of the fault selecting line are not judged as coincident), the column decoder 700 decodes the input address of the address signal Add as usual and selects the object selecting line from among the selecting lines s0 to sn. When the redundancy enable signal JEN outputted from the redundancy decision circuit 740 is at the "H (High)" level (that is, when the input address and the address of the fault selecting line are judged as coincident), on the other hand, the column decoder 700 brings the selecting line, which is to be selected from the input address, into the non-selection state and selects the redundancy selecting line sj0.

On the other hand, the operation will be given in further detail when any fault occurs in the row selecting lines WL with reference to FIG. 1. When the redundancy enable (activation) signal JEN outputted from the redundancy decision circuit 840 is at the "L" level (that is, when the input address and the address of the fault selecting line are not judged as coincident), the row decoder 800 decodes the input address of the address signal Add as usual and selects the object selecting line from among a plurality of selecting lines. When the redundancy enable signal JEN outputted from the redundancy decision circuit 840 is at the "H" level (that is, when the input address and the address of the fault selecting line are judged as coincident), on the other hand, the row decoder 800 brings the selecting line, that is to be selected from the input address, into the non-selection state and selects the redundancy selecting line.

As described above, the address signal Add is serially inputted to the column decoder 700 (or to the row decoder 800) irrelevantly to the redundancy judgement operation of the redundancy decision circuit 740 (or the redundancy decision circuit 840). Therefore, the redundancy enable signal JEN outputted as the judgement result from the redundancy decision circuit 740 (or 840) is inputted to the column decoder 700 (or to the row decoder 800) more belatedly than the timing at which the address signal Add is inputted to the column decoder 700 (or to the row decoder 800: with the proviso that delay circuits 720 and 820 shown in FIG. 1 do not exist). Here, if the path through which the address signal Add is inputted to the column decoder 700 (or to the row decoder 800) is not retarded time-wise, the selecting line that should originally be subjected to redundancy (that is, the selecting line to be brought into the non-selection state) is often selected for a certain period of time. To avoid such a problem, the address signal must be decoded after the redundancy judgement of the redundancy decision circuit 740 (or the redundancy decision circuit 840) is done, by a method that disposes a delay circuit 720 in the path through which the address signal Add is supplied to the column decoder 700 (or disposes a delay circuit 820 in the path through which the address signal Add is supplied to the row decoder 800), or like means. Due to this delay time by the delay circuit, the access time gets prolonged at the time of the data write or read operation, and the high-speed access becomes difficult. Furthermore, the redundancy decision circuit 740 (or the redundancy decision circuit 840) must be operated whenever the address signal Add is inputted, and the consumed current (consumed power) increases, in consequence.

Unlike the system described above which directly replaces the fault selecting line by the redundancy selecting line, the shift redundancy system having the shift redundancy function according to the prior art operates a plurality of switch devices so that the addresses of the selecting lines of the high order (or the low order) can be shifted by one bit to the lower order (or to the higher order) by the fault selecting lines. In such a shift redundancy system, once the connection relationship between the decode signal outputted from the column decoder 700 (or the row decoder 800) and the column selecting line CL (or the row selecting line) is determined by a plurality of switch devices, this relationship remains unaltered. Therefore, it is not necessary to operate the redundancy decision circuit in order to judge conformity/inconformity between the input address and the address of the fault selecting line. As a result, the access speed becomes relatively higher and the consumed current becomes smaller in the semiconductor device using the conventional shift redundancy system.

However, the shift redundancy system according to the prior art can shift decode signal lines by only one bit, that is, by only one selecting line (or in other words, it can execute the shift redundancy operation of only one bit). Therefore, if two or more than two fault selecting lines exist due to short circuit between the selecting lines, etc., this system cannot relieve such fault selecting lines.

For this reason, even when the conventional shift redundancy system is employed, the faults on the semiconductor chip cannot be relieved efficiently, and the production yield of the chips cannot be greatly improved.

In a semiconductor chip equipped with a plurality of cell arrays each including a plurality of memory cells, a redundancy decision circuit, etc, is generally disposed independently so as to correspond to each cell array. Therefore, the degree of freedom of redundancy can be secured for only the total number of selecting lines (the row selecting lines or the column selecting lines) inside one cell array.

Furthermore, when the shift redundancy operation is executed for the column selecting lines disposed for a plurality of row blocks, whether or not the shift redundancy operation is executed for the column selecting lines is determined uniformly for all the row blocks. Therefore, the redundancy operation is not executed for all the row blocks, or the shift redundancy operation is executed for the same column selecting lines of all the row blocks. Consequently, redundancy cannot be executed in the row block unit, and the degree of freedom of redundancy tends to be limited.

SUMMARY OF THE INVENTION

In view of the problems described above, the present invention aims at providing a semiconductor memory device of a shift redundancy system which can relieve fault selecting lines when two or more than two fault selecting lines occur due to short circuit between the selecting lines, etc., and which can relatively increase the degree of freedom of redundancy, and a method for executing the shift redundancy operation.

To accomplish the object described above, a semiconductor memory device according to the present invention includes a plurality of selecting lines for writing or reading data by selecting a specific memory cell from among a plurality of memory cells on the basis of the address signal supplied from external, and further includes at least one first redundancy selecting line positioned at one of the ends among a plurality of selecting lines, at least one second redundancy selecting line positioned at the other end, and switch circuit for changeably connecting a plurality of decode signal lines decoding the address signal to a plurality of selecting lines and to the redundancy selecting lines.

When any faults occur in a plurality of selecting lines in such a circuit construction, a first switch operation for shifting at least one of the decode signal lines in the direction of the first redundancy selecting line is executed, or a second switch operation for shifting at least one of the decode signal lines in the direction of the second switch operation is executed, or both of the first and second switch operations are executed. Here, the term "to shift decode signal lines" means the shift of the state of connection between the selecting line and the decode signal line.

Preferably, both of the first and second switch operations are executed when the faults occur in two selecting lines among a plurality of selecting lines.

Preferably, further, when a plurality of selecting lines are arranged in alignment in the transverse direction and when the faults occur in two selecting lines among a plurality of selecting lines, the first switch operation is executed by shifting at least one of the decode signal lines to the left and the second switch operation is executed by shifting at least one of the decode signal lines to the right. In other words, the semiconductor memory device according to the present invention is constituted so that the two-bit shift redundancy operation is executed by shifting the decode signal lines in the direction of the first redundancy selecting line and in the direction of the second redundancy selecting lines.

Preferably, when the fault occurs in one of a plurality of selecting lines, the first or second switch operation described above is executed.

Preferably, further, when a plurality of selecting lines are arranged in alignment in the transverse direction and when the fault occurs in one of these selecting lines, the first switch operation is executed by shifting at least one of the decode signal lines to the left, or the second switch operation is executed by shifting at least one of the decode signal lines to the right. In other words, the semiconductor memory device according to the present invention is constituted so that the one-bit shift redundancy operation can be executed in the same way as in the prior art by shifting the decode signal lines in the direction of the first redundancy selecting line or in the direction of the second redundancy selecting line.

On the other hand, the semiconductor device according to the present invention includes a plurality of selecting lines for writing or reading data by selecting a specific memory cell from among a plurality of memory cells on the basis of the address signal supplied from external; at least one first redundancy selecting line positioned at one of the ends among a plurality of the selecting lines and at least one second redundancy selecting line positioned at the other end; a switch unit including a plurality of switch devices for changeably connecting a plurality of decode signal lines decoding the address signal to a plurality of the selecting lines and to the redundancy selecting lines; a shift fuse circuit unit having a plurality of fuses disposed so as to correspond to a plurality of selecting lines and to the redundancy selecting lines, for cutting the fuses corresponding to fault selecting lines in which the faults occur, and redundancy selecting fuses corresponding to the redundancy selecting lines, when the faults occur in a plurality of selecting lines; and a shift redundancy control circuit unit for controlling a plurality of the switch devices in such a manner as to execute a first switch operation for shifting at least one of the decode signal lines in the direction of the first redundancy selecting line or a second switch operation for shifting at least one of the decode signal lines in the direction of the second redundancy selecting line or both of the first and second switch operations, in accordance with the output result from the shift redundancy fuse circuit unit.

When faults occur in two of a plurality of selecting lines, the shift redundancy fuse circuit unit preferably cuts the fuses corresponding to the two fault selecting lines in which the faults occur, and the redundancy selecting fuses corresponding to the redundancy selecting lines, and the shift redundancy control circuit unit controls a plurality of the switch de,ices in such a manner as to execute both of the first and second switch operations.

Preferably, further, when a fault occurs in one of a plurality of selecting lines, the shift redundancy fuse circuit unit cuts the fuse corresponding to one fault selecting line in which the fault occurs, and the redundancy selecting fuse corresponding to the redundancy selecting line, and the shift redundancy control circuit unit controls a plurality of the switch devices in such a manner as to execute either one of the first and second switch operations.

On the other hand, the first method for executing a shift redundancy operation according to the present invention comprises the steps of arranging a plurality of selecting lines for writing or reading data by selecting a specific memory cell from among a plurality of memory cells on the basis of the address signal supplied from external; using at least one selecting line positioned at one of the ends among these selecting lines as at least one first redundancy selecting line and at least one selecting line positioned at the other end as at least one second redundancy selecting line; connecting changeably a plurality of decode signal lines decoding the address signal to a plurality of the selecting lines and to the redundancy selecting lines; and executing a first switch operation for shifting at least one of the decode signal lines in the direction of the first redundancy selecting line or a second switch operation for shifting at Least one of the decode signal lines in the direction of the second redundancy selecting lines, or both of the first and second switch operations.

Preferably, when faults occur in two of a plurality of selecting lines, the first method for executing a shift redundancy operation according to the present invention executes both of the first and second switch operations.

Preferably, further, when the fault occurs in one of a plurality of selecting lines, the first method for executing a shift redundancy operation according to the present invention executes either one of the first and second switch operations.

The second method for executing a shift redundancy operation according to the present invention comprises the steps of arranging a plurality of selecting lines for writing or reading data by selecting a specific memory cell from among a plurality of memory cells on the basis of the address signal supplied from external; using a selecting line positioned at one of the ends of these selecting line as at least one first redundancy selecting line and a selecting line positioned at the other end as at least one second redundancy selecting line; connecting changeably a plurality of decode signal lines decoding the address signal to a plurality of the selecting lines and to the redundancy selecting lines; cutting a fuse corresponding to a fault selecting line, in which a fault occurs, and a redundancy selecting fuse corresponding to the redundancy selecting line, in a shift redundancy fuse circuit unit having a plurality of fuses when any fault occurs in a plurality of the selecting lines; and executing a first switch operation for shifting at least one of the decode signal lines in the direction of the first redundancy selecting line or a second switch operation for shifting one of the decode signal lines in the direction of the second redundancy selecting line or both of the first and second switch operations, in accordance with the output result from the shift redundancy fuse circuit unit.

The third method for executing a shift redundancy operation according to the present invention comprises the steps of arranging a plurality of selecting lines for writing or reading data by selecting a specific memory cell from among a plurality of memory cells on the basis of the address signal supplied from external; using a selecting line positioned at one of the ends of these selecting lines as at least one first redundancy selecting line and a selecting line positioned at the other end as at least one second redundancy selecting line; connecting changeably a plurality of decode signal lines decoding the address signal to a plurality of the selecting lines and to the redundancy selecting lines; designating the address of a fuse corresponding to a fault selecting line, in which a fault occurs, and generating a fuse decode signal, when any fault occurs in a plurality of the selecting lines; and executing a first switch operation for shifting at least one of the decode signal lines in the direction of the first redundancy selecting line or a second switch operation for shifting at least one of the decode signal lines in the direction of the second redundancy selecting line or both of the first and second switch operations, in accordance with the fuse decode signal.

The fourth method for executing a shift redundancy operation according to the present invention comprises the steps of arranging a plurality of selecting lines for writing or reading data by selecting a specific memory cell from among a plurality of memory cells on the basis of the address signal supplied from external; using a selecting line positioned at one of the ends of a plurality of the selecting lines as at least one first redundancy selecting line and a selecting line positioned at the other end as at least one second redundancy selecting line; connecting changeably a plurality of decode signal lines decoding the address signal to a plurality of the selecting lines and to the redundancy selecting lines; causing adjacent cell arrays to share a shift redundancy circuit unit having a plurality of fuses; designating the address of the fuse corresponding to a fault selecting line, in which the fault occurs, and generating a fuse decode signal, on the basis of the combination of a plurality of fuses when any fault occurs in a plurality of selecting lines; and executing a first switch operation for shifting at least one of the decode signal lines in the direction of the first redundancy selecting line or a second switch operation for shifting at least one of the decode signal lines in the direction of the second redundancy selecting line or both of the first and second switch operations, in accordance with the fuse decode signal from the fuse decoder circuit.

The fifth method for executing a shift redundancy operation according to the present invention comprises the steps of arranging a plurality of column selecting lines for writing or reading data by selecting a specific memory cell, from among a plurality of memory cells constituting each of a plurality of memory cell blocks on the basis of the address signal supplied from external, each of these memory cell blocks being divided into a plurality of row blocks; using a column selecting line positioned at one of the ends of a plurality of the column selecting lines as at least one first redundancy selecting line and a column selecting line positioned at the other end as at least one second redundancy selecting line; connecting changeably a plurality of decode signal lines decoding the address signal to a plurality of column selecting lines and to the redundancy selecting lines; designating the address of the fuse corresponding to a fault selecting line, in which a fault occurs, and generating a fuse decode signal in the shift redundancy fuse circuit unit having a plurality of fuses on the basis of the combination of these fuses when any fault occurs in a plurality of the column selecting lines; and executing a first switch operation for shifting at least one of the decode signal lines in the direction of the first redundancy selecting line or a second switch operation for shifting at least one of the decode signal lines in the direction of the second redundancy selecting line or both of the first and second switch operation, or not executing both of the first and second switch operation, independently for each of a plurality of the row blocks on the bases of the logical addresses of these row blocks.

The sixth method for executing a shift redundancy operation according to the present invention comprises the steps of arranging a plurality of column selecting lines for writing or reading data by selecting a specific memory cell, from among a plurality of memory cells constituting each of a plurality of memory cell blocks on the basis of the address signal supplied from external, each of the memory cell blocks being divided into a plurality of row blocks; using a column selecting line positioned at one of the ends of a plurality of column selecting lines as at least one first redundancy selecting line and a selecting line positioned at the other end as at least one second redundancy selecting line; connecting changeably a plurality of decode signal lines decoding the address signal to a plurality of the selecting lines and to the redundancy selecting lines; cutting a fuse corresponding to a fault selecting line, in which a fault occurs, and a redundancy selecting fuse corresponding to the redundancy selecting line inside a shift redundancy fuse circuit unit having a plurality of fuses, when any fault occurs in a plurality of column selecting lines; and executing a first switch operation for shifting at least one of the decode signal lines in the direction of the first redundancy selecting line or a second switch operation for shifting at least one of the decode signal lines in the direction of the second redundancy selecting line or both of the first and second switch operations, or not executing both of the first and second switch operations, independently for each of a plurality of row blocks on the basis of the logical addresses of a plurality of row blocks.

Furthermore, a semiconductor device according to the present invention comprises a plurality of selecting lines for writing or reading data from among a plurality of memory cells on the basis of the address signal supplied from external; at least two first redundancy selecting lines positioned at one of the ends among a plurality of the selecting lines and at least two second redundancy selecting lines positioned at the other end; and first and second switch units disposed in at least two stages, for changeably connecting a plurality of decode signal lines decoding the address signal to a plurality of the selecting lines and to the redundancy selecting lines.

When any faults occur in a plurality of the selecting lines in such a circuit construction, a first switch operation for shifting at least one of the decode signal lines in the direction of the first redundancy selecting lines or a second switch operation for shifting at least one of the decode signal lines in the direction of the second redundancy selecting lines or both of the first and second switch operations are executed by the first switch unit, and a third switch operation for shifting further at least one of the decode signal lines, that is subjected to the first switch operation, in the direction of the first redundancy selecting lines or a fourth switch operation for shifting further at least one of the decode signal lines, that is subjected to the second switch operation, in the direction of the second redundancy selecting lines, or both, or none, of the third and fourth switch operations are executed by the second switch unit.

Preferably, when the faults occur in four of the selecting lines, both of the first and second switch operations by the first switch unit are executed and both of the third and fourth switch operations by the second switch unit are executed.

Preferably, when the faults occur in three of the selecting lines, both of the first and second switch operations are executed by the first switch unit and either one of the third and fourth switch operations is executed by the second switch unit.

Preferably, further, when the faults occur in two of the selecting lines, either one of the first and second switch operations is executed by the first switch unit and either one of the third and fourth switch operations is executed by the second switch unit.

Preferably, further, when the faults occur in two of the selecting lines, both of the first and second switch operations are executed by the first switch unit and one of the third and fourth switch operations are executed by the second switch unit.

Preferably, further, when the fault occurs in one of the selecting lines, either one of the first and second switch operations is executed by the first switch unit and none of the third and fourth switch operations are executed by the second switch unit.

Preferably, further, when at least one of the first redundancy selecting lines and the second redundancy selecting lines are connected to the decode signal lines by the switch operation described above, the redundancy selecting line positioned closer to a plurality of selecting lines is preferentially used.

BRIEF DESCRIPTION OF THE DRAWINGS

The above object and features of the present invention will be more apparent from the following description of the preferred embodiments with reference to the accompanying drawings, wherein:

FIGS. 5a to 5c are diagrams each showing a signal level at each cart of FIG. 4;

FIG. 105 is a diagram showing a signal level at each portion by the operation of the switch unit when any fault occurs in the four selecting lines;

FIG. 106 is a diagram showing a signal level at each portion by the operation of the switch unit when any fault occurs in the three selecting lines;

DESCRIPTION OF THE PREFERRED EMBODIMENTS

Hereinafter, a basic embodiment as well as some preferred embodiments of the present invention will be explained with reference to FIGS. 2 to 114.

Figure 2:
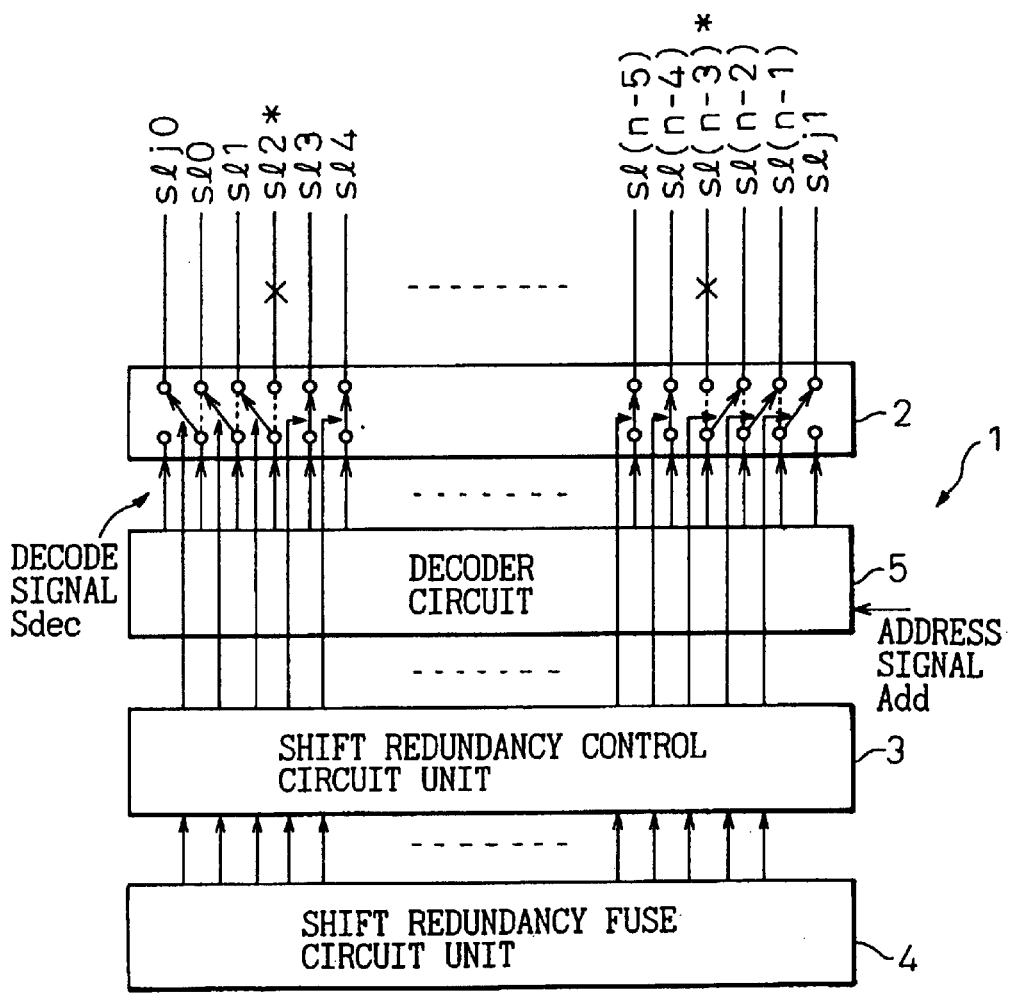
FIG. 2 is a block diagram showing a basic embodiment according to the basic principle of the present invention.
Figure 3:
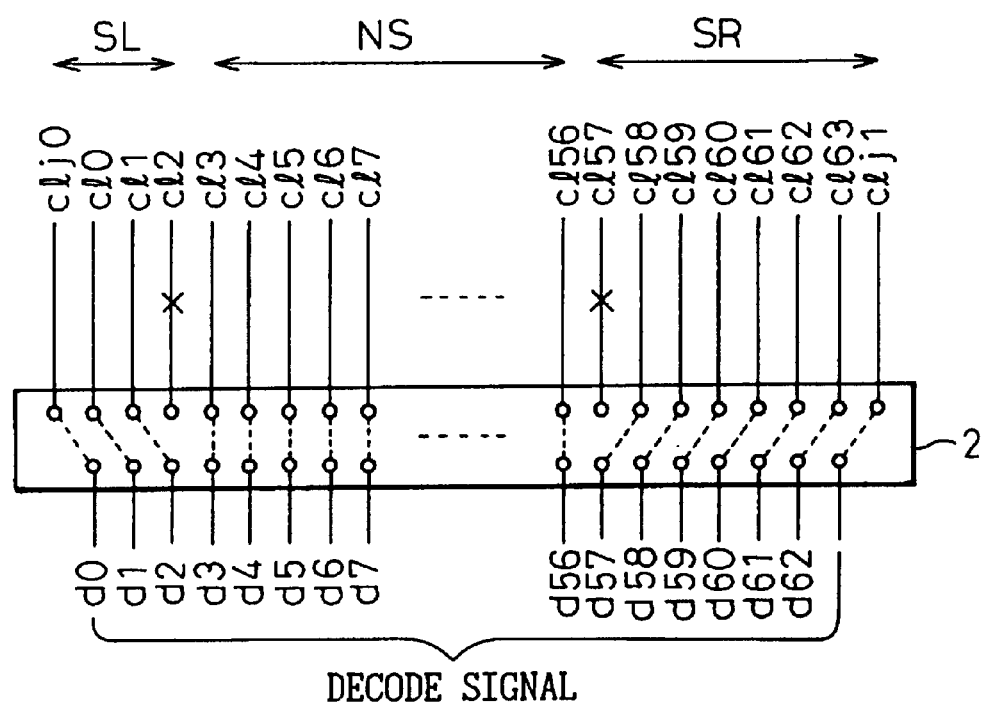
FIG. 3 is a schematic view useful for explaining the basic principle of the present invention.
Figure 4:
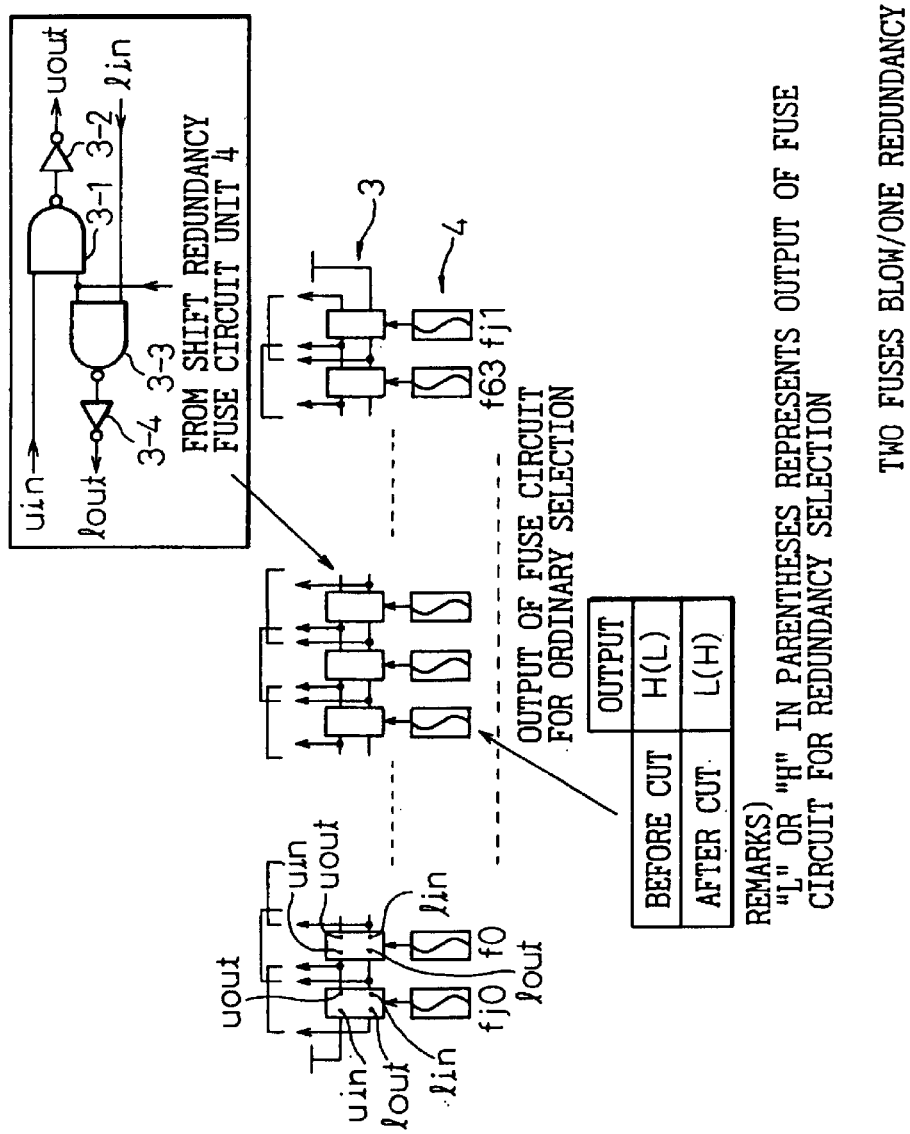
FIG. 4 is a block diagram showing the basic concept of a shift redundancy circuit according to the present invention.

FIG. 2 is a block diagram showing the construction of a basic embodiment according to the basic principle of the present invention; FIG. 3 is a schematic view useful for explaining the basic principle of the present invention; FIG. 4 is a block diagram showing the basic concept of a shift redundancy circuit of the present invention; and FIGS. 5*a* to 5*c* are diagrams showing a signal level of each portion. Incidentally, the same reference numeral will be used to identify a constituent element the same as that described already.

A semiconductor memory device according to the basic embodiment of the present invention includes a decoder circuit 5 for decoding an address signal Add supplied from external, as shown in FIG. 2. The semiconductor memory device further includes a plurality of selecting lines sl0 to sl(n−1) (where n is an arbitrary positive number of 2 or more than 2) for writing or reading data by selecting a specific memory cell from among a plurality of memory cells on the basis of the address of a decode signal Sdec outputted from the decoder circuit 5. Two redundancy selecting lines slj0 and slj1, that are not connected to those decode signal lines to which the decode signal Sdec is transferred, when no fault exists in a plurality of selecting lines, are disposed at one, and the other, of the end portions of these selecting lines, respectively.

In FIG. 2, the semiconductor memory device includes a shift redundancy control circuit 1 for controlling the connection relationship between a plurality of selecting lines and the redundancy lines. The shift redundancy control circuit 1 includes in a switch unit 2 (corresponding to a switch circuit of the present invention) including a plurality of switch devices for changeably connecting a plurality of decode signal lines to the selecting lines and to the redundancy selecting lines, and a shift redundancy fuse circuit unit 4 including a plurality of fuses disposed so as to correspond to a plurality of selecting lines and to the redundancy selecting lines, for cutting the fuse corresponding to the fault selecting line, in which any fault occurs, and also cutting the redundancy selecting fuse corresponding to the redundancy selecting line in which any fault occurs, when the fault occurs in a plurality of selecting lines. The signal outputted from the shift redundancy fuse circuit unit 4 is inputted to a shift redundancy control circuit unit 3. The signal outputted to this shift redundancy control circuit unit 3 is used as a shift control signal for controlling the switch unit 2.

Figure 1:
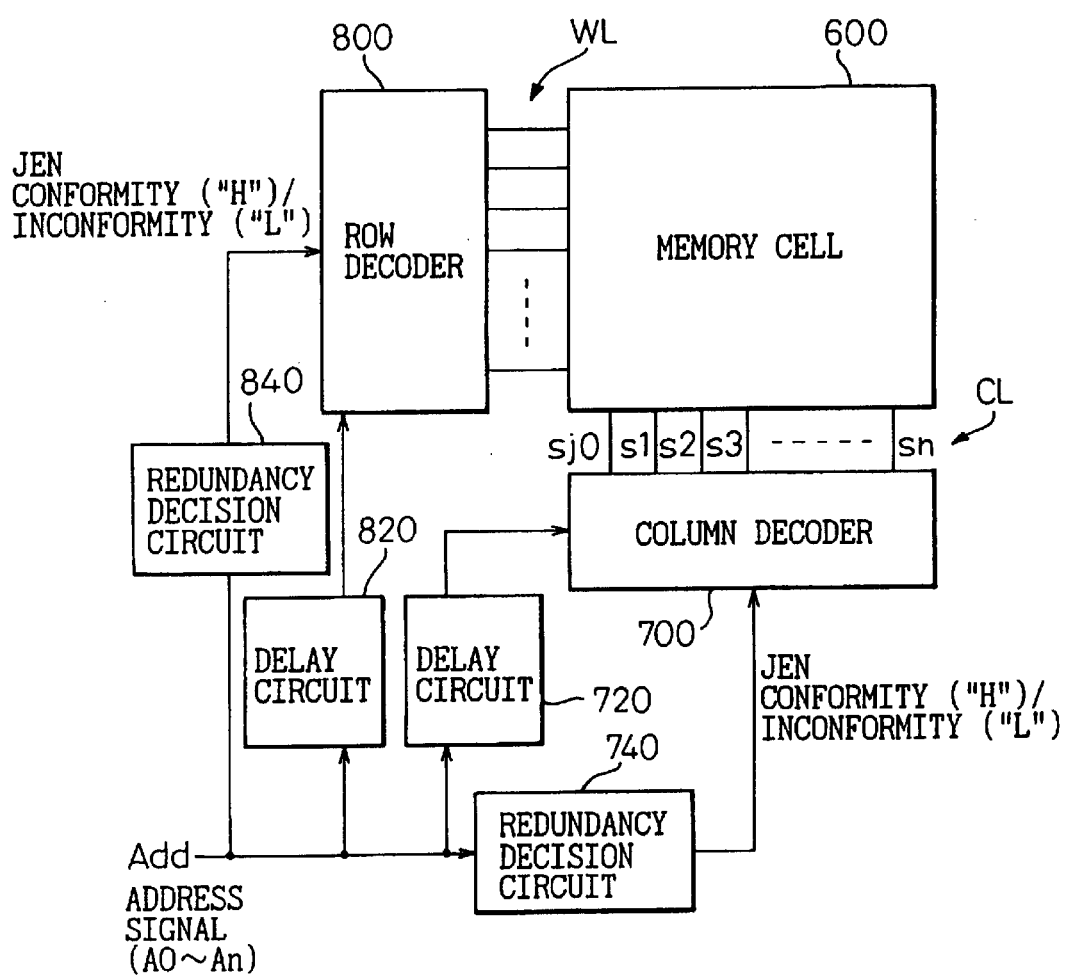
FIG. 1 is a block diagram showing the construction of a semiconductor memory device equipped with an ordinary redundancy function.

The shift redundancy circuit 1 shown in FIG. 2 includes further the shift redundancy control circuit 3. The shift redundancy fuse circuit unit 3 brings the fault selecting line to a non-selection state in which it is connected to none of the decode signal lines, in accordance with the output result from the shift redundancy fuse circuit unit 4, and controls the switching operation of a plurality of switch devices so that a plurality of decode signal lines can be shifted by one selecting line (that is, by one bit) in the direction of the first redundancy selecting line slj0 positioned at one of the ends (for example, at the left end) among a plurality of selecting lines, or can be shifted by one selecting line in the direction of the second redundancy selecting lines slj1 positioned at the other end (for example, at the right end). In other words, the semiconductor memory device shown in FIG. 1 is constituted in such a manner as to execute the shift operation of one bit or two bits in the direction of the first redundancy selecting lines, or in the direction of the second redundancy selecting lines, or in the directions of both of these lines.

Preferably, in the semiconductor memory device according to the basic embodiment of the present invention, the output result from the shift redundancy fuse circuit unit 4 is outputted by a level of a DC voltage which represents whether or not the fuses corresponding to the fault selecting line and the redundancy selecting fuse are cut.

Preferably, further, the shift redundancy control circuit unit 3 includes an NAND gate (nonconjunction gate), for outputting a shift control signal for shifting the selecting lines in any direction upon receiving the output result of the shift redundancy fuse circuit unit 4, and an inverter for inverting the shift control signal from this NAND gate.

Preferably, further, the shift redundancy control circuit unit 3 includes a NOR gate (nondisjunction gate), for outputting the shift control signal for shifting the selecting lines in any direction upon receiving the output result from the shift redundancy fuse circuit unit, and an inverter for inverting the shift control signal from this NOR gate.

Preferably, further, in the semiconductor memory device according to the basic embodiment of the present invention, each of a plurality of switch devices in the switch unit 2 is a three-directional switch device that can select a mode for executing the shift operation in the direction of the first redundancy selecting line slj0 (that is, shift in the left direction), a mode for executing the shift operation in the direction of the second redundancy selecting line (that is, the shift in the right direction) and a node for not executing the shift operation (that is, no shift).

Preferably, further, each of a plurality of switch devices can select a non-selection mode in which the connection between the decode signal line and the fault selecting line is not established.

Preferably, further, in the semiconductor memory device according to the basic embodiment of the present invention, the shift redundancy fuse circuit unit 4 includes a fuse circuit for normal selection which is used during a normal operation, a fuse circuit for redundancy selection which is used at the time of redundancy selection, and a fuse circuit for forced redundancy that is used for forced redundancy.

Preferably, further, in the semiconductor memory device according to the basic embodiment of the present invention, the shift redundancy fuse circuit unit 4 includes a fuse circuit for forced redundancy which lets a fuse corresponding to a predetermined selecting line look as being apparently cut (i.e., a fuse corresponding to a predetermined selecting line which appears to be cut) at the time of forced redundancy, and confirms whether or not any fault exists in the redundancy selecting lines.

Preferably, further, in the semiconductor memory device according to the basic embodiment of the present invention, the selecting line connected to the fuse circuit for forced redundancy is disposed at a position other than the position adjacent to the redundancy selecting line.

On the other hand, the shift redundancy circuit 1 in the semiconductor memory device shown in FIG. 2 includes a switch unit 2 that includes a plurality of switch devices for changeably connecting a plurality of decode signal lines to a plurality of selecting lines and to the redundancy selecting lines, and a shift redundancy fuse circuit unit 4 including a plurality fuses disposed so as to correspond to the selecting lines and to the redundancy selecting lines, respectively, for cutting the fuse corresponding to a fault selecting line, in which a fault occurs, and the redundancy selecting fuse corresponding to the redundancy selecting line when any fault occurs in one of the selecting lines.

The shift redundancy circuit 1 includes further a shift redundancy control circuit unit 3 for controlling the switching operation of a plurality of switch devices in accordance with the output result of the shift redundancy fuse circuit unit so that the fault selecting line is brought into the non-selection state in which it is not connected to any of the decode signal lines, and a plurality of decode signal lines can be shifted by one selecting line in the direction of the redundancy selecting line positioned at one of the ends among a plurality of the selecting lines. In other words, the semiconductor memory device can execute one-bit shift redundancy by executing the shift operation in the direction of the first redundancy selecting lines or in the direction of the second redundancy selecting lines.

Preferably, further, the semiconductor memory device according to the basic embodiment of the present invention can detect whether or not the redundancy selecting lines are used by evaluating the output level of the shift redundancy fuse circuit unit 4 in a plurality of memory cell blocks, and by judging whether or not at least one of the fuses is cut.

Preferably, further, in the semiconductor memory device according to the basic embodiment of the present invention, periodicity of the memory cell block selected by one selecting line is brought into conformity with periodicity of the memory cells lest periodicity of a plurality of memory cells changes (that is, lest the topology of the memory cell changes).

Preferably, further, in the semiconductor memory device according to the basic embodiment of the present invention, a plurality of the selecting lines and that of a plurality of fuses are laid out in the same pitch in the semiconductor chip.

In the first preferred embodiment based on the basic embodiment of the invention described above, a semiconductor memory device having a plurality of selecting lines for writing or reading data by selecting a specific memory cell from among a plurality of memory cells on the basis of an address signal supplied from external comprises a switch unit including a plurality of switch devices for changeably connecting at least one redundancy selecting line positioned at one of the ends of a plurality of the selecting lines, at least one second redundancy selecting line positioned at the other end and a plurality of decode signal lines for decoding the address signal to a plurality of selecting lines and to the redundancy selecting lines; a fuse decoder circuit for generating a fuse decode signal by designating the address of a fuse corresponding to a fault selecting line, in which a fault occurs, when the fault occurs in a plurality of selecting lines; and a shift redundancy control circuit unit for controlling a plurality of switch devices so as to execute a first switch operation which shifts at least one of the decode signal lines in the direction of the first redundancy selecting lines or a second switch operation which shifts at least one of the decode signal lines in the direction of the second redundancy selecting lines or both switch operations in accordance with the fuse decode signal from the fuse decoder circuit.

Preferably, when the faults occur in two selecting lines among a plurality of selecting lines, the fuse decoder circuit generates the fuse decode signal by designating the addresses of the fuses corresponding to the two fault selecting lines, and the shift redundancy control circuit unit controls a plurality of switch devices so that both of the first and second switch operations can be executed.

In the first preferred embodiment described above, designation of the address of the fuse corresponding to each fault selecting line by the fuse decoder circuit is effected by the combination of a smaller number of fuses than the total number of a plurality of selecting lines.

In the first preferred embodiment described above, the fuse decoder circuit includes two fuse decoder units for decoding the signals generated by the combinations of a plurality of different fuses, respectively.

When a fault occurs in one of a plurality of selecting lines in the second preferred embodiment based on the basic embodiment of the present invention, the fuse decoder circuit described above designates the fuse corresponding to one fault selecting line, in which the fault occurs, and generates the fuse decode signal, and the shift redundancy control circuit unit controls a plurality of switch devices in such a manner as to execute either one of the first and second switch operations.

In the second preferred embodiment described above, designation of the address of the fuse corresponding to the fault selecting line by the fuse decoder circuit is effected by the combination of a smaller number of fuses than the total number of selecting lines.

In the second preferred embodiment described above, the fuse decoder circuit described above includes two fuse decoder units for decoding the signals generated by different combinations of a plurality of fuses, respectively.

In the third preferred embodiment based on the basic embodiment of the present invention, a semiconductor memory device having a plurality of selecting lines for writing or reading data by selecting a specific memory cell, from among a plurality of memory cells that are disposed in each of a plurality of cell arrays, on the basis of the address signal supplied from external comprises at least one first redundancy selecting line positioned at one of the ends among a plurality of selecting lines and at least one second redundancy selecting line positioned at the other end; a switch unit including a plurality of switch devices for changeably connecting a plurality of decode signal lines decoding the address signal to a plurality of selecting lines and to the redundancy selecting lines; a fuse decoder circuit for designating the address of a fuse corresponding to a fault selecting line, in which a fault occurs, and generating a fuse decode signal on the basis of the combination of a smaller number of fuses than the total number of the selecting lines when any fault occurs in a plurality of selecting lines; and a shift redundancy control circuit unit for controlling a plurality of switch devices so that a first switch operation for shifting at least one of the decode signal lines in the direction of the first redundancy selecting lines or a second switch operation for shifting at least one of the decode signal line in the direction of the second redundancy selecting line, or both of the first and second switching operations, can be executed in accordance with the fuse decode signal from the fuse decoder circuit; wherein the shift redundancy fuse circuit unit having a plurality of fuses is shared in common by adjacent cell arrays.

In the third preferred embodiment described above, the shift redundancy fuse circuit unit includes a normal selection fuse circuit used for a normal operation, a redundancy selection fuse circuit used for redundancy selection and a forced redundancy fuse circuit used for forced redundancy, and the normal selection fuse circuit and the forced redundancy fuse circuit are shared by the adjacent cell arrays.

In the third preferred embodiment described above, the redundancy selection fuse circuits are provided, independently, to the adjacent cell arrays.

The third preferred embodiment described above can execute, for a plurality of selecting lines of either one of the adjacent cell arrays, the first switch operation or the second switch operation or both of the first and second switch operations, or dan execute, for both of adjacent cell arrays, the first switch operation or the second switch operation or both of the first and second switch operations.

In a fourth preferred embodiment based on the basic embodiment of the present invention, a semiconductor memory device including a plurality of column selecting lines for writing or reading data by selecting a specific memory cell, from among a plurality of memory cells constituting a plurality of memory cell blocks on the basis of the address signal supplied from external comprises the memory cell blocks each being divided into a plurality of row blocks, and includes, for each of these memory cell blocks, at least one first redundancy selecting line positioned at one of the ends of a plurality of column selecting lines and at least one second redundancy selecting line positioned at the other end; a switch unit including a plurality of switch devices for changeably connecting a plurality of decode signal lines decoding the address signal to a plurality of column selecting lines and to the redundancy selecting lines; a shift redundancy fuse circuit unit including a smaller number of fuses than the total number of a plurality of column selecting lines and a plurality of redundancy selecting fuses disposed so as to correspond to the redundancy selecting lines; a fuse decoder circuit for designating the address of a fuse corresponding to a fault selecting line, in which a fault occurs, when any fault occurs in the selecting lines, and generating a fuse decode signal on the basis the combination of a plurality of fuses; and a shift redundancy control circuit unit for controlling a plurality of switch devices so that a first switch operation for shifting at least one of the decode signal line in the direction of the first redundancy selecting line or a second switch operation for shifting at least one of the decode signal lines in the direction of the second redundancy selecting line or both of the first and second switch operations, can be executed in accordance with the fuse decode signal from the fuse decoder circuit; wherein the first switch operation or the second switch operation or both of the first and second switch operations are executed independently for each of a plurality of row blocks, or both of the first and second switch operations are not executed independently for each of the row blocks.

Preferably, the fuse decode signal from the fuse decoder circuit is generated on the basis of the logic address described above.

In a fifth preferred embodiment based on the basic embodiment of the present invention, a semiconductor memory device including a plurality of column selecting lines for writing or reading data by selecting a specific memory cell, from among a plurality of memory cells constituting a plurality of memory cell blocks on the basis of an address signal supplied from external comprises the memory cell blocks each being divided into a plurality of column blocks, and includes, for each of these memory cell blocks, at least one first redundancy selecting line positioned at one of the ends among a plurality of column selecting lines and at least one second redundancy selecting line positioned at the other end; a switch unit including a plurality of switch devices for changeably connecting a plurality of decode signal lines decoding the address signal to a plurality of column selecting lines and to the redundancy selecting lines; and a shift redundancy fuse circuit unit including a plurality of fuses disposed so as to correspond to a plurality of column selecting lines and to the redundancy selecting lines, for cutting the fuse corresponding to a fault selecting line in which a fault occurs, when any fault occurs among a plurality of column selecting lines, and the redundancy selecting fuse corresponding to the redundancy selecting line; wherein a first switch operation for shifting at least one of the decode signal lines in the direction of the first redundancy selecting line or a second switch operation for shifting at least one of the decode signal lines in the direction of the second redundancy selecting line or both of the first and second switch operations are executed in accordance with the output result from the shift redundancy fuse circuit unit, or the first switch operation or the second switch operation or none of the first and second switch operation are executed independently for each of a plurality of row blocks on the basis of the logical addresses of a plurality of row blocks.

Preferably, the output result from the shift redundancy fuse circuit unit is generated on the basis of the logical address described above.

Next, the two-bit shift redundancy operation of the present invention will be explained with reference to the schematic view of FIG. 3. In FIG. 3, symbols clj0 and clj1 represent redundancy selecting lines (for example, column selecting lines for redundancy selection) that are used at the time of the shift redundancy operation, and symbols cl0 to cl63 represent selecting line for normal operation (for example, column selecting lines) that are used for a normal operation. These selecting lines are connected to decode signal lines d0 to d3 decoding the address signals supplied from outside the semiconductor chip through a plurality of switch devices in the semiconductor chip. Before the shift redundancy process is executed or when no fault exists in the selecting lines, the selecting lines are controlled by the switch devices so that the connection can be established between cl1 and d1, cl0 and d0, . . . , cl62 and d62, and cl63 and d63. The case in which the selecting line cl# and the decode signal line d# (#: 0 to 63) is connected is called "NS" (No Shift).

The schematic view of FIG. 3 explains the case in which faults exist in two selecting lines cl2 and cl157 and shift redundancy is executed for these faults. The decode signal lines d0, d1 and d2 are connected to the redundancy selecting line clj0, the selecting line cl0 and selecting line cl1 (SL (Shift Left)), respectively. The selecting lines cl2 and cl57 are connected to none of the decode signal lines and are always under the non-selection state. The selecting lines cl3 to cl56 are under the NS state, and the selecting lines cl58 to cl63 and the redundancy selecting line clj1 are connected to the decode signal lines d57 to d63 (RS (Shift Right)), respectively.

The basic concept of the shift redundancy switch circuit equipped with the two-bit shift redundancy function according to the present invention will be explained with reference to FIGS. 4 and 5a to 5c. In FIG. 4, symbols fj0, fj1 and f0 to f63 represent the fuse circuits inside the shift redundancy fuse circuit unit 4. The fuse circuits f0 to f63 for the normal selection output a low voltage level ("L" level) when the fuse is cut and a high voltage level ("H" level) when the fuse is not cut. On the other hand, the redundancy selecting fuse circuits fj0 output the "H" level when the fuse is cut and the "L" level when the fuse is not, on the contrary. The fuses of each fuse circuit and a plurality of selecting lines are disposed in the same pitch (for example, 3.2 μm) on the semiconductor chip and correspond to one another on the 1:1 basis.

The shift redundancy control circuit unit 3 is the circuit for controlling each of the switch devices of the switch unit 2 upon receiving the output result from these fuse circuits. The shift control circuit connected to each fuse circuit comprises a NAND gate 3-1, 3-3 and an inverter 3-2, 3-4 that are connected as shown in FIG. 4. In this case, a NOR gate can be used in place of the NAND gate 3-1 and 3-3 (as will be described later in detail). Here, a plurality of shift control circuits in the shift redundancy control circuit unit 3 are connected in series as shown in FIG. 4 by connecting one of the input signals uin and one of the output signals uout, and connecting the other input signal lin and the other output signal lout, respectively. The input signals uin and lin of the shift control circuits positioned at one, and the other, of the ends of the shift redundancy control circuit unit 3 are connected to the power sources on the high voltage side, respectively, and the voltage of the "H" level is inputted to them.

The switch operation of each switch device in the switch unit 2 is controlled by the combination of the "H" level and the "L" level of the output signals uout and lout outputted from the shift redundancy control circuit unit 3. When the fuse is not cut (refer to the default state shown in FIG. 5*a*), the output level of all the output signals uout and lout is at the "L" level. At this time, the outputs of the fuse circuits corresponding to the selecting lines other than the redundancy selecting lines are at the "H" level and the outputs of the fuse circuits corresponding to the redundancy selecting lines are at the "L" level. In this case, the shift redundancy operation is judged as not being executed (that is, NS (No Shift)).

If the fuse f1 and the redundancy selecting fuse fj0 are cut hereby (that is, when any fault exists in the selecting line cl1 and the redundancy selecting line clj0 is used), for example, the decode signal lines d0 and d1 are connected to the redundancy selecting line clj0 and the selecting line cl0, respectively (that is, shift left (SL)), as is obvious from the state of the selecting lines due to one-bit shift redundancy shown in FIG. 5*b*. The state becomes NS (no shift) in other cases. At this time, only the output signal uout, at the position at which the signals from the fuse f0 and the redundancy selecting fuse fj0 are inputted, is at the "H" level, and the output signals at the other positions are all at the "L" level. Therefore, the state of the output signal lout="L" is judged as the shift left SL by the output signal uout="H". Further, the output of the fuse circuit (fuse f0) corresponding to the selecting line cl0 remains at the "H" level in the shift redundancy fuse circuit 4 at this time, but the output of the fuse circuit (fuse fj0 for the cut fuse for the redundancy selection) corresponding to the redundancy selecting line clj0 changes to the "L" level.

The shift redundancy control circuit unit 3 executes the switch control of the corresponding switch devices in the switch unit 1 so as to establish the non-selection state in which none of the decode signal lines are connected to the selecting line cl1 in which the fault exists. At this time, the output signal uout at the position at which the signal from the fuse f1 corresponding to the selecting line cl1 is inputted is at the "L" level and the output signal lout is at the "L" level in the shift redundancy control circuit unit 3. Further, the output of the fuse circuit (cut fuse f1) corresponding to the selecting line cl1 having the fault is at the "L" level at this time.

Similarly, when the fuses of the fuse circuits fj0 and fj1 for redundancy selection and the fuses of the fuse circuits f1 and f61 for normal selection are cut, the decode signal lines d0 and d1 are connected to the redundancy selecting line clj0 and to the selecting line cl0, respectively (Shift Left: SL), the decode signal lines d2 to d60 are connected to the selecting lines cl2 to cl60 (No Shift: NS), respectively, and the decode signal lines d61, d62 and d63 are connected to the selecting lines cl62 and cl63 and to the redundancy selecting line clj1 (Shift Right: SR), respectively. As to the output signals uout and lout at this time, the state of the output signal lout="H" with the output signal uout="L" may be judged as the Shift Right SR, as is obvious from the state of the selecting lines by the two-bit shift redundancy shown in FIG. 5*c*. At this time, further, the outputs of the fuse circuits corresponding to the selecting lines cl0, cl62 and cl63 in the shift redundancy fuse circuit 4 remain at the "H" level, but the outputs of the fuse circuits (the redundancy selecting fuses fj0 and lj1 that are cut) corresponding to the redundancy selecting lines clj0 and clj1 change to the "L" level.

Further, the shift redundancy control circuit unit 3 executes the switch control of the corresponding switch devices in the switch unit 1 so as to establish the nonselection state in which no decode signal line is connected, for the fault selecting lines cl1 and cl61. The output signals uout at the positions inside the shift redundancy control circuit unit 3 at which the signals from the fuses f1 and f61 corresponding to the selecting lines cl1 and cl61 are inputted are at the "L" level and the output signal lout is "L". The outputs of the fuse circuits (cut fuses f1 and f61) corresponding to the fault selecting lines cl1 and cl61 in the shift redundancy fuse circuit 4 are at the "L" level at this time.

In summary, the basic embodiment of the present invention can relieve the fault selecting lines through two-bit shift redundancy when at least two fault selecting lines exist due to short circuit between the selecting lines, etc., by shifting the decode signal lines in the direction of one of the redundancy selecting lines and in the direction of the other of the redundancy selecting lines.

On the other hand, when one fault selecting line develops, the basic embodiment of the present invention can relieve the fault selecting line through one-bit shift redundancy by shifting the decode signal lines in either one of the directions of two redundancy selecting lines in the same way as in the conventional shift redundancy system.

According to the basic embodiment of the present invention, further, the fuse circuit for normal selection and the fuse circuit for forced redundancy are shared by the two cell arrays adjacent to each other inside the semiconductor chip, and the fuse circuit for redundancy selection is independently disposed in such a manner as to correspond to each cell array so that two-bit or one-bit shift redundancy can be executed for the total number of the selecting lines of the two adjacent cell arrays.

When shift redundancy is executed for the column selecting lines disposed for a plurality of row blocks, the logic of the address of the row block is incorporated into the address of the column selecting line as the object of the shift redundancy so that the column selecting lines driven for a plurality of row blocks can receive the logic of the address of the corresponding row block and redundancy can be executed in the row block unit.

Because the basic embodiment of the present invention can execute both one-bit shift redundancy and two-bit shift redundancy, it can accomplish low power consumption and high-speed access, and can efficiently relieve the fault on the semiconductor chip. Furthermore, the basic embodiment can relatively increase the degree of freedom of redundancy by causing the two adjacent cell arrays to share the fuse circuit for normal selection and the fuse circuit for forced redundancy, or by executing redundancy in the row block unit by incorporating the logic of the address of the row blocks.

Figure 6:
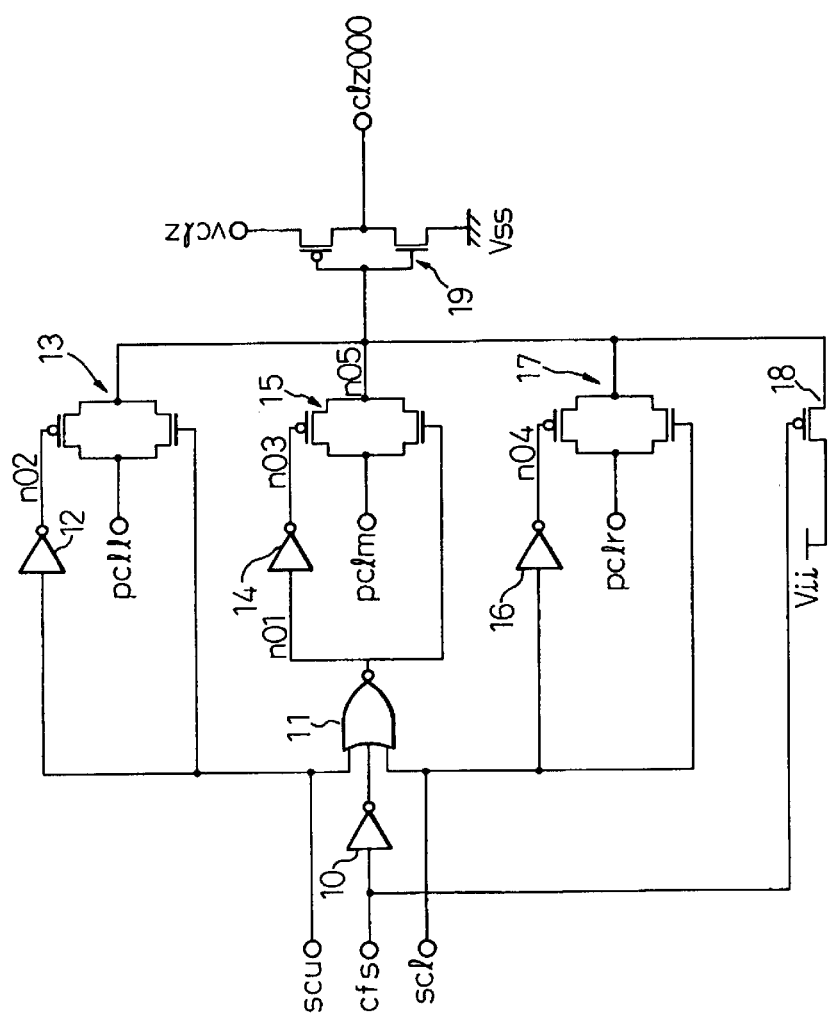
FIG. 6 is a circuit diagram showing the construction of a selecting line drive circuit in a first preferred embodiment of the present invention.

FIG. 6 is a circuit diagram showing the construction of a selecting line drive circuit in the first preferred embodiment of the present invention. This selecting line drive circuit includes circuit elements corresponding to the switch devices in the switch unit 2 in FIG. 2, and has also the function of driving the selecting lines and supplying a predetermined output voltage when the load of the selecting lines becomes great.

In FIG. 6, the output signal lout in each shift control circuit of the shift redundancy control circuit unit is inputted to scu, and the output signal lout of each shift control circuit is inputted to scl. Symbol cfs represents the output signal of the fuse circuit (which corresponds on the 1:1 basis to the output signal cfsz of the fuse circuit to be later described with reference to FIG. 9), and symbols pcll, pclm and pclr correspond to the decode signals from the decode signal lines d(#−1), d# and d(#+1), respectively. Symbol clz000 represents an arbitrary one of the selecting lines (for example, a column selecting line) and Vclz is equal to the power source voltage Vii (internal voltage) of the power source on the high voltage side. Symbol Vss represents the power source voltage of the power source on the low voltage side, that is, the ground potential.

The selecting line drive circuit shown in FIG. 6 includes a three-directional switch device comprising a NOR gate (nondisjunction gate) using the signal obtained by inverting the output signal cfs of the fuse circuit by the inverter 10 and one and the other of the output signals uout and lout of the shift control circuit, as three input signals thereof, three inverters 12, 14 and 16 and three transfer gates 13, 15 and 17, a P channel transistor 18 and an output driver (or selecting line drive circuit unit) 19 comprising a P channel transistor and an N channel transistor.

The explanation will be given in further detail. When the output signals uout and lout of the shift control circuit are both at the "L" level and the output us signal cfs of the fuse circuit is at the "H" level, the mode for not executing the shift redundancy operation is selected and the second transfer gate 15 is turned ON. When the output signals uout and lout of the shift control circuit are at the "H" level and the "L" level, respectively, and when the output signal cfs of the fuse circuit is at the "H" level, a mode for executing the shift redundancy operation in one direction is selected and the first transfer gate 13 is turned ON. When the output signals uout and lout of the shift control circuit are at the "L" level and the "H" level, respectively, and when the output signal cfs of the fuse circuit is at the "H" level, a mode for executing the shift redundancy operation in the other direction is selected and the third transfer gate 17 is turned ON.

Here, the path from the decode signal lines d(#−1), d# and d(#+1), through which the decode signals pcll, pclm and pclr are transferred, respectively, to the selecting line clz000 affects the access time of the semiconductor chip, but the circuit devices associated with the shift redundancy operation are only the first stage transfer gates 13, 15 and 17. Therefore, it can be appreciated that excellent high-speed access can be made.

On the other hand, when the output signals uout and lout of the shift control circuit are both at the "L" level and the output signal cfs of the fuse circuit is at the "L" level, all of the three transfer gates 13, 15 and 17 are turned OFF. The P channel transistor 18 is turned ON at this time and the voltage of the "H" level is inputted to an output driver 19. Since this output driver 19 has an inverter construction, the output voltage of the output driver 19 changes to the "L" level. In other words, when the selecting line connected to this output driver 19 is a fault selecting line, this fault selecting line can be always kept under the non-selection state.

Figure 7:
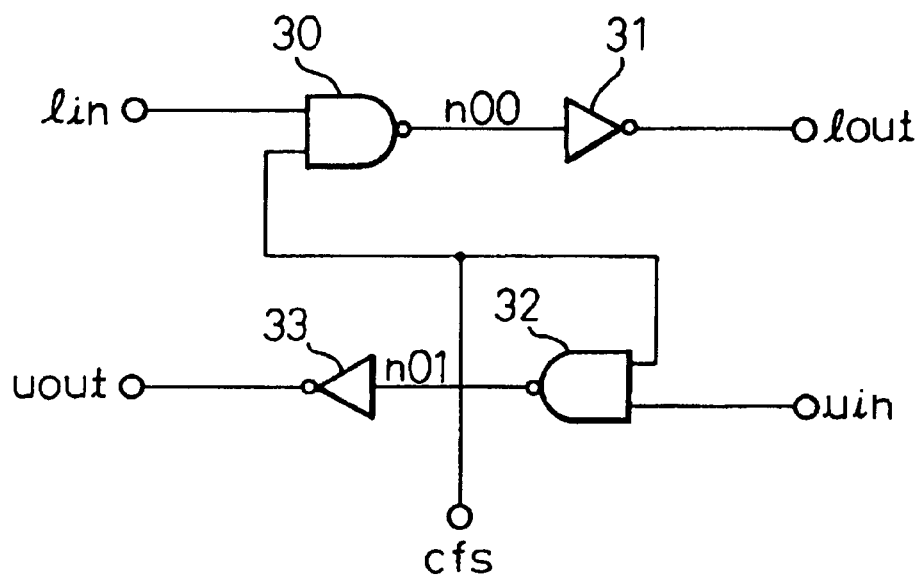
FIG. 7 is a circuit diagram showing the construction of a shift control circuit in the first preferred embodiment of the present invention.

FIG. 7 is a circuit diagram showing the construction of the shift control circuit in the first preferred embodiment of the present invention. The shift control circuit in FIG. 7 corresponds to each shift control circuit inside the shift redundancy control circuit unit 3 shown in FIG. 2.

In FIG. 7, symbol uout represents one of the output signals in each shift control circuit of the shift redundancy control circuit unit, and symbol lout represents the other output signal in each shift control circuit. Symbol cfs represents the output signal of the fuse circuit, which corresponds on the 1:1 basis to the output signal cfsz of the fuse circuit which will be described later with reference to FIG. 9. The shift control circuit is the one that controls each switch device upon receiving the output result of each fuse circuit, and comprises NAND gates 30 and 32 and inverters 31 and 32 that are connected as shown in FIG. 7. A shift redundancy control circuit unit comprising a plurality of shift control circuits connected in series can be constituted by connecting one of the input signals uin and one of the output signals uout, and connecting the other of the input signals lin and the other of the output signals lout, as shown in FIG. 4.

Figure 8:
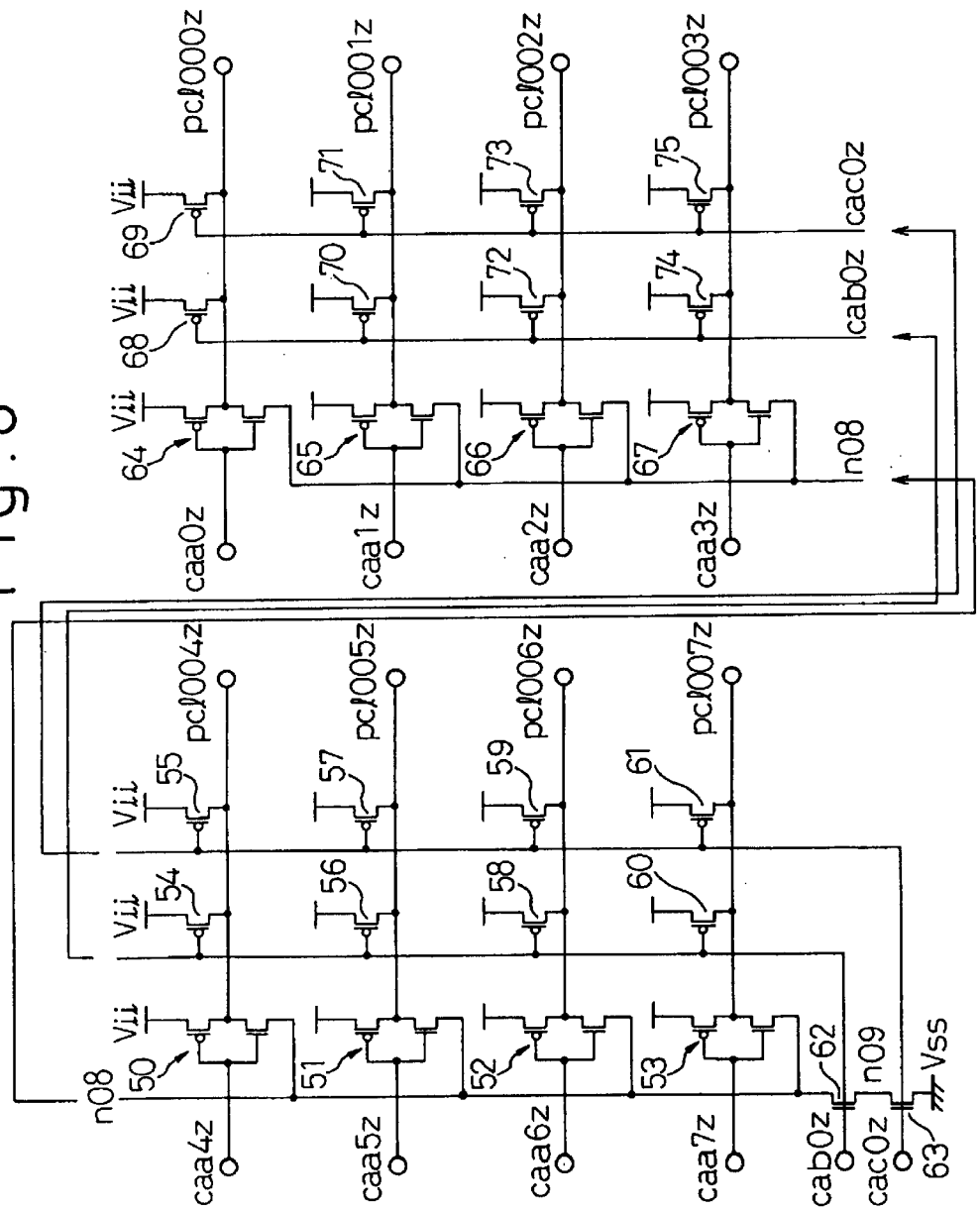
FIG. 8 is a circuit diagram showing the construction of a decoder circuit in the first preferred embodiment of the present invention.

FIG. 8 is a circuit diagram showing the construction of the decoder circuit in the first preferred embodiment of the present invention. The decoder circuit shown in FIG. 8 is the one that outputs the decode signals pc1000z to pc10007z (that is, corresponding to d# in FIG. 3). In the drawing, symbols caa#z, cab#z and cac#z represent pre-decode signals of the selected addresses (that is, corresponding to the address signals Add in FIG. 2).

The first pre-decode signals caa0z to caa7z are supplied to inverters 64 to 67 and inverters 50 to 53 each comprising a P channel transistor and an N channel transistor. The second pre-decode signal cab0z inputted to the gate of the N channel transistor 62 is supplied to the gate of each P channel transistor 68, 70, 72 and 74, and 54, 56, 58 and 60. The third pre-decode signal inputted to the gate of the N channel transistor 63 is supplied to the gate of each P channel transistor 69, 71, 73 and 75, and 55, 57, 59 and 61.

Figure 9:
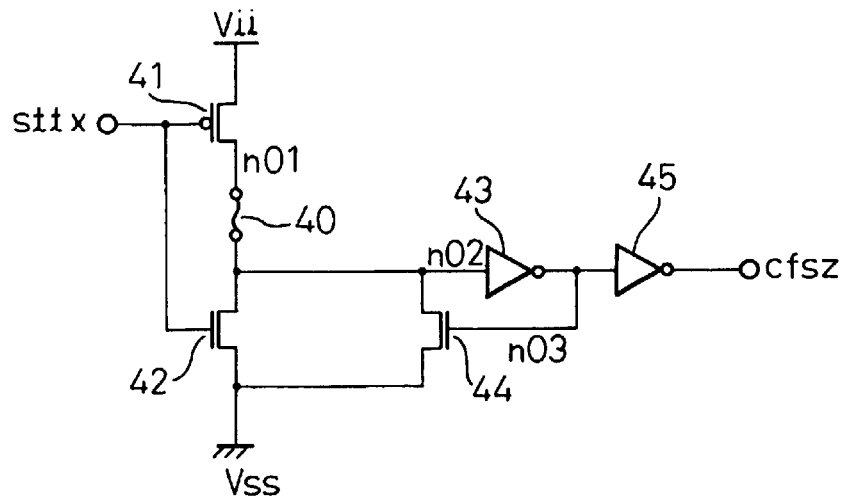
FIG. 9 is a circuit diagram showing the construction of a fuse circuit for normal selection in the first preferred embodiment of the present invention.

FIG. 9 is a circuit diagram showing the construction of the fuse circuit for normal selection in the first preferred embodiment of the present invention. The fuse circuits for normal selection shown in FIG. 9 (with the exception of the fuse circuits for selecting lines which are subjected to redundancy at the time of forced redundancy) correspond to the fuse circuits that are used for the selecting lines cl0, cl2 to cl61 and cl63 inside the shift redundancy fuse circuit unit 4 shown in FIG. 2.

In FIG. 9, symbol sttx represents a control signal which remains at the "H" level until the power source becomes operative after the power source is switched on and changes to the "L" level after the power source becomes operative, and symbol cfsz represents the output signal of the fuse circuit. The fuse circuit shown in FIG. 9 includes a P channel transistor 41 and an N channel transistor 42 to which the control signal sttx is inputted, an N channel transistor 44 and two inverters 43 and 45. When the fuse 40 is not cut, the output signal cfsz of the fuse circuit reaches the "H" level after the power source becomes operative. When the fuse 40 is cut, the output signal sfsz of the fuse circuit falls to the "L" level.

Figure 10:
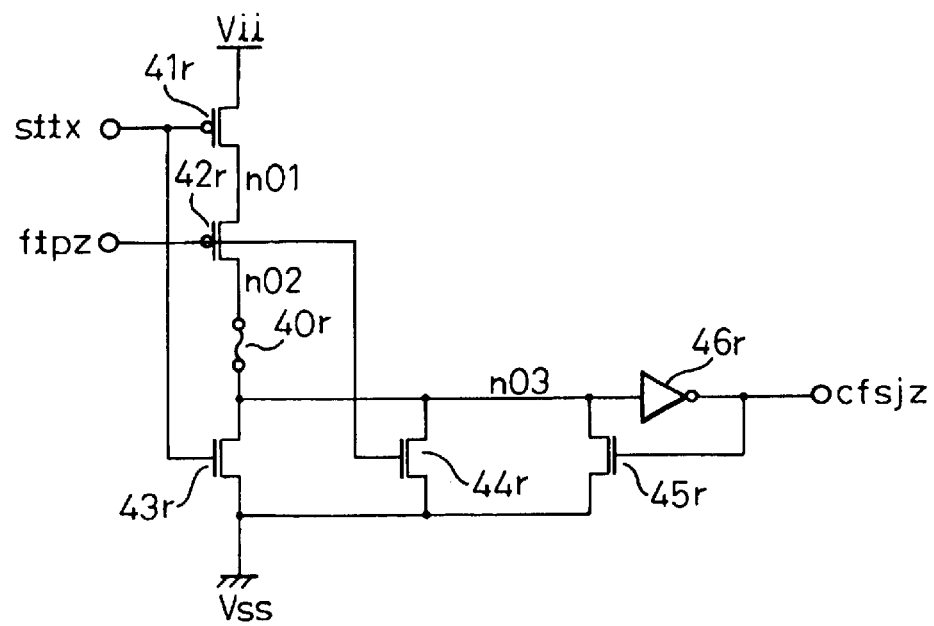
FIG. 10 is a circuit diagram showing the construction of a fuse circuit for redundancy selection in the first preferred embodiment of the present invention.

FIG. 10 is a circuit diagram showing the construction of the fuse circuit for redundancy selection in the first preferred embodiment of the present invention. The fuse circuit for redundancy selection shown in FIG. 10 corresponds to the fuse circuit for redundancy selection used for the redundancy selecting lines clj0 and clj1 in the shift redundancy fuse circuit unit 4 shown in FIG. 2.

In FIG. 10, symbol ftpz represents the control signal which attains the "H" level when forced redundancy is executed. The fuse circuit for redundancy selection shown in FIG. 10 includes a P channel transistor 41r and an N channel transistor 43r to which the control signal sttx is inputted, a P channel transistor 42r and an N channel transistor 44r to which the control signal ftpz is inputted, an N channel transistor 45r and an inverter 46r. When the fuse 40r is not cut and forced redundancy is not executed (when control signal ftpz="L"), the output signal cfsjz of the fuse circuit for redundancy selection changes to the "L" level. When the fuse 40r is cut in practice, on the other hand, the output signal cfsjz of the fuse circuit for redundancy selection rises to the "H" level.

In FIG. 10, further, when the fuse 40r is not cut and forced redundancy is executed (control signal ftpz="H"), the P channel transistor 42r is turned OFF while the N channel transistor 44r is turned ON, so that the node n03 falls to the "L" level. In consequence, the output signal cfsjz of the fuse circuit for redundancy selection rises to the "H" level. In this case, the fuse 40r is apparently cut, and whether or not any fault exists in the redundancy selecting lines can be confirmed by executing the forced redundancy operation with a fuse circuit for forced redundancy shown in later-appearing FIG. 11.

In both of the fuse circuit for normal selection in FIG. 9 and the fuse circuit for redundancy selection in FIG. 10, the fuse of the fuse circuit corresponding to the selecting lines as the object of redundancy and the fuse of the fuse circuit for redundancy selection corresponding to the redundancy selecting lines are cut.

Figure 11:
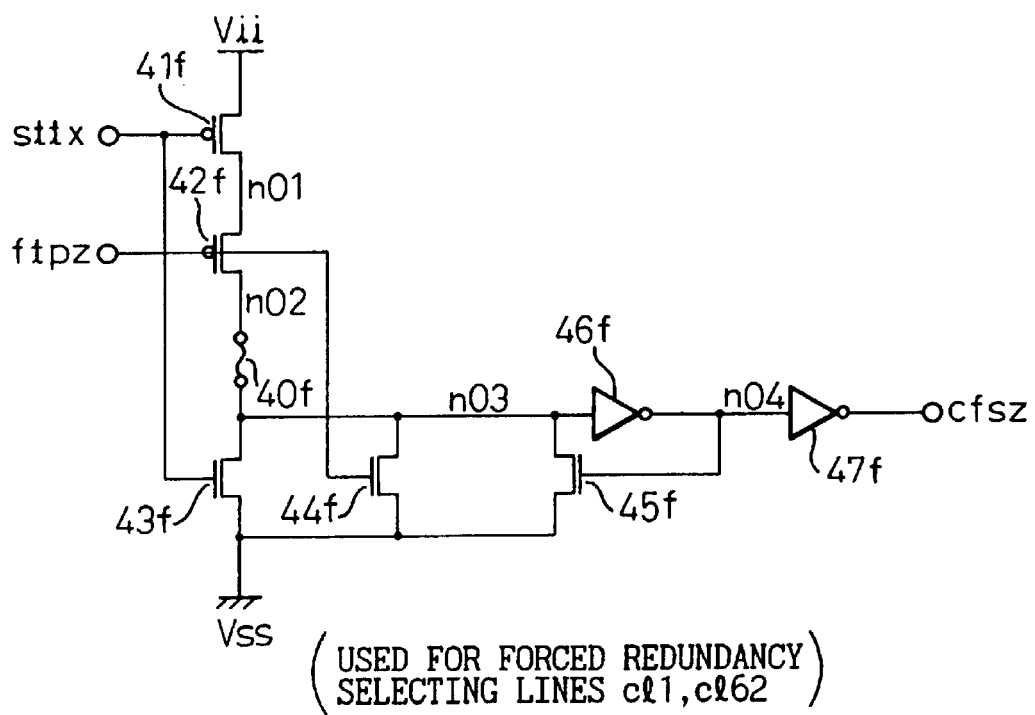
FIG. 11 is a circuit diagram showing the construction of a fuse circuit for forced redundancy in the first preferred embodiment of the present invention.

FIG. 11 is a circuit diagram showing the construction of the fuse circuit for forced redundancy selection in the first embodiment of the present invention. This circuit corresponds to the fuse circuit for forced redundancy used for the forced redundancy selecting lines cl1 and cl62 in the shift redundancy fuse circuit unit 4 in FIG. 1.

In FIG. 11, symbol ftpz represents the control signal which rises to the "H" level when the forced redundancy operation is executed. The fuse circuit for forced redundancy shown in FIG. 11 includes a P channel transistor 41f and an N channel transistor 43f, to which the control signal sttx is inputted, a P channel transistor 42f and an N channel transistor 44f, to which the control signal ftpz is inputted, an N channel transistor 45f and two inverters 46f and 47f. When the fuse 40f is caused to look as being apparently cut at the time of forced redundancy, the output signal cfsjz of the forced redundancy fuse circuit falls to the "L" level. Before the fuse corresponding to the selecting line as the object of shift redundancy is cut under this state, it is possible to confirm whether or not any fault exists in the redundancy selecting lines.

The explanation will be given in further detail. When the forced redundancy operation is executed, the "H" level control signal ftpz is inputted to the gate of each of the P channel transistor 42f and the N channel transistor 44f. In this way, the P channel transistor 42f is turned OFF, the N channel transistor 44f is turned ON, and the input level of the inverter 46f falls to the "L" level. As a result, the output level of the inverter 47f changes to the "L" level, and the output signal cfsjz of the "L" level is generated.

When the forced redundancy operation is not executed (control signal ftpz="L"), on the other hand, the P channel transistor 42f is turned ON, the N channel transistor 44f is turned OFF and the input level of the inverter 46f rises to the "H" level. As a result, the output level of the inverter 47f rises to the "H" level, and the output signal of the "H" level is generated. Further, when the fuse 40f is cut actually, the N channel transistor 45f is turned OFF and the input level of the inverter 46f falls to the "L" level. As a result, the output level of the inverter 47f falls to the "L" level and the output signal cfsjz of the "L" level is generated.

FIGS. 12 to 17 are circuit diagrams Nos. 1 to 6 showing the connection among the circuits in the first preferred embodiment of the present invention, respectively. Here, the drawings show a semiconductor memory device (parent circuit) having sixty-four selecting lines clz(1) to clz(64) and two redundancy selecting lines cljz(0) and cljz(1) is formed by connecting mutually a plurality of children circuits including the selecting line drive circuit shown in FIG. 6, the shift control circuit shown in FIG. 7, the fuse circuit for normal selection shown in FIG. 9, the fuse circuit for redundancy selection shown in FIG. 10 and the fuse circuit for forced redundancy selection shown in FIG. 11.

Figure 12:
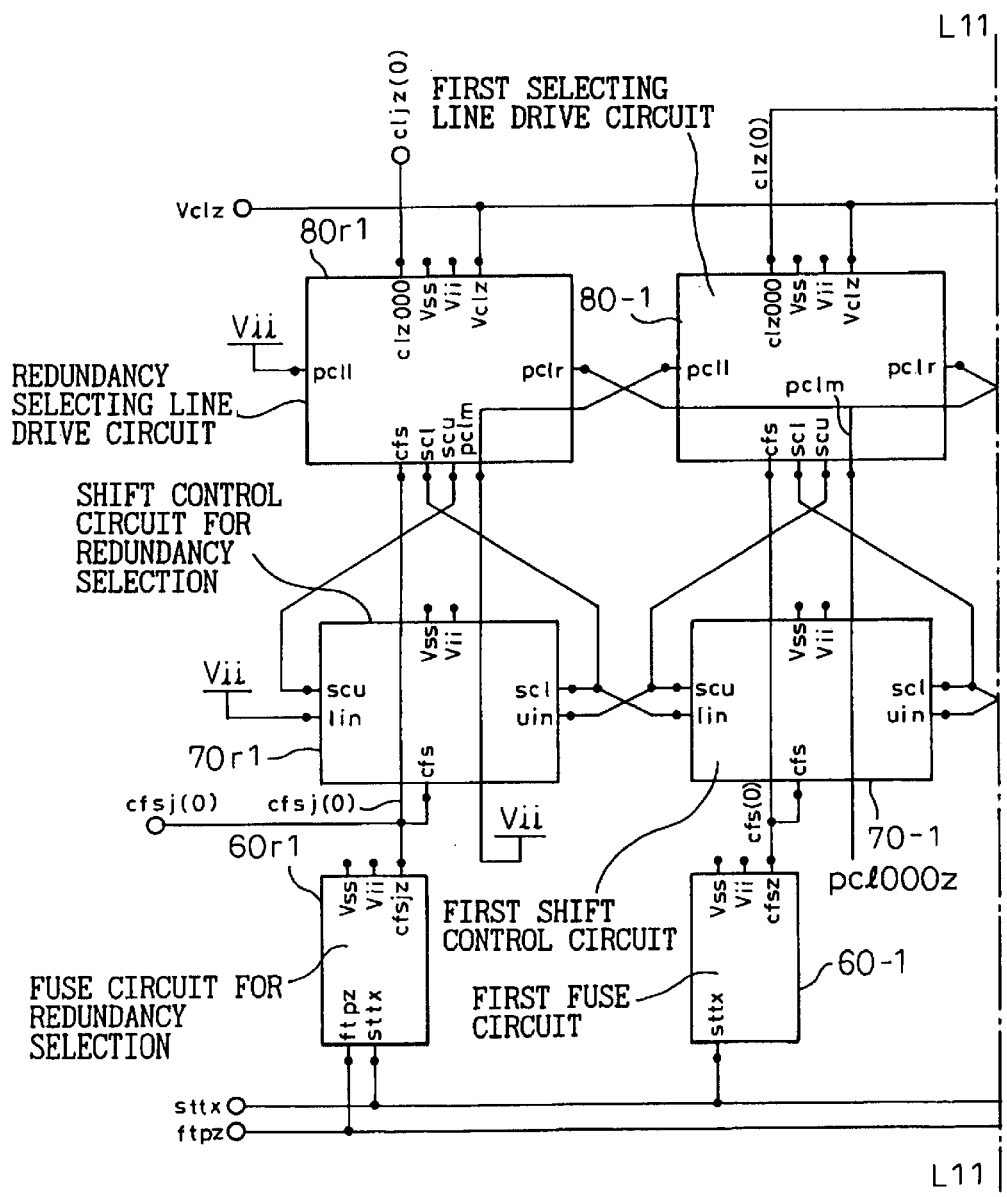
FIG. 12 is a circuit diagram (No. 1) showing the connection of each circuit in the first preferred embodiment of the present invention.
Figure 13:
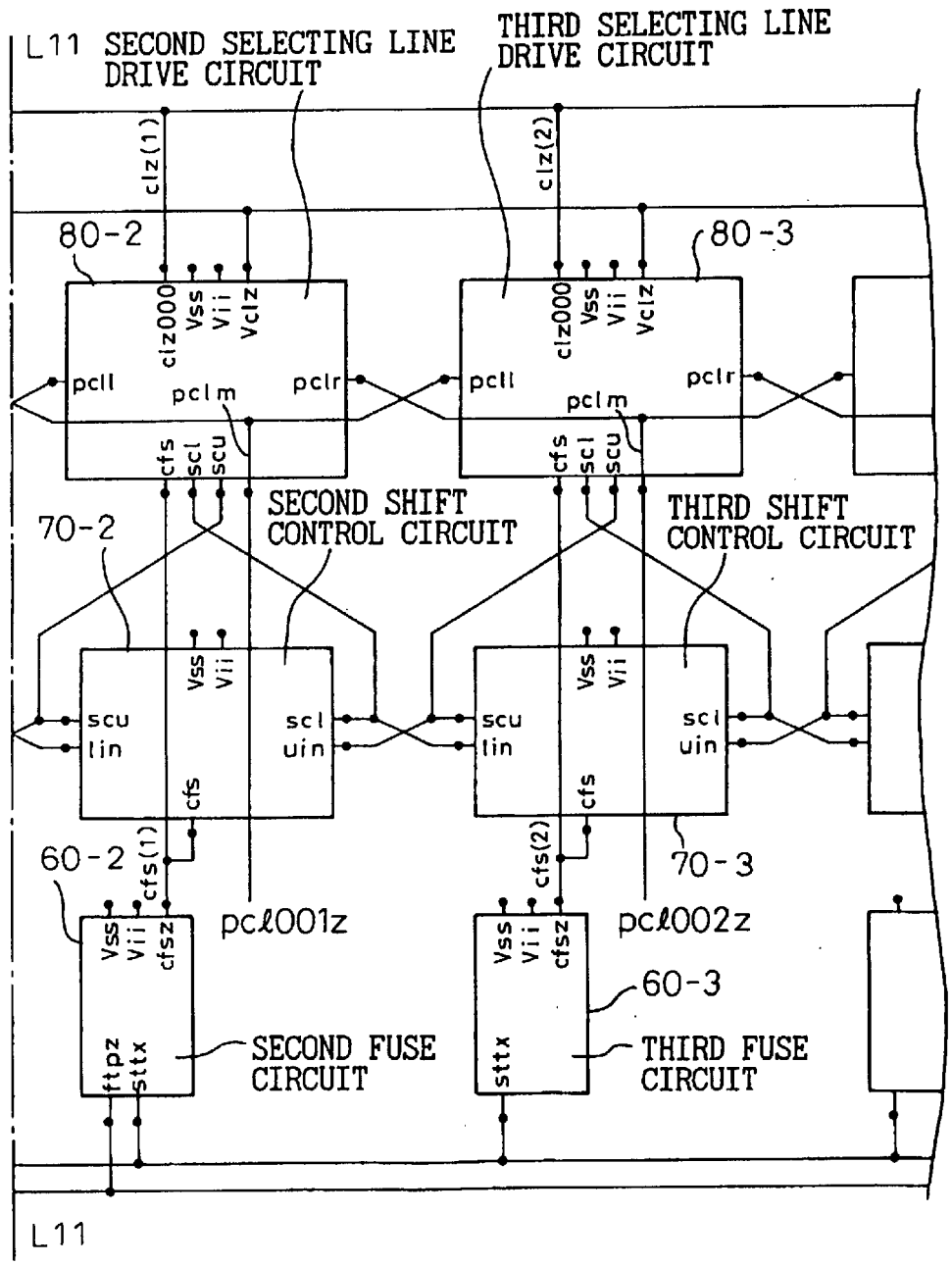
FIG. 13 is a circuit diagram (No. 2) showing the connection of each circuit in the first preferred embodiment of the present invention.
Figure 14:
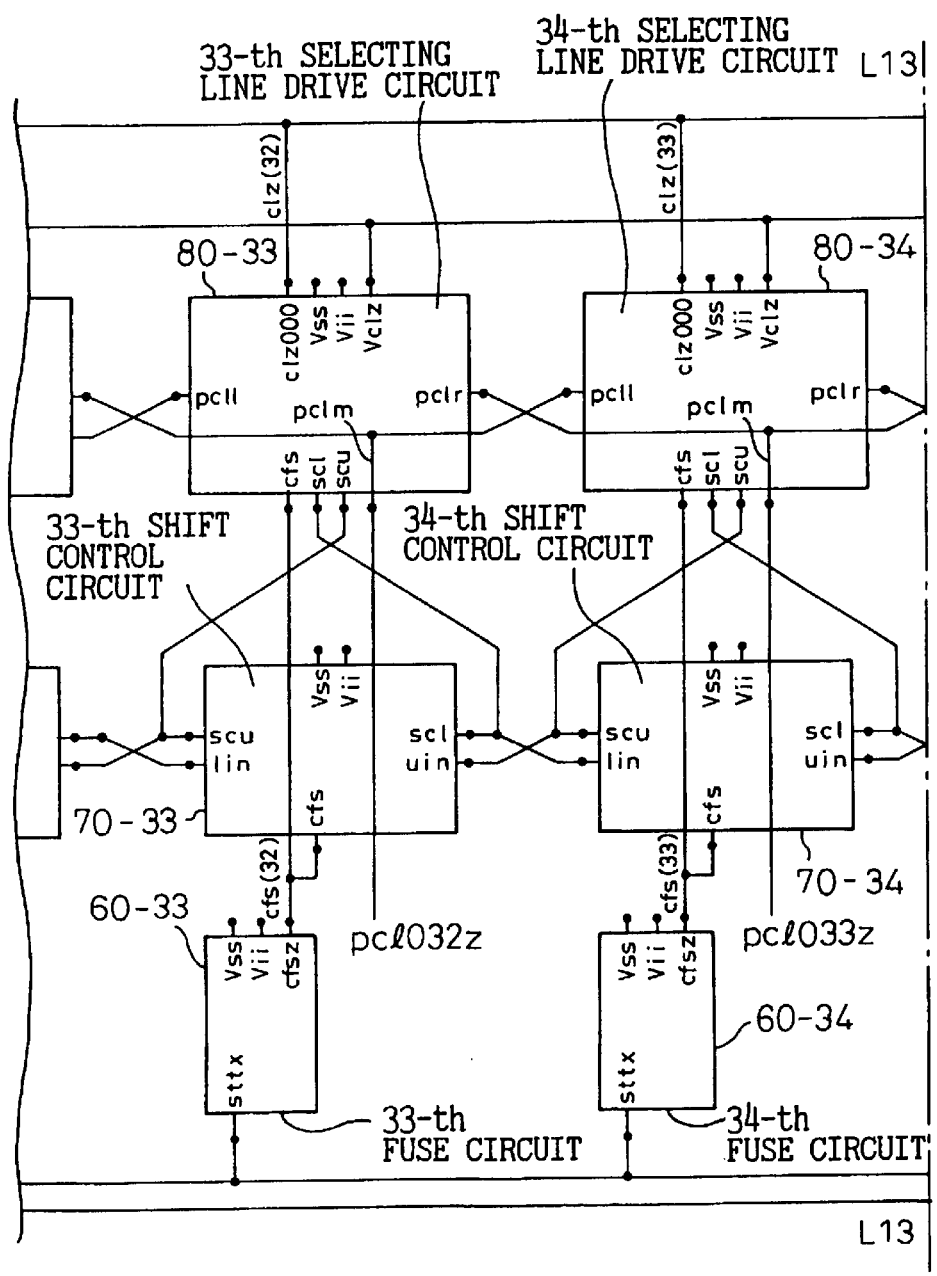
FIG. 14 is a circuit diagram (No. 3) showing the connection of each circuit in the first preferred embodiment of the present invention.
Figure 15:
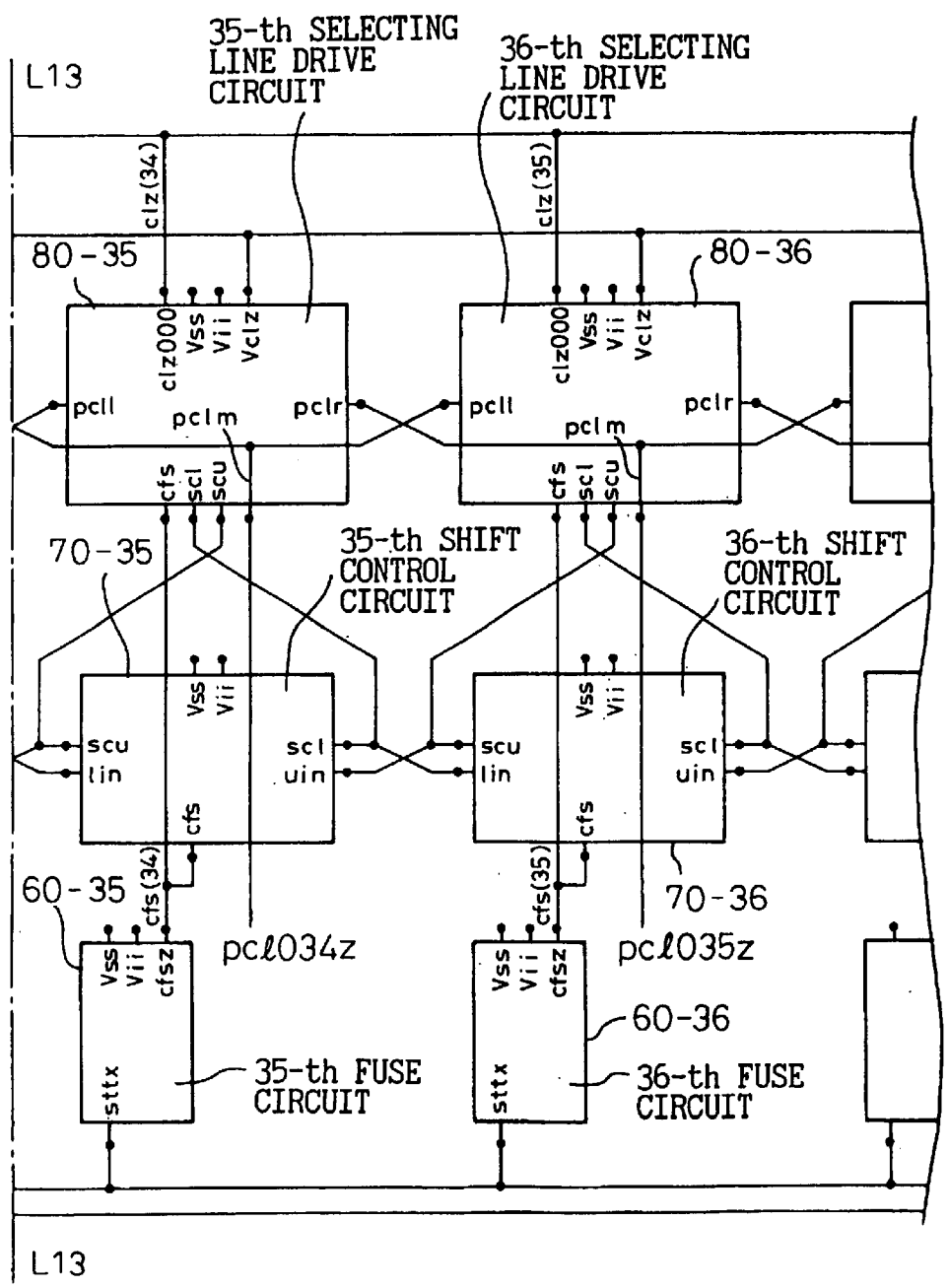
FIG. 15 is a circuit diagram (No. 4) showing the connection of each circuit in the first preferred embodiment of the present invention.
Figure 16:
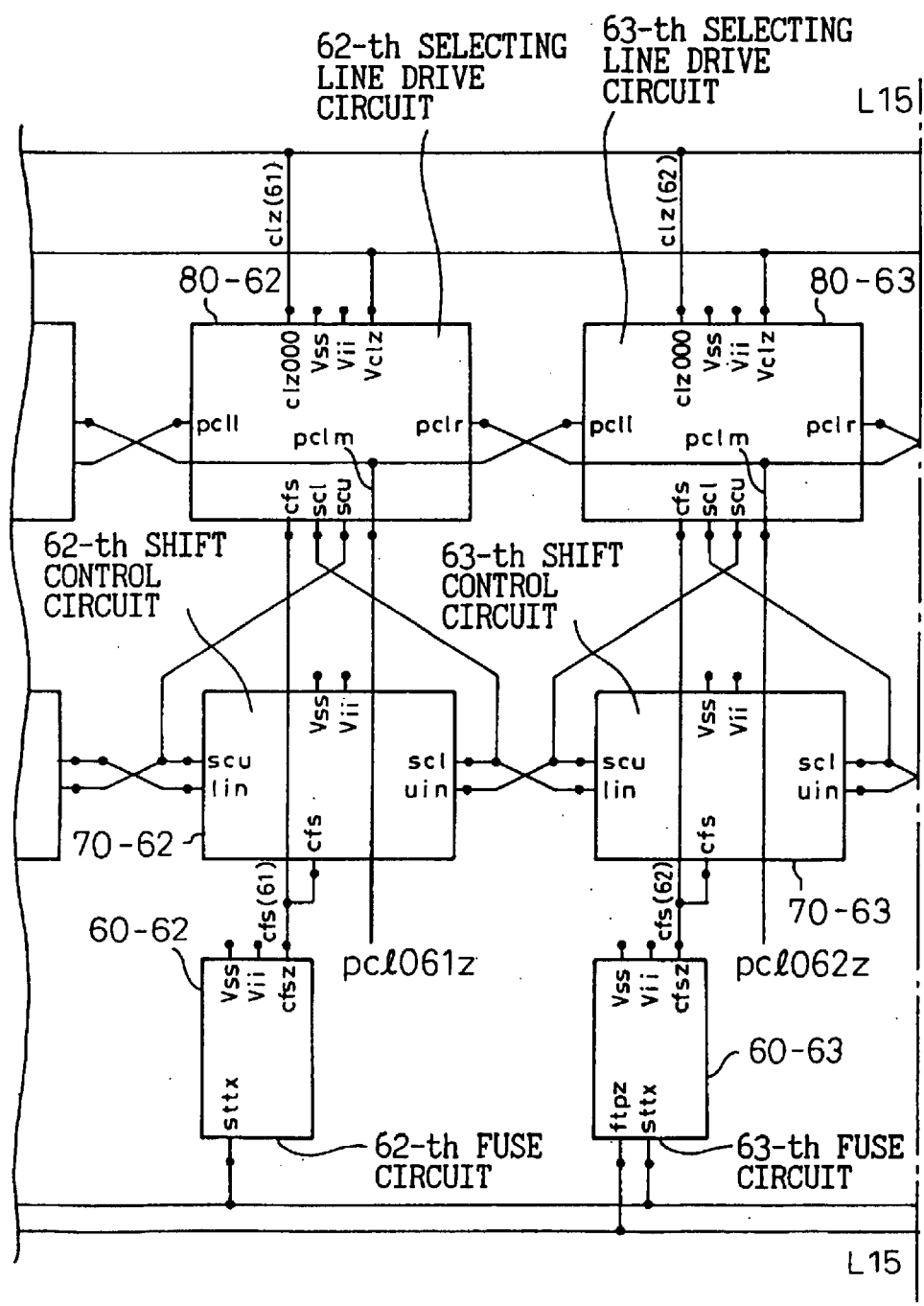
FIG. 16 is a circuit diagram (No. 5) showing the connection of each circuit in the first preferred embodiment of the present invention.
Figure 17:
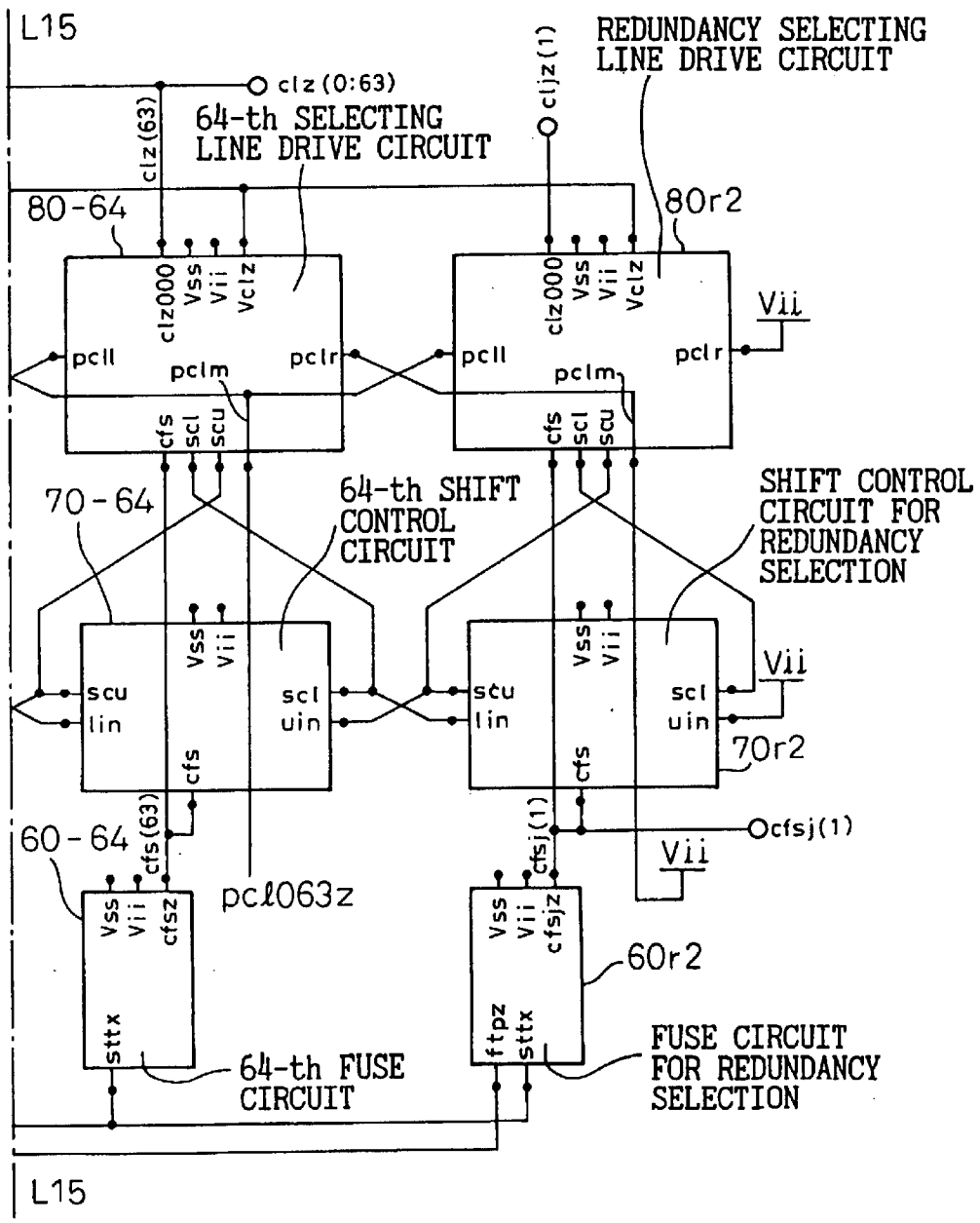
FIG. 17 is a circuit diagram (No. 6) showing the connection of each circuit in the first preferred embodiment of the present invention.

FIGS. 12 and 13 show the left end portion of such a parent circuit, FIGS. 14 and 15 show the center portion of the parent circuit and FIGS. 16 and 17 show the right end portion of the parent circuit. In FIGS. 12 to 17, a plurality of fuse circuits including the fuse circuit for forced redundancy selection (for example, first fuse circuit 60-1 to 64-th fuse circuit 60-64) are connected to a plurality of shift control circuits (for example, first shift control circuit 70-1 to 64-th shift control circuit 70-64), respectively. Further, these shift control circuits are connected to a plurality of selecting line drive circuits (for example, first selecting line drive circuit 80-1 to 64-th selecting line drive circuit 80-64). The decode signal lines of the decoder circuit shown in FIG. 8 are connected to a plurality of selecting line drive circuits, and the decode signals pcl000z to pcl063z outputted from the decoder circuit are inputted to a plurality of selecting circuits (to the decode signal pclm in each selecting line drive circuit), respectively. Incidentally, each of these selecting line drive circuits includes the circuit element corresponding to each switch element in the switch unit 2 (see FIG. 2).

In FIG. 12, further, the fuse circuit 60r1 for redundancy selection positioned at the extreme left is connected to the shift control circuit 70r1 for redundancy selection, and this shift control circuit 70r1 for redundancy selection is connected to the redundancy selecting line drive circuit 80r1. In FIG. 17, on the other hand, the fuse circuit 60r2 for redundancy selection positioned on the extreme right is connected to the shift control circuit 70r2 for redundancy selection, and this shift control circuit 70r2 for redundancy selection is connected to the redundancy selecting line drive circuit 80r2.

It can be seen from FIGS. 12 to 17 that the forced redundancy selecting lines as the object of forced redundancy when the forced redundancy system is executed are clz(1) and clz(62). It is necessary to test whether or not any fault exists in the redundancy selecting lines when the shift redundancy operation is executed. The redundancy selecting lines can be selected electrically without cutting the fuses at this time by executing the forced redundancy system, but there is the case in which a disturb test is carried out for the redundancy selecting lines, that is, the case in which the influences when the adjacent selecting lines are repeatedly selected are tested. In such a case, if the selecting lines adjacent to the redundancy selecting line are selected as the object of forced redundancy, the test cannot be conducted, and other selecting lines must be selected as the object of forced redundancy.

Therefore, the first preferred embodiment of the present invention uses the first adjacent selecting lines clz(1) and clz(62) apart from the redundancy selecting line by one line as the object of the forced redundancy. Quite naturally, other selecting lines clz(2) to clz(61) are also the possible object, but it is advantageous from the circuit layout to dispose the selecting lines at positions close to the redundancy selecting lines having a somewhat different circuit construction of the fuse circuit because the fuse circuit for forced redundancy selection is different from the fuse circuit for normal selection (see FIG. 9).

Preferably, in the first preferred embodiment of the present invention, periodicity of the memory cell blocks selected by one selecting line is brought into conformity with periodicity of the memory cells lest periodicity of the memory cells of the semiconductor chip changes (that is, lest topology of the memory cells changes).

Figure 18:
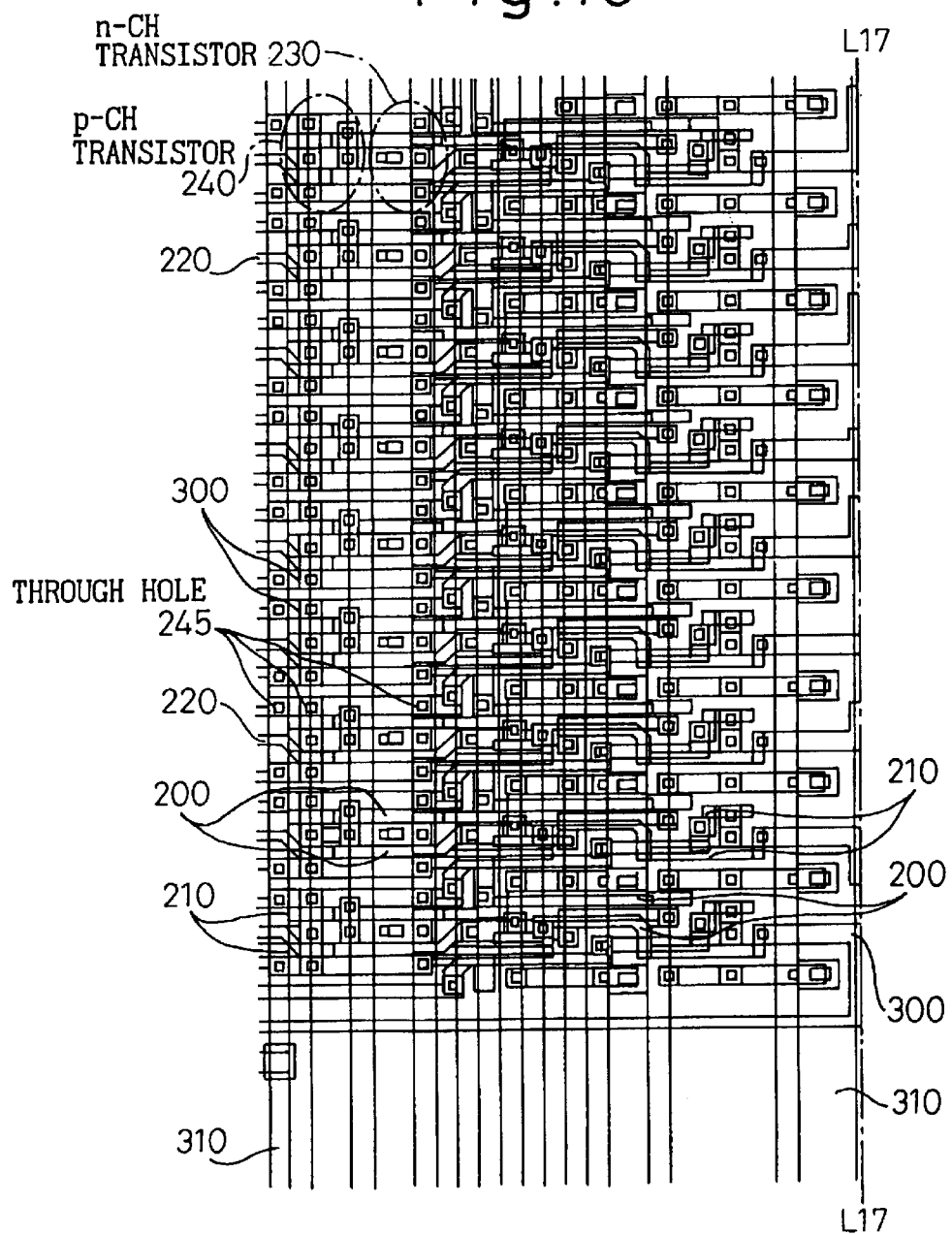
FIG. 18 is a diagram showing a circuit layout of a shift control circuit in the first preferred embodiment of the present invention.
Figure 19:
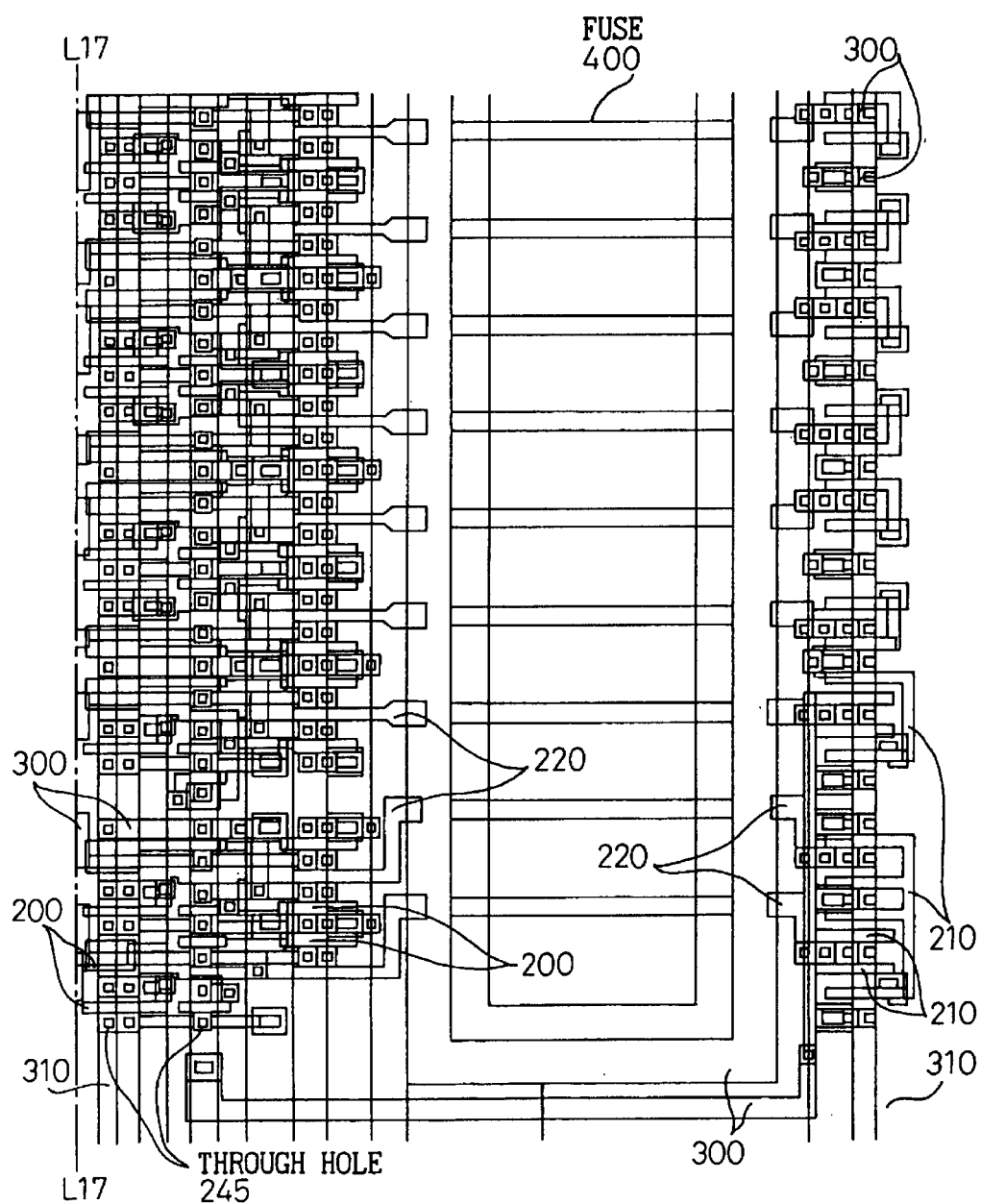
FIG. 19 is a diagram showing a circuit layout of the fuse circuits in the first preferred embodiment of the present invention.

FIG. 18 is a diagram showing the circuit layout of the shift control circuit in the first preferred embodiment of the present invention, and FIG. 19 is a diagram showing the circuit layout of the fuse circuit in the first preferred embodiment. These drawings show in enlargement a part of the schematic circuit pattern when the shift control circuit and the fuse circuit in the first preferred embodiment are formed on the semiconductor chip.

In the circuit patterns shown in FIGS. 18 and 19, a polysilicon pattern for the first layer N channel transistor (hereby abbreviated as the "n-CH polysilicon pattern") 200, a polysilicon pattern for the first layer P channel transistor (hereby abbreviated as the "p-CH polysilicon pattern") 210, a polysilicon pattern 220 of the second layer, a metal wiring pattern 300 of the first layer formed of aluminum (Al), etc., and a metal wiring pattern 310 of the second layer formed likewise of aluminum, etc., are formed. The N channel transistor (n-CH transistor) 230 is formed using the first layer n-CH polysilicon pattern and the P channel transistor (p-CH transistor) 240 is formed using the second layer p-CH polysilicon pattern. On the other hand, connection of the patterns of different layers is done through a large number of through holes 245.

In FIG. 19, a pattern of column selecting lines for constituting a plurality of column selecting lines and a plurality of fuses 400 are depicted with the same pitch, and the fuses and the column selecting line pattern correspond to each other on the 1:1 basis. Therefore, the selecting line subjected to the shift redundancy process can be grasped at sight. On the other hand, once the electrical state is determined by cutting the fuse, the shift control circuit has the function of only keeping this state (DC level), and speed-up of the signal processing is not at all required. In the circuit patterns shown in FIGS. 18 and 19, therefore, the metal wiring having a low resistance such as the second layer metal wiring pattern 310 need not be used for transferring the control signal for the shift redundancy processing. Therefore, other wiring patterns used for the shift redundancy processing can be disposed efficiently in the regions below the second layer metal wiring pattern 310, and the occupying area of the circuits on the semiconductor chip can be reduced.

Figure 20:
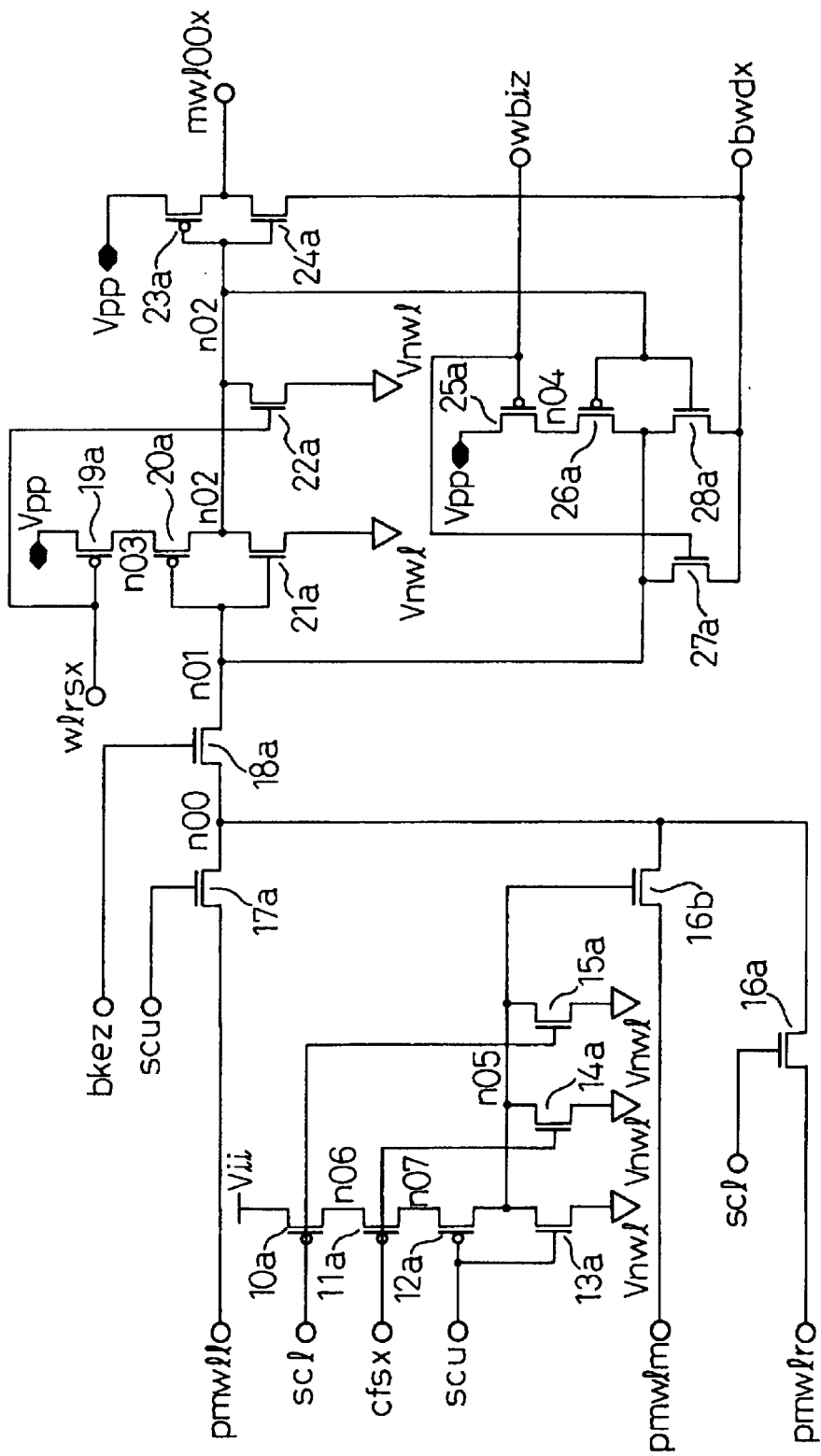
FIG. 20 is a circuit diagram showing the construction of a selecting line drive circuit in a second preferred embodiment of the present invention.

FIG. 20 is a circuit diagram showing the construction of the selecting line drive circuit in the second preferred embodiment of the present invention. This selecting line drive circuit includes the circuit elements corresponding to the switch devices inside the switch unit 2 shown in FIG. 2, and has the function of supplying a predetermined output voltage by driving the selecting line when the load of the selecting line becomes great.

In FIG. 20, the output signals having the levels obtained by inverting the output signals uout and lout in each shift control circuit (which will be described later in FIG. 21) of the shift redundancy control circuit unit are inputted to scu and scl. Symbol cfsx represents the output signal of the fuse circuit, and symbols pmwll, pmwlm and pmwlr correspond to the decode signals from the decode signal lines d(#−1), d# and d(#+1), respectively. Symbol mwl00x represents an arbitrary one of the selecting lines (such as a main word selecting line), and this line enters the selection state at the "L" level, contrary to the case of the first embodiment. Symbol Vpp in FIG. 19 represents one of the power source voltages of the internal power source (that is, the "H" level of the selecting line), and Vnwl represents the power source voltage of the power source for the "L" level of the selecting line. Generally, the power source voltage Vpp has a positive voltage level while the power source voltage Vnwl has a negative voltage level.

In FIG. 20, bwdx is a part of the selecting signal, and the signal pulse of the "L" level is applied during the operation. Symbol bkez, too, is a part of the selecting signal. This signal is used for sampling the decode result of the decode signal as the "H" level signal pulse is applied thereto during the operation. Symbol wbiz represents a control signal for selecting unconditionally all the selecting lines at the time of the test and is normally at the "L" level. Symbol wlrsx represents a reset signal of the selecting lines, which rises to the "H" level when the selected selecting line is brought into the non-selection state.

The selecting line drive circuit shown in FIG. 20 includes three P channel transistors 10a, 12a and 11a and three N channel transistors 13a to 15a to which the output signals scu and scl of the shift control circuit and the output signal cfsx of the fuse circuit are inputted, respectively. These P and N channel transistors 10a, 12a, 11a and 13a to 15a constitute a 3-input NOR gate. Furthermore, the selecting line drive circuit shown in FIG. 20 includes three N channel transistors 17a, 16b and 16a for receiving the three decode signals pmwll, pmwlm and pmwlr at the source (or drain) thereof as the input. The transfer gate constituted by these three N channel transistors 17a, 16b and 16a functions as a three-directional switch device.

In the selecting line drive circuit shown in FIG. 20, the select signal bkez is supplied to the gate of the N channel transistor 18a, and the reset signal wlrsx of the selecting line is supplied to the gate of each of the P and N channel transistors 19a and 22a. The output signal from the NOR gate is inputted to the gate of the N channel transistor 16b. The drain of the N channel transistor 16b is connected to the source of the N channel transistor 18a. The drain of the N channel transistor 18a is connected to the gate of each of the P and N channel transistors 20a and 21a. The P channel transistor 19a and the P channel transistor 20a, and the N channel transistor 21a and the N channel transistor 22a together constitute two-input NOR gates receiving the select signal bkez and the reset signal wlrsx as the input signals thereof.

In the selecting line drive circuit shown in FIG. 20, the drain (node n02) of each of the P and N channel transistors 20a and 21a is connected to the gate of each of the P and N channel transistors 23a and 24a. These P and N channel transistors 23a and 24a together constitute one inverter, and the signal of the "L" level or the "H" level is supplied to an arbitrary one of the selecting lines mwl00x from this inverter.

In the selecting line drive circuit shown in FIG. 20, further, the control signal wbiz is inputted to the gate of each of the P and N channel transistors 25a and 27a. The drain (node n02) of each of the P and N channel transistors 20a and 21a is connected to the gate of each of the P and N channel transistors 26a and 28a. On the other hand, the control signal bwdx is inputted to the source of each of the N channel transistors 27a and 28a. The P channel transistor 25a and the P channel transistor 26a, and the N channel transistor 28a and the N channel transistor 27a constitute a 2-input NOR gate receiving the control signals wbiz and bwdx as the input.

In the selecting line drive circuit shown in FIG. 20, too, when the output signals scu and scl are at the "H" level and the "L" level, respectively, with the output signal cfsx being at the "L" level, the mode for executing the shift redundancy operation in one direction is selected in the same way as in the selecting line drive circuit of the first embodiment (FIG. 6). In contrast, when the output signals scu and scl of the shift control circuit are at the "L" and "H" levels, respectively, with the output signal cfsx of the fuse circuit being at the "L" level, the mode for executing the shift redundancy operation in the other direction is selected.

Figure 21:
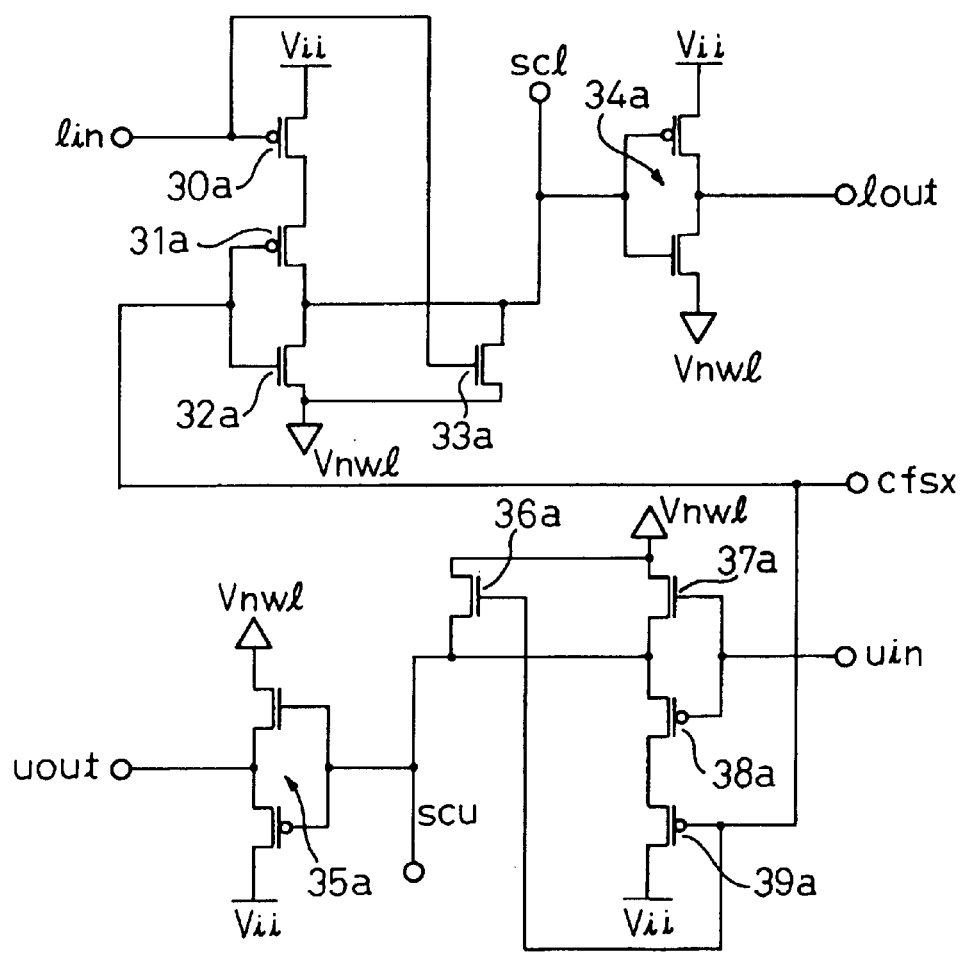
FIG. 21 is a circuit diagram showing the construction of a shift control circuit for normal selection in the second preferred embodiment of the present invention.
Figure 22:
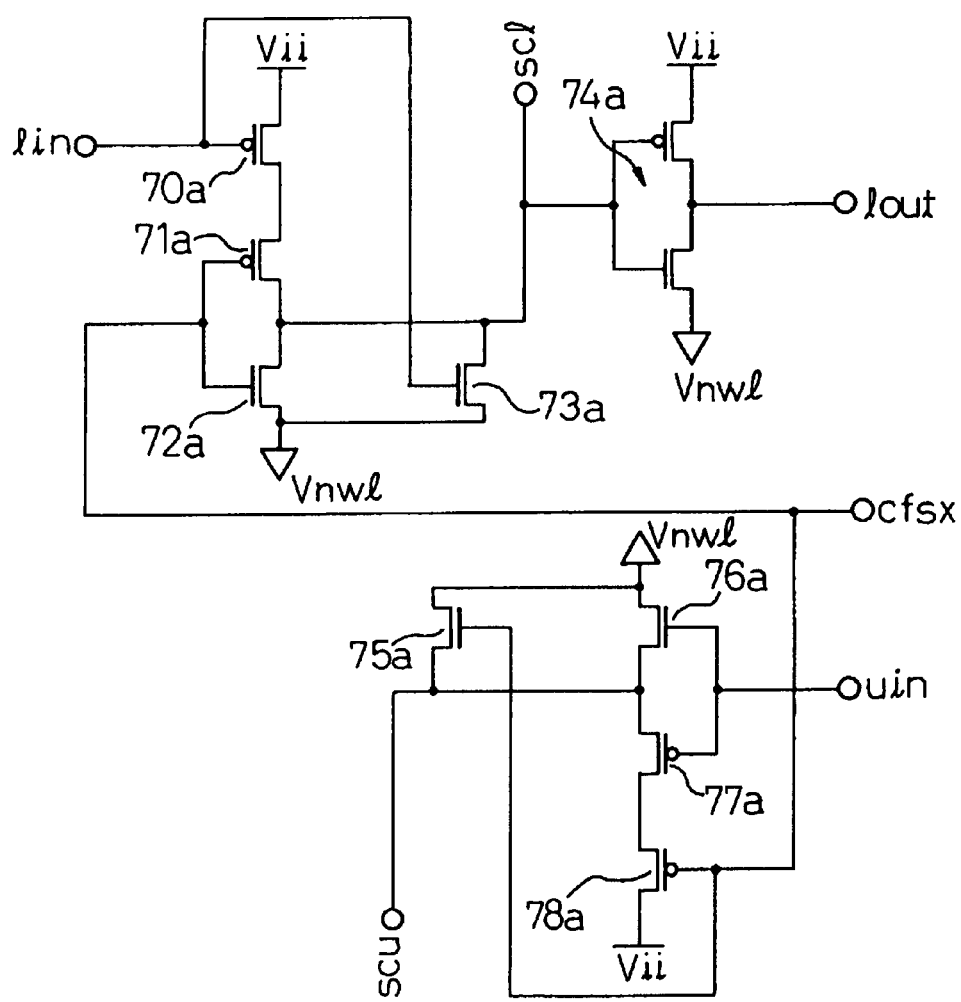
FIG. 22 is a circuit diagram showing the construction of a redundancy shift control circuit for the left end in the second preferred embodiment of the present invention.
Figure 23:
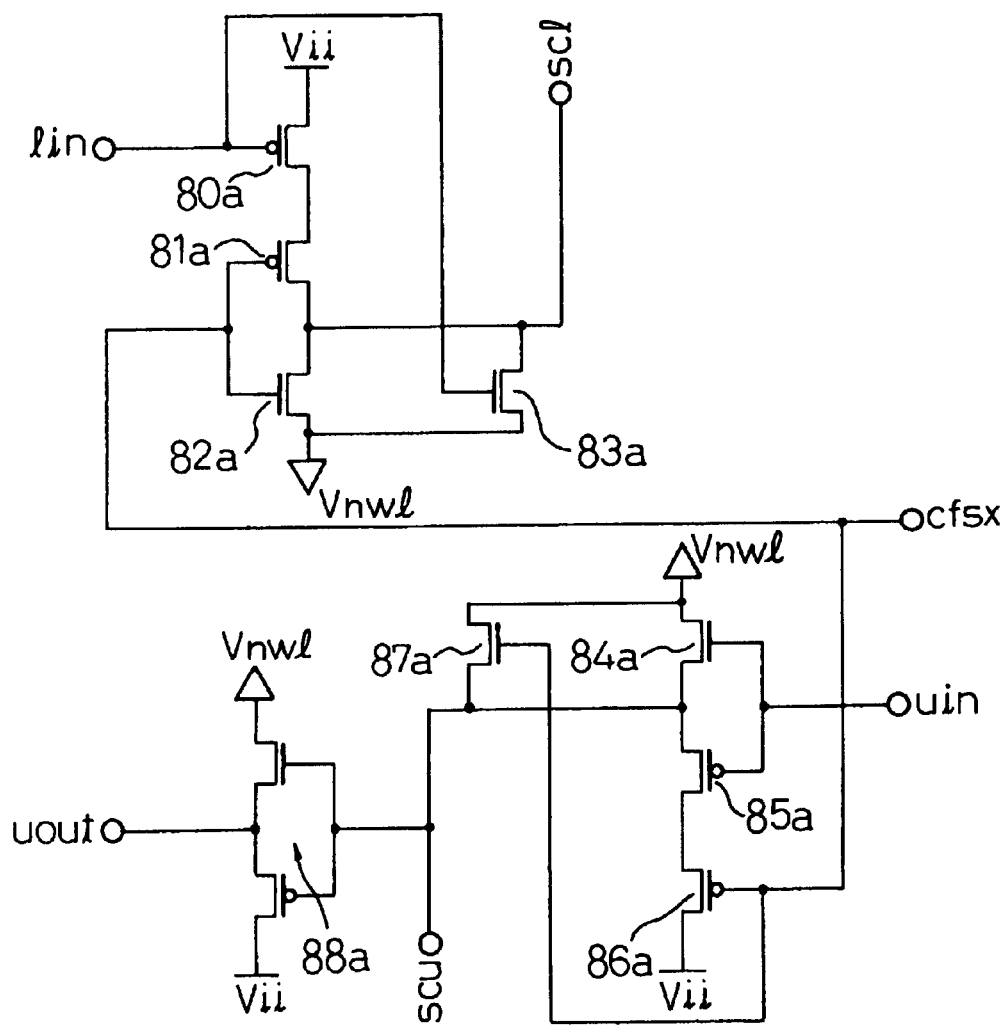
FIG. 23 is a circuit diagram showing the construction of a redundancy shift control circuit for the right end in the second preferred embodiment in the present invention.

FIG. 21 is a circuit diagram showing the construction of the shift control circuit for normal selection in the second preferred embodiment of the present invention; FIG. 22 is a circuit diagram showing the construction of the redundancy shift control circuit for the left end in the second preferred embodiment; and FIG. 23 is a circuit diagram showing the construction of the redundancy shift control circuit for the right end in the second preferred embodiment. In other words, FIG. 21 shows the shift control circuit for normal selection; FIG. 22 shows the shift control circuit for redundancy selection positioned at the left end; and FIG. 23 shows the shift control circuit for redundancy selection positioned at the right end.

In FIGS. 21 to 23, symbol cfsx represents the output signal of the fuse circuit. The shift control circuits described above have substantially the same function as those of the first preferred embodiment (FIG. 7). The input signal lin of the shift control circuit is connected to the adjacent output signal lout on the left side, the other input signal uin of the shift control circuit is connected to the adjacent output signal uout on the right side, and the "L" (voltage Vnwl) level is inputted to the input signal lin of the left end and the input signal uin of the right end. Unlike the first preferred embodiment (FIG. 7), each of the shift control circuits in this embodiment comprises the NOR gate and the inverter.

More particularly, the NOR gate disposed on the side of the input signal lin of the shift control circuit for normal selection in FIG. 21 comprises two P channel transistors 30a and 31a and two N channel transistors 32a and 33a. Further, the inverter 34a disposed on the side of the output signal lout comprises a P channel transistor and an N channel transistor. On the other hand, the NOR gate disposed on the side of the input signal uin of the shift control circuit in FIG. 21 comprises two P channel transistor 38a and 39a and two N channel transistors 36a and 37a. The inverter 35a disposed on the side of the output signal uout comprises a P channel transistor and an N channel transistor.

The output signal scu outputted from the drain of the N channel transistor 36a in the NOR gate disposed on the side of the input signal uin is used as the other input signal of the selecting line drive circuit shown in FIG. 20. On the other hand, the output signal scl outputted from the drain of the N channel transistor 33a in the NOR gate disclosed on the side of the input signal uin is used as one of the input signals of the selecting line drive circuit in FIG. 20. Unlike the first embodiment (in which the output signals uout and lout control the operation of the switch devices), these output signals scu and scl are used for controlling the operation of a three-directional switch device comprising the N channel transistors 17a, 16b and 16a shown in FIG. 20.

The construction of the shift control circuit for redundancy selection at the left end in FIG. 22 is substantially the same as the construction of the shift control circuit for normal selection in FIG. 21, but is different in that the inverter for transferring the output signal uout is not disposed.

More particularly, the NOR gate disposed on the side of the input signal lin of the shift control circuit for redundancy selection at the left end in FIG. 22 comprises two P channel transistors 70a and 71a and two N channel transistors 72a and 73a. The inverter 74a disposed on the side of the output signal lout comprises a P channel transistor and an N channel transistor. On the other hand, the NOR gate disposed on the side of the input signal uin of the shift control circuit for redundancy selection in FIG. 21 comprises two P channel transistors 77a and 78a and two N channel transistors 75a and 76a.

The construction of the shift control circuit for redundancy selection at the right end in FIG. 23 is substantially the same as the construction of the shift control circuit for normal selection in FIG. 21, but is different in that the inverter for transferring the output signal lout is not disposed.

More particularly, the NOR gate disposed on the side of the input signal lin of the shift control circuit for redundancy selection at the left end of FIG. 23 comprises two P channel transistors 80a and 81a and two N channel transistors 82a and 83a. On the other hand, the NOR gate disposed on the side of the input signal uin of the shift control circuit for redundancy selection in FIG. 23 comprises two P channel transistors 85a and 86a and two N channel transistors 84a and 87a. Further, the inverter 88a disposed on the side of the output signal uout comprises the P channel transistor and the N channel transistor.

Figure 24:
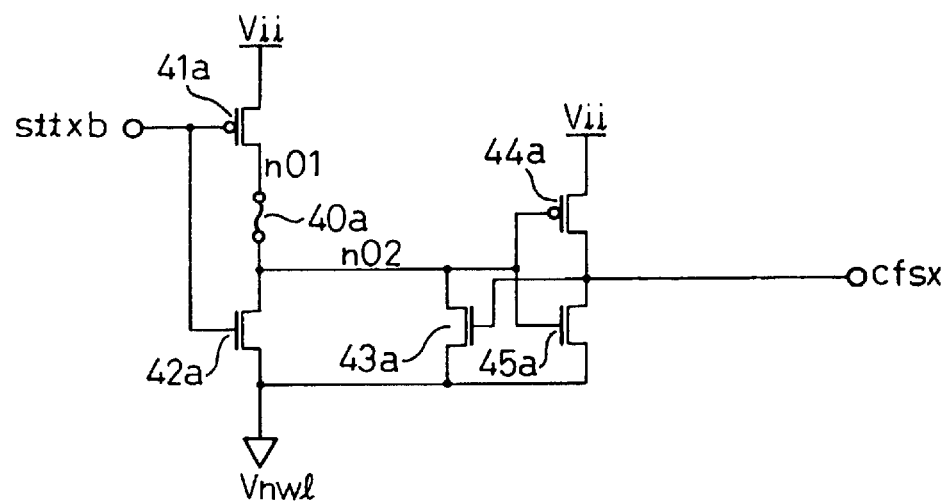
FIG. 24 is a circuit diagram showing the construction of a fuse circuit for normal selection in the second preferred embodiment of the present invention.
Figure 25:
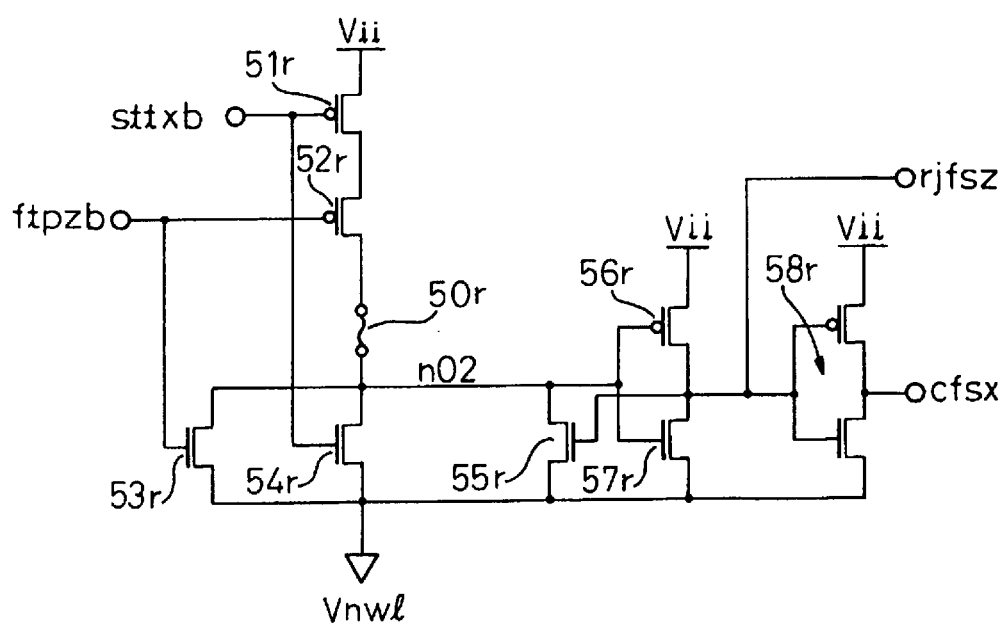
FIG. 25 is a circuit diagram showing the construction of a fuse circuit for redundancy selection in the second preferred embodiment of the present invention.

FIG. 24 is a circuit diagram showing the construction of a fuse circuit for normal selection in the second preferred embodiment of the present invention; FIG. 25 is a circuit diagram showing the construction of a fuse circuit for redundancy selection in the second preferred embodiment; and FIG. 26 is a circuit diagram showing the construction of a fuse circuit for forced redundancy in the second preferred embodiment.

In FIG. 24, the output signal cfsx of the fuse circuit is inputted to the NOR gate of the shift control circuit. Therefore, when the fuse is not cut, the fuse circuit for normal selection outputs the "L" level signal unlike the first embodiment (FIG. 9). When the fuse is cut, on the other hand, it outputs the "H" level signal.

In FIG. 25, when the fuse is not cut and forced redundancy is not executed, the fuse circuit for redundancy selection outputs the "H" level signal. When the fuse is cut, it outputs the "L" level signal. When forced redundancy is executed, on the other hand, the fuse for redundancy selection is apparently cut and the "L" level signal is outputted.

Figure 26:
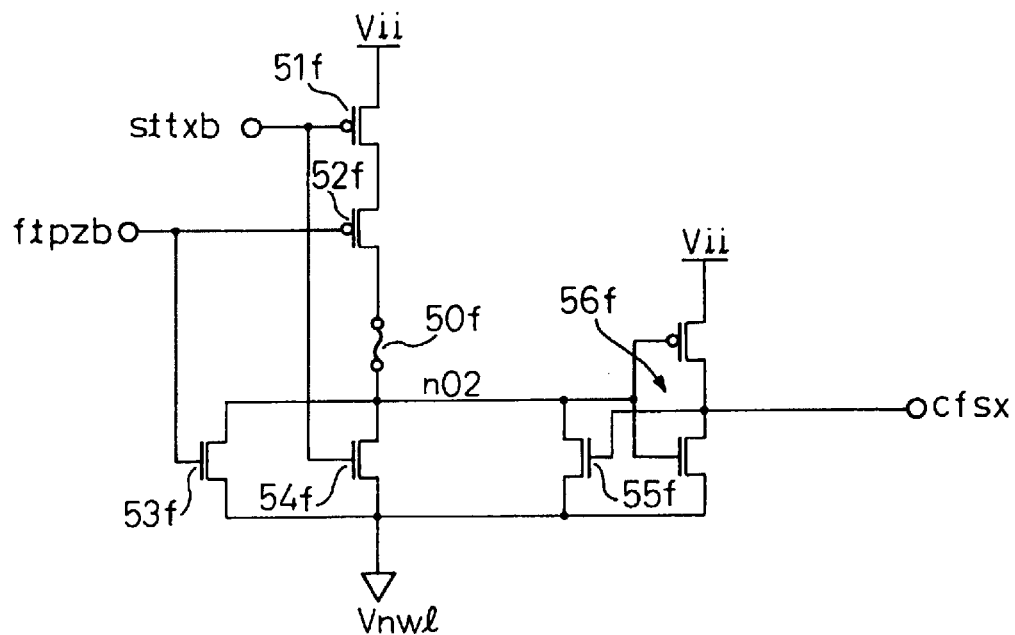
FIG. 26 is a circuit diagram showing the construction of a fuse circuit for forced redundancy in the second preferred embodiment of the present invention.

In FIG. 26, when the fuse is not cut and forced redundancy is not executed, the fuse circuit for forced redundancy outputs the "L" level signal. When forced redundancy is executed, the fuse for forced redundancy is apparently cut, and the "H" level signal is outputted. On the other hand, when the fuse for forced redundancy is cut actually, the "H" level signal is outputted.

In FIGS. 24 to 26, sttxb and ftpzb have substantially the same function as sttx and ftpz in the first preferred embodiment (FIG. 9) except that the voltage level is different.

More particularly, the fuse circuit for normal selection shown in FIG. 24 includes a P channel transistor 41a and an N channel transistor 42a for receiving the control signal sttxb at the gates thereof as the input, two N channel transistors 43a and 45a and a P channel transistor 44a. When the fuse 40a is not cut, the output signal cfsx of the fuse circuit attains the "L" level after the power becomes operative. When the fuse 40 is cut, the output signal cfsx of the fuse circuit changes to the "H" level.

The fuse circuit for redundancy selection shown in FIG. 25 includes a P channel transistor 51r and an N channel transistor 54r the gates of which the control signal ftpzb is inputted to, a P channel transistor 52r and a P channel transistor 53r the gates of which the control signal ftpzb is inputted to, two N channel transistors 55r and 57r, a P channel transistor 56r and an inverter 58r. When forced redundancy is not executed, the N channel transistor 55r is turned ON and the output signal cfsx of the fuse circuit attains the "H" level. When the fuse 40r is cut, the N channel transistor 55r is turned OFF and the output signal cfsx of the fuse circuit changes to the "L" level. When forced redundancy is executed, on the other hand, that is, when the control signal ftpzb is at the "H" level, the N channel transistor 53r is turned ON and the output signal cfsx of the fuse circuit changes to the "L" level.

The fuse circuit for forced redundancy shown in FIG. 26 includes a P channel transistor 51f and an N channel transistor 54f the gates of which the control signal sttxb is inputted to, a P channel transistor 52f and an N channel transistor 53 the gates of which the control signal ftpzb is inputted to, an N channel transistor 55f, and an inverter 56f. When the fuse 50f is not cut and forced redundancy is not executed, the P channel transistor 52f is turned ON while the N channel transistor 55f is turned OFF, so that the output signal cfsx of the fuse circuit changes to the "L" level. Further, when forced redundancy is executed, that is, when the control signal ftpzb remains at the "H" level, the N channel transistor 53f is turned ON and the output signal cfsx of the fuse circuit changes to the "H" level.

It is possible under this state to check whether or not any fault exists in the redundancy selecting lines before the fuse corresponding to the selecting line as the object of shift redundancy is cut. When the fuse 50f is actually cut, on the other hand, the N channel transistor 55f is turned ON and the output signal cfsx of the fuse circuit changes to the "H" level.

Figure 27:
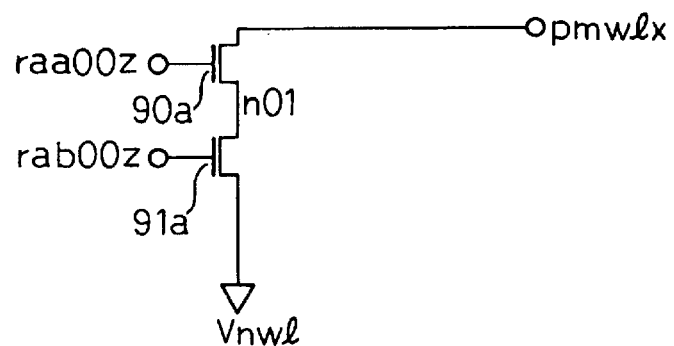
FIG. 27 is a circuit diagram showing the construction of a decoder circuit in the second preferred embodiment of the present invention.

FIG. 27 is a circuit diagram showing the construction of the decoder circuit in the second preferred embodiment of the present invention. This decoder circuit is the one that outputs the decode signal d# (that is, the decode signal pmwlx).

In the drawing, symbols raa00z and rab00z represent pre-decode signals that represent the address. The first pre-decode signal raa00z is supplied to the gate of the N channel transistor 90a. The second pre-decode signal rab00z is supplied to the gate of the N channel transistor 91a.

Figure 28:
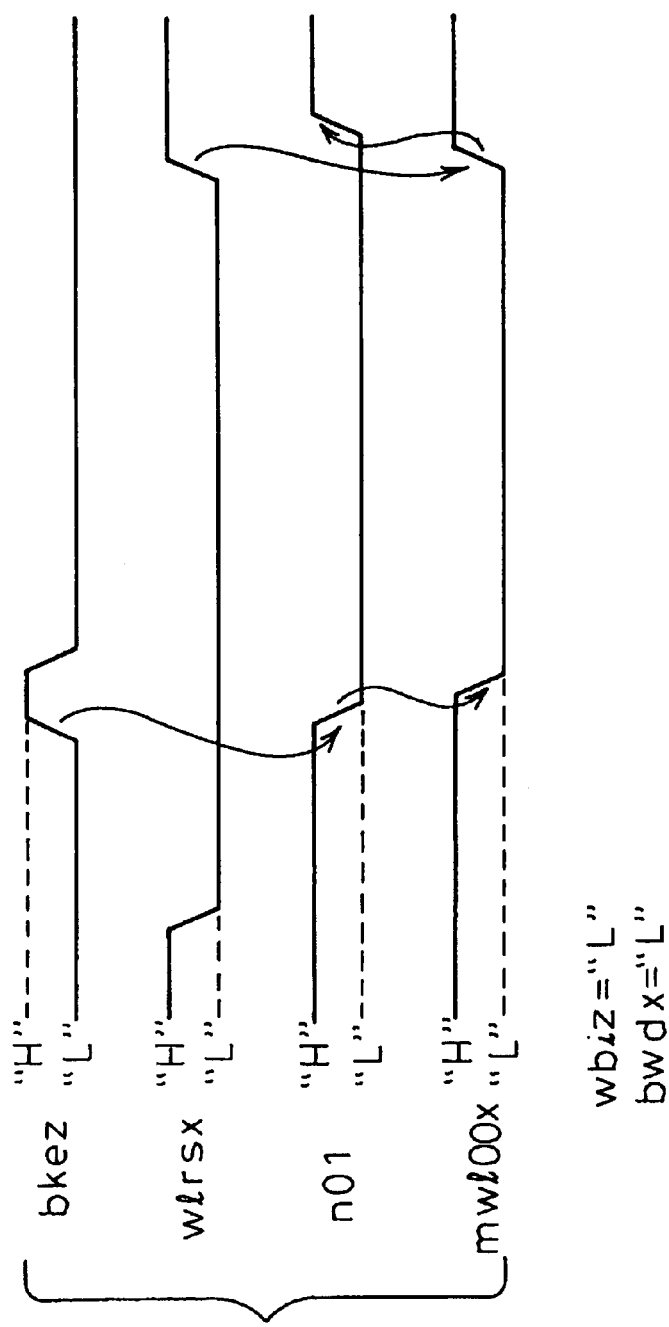
FIG. 28 is a timing chart useful for explaining the operation of the selecting line drive circuit shown in FIG. 20.

FIG. 28 is a timing chart for explaining the operation of the selecting line drive circuit shown in FIG. 20.

It will be assumed hereby that the first and second pre-decode signals raa00z and rab00z are at the "H" level, that is, only the decode signal pmwlx selected by the address is at the "L" level, and the reset signal wlrsx of the selecting line is at the "L" level and the selecting signal bkez is at the "H" level, as shown in FIG. 28. Here, when both of the first and second pre-decode signals raa00z and rab00z are at the "H" level, that is, when only the decode signal pmwlx selected by the address is at the "L" level, the voltage level of only the node n01 of the selecting line driving circuit (see FIG. 19) connected to the signal line of the decode signal pmwlx falls to the "L" level. Under this state, the selecting line mwl00x is selected and the "L" level signal is outputted.

When the reset signal wlrsx of the selecting line rises to the "H" level, on the other hand, the selecting line mwl100x enters the non-selection state and the "H" level signal is outputted. Incidentally, both of the control signal wbiz and selecting signal bwdx are at the "L" level in this case.

FIGS. 29 to 34 are circuit diagrams Nos. 1 to 6 each showing the connection among the circuits in the second preferred embodiment of the present invention. These drawings typically show the case in which the semiconductor memory device (parent circuit) having sixty-four main selecting lines mwl(0) to mwl(63) (for example, main word selecting lines) and two redundancy selecting lines mwljz(0) and mwljz(1) is formed by connecting one another a plurality of children circuits each comprising the selecting line drive circuit shown in FIG. 20, the shift control circuit shown in FIGS. 21 to 23, the fuse circuit shown in FIGS. 24 to 26 and the decoder circuit shown in FIG. 27.

Figure 29:
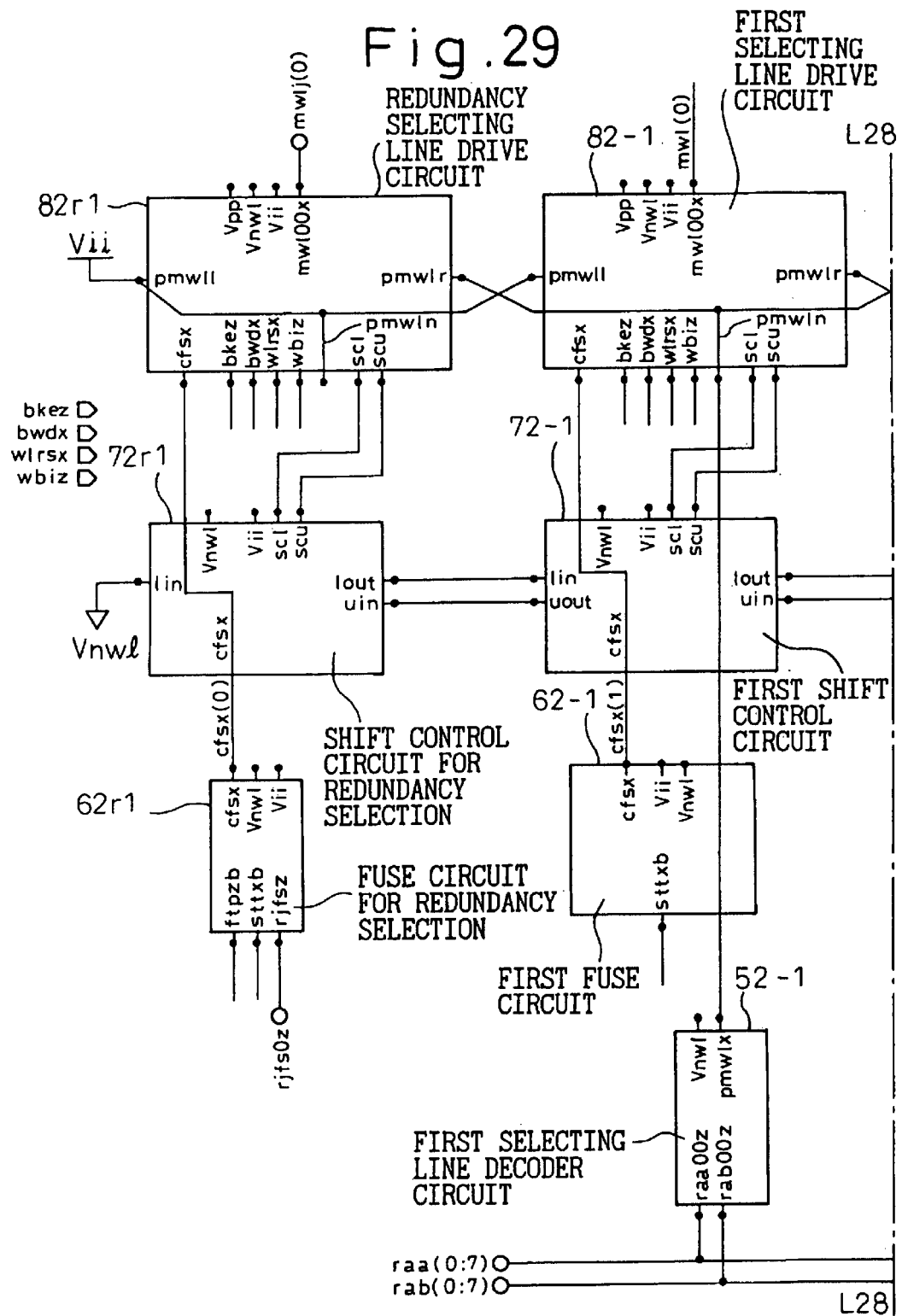
FIG. 29 is a circuit diagram (No. 1) showing the connection of each circuit in the second preferred embodiment of the present invention.
Figure 30:
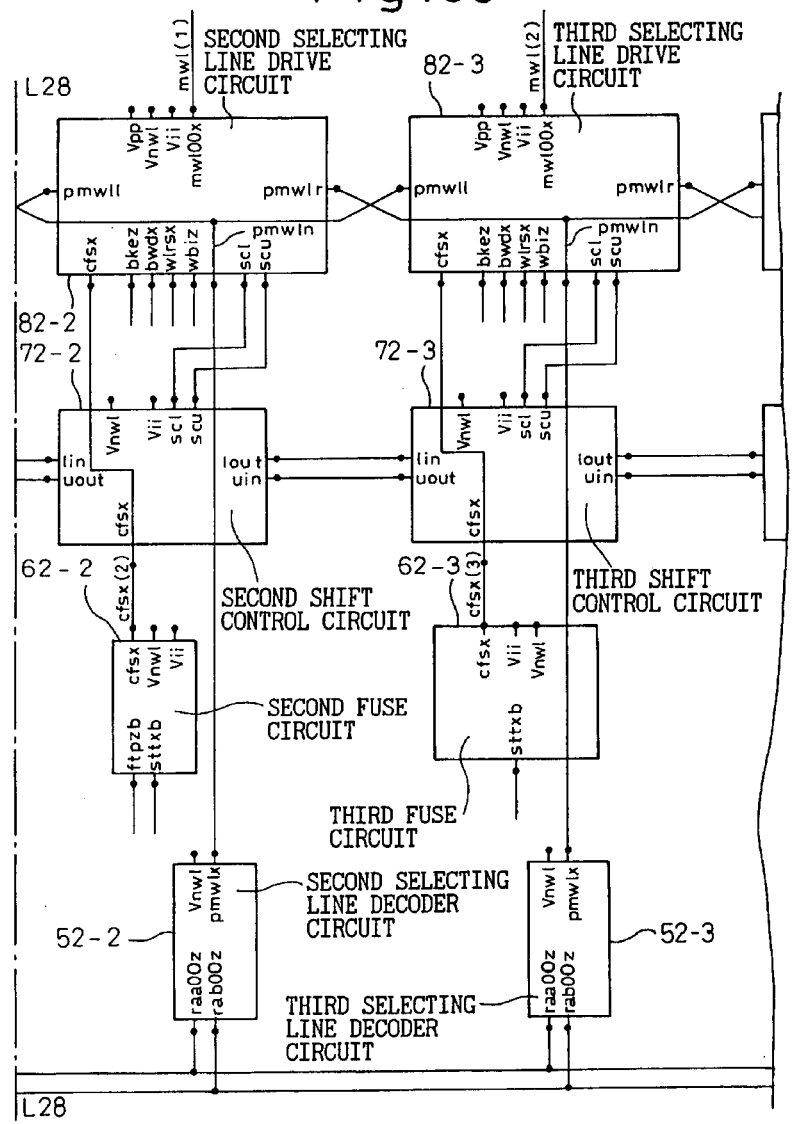
FIG. 30 is a circuit diagram (No. 2) showing the connection of each circuit in the second preferred embodiment of the present invention.
Figure 31:
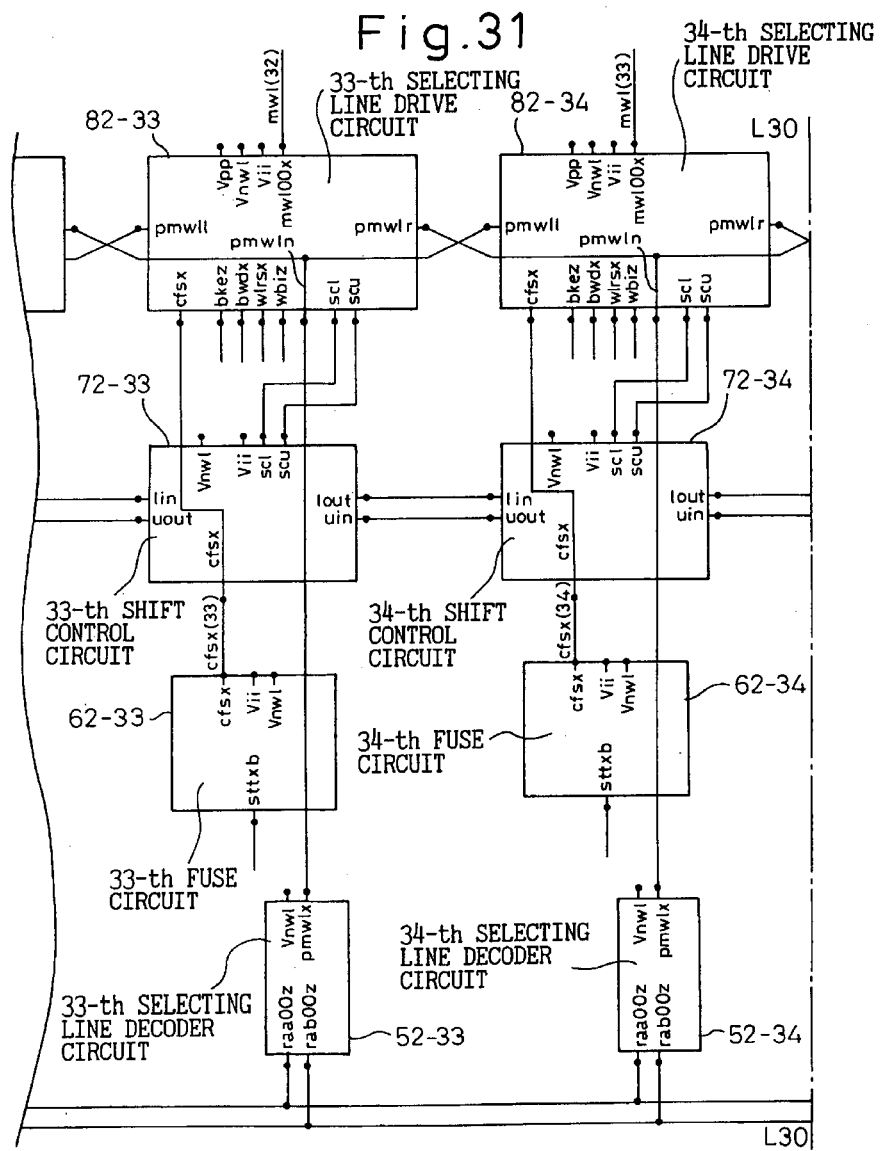
FIG. 31 is a circuit diagram (No. 3) showing the connection of each circuit in the second preferred embodiment of the present invention.
Figure 32:
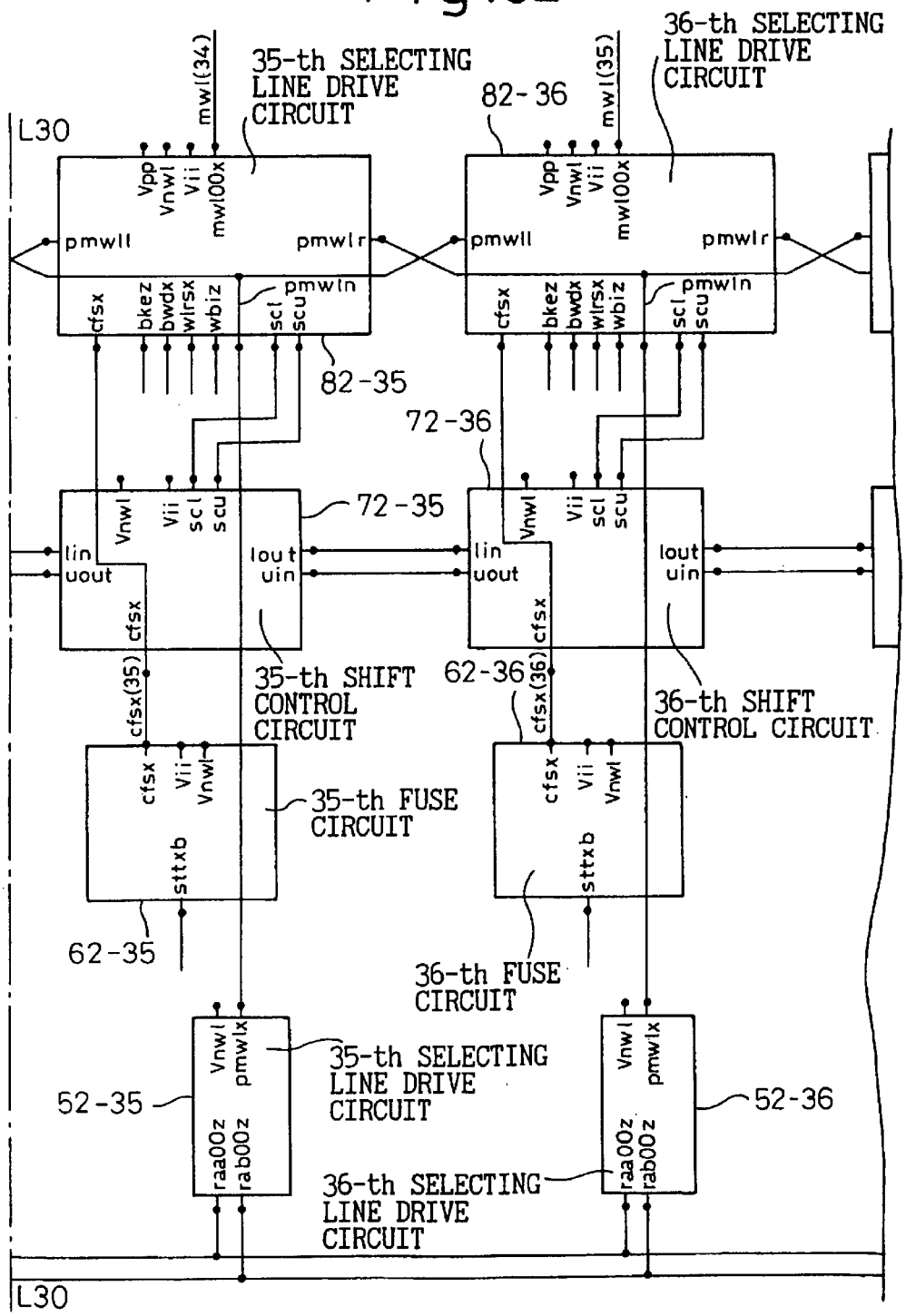
FIG. 32 is a circuit diagram (No. 4) showing the connection of each circuit in the second referred embodiment of the present invention.
Figure 33:
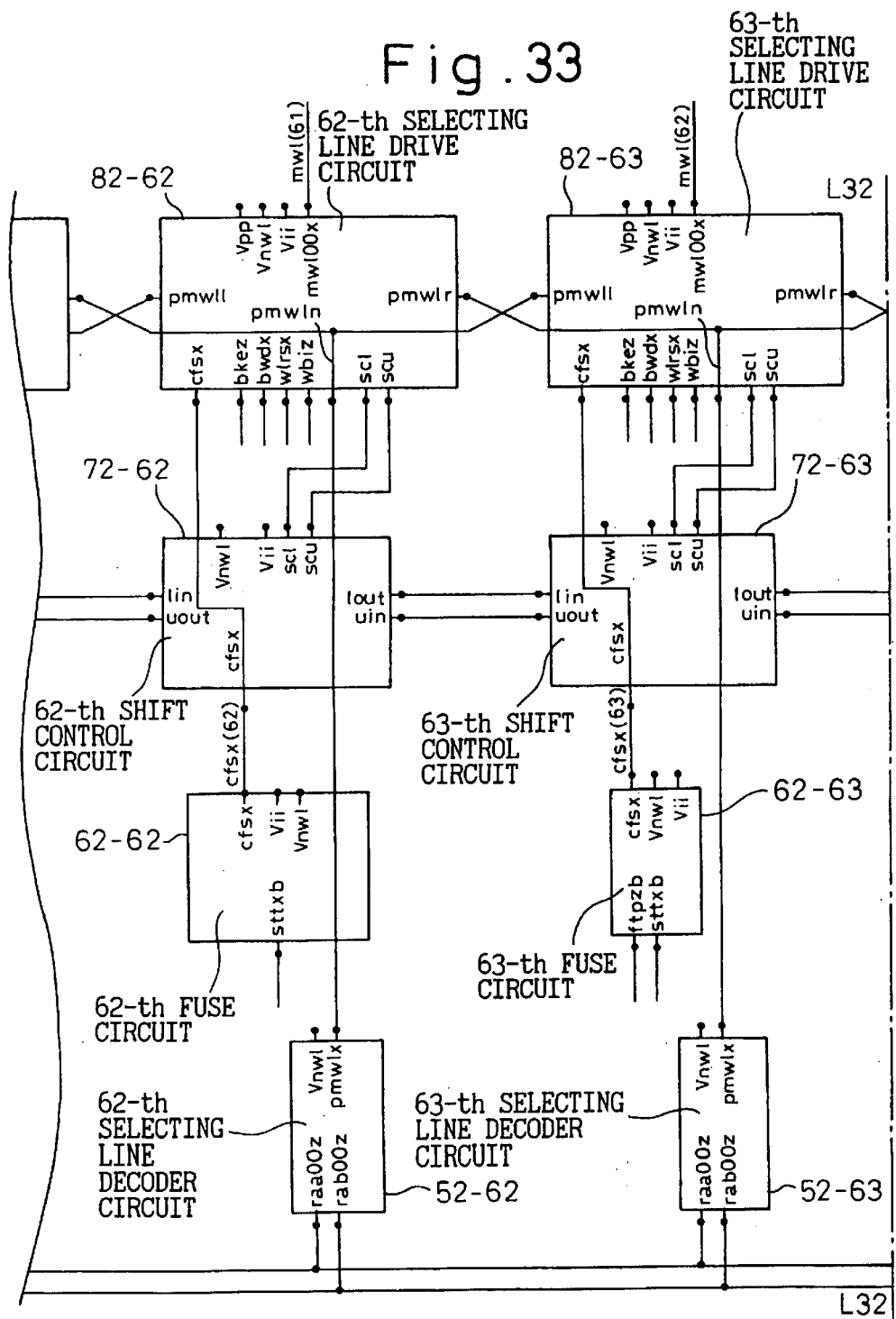
FIG. 33 is a circuit diagram (No. 5) showing the connection of each circuit in the second preferred embodiment of the present invention.
Figure 34:
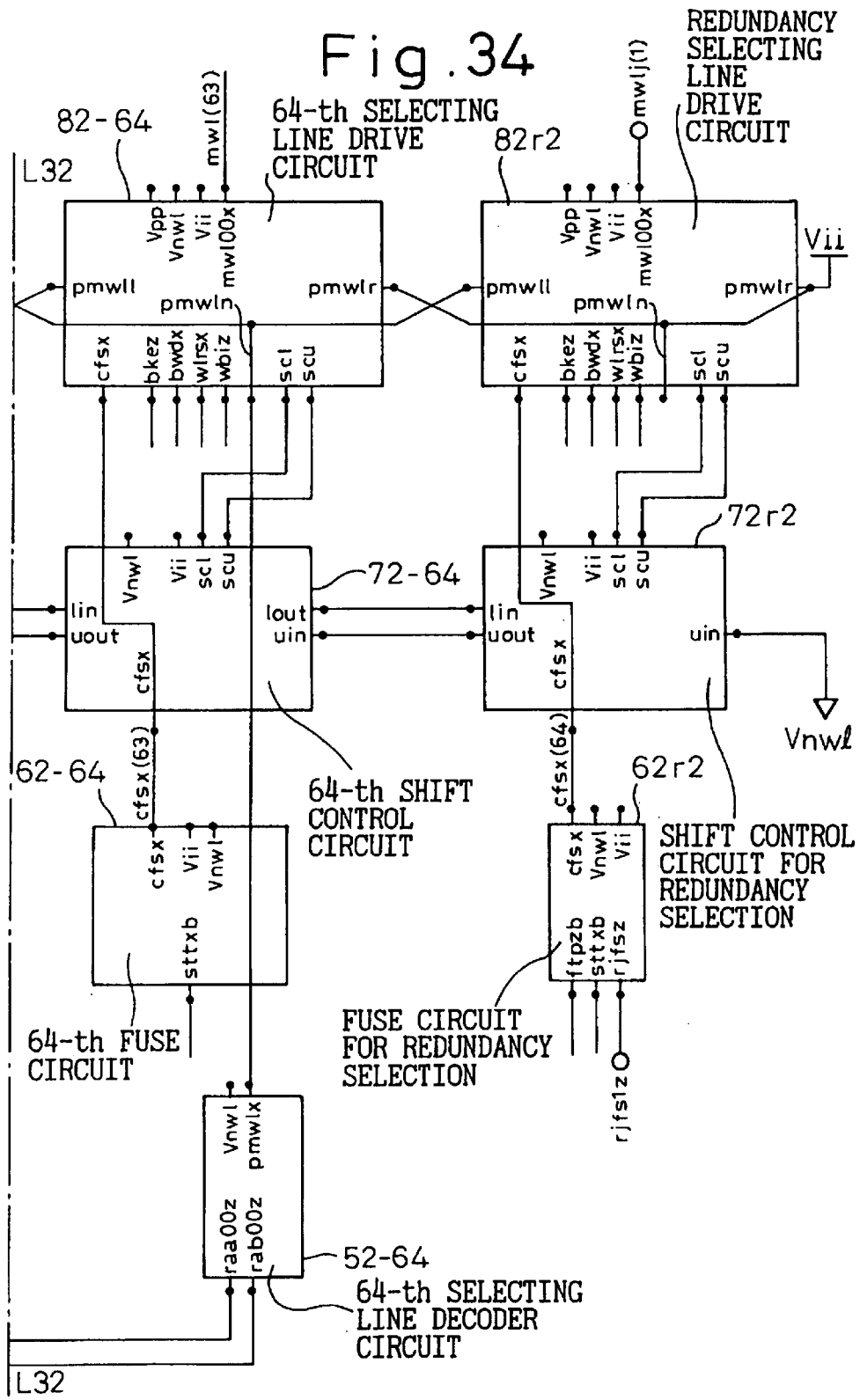
FIG. 34 is a circuit diagram (No. 6) showing the connection of each circuit in the second preferred embodiment of the present invention.

FIGS. 29 and 30 show the left end portion of such a parent circuit, FIGS. 31 and 32 show the center portion of the parent circuit and FIGS. 33 and 34 show the right end portion of the parent circuit. In FIGS. 29 to 34, a plurality of decoder circuits (for example, first to 64-th decoder circuits 52-1 to 52-64) are connected to a plurality of selecting line drive circuits (for example, first to 64-th selecting line drive circuits 82-1 to 82-64), respectively, and the decode signals pmwlx outputted from these decoder circuits are applied to the selecting line drive circuits, respectively.

Further, a plurality of fuse circuits (for example, first to 64-th fuse circuits 62-1 to 62-64) are connected to a plurality of shift control circuits (for example, first to 64-th shift control circuits 72-1 to 72-64), respectively. These shift control circuits are further connected to a plurality of selecting line drive circuits, respectively.

In FIG. 29, the fuse circuit 62r1 for redundancy selection positioned at the left end is connected to the shift control circuit 72r1 for redundancy selection, and this shift control circuit 72r1 for redundancy selection is connected to the redundancy selecting line drive circuit 82r1. In FIG. 34, on the other hand, the redundancy selecting fuse circuit 62r2 positioned at the right end is connected to the shift control circuit 72r2 for redundancy selection, and this shift control circuit 72r2 for redundancy selection is connected to the redundancy selecting line drive circuit 82r2.

It can be appreciated from FIGS. 29 to 34 that the forced redundancy selecting lines that become the object of forced redundancy when the forced redundancy operation is executed are mwl(1) and mwl(62). When shift redundancy is executed, it is necessary to first test whether or not any fault exists in the redundancy selecting lines. At this time, the redundancy selecting lines can be selected electrically by executing the forced redundancy operation without cutting the fuse, and such a forced redundancy system includes the case in which the disturb test is conducted for the redundancy selecting lines, that is, the case in which the influences are tested when the adjacent, selecting lines are repeatedly selected. If the selecting lines adjacent to the redundancy selecting line are selected as the object of forced redundancy in such a case, the test described above cannot be conducted. Therefore, other selecting lines must be selected as the object of forced redundancy.

Accordingly, in the second preferred embodiment of the present invention, too, the selecting lines mwlz(1) and mwl(62), that are spaced apart by one selecting line from the redundancy selecting line, are selected as the object of forced redundancy in the same way as in the first preferred embodiment.

Figure 35:
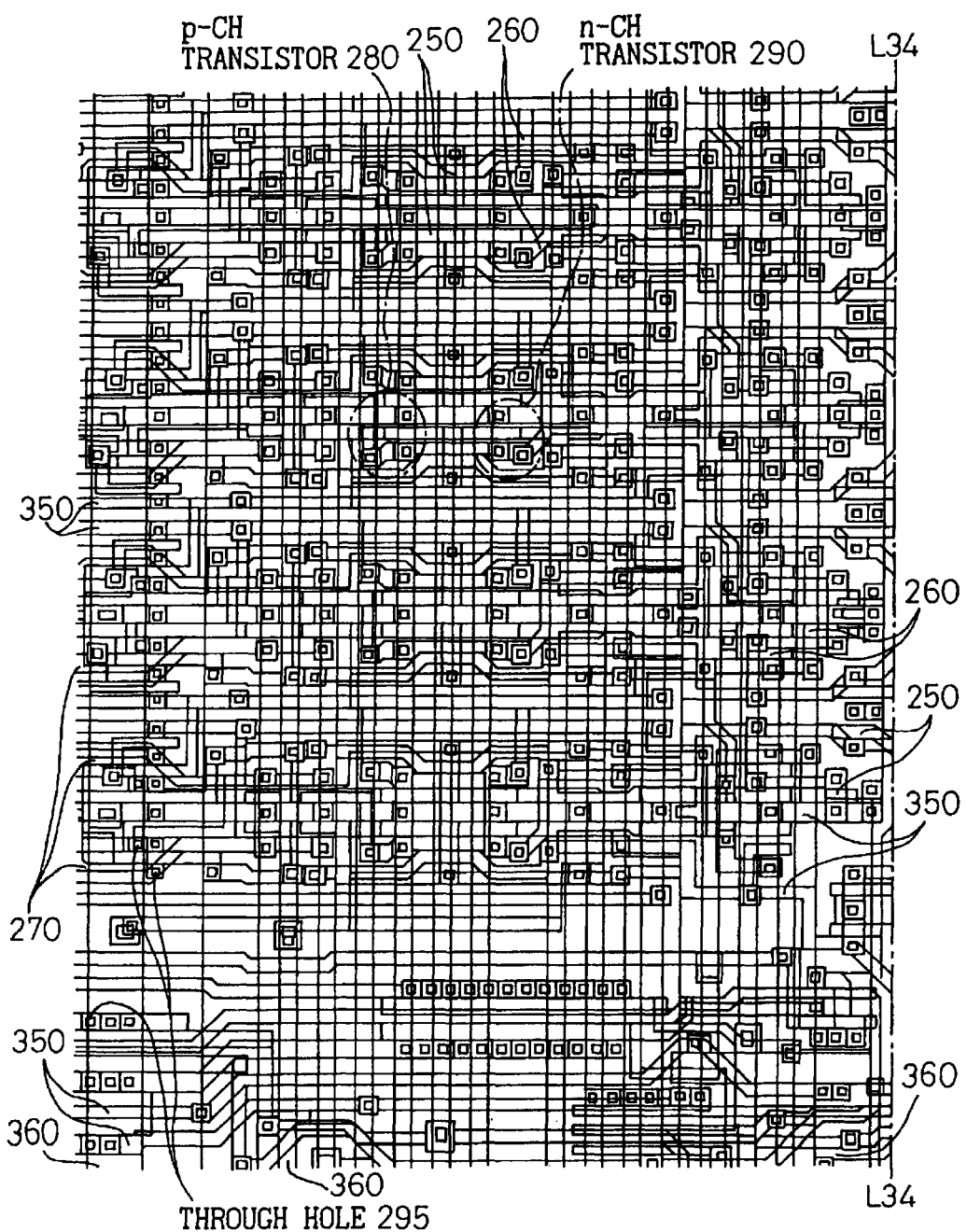
FIG. 35 is a diagram showing a circuit layout of a shift control circuit in the second preferred embodiment of the present invention.
Figure 36:
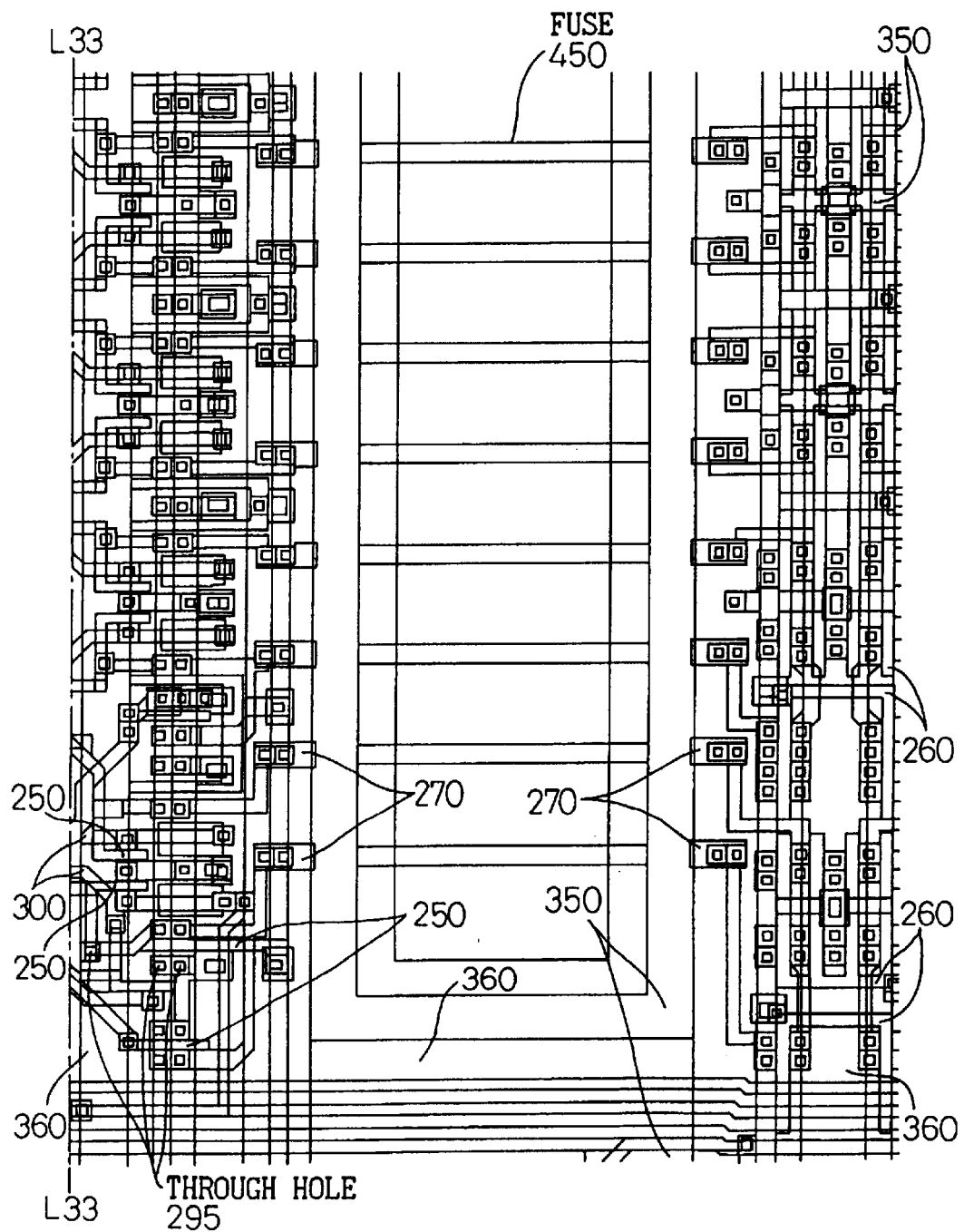
FIG. 36 is a diagram showing a circuit layout of the fuse circuits in the second preferred embodiment of the present invention.

FIG. 35 is a schematic view showing the circuit layout of the shift control circuits in the second preferred embodiment of the present invention, and FIG. 36 is a schematic view showing the circuit layout of the fuse circuits in the first preferred embodiment of the present invention. FIGS. 35 and 36 show in enlargement a part of a schematic circuit pattern when the circuit patterns of the shift control circuits and the fuse circuits of the second preferred embodiment are formed on the semiconductor chip.

In the circuit patterns shown in FIGS. 35 and 36, there are formed a polysilicon pattern for a first layer N channel transistor (hereby abbreviated to "n-CH polysilicon pattern") 250, a polysilicon pattern for a first layer P channel transistor (hereby abbreviated to the "p-CH polysilicon pattern") 260, a second layer polysilicon pattern 270, a first layer metal wiring pattern 350 made of aluminum, etc., and a second layer metal wiring pattern 360 made likewise of aluminum, etc. The N channel transistor (n-CH transistor) 280 is formed using the first layer n-CH polysilicon pattern, and the P channel transistor (p-CH transistor) 290 is formed using the second layer p-CH polysilicon pattern. On the other hand, connection among the patterns of different layers is effected through a large number of through holes 295.

In FIG. 36. further, a main word pattern for constituting a plurality of main word selecting lines and a plurality of fuses 450 are depicted in the same pitch, and the fuses and the column selecting line patterns correspond to one another on the 1:1 basis so that the selecting line for which the shift redundancy process is being executed can be grasped am sight. On the other hand, the shift control circuit has only the function of keeping the electrical state once the electrical state is determined by cutting the fuse, but speed-up of the signal processing speed is not at all required. Therefore, in the circuit patterns shown in FIGS. 35 and 36, too, the metal wiring having a low resistance such as the second layer metal wiring pattern 360 needs not be used for transferring the control signal for the shift redundancy process, in the same way as in the cases shown in FIGS. 18 and 19. Accordingly, other wiring patterns used for the shift redundancy process can be disposed efficiently in the region below the second layer metal wiring pattern.

Figure 37:
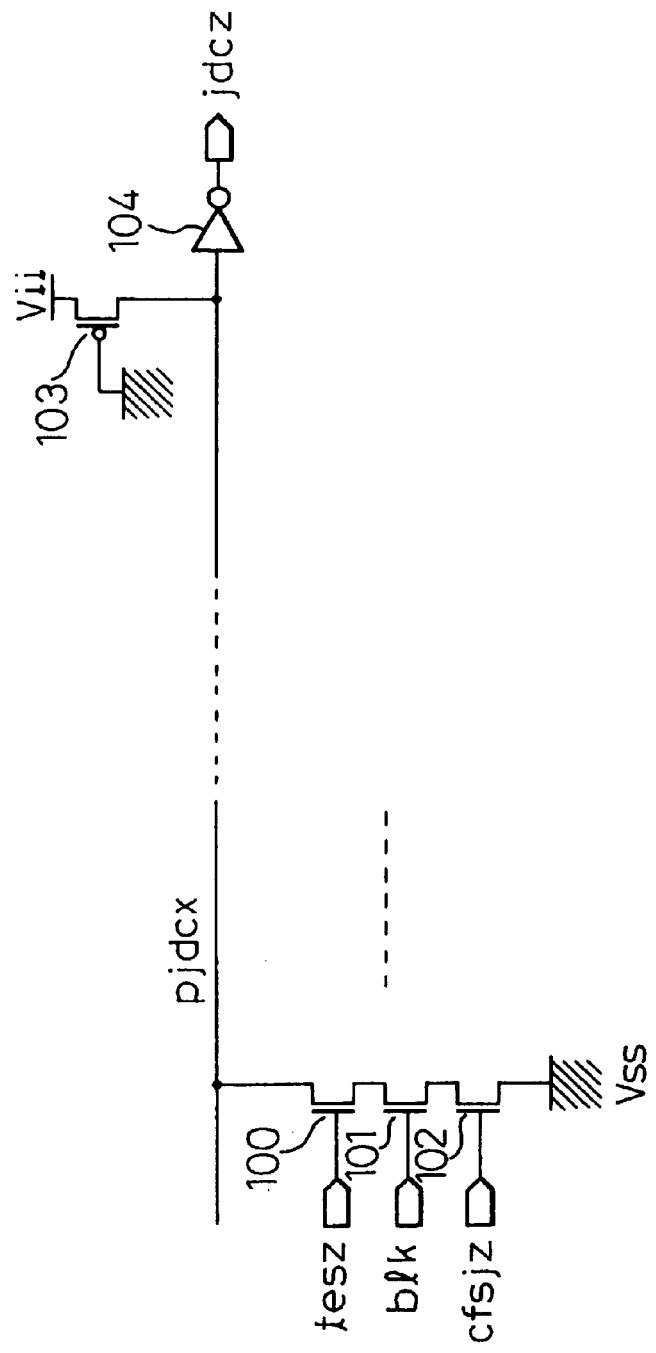
FIG. 37 is a circuit diagram showing a structural example of a redundancy block detecting circuit applied to an embodiment of the present invention.

FIG. 37 is a circuit diagram showing a structural example of the redundancy block detecting circuit applied to the embodiment of the present invention.

When the fault analysis is executed for the package having the semiconductor chip mounted thereto, the position to which shift redundancy is applied cannot be stipulated by a microscope, etc. Therefore, there is the case in which the block subjected to the shift redundancy process must be detected electrically. Therefore, it is effective to employ a method that detects the block subjected to the shift redundancy process, by using the redundancy block detecting circuit shown in FIG. 37.

In FIG. 37, symbol tesz represents the signal which attains the "H" level when the test of redundancy block detect is conducted, and symbol blkz represents the selecting signal of the block in the minimum unit when the test described above is conducted. In this case, the selecting signal blkz of the corresponding block attains the "H" level. The shift redundancy system in the basic embodiment and in the preferred embodiments of the present invention cuts the fuse corresponding to the redundancy selecting line when the redundancy selecting line is used. Therefore, redundancy block detection becomes possible by using this fuse cut state as the reference of judgement.

For example, when the corresponding fuse is cut, the output signal cfsjz of the fuse circuit for redundancy selection shown in FIG. 37 outputs the "H" level signal (see FIG. 10). This output signal cfsjz is supplied to the semiconductor chip through the N channel transistor 102. When the output signal is inputted to the "cfsjz" terminal shown in FIG. 37, the signal pjdcx transferred to the line connected to the power source through the transistor 103 changes to the "L" level if the shift redundancy process is executed in the selected block, and the invert signal jdcz outputted through the inverter 104 changes to the "H" level. The desired operation can be achieved by outputting this invert signal jdcz to the output or causing the leakage current to flow through the pins of the output data DQ or the address signal Add.

Figure 38:
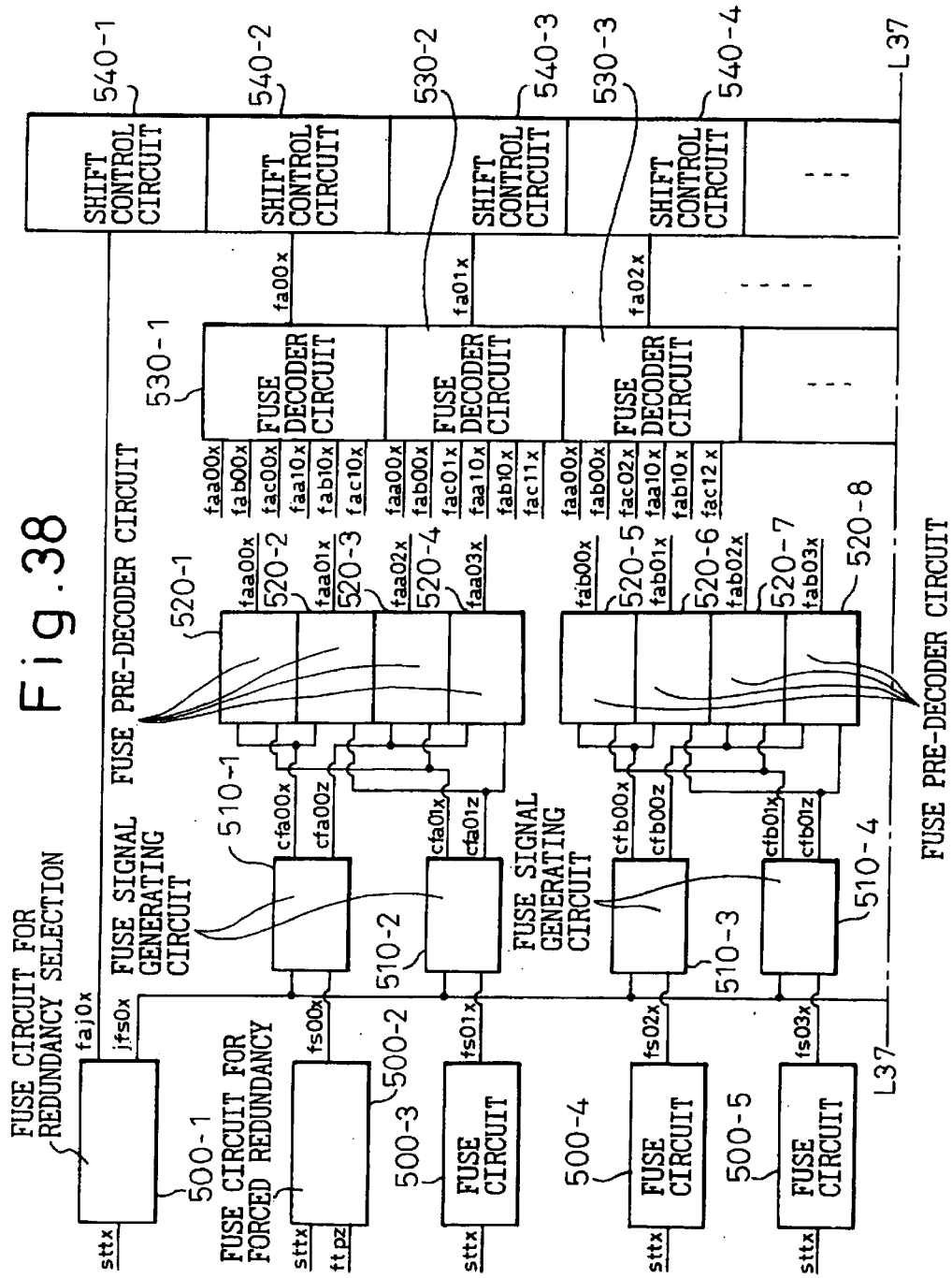
FIG. 38 is a block diagram (No. 1) showing an overall circuit construction of a third preferred embodiment of the present invention.
Figure 39:
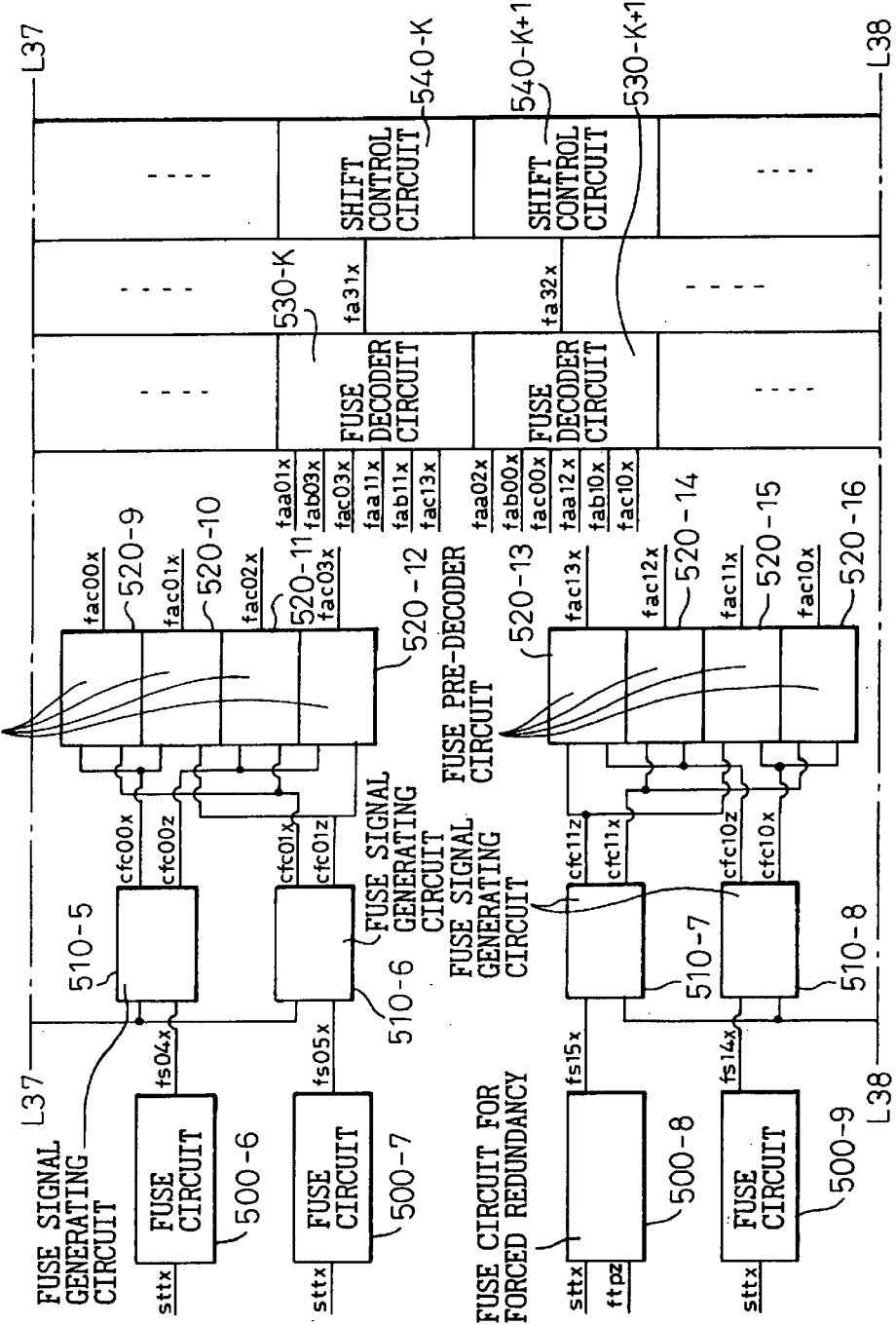
FIG. 39 is a block diagram (No. 2) showing the overall circuit construction of the third preferred embodiment of the present invention.
Figure 40:
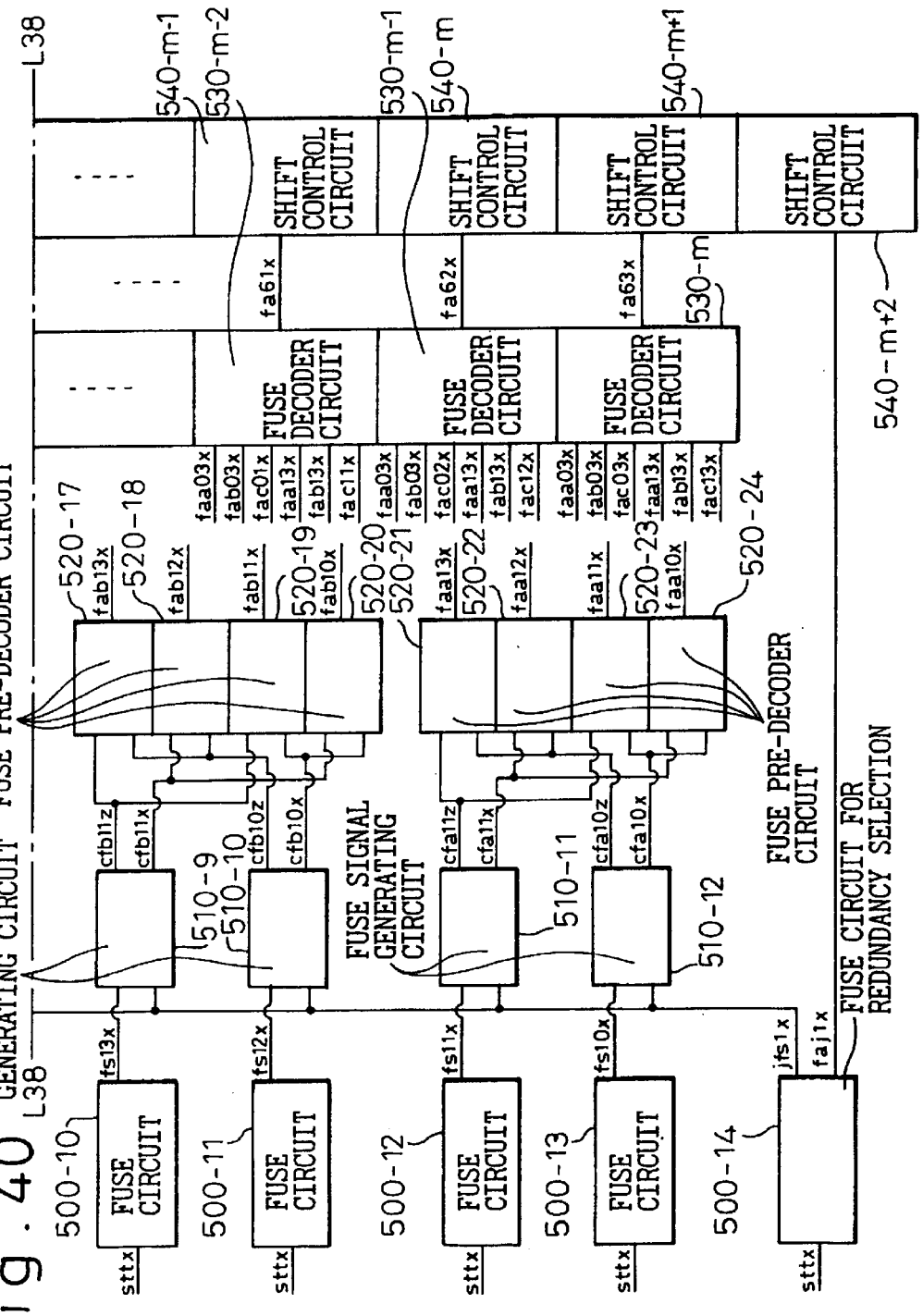
FIG. 40 is a block diagram (No. 3) showing the overall circuit construction of the third preferred embodiment of the present invention.

FIGS. 38 to 40 are block diagrams Nos. 1 to 3 showing the overall circuit construction of the third preferred embodiment of the present invention, respectively.

In the first and second preferred embodiments described already, the fuses must be disposed in such a manner as to correspond on the 1:1 basis to a plurality of selecting lines for the purpose of executing the shift redundancy operation. Therefore, when the number of selecting lines increases, the number of fuses increases, as well. In a semiconductor memory device wherein sixty-four selecting lines are disposed, for example, sixty-six, in total, fuses must be laid out on the semiconductor chip so as to correspond to the sixty-four selecting lines and the redundancy selecting lines.

In view of the problem described above, the third preferred embodiment of the present invention shown in FIGS. 38 to 40 reduces the number of necessary fuses by decoding the signals generated by the combination of fuses. When the fuse decode signals corresponding to the sixty-four selecting lines, respectively, are generated, sixty-four fuse decode signals can be generated by combining six fuses ($2^6$=64). Therefore, fourteen fuses may be prepared even when the two fuses for redundancy selection are taken into account. In this case, too, the circuits for generating the fuse for forced redundancy (that is, the fuse circuits 500-2 and 500-8) are disposed in the same way as described above. These fuse circuits for forced redundancy have the function of confirming whether or not any fault exists in the redundancy selecting lines without cutting the fuses.

The explanation will be given in further detail. The third preferred embodiment described above includes ten fuse circuits 500-3 to 500-7 and 500-9 to 500-13 each having a fuse, two fuse circuits 500-1 and 500-14 for redundancy selection and two fuse circuits 500-2 and 500-8 for forced redundancy. The third embodiment further includes fuse signal generating circuits 510-1 to 510-6 for generating complementary fuse signals cfa00x/cfa00z, cfa01x/cfa01z, cfb00x/cfb00z, cfb01x/cfb01z, cfc00x/cfc00zand cfc01x/cfc01z on the basis of the signal jfs0z outputted from one of the fuse circuits 500-1 for redundancy selection, the signal fs00x outputted from one of the fuse circuits 500-2 for forced redundancy and the signals fs01x to fs05x outputted from the fuse circuits 500-3 to 500-7.

In the third preferred embodiment described above, fuse pre-decoder circuits 520-1 to 520-12 are disposed on the output side of the fuse signal generating circuits 510-1 to 510-6. These fuse pre-decoder circuits output twelve kinds of fuse pre-decode signals faa00x to faa03x, fab00x to fab03x and fac00x to fac03x by suitably combining the complementary fuse signals generated by the fuse signal generating circuits.

The third preferred embodiment described above further includes fuse signal generating circuits 510-7 to 510-12 for generating complementary fuse signals cfal0x/cfal0z, cfal1x/cfal1z, cfbl0x/cfbl0z, cfbl1x/cfbl1z, cfcl0x/cfcl0z and cfcl1x/cfcl1z on the basis of the signal fsl5x outputted from the other fuse circuit 500-8 for forced redundancy, the signals fsl0x to fsl4x outputted from the fuse circuits 500-9 to 500-13 and the signal jfslx outputted from the other fuse circuit 500-14 for forced redundancy.

In the third preferred embodiment described above, fuse pre-decoder circuits 520-13 to 520-24 are disposed on the output side of the fuse signal generating circuits 510-7 to 510-12. These fuse pre-decoder circuits output other twelve kinds of fuse pre-decode signals fal10x to fal13x, fabl0x to fab13x and facl0x to facl3x by suitably combining the complementary fuse signals generated from the fuse signal generating circuits.

The third preferred embodiment described above includes fuse decoder circuits 530-1 to 530-m (where m is an arbitrary positive integer or 2 or more than 2 and is 64 in this case) for generating sixty-four fuse decode signals fa00x to fa63x, that correspond to the total number of selecting lines, by combining twelve kinds of fuse pre-decode signals outputted from the first group fuse pre-decoder circuits 520-1 to 520-12 with twelve kinds of fuse pre-decode signals outputted from the second group fuse pre-decoder circuits 520-13 to 520-24. The fuse decode signals fa00x to fa63x generated by these fuse decoder circuits are inputted to the shift control circuits 540-2 to 540-m+1 having substantially the same construction as those of the first and second embodiments, and the shift redundancy operation is executed, whenever necessary. Incidentally, the output signals faj0x and faj1x of the fuse circuits for redundancy selection 500-1 and 500-14 are as such inputted to the shift control circuits for redundancy selection 540-1 and 540-m+2.

Figure 41:
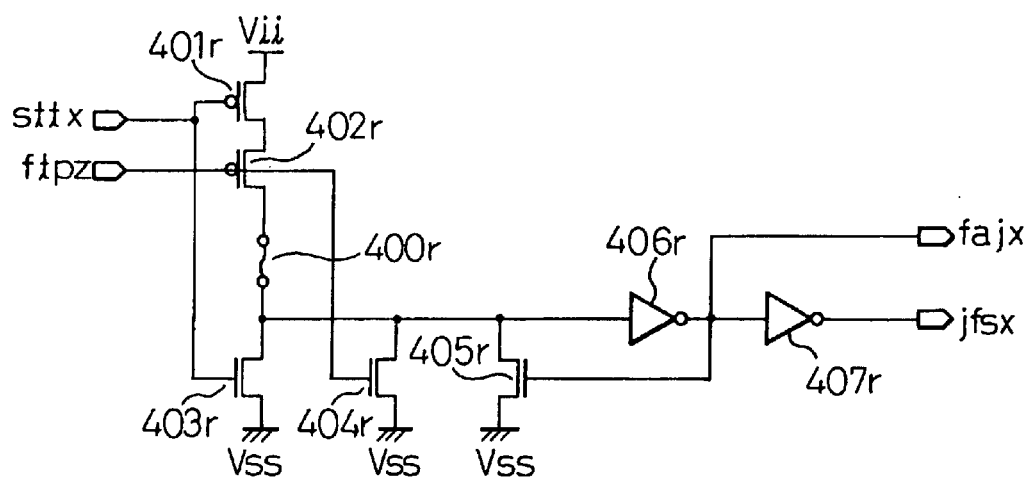
FIG. 41 is a circuit diagram showing the construction of a fuse circuit for redundancy selection in the third preferred embodiment of the present invention.
Figure 42:
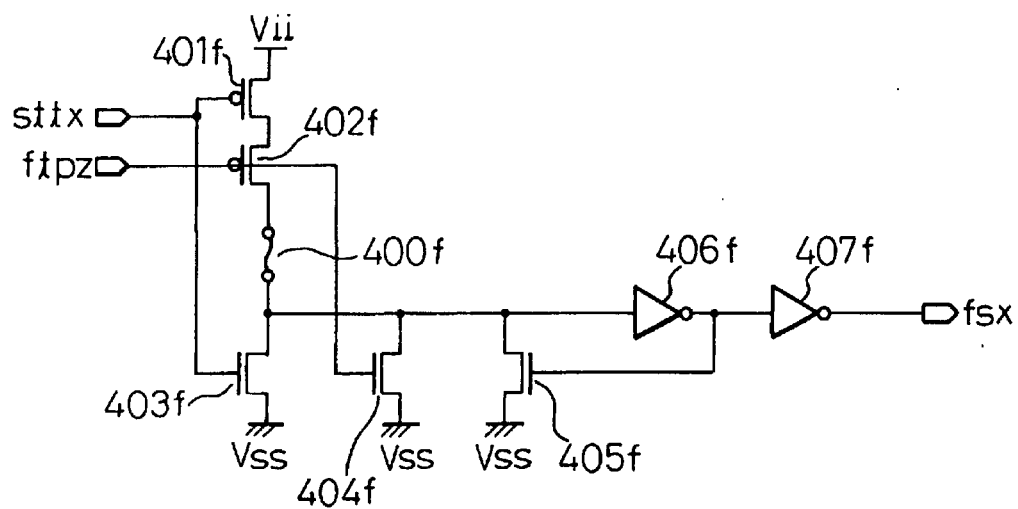
FIG. 42 is a circuit diagram showing the construction of a fuse circuit for forced redundancy in the third preferred embodiment of the present invention.

FIG. 41 is a circuit diagram showing the construction of the fuse circuit for redundancy selection in the third preferred embodiment of the present invention; FIG. 42 is a circuit diagram showing the construction of the fuse circuit for forced redundancy in the third preferred embodiment; and FIG. 43 is a circuit diagram showing the construction of the fuse circuit for normal selection in the third preferred embodiment.

Figure 43:
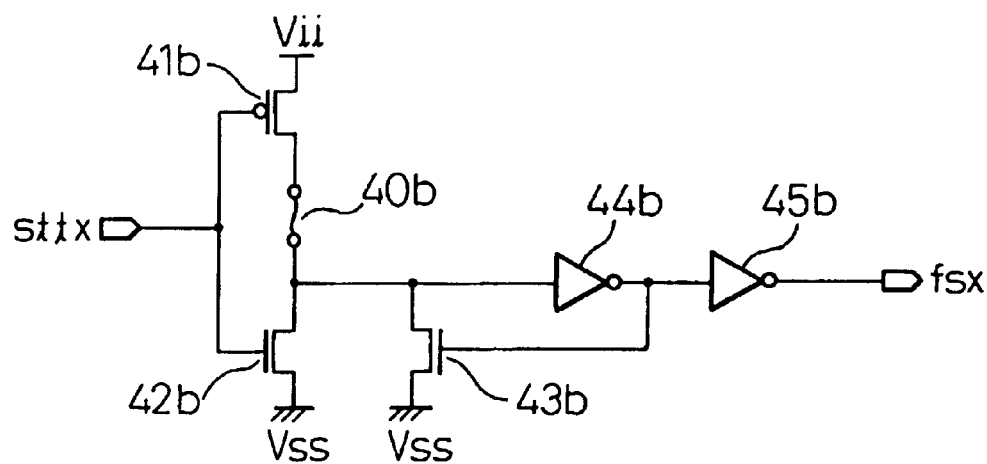
FIG. 43 is a circuit diagram showing the construction of a fuse circuit for normal selection in the third preferred embodiment of the present invention.

The constructions of the fuse circuit for redundancy selection and fuse circuit for normal selection shown in FIGS. 41 to 43 are substantially the same as the construction of the first preferred embodiment (FIGS. 9 to 11).

In FIG. 41, symbol sttx represents the control signal which remains at the "H" level until the power source becomes operative after the power source is switched on and falls to the "L" level after the power source becomes operative. Symbol ftpz represents the control signal which attains the "H" level when the forced redundancy is executed. The fuse circuit for redundancy selection shown in FIG. 41 includes a P channel transistor 401r and an N channel transistor 403r to which the control signal sttx is inputted, a P channel transistor 402r and an N channel transistor 404r to which the control signal ftpz is inputted, an N channel transistor 405r, and two inverters 406r and 407r. When the forced redundancy operation is not executed, the output signal jfsx of the fuse circuit (corresponding to the output signals jfs0x and jfs1x shown in FIGS. 38 and 40) is at the "H" level. When the forced redundancy operation is executed (that is, when the fuse 400r is apparently cut), the output signal jfsx of the fuse circuit for redundancy selection changes to the "L" level. As to the shift control circuit, however, the output signal fajx (corresponding to the output signals faj0x and faj1x in FIGS. 38 and 40) of the "L" level is supplied when the forced redundancy process is not executed.

In FIG. 42, symbol ftpz represents the control signal which attains the "H" level when forced redundancy is executed as described above. The fuse circuit for force redundancy shown in FIG. 42 includes a P channel transistor 401f and an N channel transistor 403f to which the control signal sttx is inputted, a P channel transistor 402f and an N channel transistor 404f to which is the control signal ftpz is inputted, an N channel transistor 405f, and two inverters 406f and 407f. Here, if the fuse 400f is selected as the object of the forced redundancy operation and this fuse 400f is allowed to look as being apparently cut, the output signal fsx of the fuse circuit for forced redundancy (corresponding to the output signals fs00x and fs15x in FIGS. 38 and 39) changes to the "L" level. It is possible to confirm under this state whether or not any fault exists in the redundancy selecting lines.

The fuse circuit shown in FIG. 43 includes a P channel transistor 41b and an N channel transistor 42b to which the control signal sttx is inputted, an N channel transistor 43b and two inverters 44b and 45b. When the power source becomes operative and the control signal sttx changes to the "L" level, the N channel transistor 43b is turned OFF and the output signal fsx (fs#x) of the fuse circuit changes to the "H" level if the fuse 40b is not cut at this time. When the fuse 40b is cut, the N channel transistor 43b is turned ON and the output signal fsx of the fuse circuit changes to the "L" level.

Figure 44:
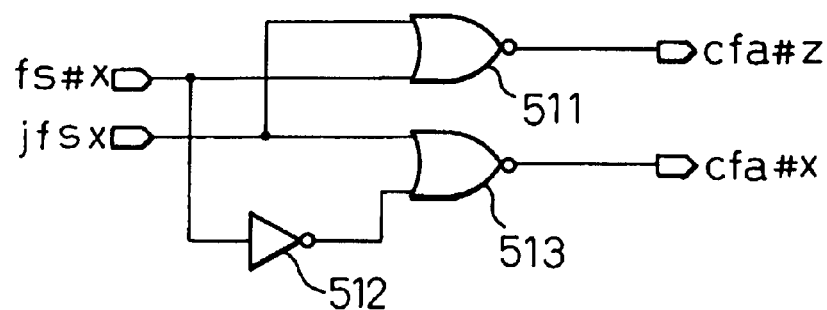
FIG. 44 is a circuit diagram showing the construction of a fuse signal generating circuit in the third preferred embodiment of the present invention.

FIG. 44 is a circuit diagram showing the construction of the fuse signal generating circuit in the third preferred embodiment of the present invention. The fuse signal generating circuit shown in FIG. 44 comprises an inverter 512 and two NOR gates 511 and 513. This fuse signal generating circuit generates the complementary fuse signals cfa#x/cfa#z on the basis of the output signal fs#x of the fuse circuit for normal selection and the output signal jfsx of the fuse circuit for redundancy selection.

Figure 45:
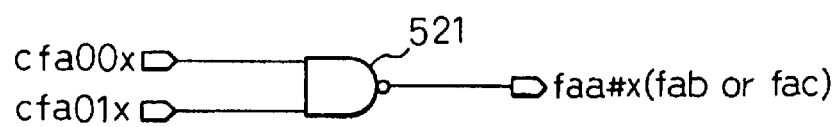
FIG. 45 is a circuit diagram showing the construction of a fuse pre-decoder circuit in the third preferred embodiment of the present invention.

FIG. 45 is a circuit diagram showing the construction of the fuse pre-decoder circuit in the third preferred embodiment of the present invention. The fuse pre-decoder circuit shown in FIG. 45 comprises a NAND gate 521. As two fuse signals (e.g., fuse signals cfa00x and cfa01x) generated by different fuse signal generating circuits are inputted, this NAND gate 521 generates a plurality of kinds of fuse pre-decode signals (faa#x, fab#x or fac#x).

Figure 46:
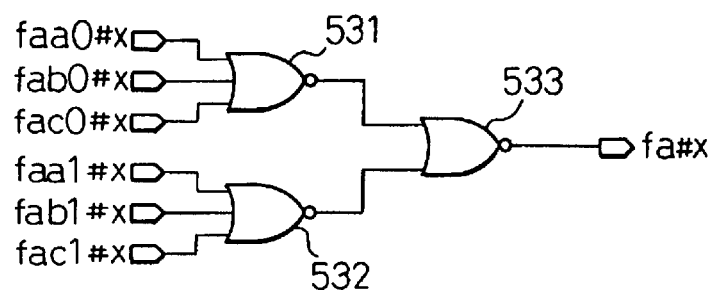
FIG. 46 is a circuit diagram showing the construction of a fuse decoder circuit in the third preferred embodiment of the present invention.

FIG. 46 is a circuit diagram showing the construction of a fuse decoder circuit in the third preferred embodiment of the present invention. The fuse decoder circuit shown in FIG. 46 comprises three NOR gates 531, 532 and 533. This fuse decoder circuit a generates the fuse decode signal (for example, fa#x) for designating the address by suitably combining the fuse pre-decode signals generated by different fuse pre-decoder circuits.

The third preferred embodiment described above can drastically decrease the number of fuses necessary for executing shift redundancy for a plurality of selecting lines of the semiconductor memory device, and can reduce the area of the semiconductor chip.

Figure 47:
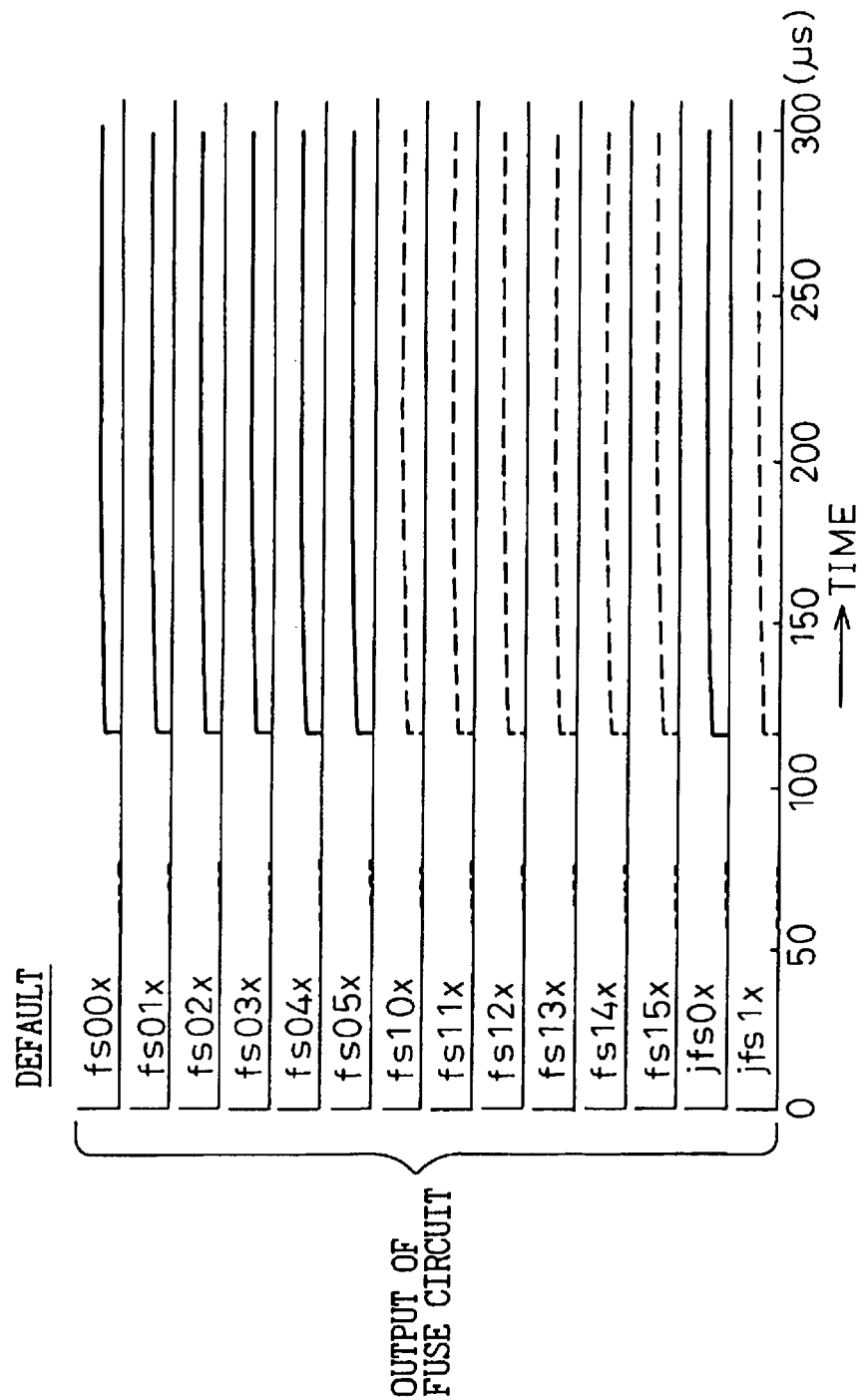
FIG. 47 is a voltage waveform diagram showing a simulation operation of the fuse circuit shown in FIG. 43 when no fault exists in the selecting line.
Figure 48:
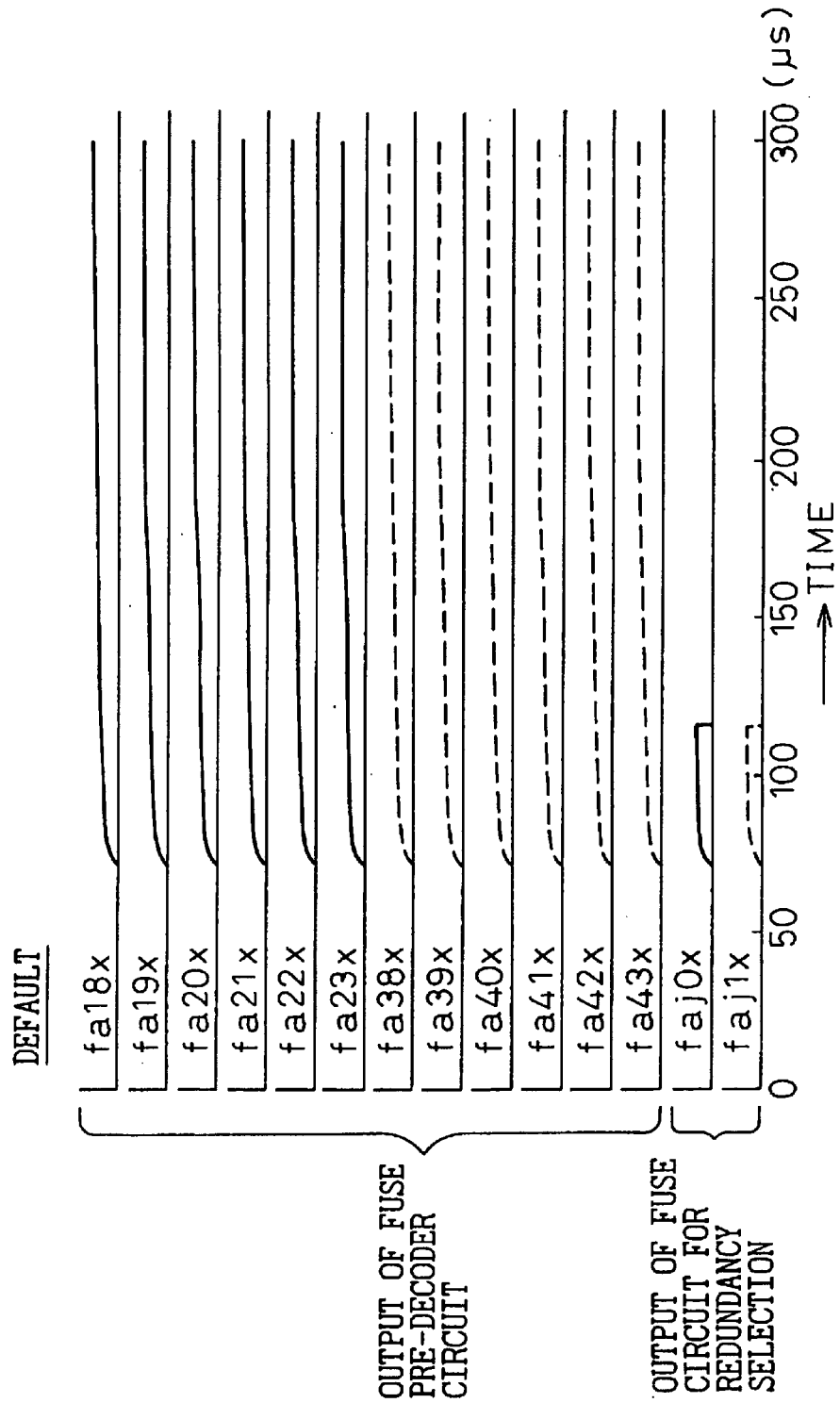
FIG. 48 is a voltage waveform diagram showing a simulation operation of the fuse pre-decoder circuit shown in FIG. 45 when no fault exists in the selecting line.
Figure 49:
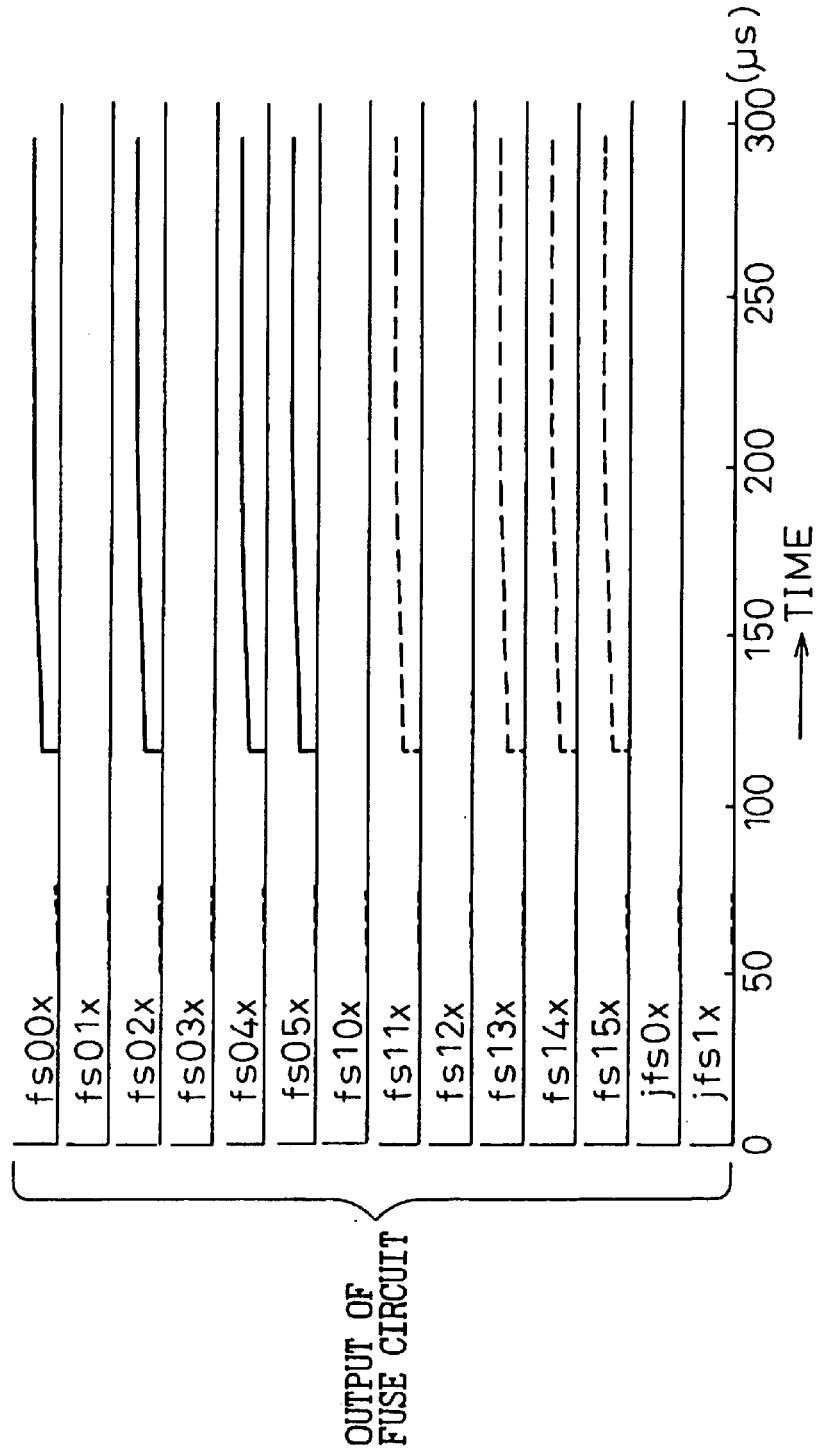
FIG. 49 is a voltage waveform diagram showing the simulation operation of the fuse circuit shown in FIG. 43 when a two-shift redundancy operation is executed.
Figure 50:
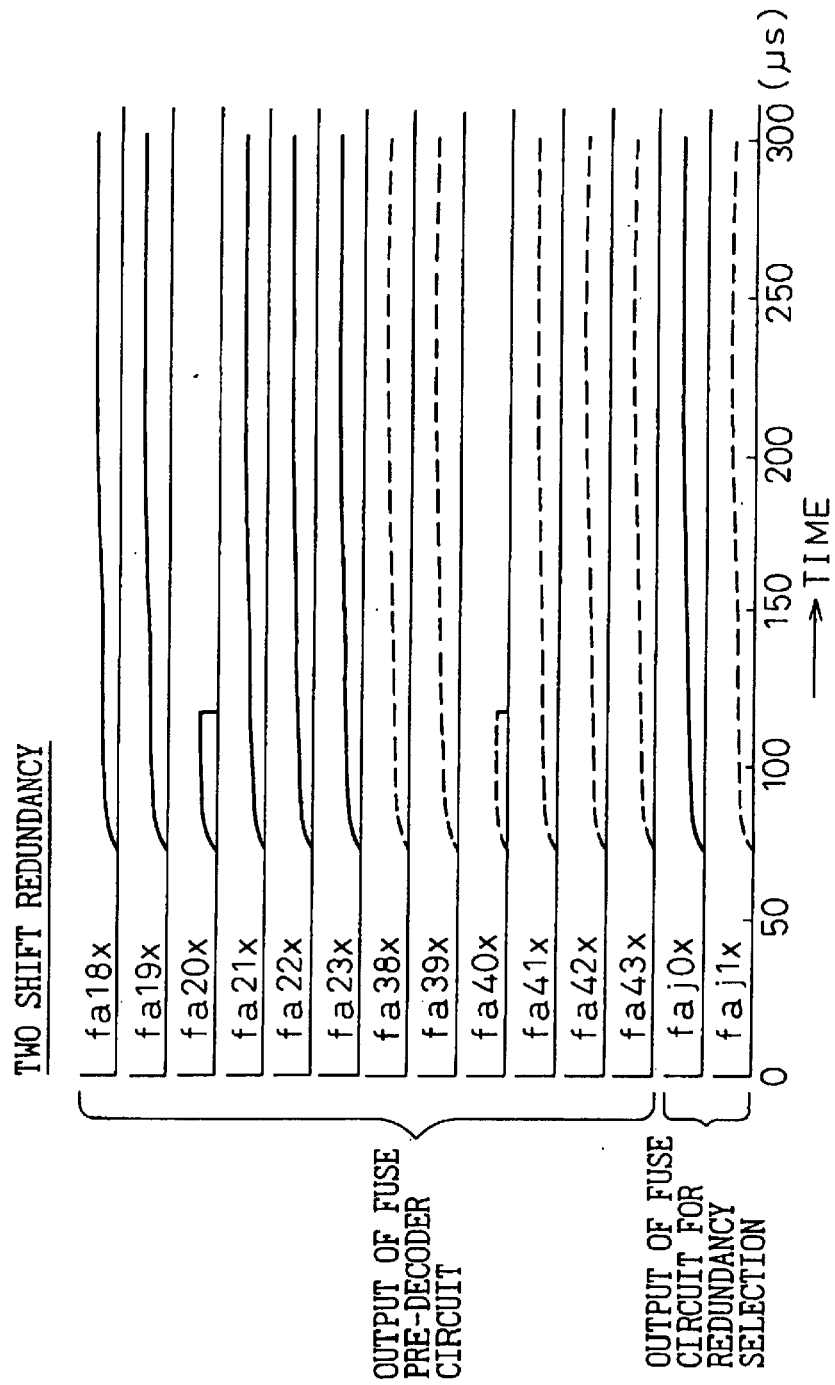
FIG. 50 is a voltage waveform diagram showing the simulation operation of the fuse pre-decoder circuit shown in FIG. 45 when a two-shift redundancy operation is executed.

FIG. 47 is a voltage waveform diagram showing the simulation operation of the fuse circuit shown in FIG. 43 when no fault exists in the selecting lines; FIG. 48 is a voltage waveform diagram showing the simulation operation of the fuse pre-decoder circuit shown in FIG. 45 when no fault exists in the selecting line; FIG. 49 is a voltage waveform diagram showing the simulation operation of the fuse circuit shown in FIG. 43 when the two-shift redundancy process (shift redundancy operation of two bits) is executed; and FIG. 50 is a voltage waveform diagram showing the simulation operation of the fuse pre-decoder circuit shown in FIG. 45 when the two-shift redundancy operation is executed.

As shown in FIG. 47, when no fault exists in a plurality of selecting lines (under the default state), the output signals fs00x to fs15x of all the fuse circuits for normal selection attain the "H" level, and the output signals of the fuse circuits for redundancy selection, that are positioned at both ends, attain the "H" level. Therefore, all the output signals change to the "H" level.

When no fault exists in a plurality of selecting lines, all the selecting lines enter the state in which they can be selected, as is obvious from FIG. 47. The output signals fs00x to fs15x in this case attain the "H" level together with the output signals jfs0x and jfs1x of the two fuse circuits for redundancy selection. As is obvious from FIG. 48, on the other hand, the output signals fa18x, fa10x, . . . , and fas43x of the fuse pre-decoder circuits are all at the "H" level. When no fault exists in a plurality of selecting lines, the signals for redundancy selection faj0x and faj1x outputted respectively from the two fuse circuits for redundancy selection are at the "L" level, as is obvious from FIG. 48.

When any faults occur in at least two selecting lines, on the other hand, the output signals of the fuse circuits corresponding to the addresses at which the faults occur change reliably to the "L" level, as shown in FIG. 49. It is obvious from FIG. 50 that the output signal corresponding to the address, at which the fault occurs, among the output signals fa18x, fa19x, . . . , fs43x of the fuse pre-decoder circuit, fall to the "L" level.

Next, concrete means for accomplishing higher freedom of redundancy than in the first to third preferred embodiments when the shift redundancy system of the present invention is applied to the semiconductor chip, and the fourth to sixth embodiments of the invention constituted by the above means, will be explained.

Figure 51:
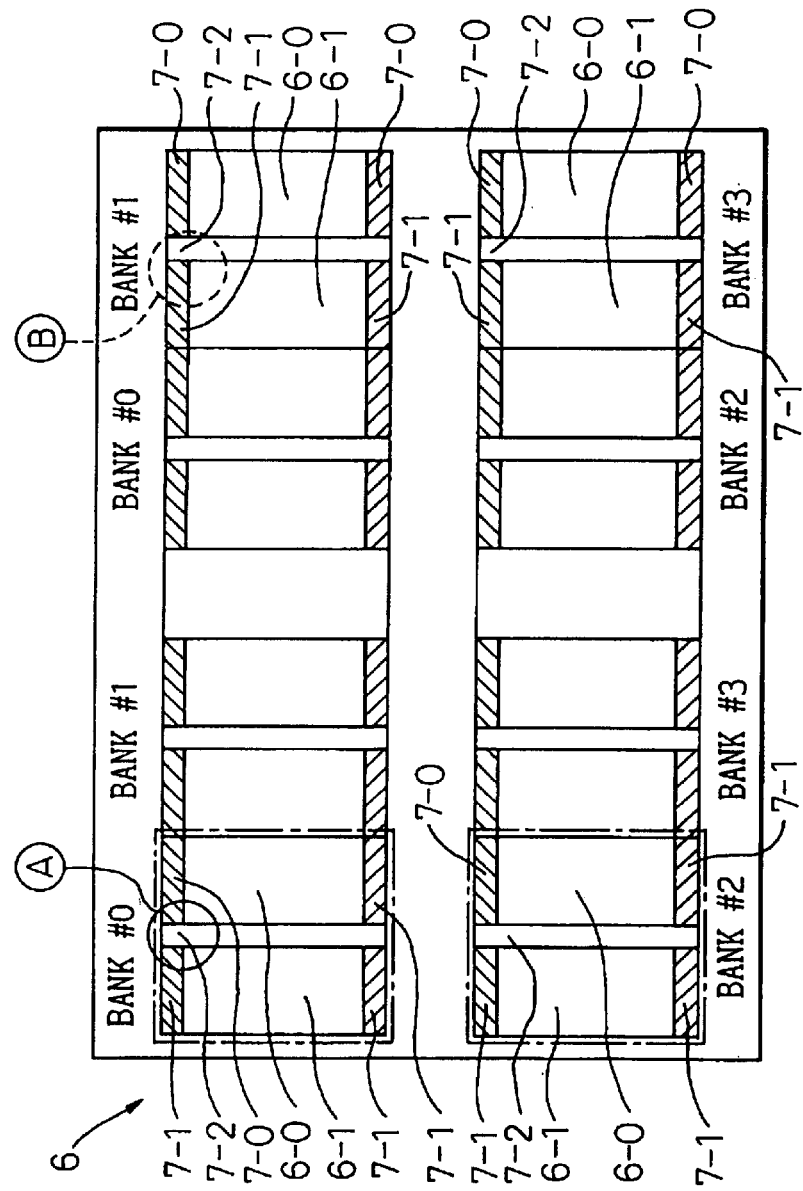
FIG. 51 is a diagram showing a schematic construction of a semiconductor chip to which a shift redundancy semiconductor memory device of the present invention is applied.
Figure 52:
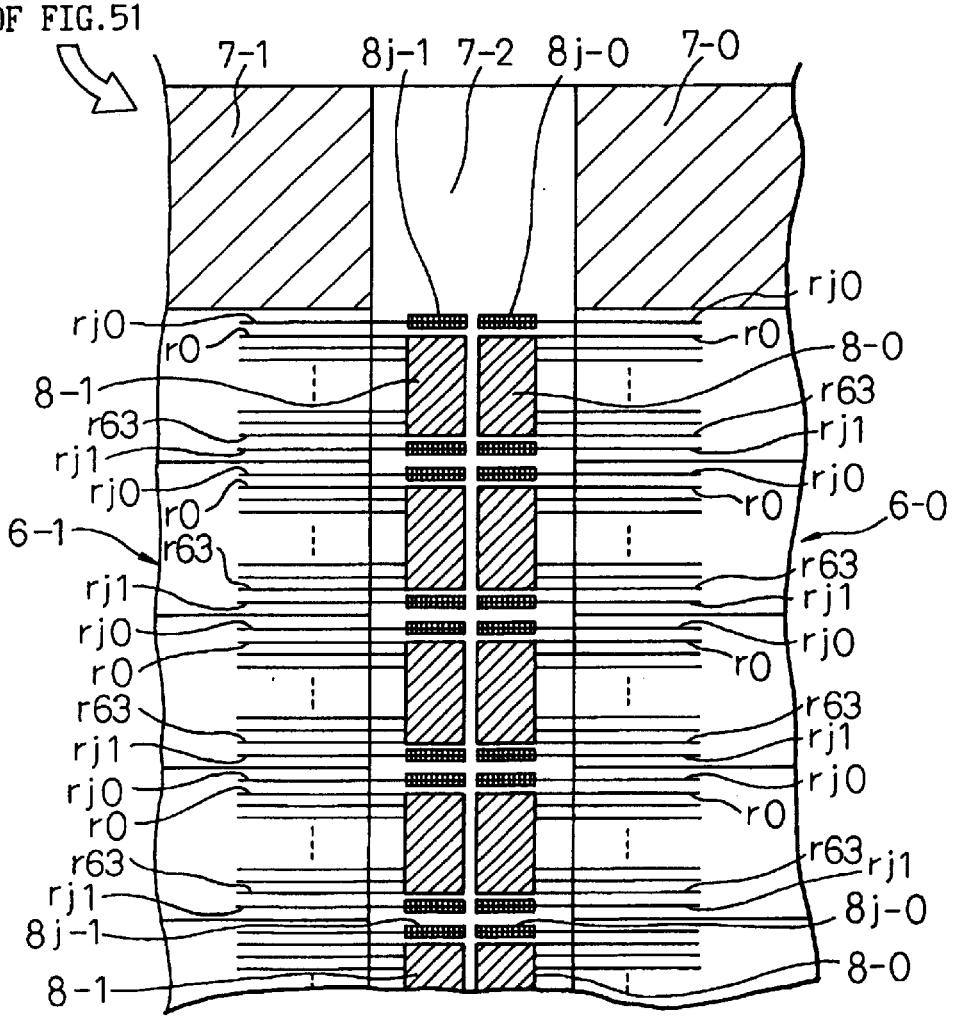
FIG. 52 is a schematic view showing in enlargement the construction of a part A in FIG. 51 when a fuse circuit, a forced redundancy fuse circuit and a redundancy selecting fuse circuit are independently provided to each of the cell arrays.
Figure 53:
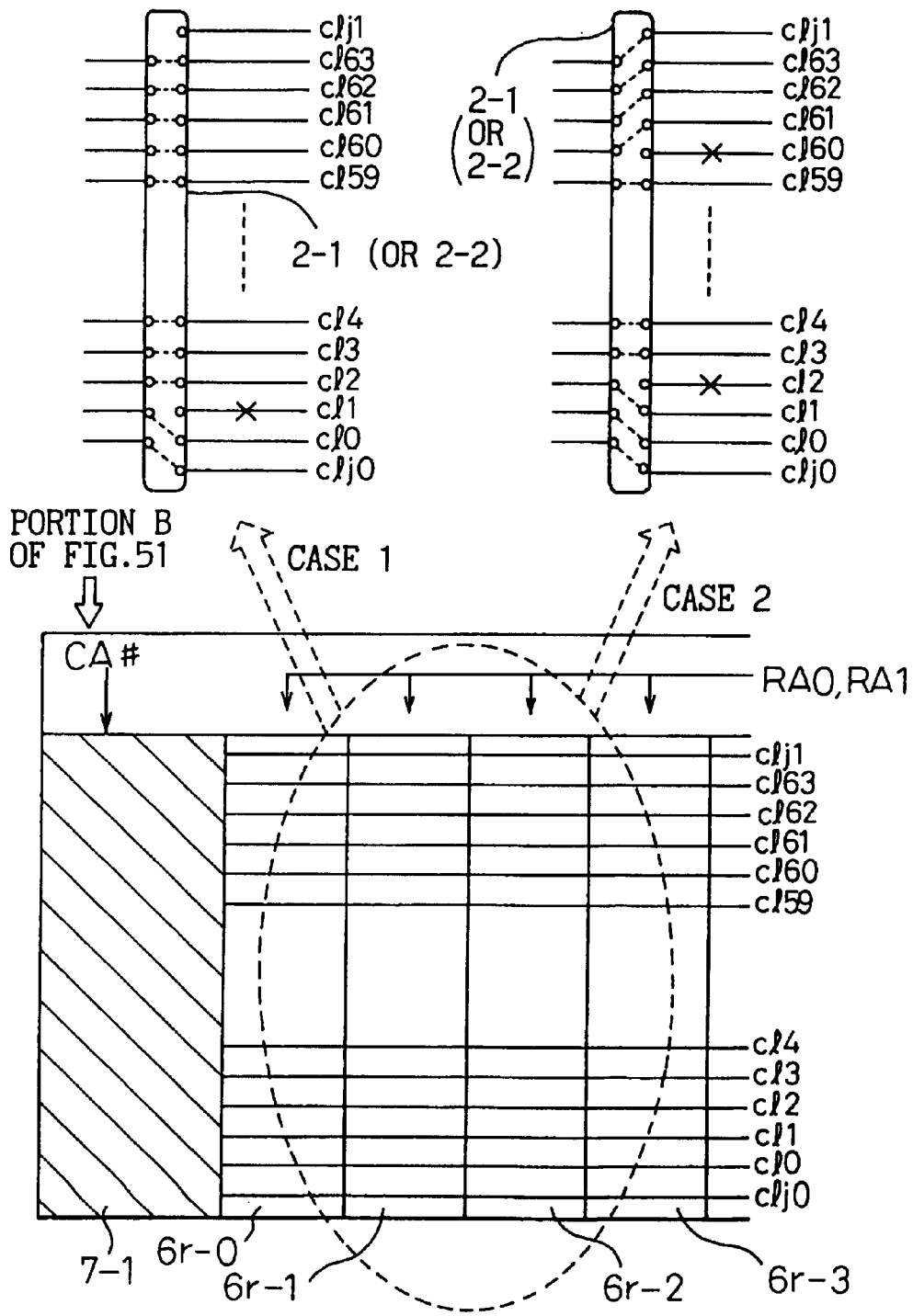
FIG. 53 is a schematic view showing in enlargement the construction of a part B shown in FIG. 51 when shift redundancy of column redundancy selecting lines is executed uniformly for a plurality of row blocks in a memory cell block.

FIG. 51 is a schematic view showing a schematic construction of a semiconductor chip to which the shift redundancy system semiconductor device of the present invention is applied; FIG. 52 is an enlarged view showing the construction of the portion A of FIG. 51 when the fuse circuit, the fuse circuit for forced redundancy and the fuse circuit for redundancy selection are independently provided to each cell array; and FIG. 53 is an enlarged view of the construction of the portion B in FIG. 51 when the shift redundancy operation of the column selecting lines is uniformly executed for a plurality of row blocks in the memory cell block.

The semiconductor chip 6 shown in FIG. 51 comprises four banks (two lines of banks #0 and #1 in the column direction and two lines of banks #2 and #3 in the column direction). Each bank is halved (hereinafter called the "half bank") and the half banks are disposed at eight positions on both sides of the chip minor side. A pair of half banks in each bank (for example, bank #0) are provided with a cell array No. 0 (indicated by reference numeral 6-0) and a memory cell array No. 1 (indicated by reference numeral 6-1) each containing a plurality of memory cells. A column decoder No. 0 (indicated by reference numeral 7-0) and a column decoder 7-1 (indicated by reference numeral 7-1) each including a plurality of decoder signal lines are disposed at both end portions of these cell arrays Nos. 0 and 1, respectively. Furthermore, a main word decoder 7-2 is disposed at the center of each pair of half banks.

As shown in FIG. 52 (which is an enlarged view of the portion A of FIG. 51), in the semiconductor memory device according to the third preferred embodiment of the present invention, the fuse circuit for normal selection (sometimes called merely the "fuse circuit") and the fuse circuit for forced redundancy 8-0 on the cell array No. 0 side are disposed so as to correspond to the row selecting lines r0 to r63 disposed in one of the pair of half banks. The fuse circuit for redundancy selection 8j-0 on the cell array No. 0 side is further disposed in such a manner as to correspond to the redundancy selecting lines rj0 and rj1.

On the other hand, the fuse circuit for normal selection (sometimes referred to merely as the "fuse circuit") and the fuse circuit for forced redundancy 8-1 on the cell array No. 1 side are disposed so as to correspond to the row selecting lines r0 to r63 disposed in the other of the pair of half banks. Furthermore, the fuse circuit for redundancy selection 8j-1 on the cell array No. 1 side is disposed in such a manner as to correspond to the redundancy selecting lines rj0 and rj1. In other words, in the semiconductor memory device of the shift redundancy system such as the one shown in FIG. 52, the fuse circuit for normal selection, the fuse circuit for forced redundancy and the fuse circuit for redundancy selection have been prepared independently in such a manner as to correspond to each cell array in the semiconductor chip.

Therefore, in the semiconductor memory device such as the one shown in FIG. 52, shift redundancy of two bits or one bit can be executed for only the total number of the selecting lines (here, row selecting lines) of one cell array. Speaking more concretely, in the shift redundancy system semiconductor memory device shown in FIG. 52, the degree of freedom of redundancy can be secured for only sixty-four selecting lines of one cell array and consequently, the degree of freedom concerning the fuses for redundancy selection is limited.

Let's consider, on the other hand, the case in which a memory cell block including a plurality of memory cells is divided into a plurality of row blocks (four row blocks in FIG. 53). In the semiconductor memory devices according to the first to third preferred embodiments, only the input address CA# of the column decoder (for example, column decoder No. 1) is used for executing shift redundancy of the column selecting lines (represented by the selecting lines cl0 to cl63 in FIG. 53) disposed to cover the four row blocks inside each half bank as shown in FIG. 53 (the enlarged view of the portion B of FIG. 51). In this case, it is determined equally for all the row blocks whether or not the shift redundancy operation of the column selecting lines driven for a plurality of row blocks is carried out.

Therefore, in the case in which redundancy by the column selecting line is not executed as in the case 1 in FIG. 53, the switch devices in the switch unit 2 (with only the switch units 2-1 and 2-2 of the second and third row blocks 6r-1 and 6r-2 being shown hereby for simplification) do not execute the switch operation, and redundancy is not executed for all the row blocks 6r-0 to 6r-3. In the case in which two-bit shift redundancy is executed by the column selecting lines as in the case 2, on the other hand, shift redundancy is executed for the same selecting line throughout all the row blocks. Therefore, redundancy in the row block cannot be executed and freedom of redundancy is limited.

Figure 54:
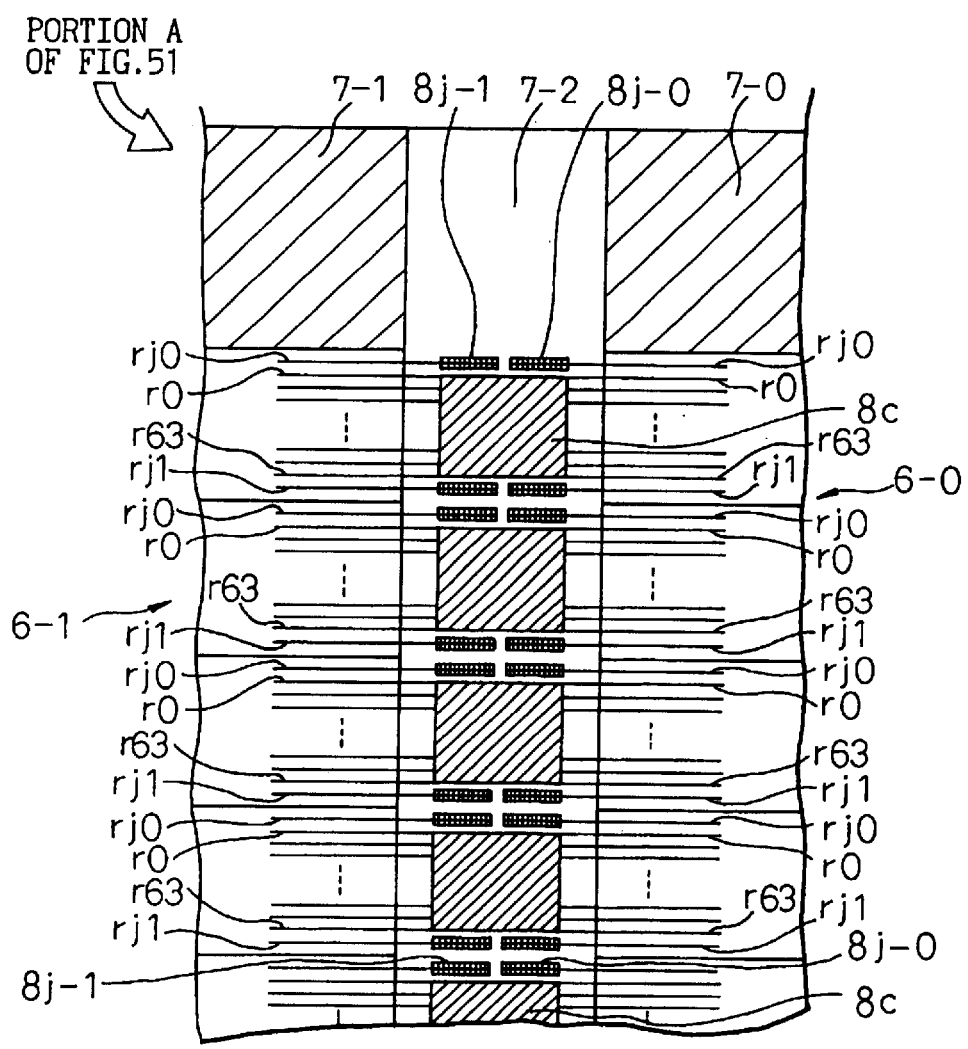
FIG. 54 is a schematic view showing in enlargement the construction of the part A shown in FIG. 51 when a fuse circuit and a forced redundancy fuse circuit are shared for adjacent cell arrays.

FIG. 54 is an enlarged view showing the construction of the portion A of FIG. 51 when the fuse circuit and the fuse circuit for forced redundancy are shared by adjacent cell arrays. The shift redundancy system shown in FIG. 54 is devised in order to solve the problem "because the degree of freedom of redundancy can be secured for only one cell array, the degree of freedom of redundancy is Limited", as explained with reference to FIG. 52.

In FIG. 54, the common fuse circuit and the fuse circuit 8c for forced redundancy are provided to two adjacent cell arrays (cell arrays Nos. 0 and 1) so that the fuse circuit for normal selection and the fuse circuit for forced redundancy can be shared. On the other hand, the fuse circuits for redundancy selection (here, the fuse circuit 8*j*-0 for redundancy selection on the cell array No. 0 side and the fuse circuit 8*j*-1 for redundancy selection on the cell array No. 1 side) are independently provided to two adjacent cell arrays, respectively. According to this construction, two-bit or one-bit shift redundancy can be executed for 128, in total, of the selecting lines of the two adjacent cell arrays, and the degree of freedom for the fuse for redundancy selection can be made larger than that of the shift redundancy system shown in FIG. 52. Incidentally, two-bit or one-bit shift redundancy can be executed in this case for either one of the two adjacent cell arrays.

Figure 55:
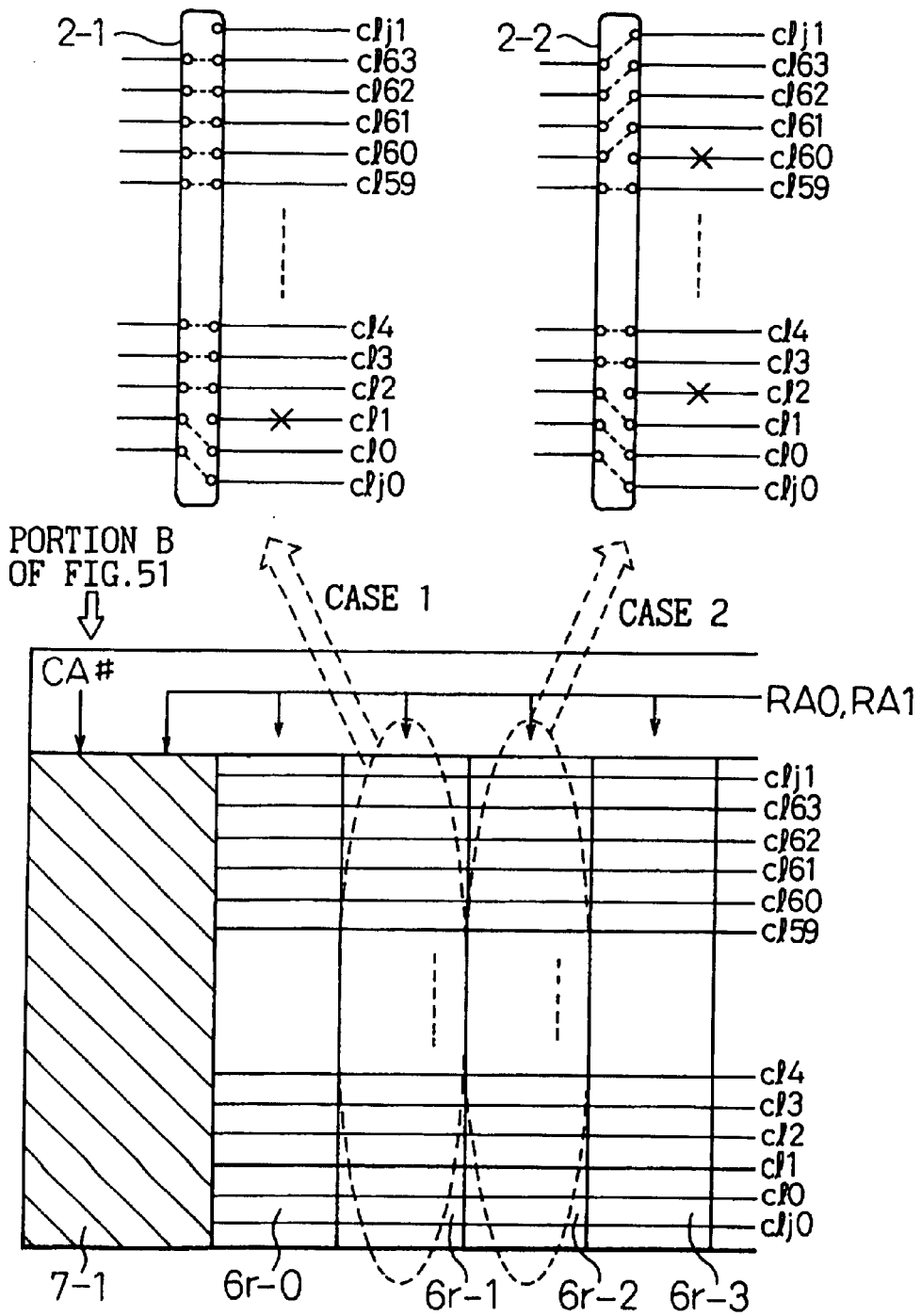
FIG. 55 is a schematic view showing in enlargement the construction of the part B shown in FIG. 51 when shift redundancy of column selecting lines is executed in a block unit in the memory cell block.
Figure 56:
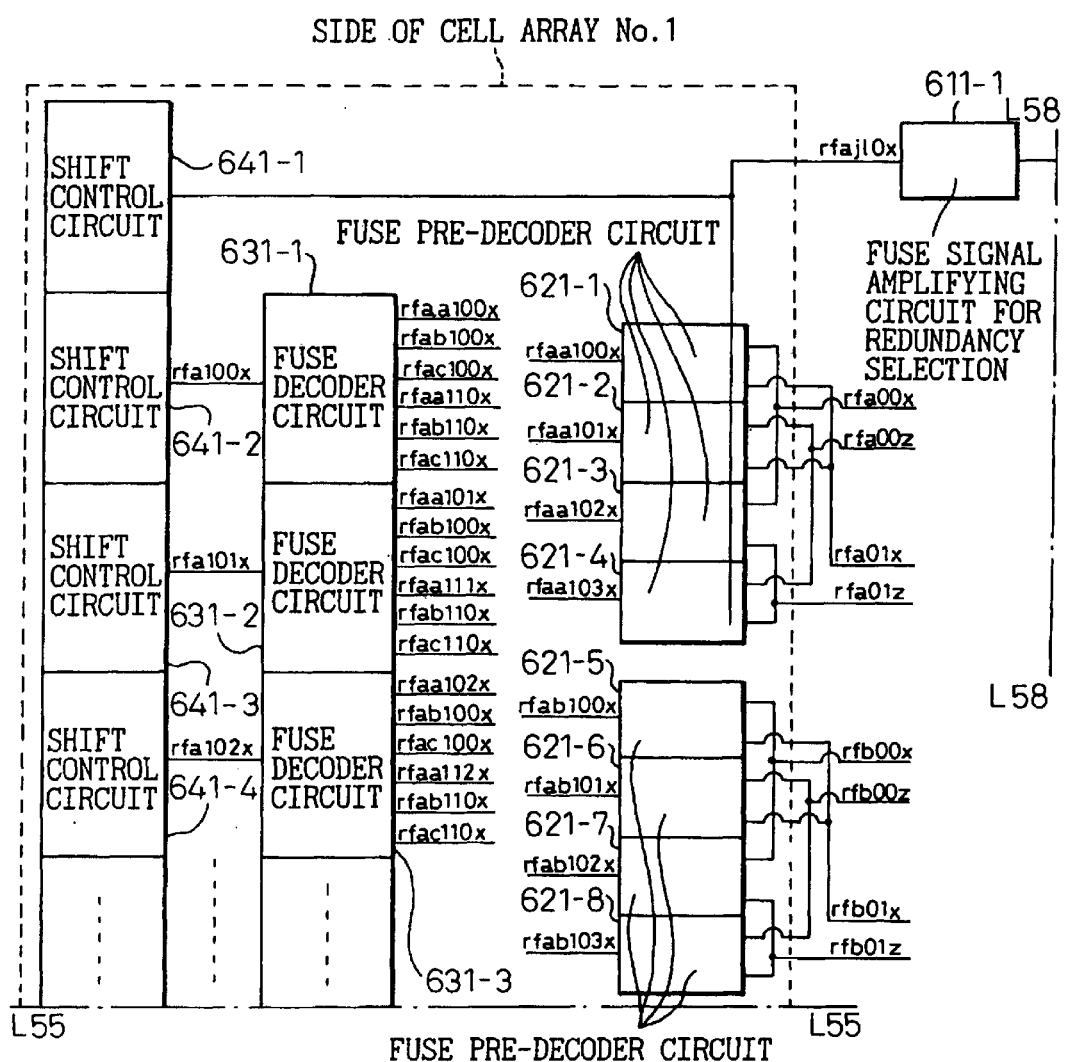
FIG. 56 is a block diagram (No. 1) showing the overall circuit construction of a fourth preferred embodiment of the present invention.
Figure 57:
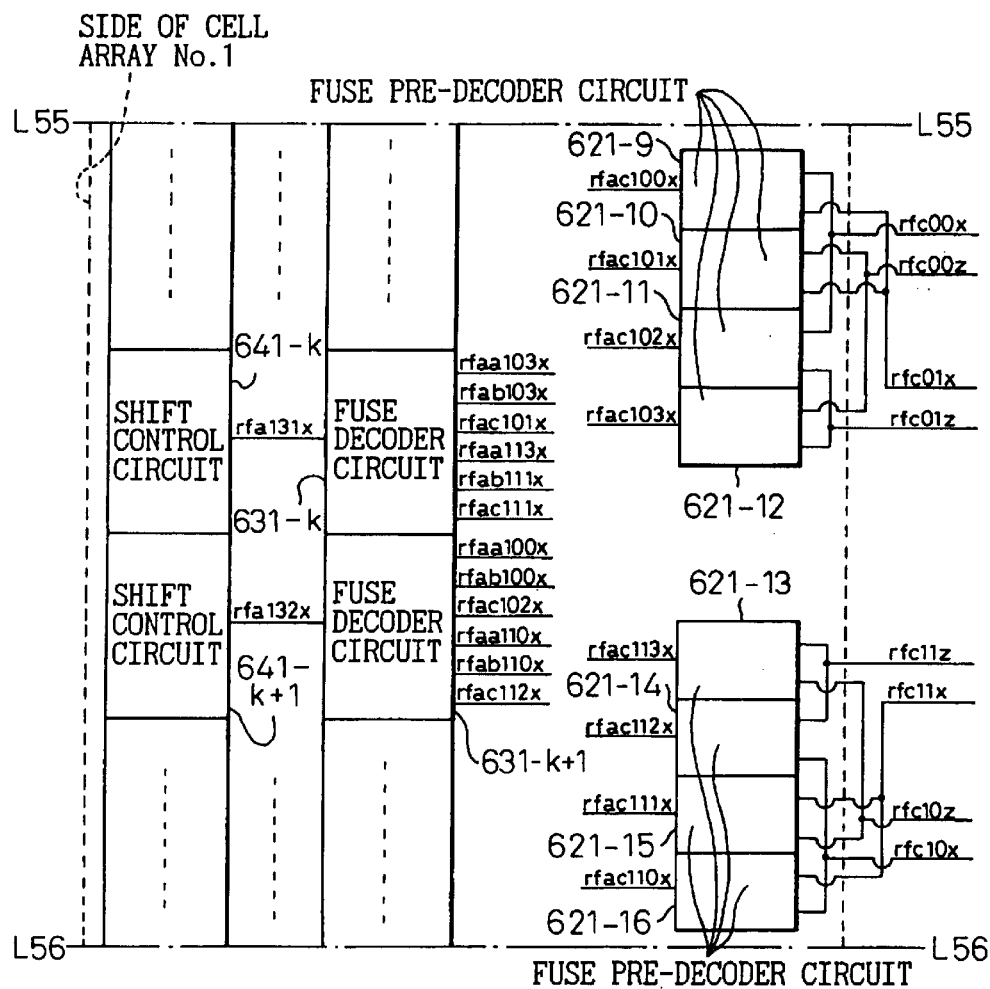
FIG. 57 is a block diagram (No. 2) showing the overall circuit construction of the fourth preferred embodiment of the present invention.
Figure 58:
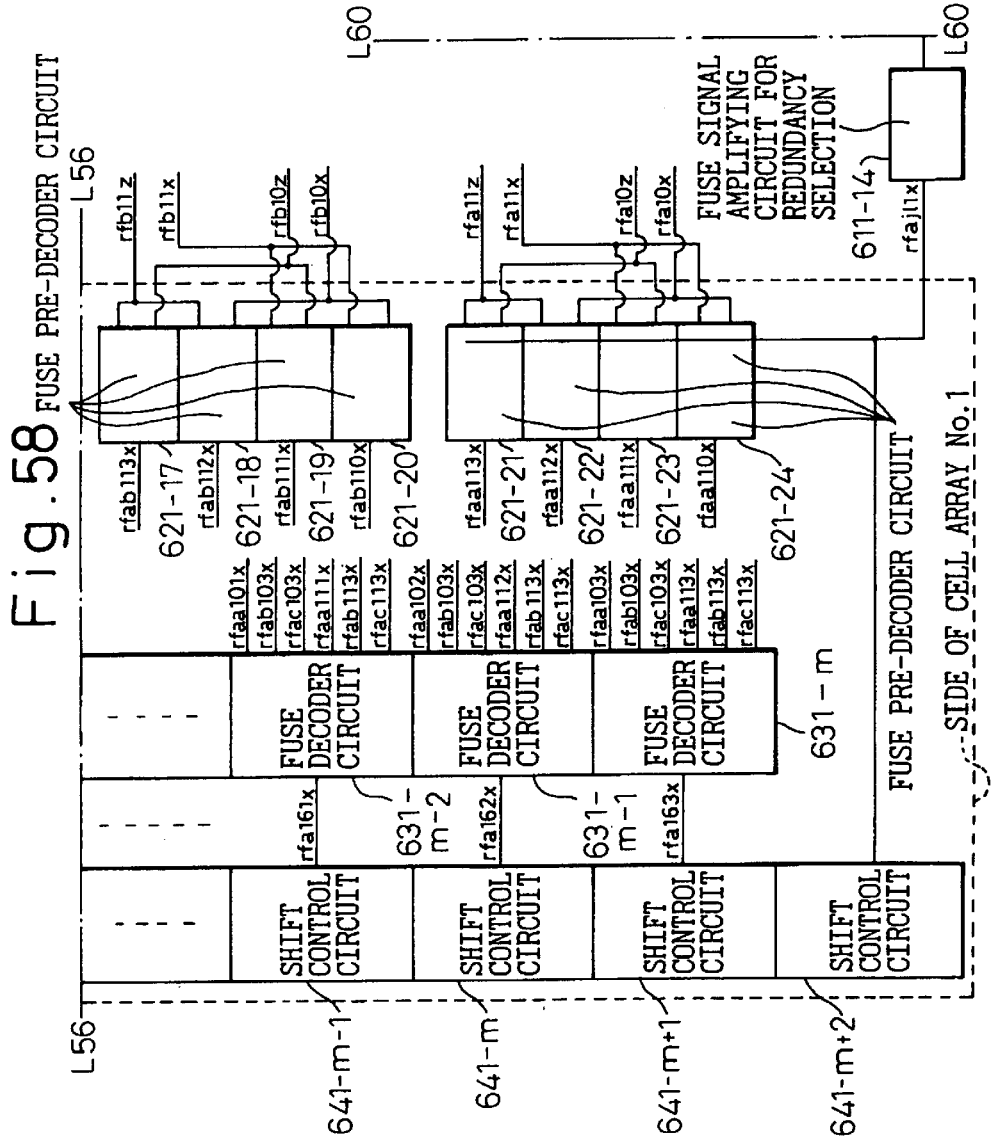
FIG. 58 is a block diagram (No. 3) showing the overall circuit construction of the fourth preferred embodiment of the present invention.
Figure 59:
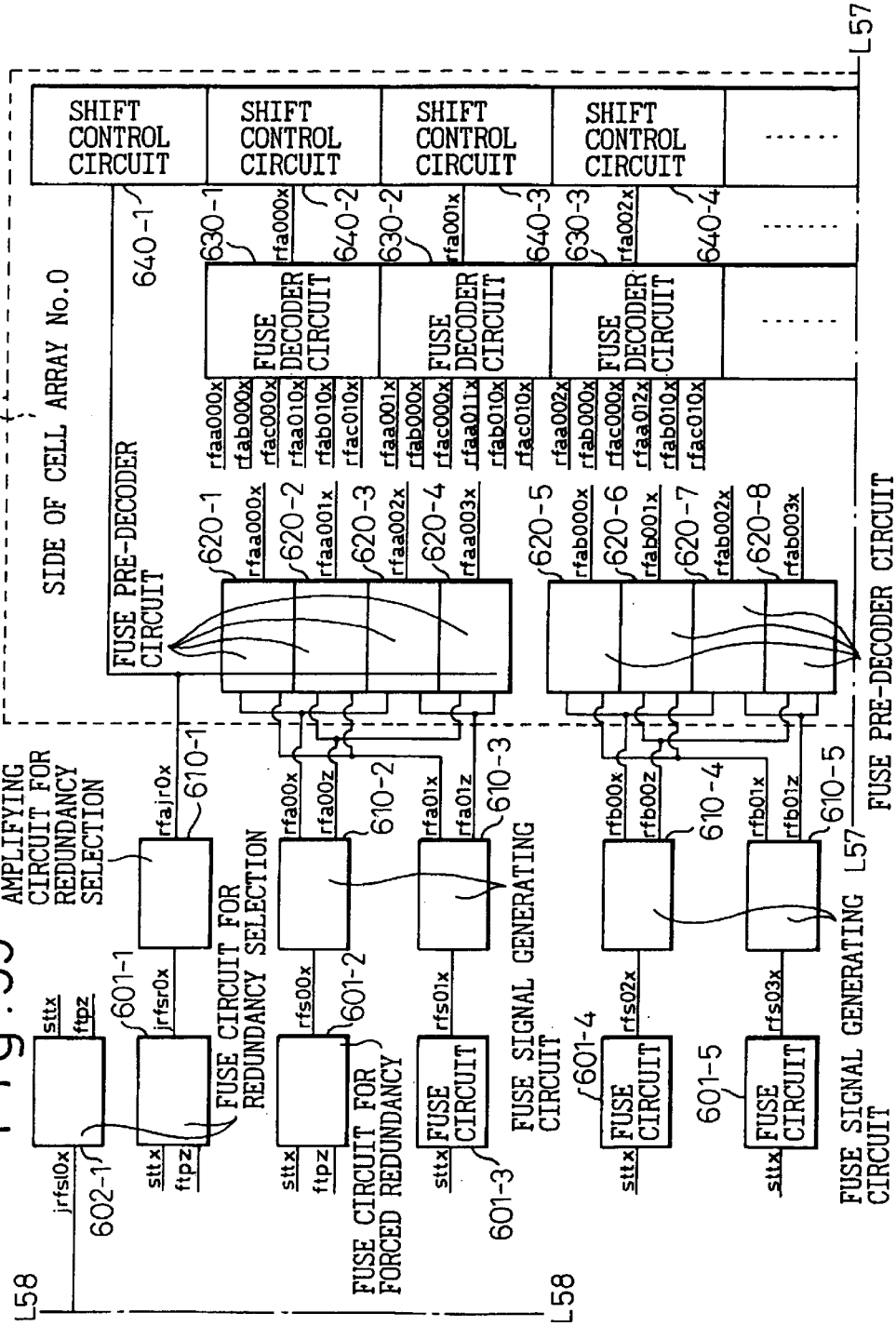
FIG. 59 is a block diagram (No. 4) showing the overall circuit construction of the fourth preferred embodiment of the present invention.
Figure 60:
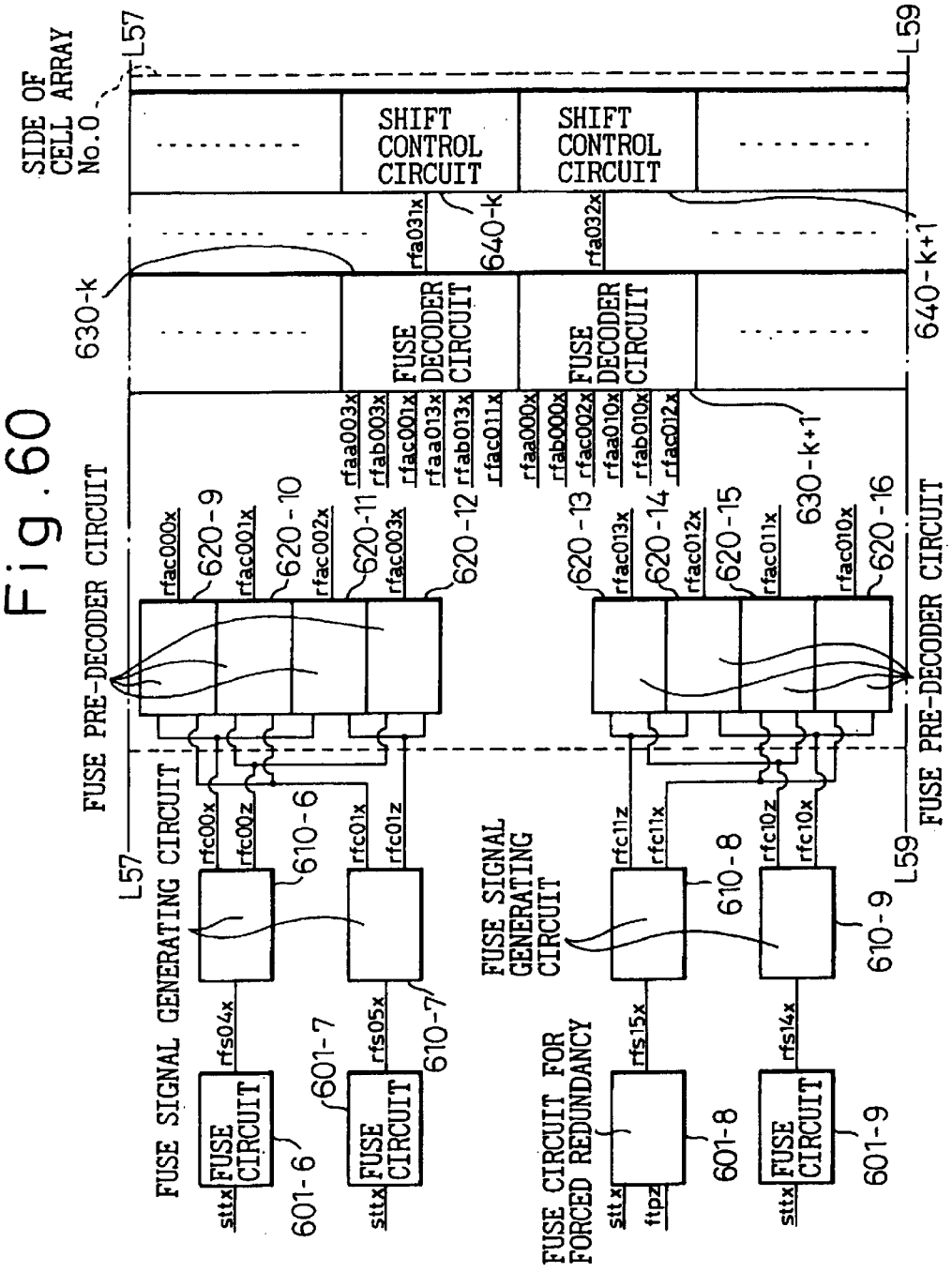
FIG. 60 is a block diagram (No. 5) showing the overall circuit construction of the fourth preferred embodiment of the present invention.
Figure 61:
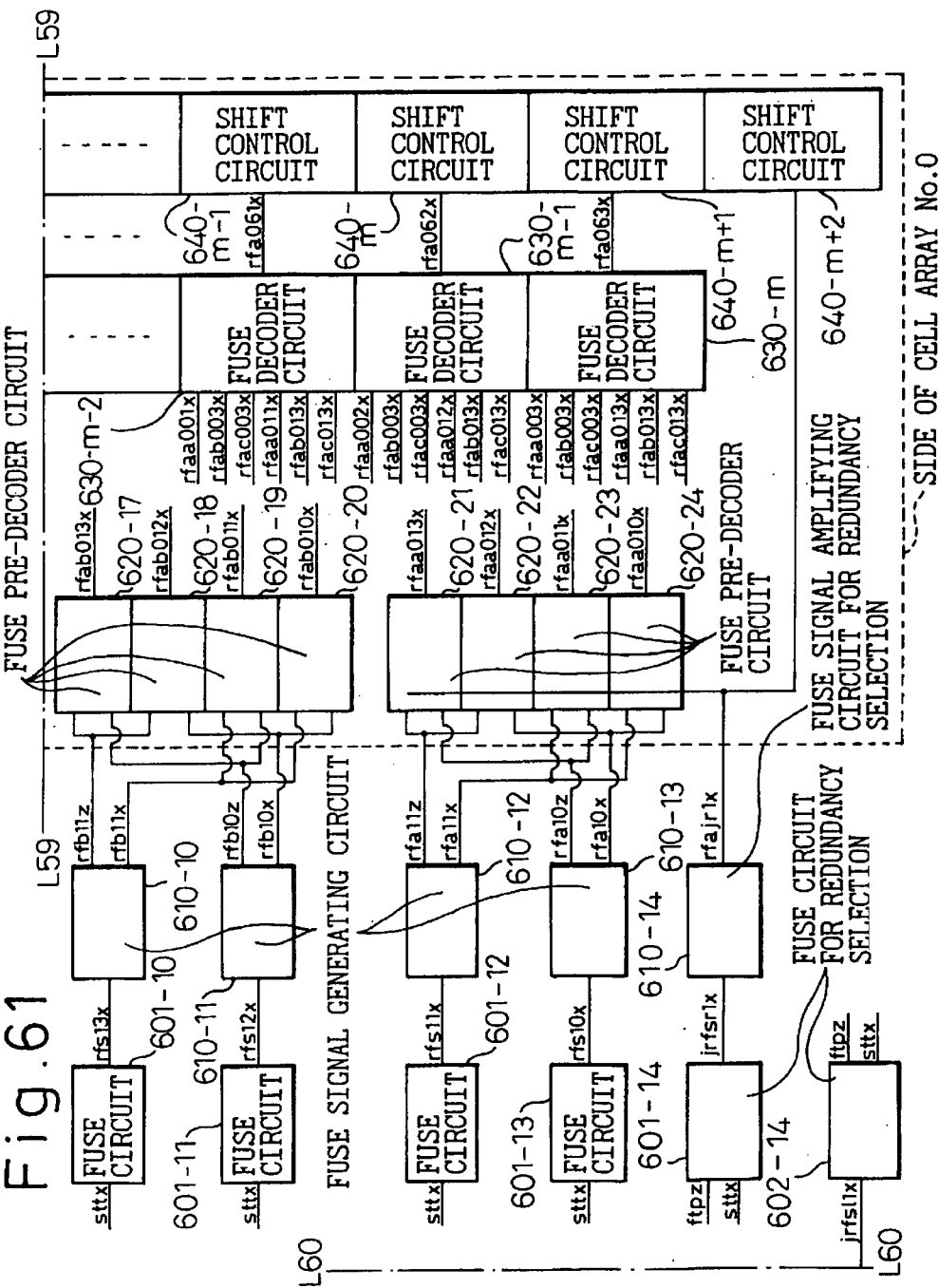
FIG. 61 is a block diagram (No. 6) showing the overall circuit construction of the fourth preferred embodiment of the present invention.

FIG. 55 is a diagram showing in enlargement the construction of the portion B when shift redundancy of the column selecting lines is executed in the row block unit in the memory cell block. The shift redundancy system shown in FIG. 55 is devised in order to solve the problem explained with reference to FIG. 53, i.e., "redundancy in the row block unit cannot be made and freedom of redundancy is limited".

When shift redundancy of the column selecting lines is executed in FIG. 55, redundancy in the row block unit can be executed because the column selecting lines driven for a plurality of row blocks 6*r*-0 to 6*r*-3 receive the logic of the address of the corresponding row blocks by combining the input address CA# of the column decoder (for example, the column decoder No. 1) with the logic of the addresses RA0 and RA1 of the row blocks.

More concretely, when the second row block 6*r*-1 is selected as in the case 1 in FIG. 55, the switch devices in the switch unit 2-1 are allowed to execute the switch operation in only the row block 6*r*-1 by the logic of the addresses RA0 and RA1 of the row block, and in this way, one-bit shift redundancy can be executed. On the other hand, when the third row block 6*r*-2 is selected as in the case 2, the switch devices inside the switch unit 2-2 are allowed to execute the switch operation in only the row block 6*r*-2 by the logic of the addresses R0 and RA1 of the row blocks. Consequently, two-bit shift redundancy can be executed. Such a construction makes it possible to execute independently two-bit shift redundancy for each of a plurality of row blocks, or to execute one-bit shift redundancy, or not to execute shift redundancy, and the degree of freedom of redundancy can be increased in comparison with the shift redundancy system shown in FIG. 53.

FIGS. 56 to 61 are block diagrams Nos. 1 to 6 showing the overall circuit construction of the fourth preferred embodiment of the present invention, respectively.

The fourth preferred embodiment shown in FIGS. 56 to 61 is directed to relatively improve the degree of freedom of redundancy by applying the construction shown FIG. 53, i.e., "the fuse circuit for normal selection and the fuse circuit for forced redundancy are shared by two adjacent cell arrays, and the fuse circuit for redundancy selection is provided independently to each of these cell arrays", to the construction of the third preferred embodiment i.e., "the fuse decode signal is generated by designating the address of the fuse corresponding to the fault selecting line by the combination of a plurality of fuses".

The feature of this fourth preferred embodiment resides in the following point. The fuse circuits for normal selection 601-3 to 601-7 and 601-9 to 601-13 and the fuse circuits for forced redundancy 601-2 and 601-8 shown in FIGS. 60 to 63 are shared by two adjacent cell arrays Nos. 0 and 1, and the fuse circuits for redundancy selection are independently provided to the two cell arrays, respectively. Furthermore, the fuse signal generating circuit is shared by the two adjacent cell arrays Nos. 0 and 1. The main constituent elements other than the fuse circuit, the fuse circuit for forced redundancy and the fuse signal generating circuit, such as the fuse pre-decoder circuit, the fuse decoder circuit and the shift control circuit, are provided independently to each cell array in the same way as in the third preferred embodiment.

The fourth preferred embodiment, too, reduces the number of necessary fuses by decoding the signals generated by the combination of a plurality of fuses in the same way as in the third preferred embodiment. When is the fuse decode signals corresponding respectively to the sixty-four selecting Lines, for example, are generated, six fuses are combined ($2^6$=64) so as to generate the sixty-four fuse decode signals. Therefore, fourteen fuses inclusive of two fuses for redundancy selection may be prepared. In this case, the circuit for generating the fuses for forced redundancy (that is, the fuse circuit's 601-2 and 601-8 for forced redundancy) has the function of confirming whether or not any fault exists in the redundancy selecting lines without actually cutting the fuses.

The explanation will be given in further detail. In the fourth preferred embodiment described above, ten fuse circuits 601-3 to 601-7 and 601-9 to 600-13 each having the fuse for normal selection and two fuse circuits 601-2 and 601-8 for forced redundancy are provided to the adjacent cell arrays Nos. 0 and 1. Furthermore, two fuse circuits 601-1 and 601-14 for redundancy selection are provided to one of the adjacent cell arrays No. 0, while two fuse circuits 602-1 and 602-14 for redundancy selection are provided to the other cell array No. 1.

The fourth preferred embodiment includes further a fuse signal amplifying circuit 610-1 for redundancy selection that inverts the level of the signal jrfsr0*x* outputted from one of the fuse circuits 601-1 for redundancy selection on the cell array No. 0, and amplifies the inverted signal, and a fuse signal amplifying circuit 610-14 for redundancy selection that inverts the level of the signal jrfsr1*x* outputted from the other fuse circuit 601-14 for redundancy selection and amplifies this signal. On the other hand, the fourth embodiment includes further a fuse signal amplifying circuit 611-1 for redundancy selection that inverts the level of the signal jrfs10*x* outputted from one of the fuse circuits 602-1 for redundancy selection on the cell array No. 1 side and amplifies this signal, and a fuse signal amplifying circuit 611-14 for redundancy selection that inverts the level of the signal jrfs11*x* outputted from the other fuse circuit 602-14 for redundancy selection on the same cell array side and amplifies this signal.

In the fourth preferred embodiment described above, there are further disposed fuse signal generating circuits 610-2 to 610-7 for generating complementary fuse signals rfa00*x*/rfa00*z*, rfa01*x*/rfa01*z*, rfb00*x*/rfb00*z*, rfb01*x*/rfb01*z*, rfc00*x*/rfc00*z* and rfac01*x*/rfc01*z* on the basis of the signal rfs00*x* outputted from one of the fuse circuits 601-2 for forced redundancy which is common to the sides of the cell arrays Nos. 0 and 1 and the signals rfs01*x* to rfs05*x* outputted from the fuse circuits 601-3 to 601-7.

In the fourth preferred embodiment described above, there are further disposed fuse pre-decoder circuits 620-1 to 620-12 on the cell array No. 0 side and also the output side of the fuse signal generating circuits 610-2 to 610-7. These fuse pre-decoder circuits output twelve kinds of fuse pre-decode signals raa000*x* to rfaa003*x*, rfab000*x* to rfab003*x* and rfac000x to rfac003x for the cell array No. 0 by combining suitably the complementary fuse signals generated by the fuse signal generating circuits. On the other hand, fuse pre-decoder circuits 621-1 to 621-12 are disposed on the output side of the fuse signal generating circuits 610-2 to 610-7 and on the side of the cell array No. 1. These fuse pre-decoder circuits output twelve kinds of fuse pre-decode signals rfaa100x to rfaa103x, rfab100x to rab103x and rfac100x to rfac103x by combining suitably the complementary fuse signals generated by the fuse signal generating circuits.

In the fourth preferred embodiment described above, there are further disposed fuse signal generating circuits 610-8 to 610-13 for generating complementary fuse signals rfc11x/rfc11z, rfc10x/rfc10z, rfb11x/rfb11z, rfb10x/cfb10z, rfa11x/rfa11z and rfa10x/rfa10z on the basis of the signal rfs15x outputted from the other fuse circuit 601-3, which is in common to the cell arrays Nos. 70 and 1, and the signals rfs14x to rfs10x outputted from the fuse circuits 601-9 to 601-13.

In the fourth preferred embodiment described above, there are further disposed fuse pre-decoder circuits 620-13 to 620-24 on the output side of the fuse signal generating circuits 610-8 to 610-13 and on the cell array No. 0 side. These fuse pre-decoder circuits output twelve kinds of fuse pre-decode signals rfac010x to rfac013x, rfab010x to rfab013x and rfaa010x to rfaa013x for the cell array No. 0 by combining suitably the complementary fuse signals generated by the fuse signal generating circuits. On the other hand, fuse pre-decoder circuits 621-13 to 621-24 are disposed on the output side on the fuse signal generating circuit 610-8 to 610-13 and on the cell array No. 1 side. These fuse pre-decoder circuits output twelve kinds of fuse pre-decode signals rfaa110x to rfaa113cx, rfab110x to rfab113x and rfac110x to rfac113x for the cell array No. 1 by combining suitably the complementary fuse signals generated by the fuse signal generating circuits.

Here, the fuse signal rfajr0x representing whether or not the fuse in one of the fuse circuits for redundancy selection 601-1 on the cell array No. 0 side is cut is supplied from the fuse signal amplifying circuit 610-1 for redundancy selection to the fuse predecoder circuits 620-1 to 620-4. Furthermore, the fuse signal rfajr1x for redundancy selection, that represents whether or not the fuse in the other fuse circuit 601-14 for redundancy selection on the cell array No. 0 side is cut, is supplied from the fuse signal amplifying circuit 610-14 for redundancy selection to the fuse pre-decoder circuits 620-21 to 620-24. On the other hand, the fuse signal rfaj10x for redundancy selection, that represents whether or not the use in one of the fuse circuits 602-1 for redundancy selection on the cell array No. 1 side is cut, is supplied from the fuse signal amplifying circuit 611-1 for redundancy selection to the fuse pre-decoder circuits 621-1 to 621-4. Further, the fuse signal rfaj11x for redundancy selection, that represents whether or not the fuse in the other fuse circuit 602-14 for redundancy selection on the cell array No. 1 side is cut, is supplied from the fuse signal amplifying circuit 611-14 for redundancy selection to the fuse pre-decoder circuits 621-21 to 621-24.

The fourth preferred embodiment described above include further fuse decoder circuits 630-1 to 630-m (where m is an arbitrary positive integer of 2 or more than 2, and is 64 in this case) for generating sixty-four fuse decode signals rfa000x to rfa063x on the cell array No. 0 side by combining suitably twelve kinds fuse predecode signals outputted from the fuse pre-decoder circuits 620-1 to 620-12 of the first group with twelve kinds of fuse pre-decode signals outputted from the fuse pre-decoder circuits 620-13 to 620-24 of the second group. The fuse decode signals fa000x to fa063x generated by these fuse decoder circuits are inputted to the shift control circuits 640-2 to 640-m+1 having substantially the same construction as those of the first to third preferred embodiments, and the shift redundancy operation is executed, whenever necessary. Incidentally, the output signals jrfsr0x and hrfsr1x of the fuse circuits 601-1 and 601-4 for redundancy selection on the cell array No. 0 side are subjected to the level inversion by the fuse signal amplifying circuits for redundancy selection, respectively, and are then inputted to the shift control circuits 640-1 and 640-m+2 for redundancy selection.

On the other hand, the fourth preferred embodiment includes further fuse decoder circuits 631-1 to 631-m (where m is an arbitrary positive integer of 2 or more than 2, and is 64 in this case) for generating 64 fuse decode signals rfa100x to rfa163x, that correspond to the total number of the selecting lines, on the cell array No. 1 side by combining suitably twelve kinds of fuse pre-decode signals outputted from the fuse pre-decoder circuits 621-1 to 621-12 of the first group with twelve kinds of fuse pre-decode signals outputted from the fuse pre-decoder circuits 621-13 to 621-24 of the second group. The fuse decode signals rfa000x to rfa163x generated by these fuse decoder circuits are inputted to the shift control circuits 641-2 to 641-m+1 having substantially the same construction as those of the first to third preferred embodiments, and the shift redundancy operation is executed, whenever necessary. Incidentally, the output signals jrfsr0x and jrfsr1x of the fuse circuits 602-1 and 602-14 for redundancy selection on the cell array No. 1 side are subjected to the level inversion by the fuse signal amplifying circuits for redundancy selection, and are then inputted to the shift control circuits 641-1 and 641-m+2 for redundancy selection.

When it is desired to execute the two-bit shift redundancy operation in both two adjacent cell arrays in the fourth preferred embodiment shown in FIGS. 56 to 61, the fuses of all the fuse circuits for redundancy selection are cut and moreover, the fuses of a plurality of fuse circuits are cut in such a manner as to correspond to the fault selecting lines in which the fault occurs. In other words, the shift redundancy operation is executed in each cell array by combining the fuse of the fuse circuit for redundancy selection, which is cut, with the fuse of the fuse circuit for normal selection, which is cut.

Furthermore, when it is desired to execute the shift redundancy operation in only one of the cell arrays, both of two fuses of the use circuits for redundancy selection corresponding to this cell array are cut while the fuses of the fuse circuits for redundancy selection, that correspond to the other cell array, is left uncut. When it is desired to execute the one-bit shift redundancy operation in one of the cell arrays, only one fuse of the fuse circuit corresponding to this cell array is cut. According to this shift redundancy system, the two-bit or one-bit shift redundancy operation can be executed for 128 selecting lines of the two cell arrays, and degree of freedom of redundancy for the fuses for redundancy selection becomes higher than in the third embodiment in which two-bit or one-bit shift redundancy is executed for 64 selecting lines.

Figure 62:
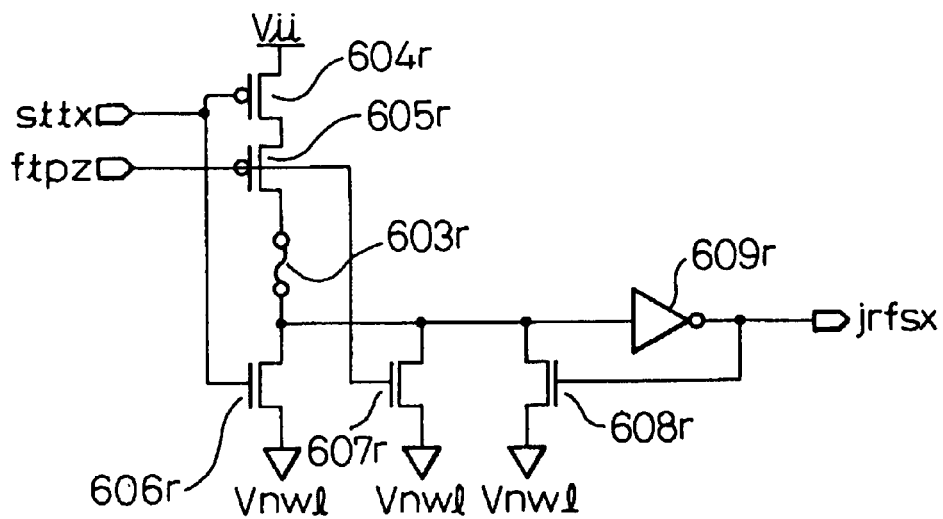
FIG. 62 is a circuit diagram showing the construction of a redundancy selecting fuse circuit in the fourth preferred embodiment of the present invention.
Figure 63:
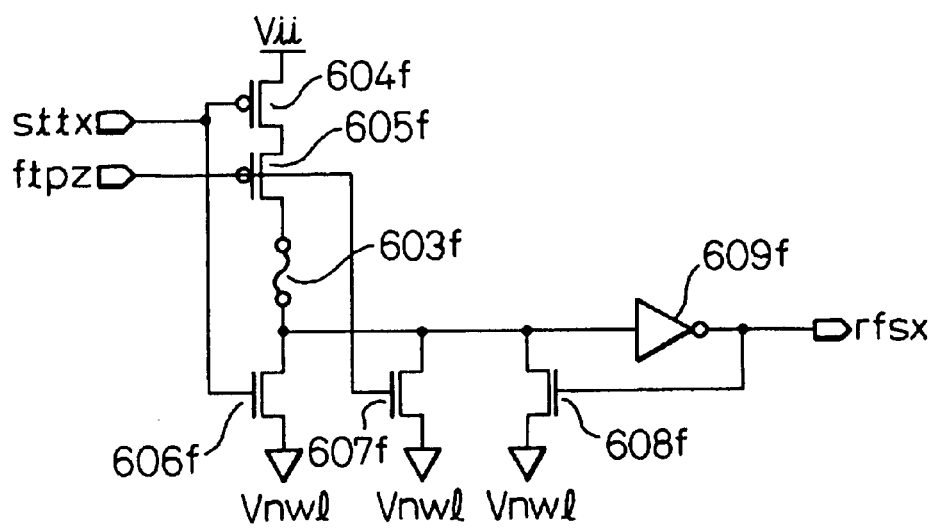
FIG. 63 is a circuit diagram showing the construction of a forced redundancy fuse circuit in the fourth preferred embodiment of the present invention.
Figure 64:
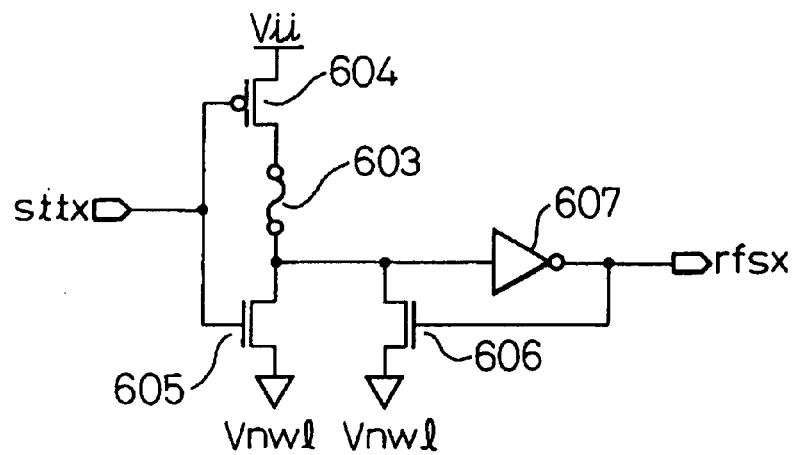
FIG. 64 is a circuit diagram showing the construction of a fuse circuit for normal selection in the fourth preferred embodiment of the present invention.

FIG. 62 is a circuit diagram showing the construction of the fuse circuit for redundancy selection in the fourth preferred embodiment; FIG. 63 is a circuit diagram showing the construction of the fuse circuit for forced redundancy in the fourth preferred embodiment; and FIG. 64 is a circuit diagram showing the construction of the fuse circuit for normal selection in the fourth preferred embodiment. In the fuse circuits shown in FIGS. 62 to 64, Vii (internal voltage) is used as the power source voltage of the power source for the "H" level of the selecting lines, while Vnwl is used as the power source voltage of the power source for the "L" level of the selecting lines.

The construction of each of the fuse circuits for redundancy selection, the fuse circuit for forced redundancy and the fuse circuit for normal selection is substantially the same as the construction in the third preferred embodiment with the exception that the logic of the output signal is inverted in comparison with the third preferred embodiment.

In FIG. 62, symbol sttx represents the control signal which remains at the "H" level until the power source becomes operative after the power source is switched on, and changes to the "L" level after the power source becomes operative. Symbol ftpz represents the control signal which rises to the "H" level when the forced redundancy operation is executed. The fuse circuit for redundancy selection shown in FIG. 62 includes a P channel transistor 604r and an N channel transistor 606r to which the control signal sttx is inputted, a P channel transistor 605r and an N channel transistor 607r to which the control signal ftpz is inputted, an N channel transistor 608r and an inverter 609r. When the fuse 603r is not cut, the N channel transistor 608r is turned OFF and the output signal jrfsx of the fuse circuit for redundancy selection (output signals jrfsr0x and jrfsr1x on the cell array No. 0 side and output signals jrfs10x and jrfs11x on the cell array No. 1 side in FIGS. 59 and 61) falls to the "L" level. When the fuse 603r is cut, the N channel transistor 608r is turned ON and the output signal jrfsx of the fuse circuit for redundancy selection rises to the "H" level. However, because the level of the output signal jrfsx of this fuse circuit for redundancy selection is inverted by the later-appearing fuse signal amplifying circuit for redundancy selection shown in FIG. 65 and is then inputted to the shift control circuit, the "H" level output signal is supplied to the shift control circuit if the fuse 603r is not cut, and the "L" level output signal is supplied to the shift control circuit when the fuse 603r is cut.

In FIG. 62, when the power source becomes operative and the control signal sttx falls to the "L" level, and moreover, when the forced redundancy process is not executed, the N channel transistor 608r is turned OFF and the output signal jrfsx of the fuse circuit for redundancy selection changes to the "L" level. When the forced redundancy process is executed, the N channel transistor 608r is turned ON and the output signal jrfsx of the fuse circuit for redundancy selection changes to the "H" level. In other words, when the forced redundancy process is executed, the result becomes the same as when the fuse 603r of the fuse circuit for redundancy selection is cut.

In FIG. 63, symbol ftpz represents the control signal which attains the "H", level when the forced redundancy operation is executed, as described above. The fuse circuit for forced redundancy shown in FIG. 62 includes a P channel transistor 604f and an N channel transistor 606f to which the control signal sttx is inputted, a P channel transistor 605f and a N channel transistor 607f to which the control signal ftpz is inputted, an N channel transistor 608f and an inverter 609f. When the fuse 603f is regarded as the object of forced redundancy and is allowed to look as being apparently cut in this case, the output signal rfsx of the fuse circuit for forced redundancy (corresponding to the output signals rfs00x and rfs15x in FIGS. 59 and 60) rises to the "H" level. It is possible to confirm under this state whether or not any fault exists in the redundancy selecting lines.

The fuse circuit shown in FIG. 64 includes a P channel transistor 604 and an N channel transistor 605 to which the control signal sttx is inputted, an N channel transistor 606 and an inverter 607. When the power source becomes operative and the control signal sttx falls to the "L" level, the N channel transistor 606 is turned OFF if the fuse 603 is not cut, and the output signal rfsx (rfsix) of the fuse circuit falls to the "L" level. When the fuse 603 is cut, the N channel transistor 606 is turned ON and the output signal rfsx of the fuse circuit rises to the "H" level.

Figure 65:
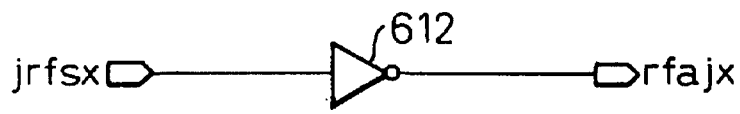
FIG. 65 is a circuit diagram showing the construction of a fuse signal amplifying circuit for redundancy selection in the fourth preferred embodiment of the present invention.
Figure 66:
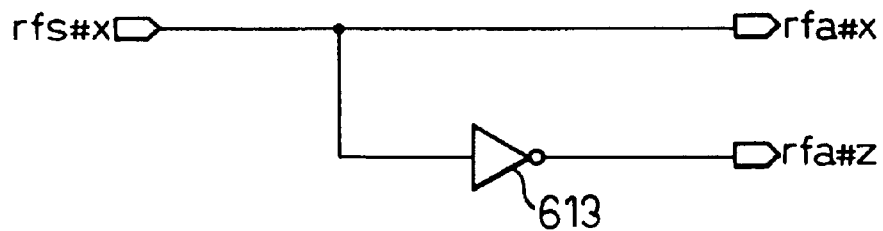
FIG. 66 is a circuit diagram showing the construction of a fuse signal generating circuit in the fourth preferred embodiment of the present invention.

FIG. 65 is a circuit diagram showing the construction of the fuse signal amplifying circuit for redundancy selection in the fourth preferred embodiment of the present invention, and FIG. 66 is a circuit diagram showing the construction of the fuse signal generating circuit in the fourth embodiment.

The fuse signal amplifying circuit for redundancy selection shown in FIG. 65 comprises an inverter 612. In this fuse signal amplifying circuit for redundancy selection, the level of the output signal jrfsx of the fuse circuit for redundancy selection is inverted and amplified by the inverter 612 in order to supply the fuse signal rfajx for redundancy selection (corresponding to the fuse signals for redundancy selection rfajr0x and rfajr1x on the cell array No. 0 side and the fuse signals for redundancy selection rfaj10x and rfaj11x on the cell array No. 1 side) having a correct logic to the shift control circuit and to the fuse pre-decoder circuit.

On the other hand, the fuse signal generating circuit shown in FIG. 66 comprises an inverter 613. This fuse signal generating circuit outputs the output signal rfs#x (rfa#x) itself of the fuse circuit for normal selection and the signal (rfa#z) obtained by inverting this output signal rfs#x by the inverter 613. In other words, this fuse signal generating circuit generates the complementary fuse signals rf#x/rfa#z.

Figure 67:
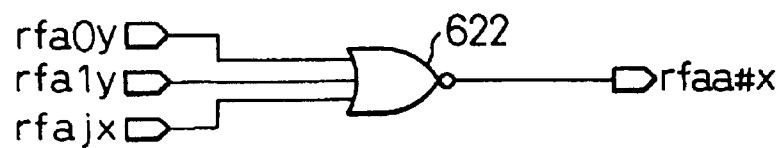
FIG. 67 is a circuit diagram showing the construction of a first fuse pre-decoder circuit in the fourth preferred embodiment of the present invention.
Figure 68:
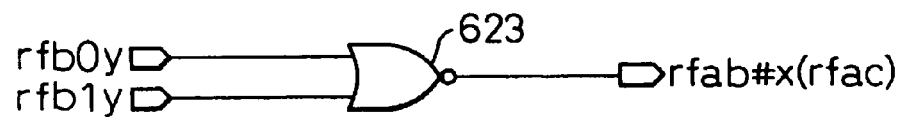
FIG. 68 is a circuit diagram showing the construction of a second fuse pre-decoder circuit in the fourth preferred embodiment of the present invention.

FIG. 67 is a circuit diagram showing the construction of the first fuse pre-decoder circuit in the fourth preferred embodiment of the present invention, and FIG. 68 is a circuit diagram showing the construction of the second fuse pre-decoder circuit in the fourth preferred embodiment.

The first fuse pre-decoder circuit shown in FIG. 67 comprises a NOR gate 622. Two fuse signals rfa0y and rfa1y (corresponding to two arbitrary signals of the fuse signals rfa00x/rfa00z and rfa01x/rfa01z outputted from the fuse signal generating circuits 610-2 and 610-3, for example) generated by different fuse signal generating circuits are inputted to this NOR gate 622, and the fuse signal for redundancy selection, that represents whether or not the fuse in the fuse circuit for redundancy selection is cut is inputted to this NOR gate, too, The NOR gate 622 operates the NOR-disjunction among the three input signals, i.e., the fuse signals rfa0y and rfa1y and the fuse signal for redundancy selection rfajx, and output the fuse pre-decode signal rfaa#x.

When the fuse in the fuse circuit for redundancy selection is not cut, the fuse signal rfajx for redundancy selection, which is obtained by inverting the level of the output signal jrfsx of the fuse circuit for redundancy selection, rises to the "H" level as described above. Therefore, the fuse pre-decode signal rfaa#x outputted from the NOR gate 622 falls to the "L" level without regard to the levels of the two fuse signals rfa0y and rfa1y. In this case, the notice that shift redundancy is no executed is transferred by the fuse pre-decode signal rfaatx to the side on which the fuse circuit for redundancy selection is disposed inside the cell array.

When the fuse in the fuse circuit for redundancy selection is cur, on the other hand, the fuse signal rfajx for redundancy selection, which is obtained by inverting the level of the output signal jrfsx of the fuse circuit for redundancy selection falls to the "L" level. In this case, therefore, shift redundancy is executed on the side in which the fuse circuit for redundancy selection is disposed in the cell array, and the fuse pre-decode signal rfaa#x of the "H" or "L" level is outputted on the basis of the combination of the two fuse signals rfa0y and rfa1y.

The fuse pre-decoder circuit shown in FIG. 68 comprises a NOR gate 623. Two fuse signals rfb0y and rfb1y generated by different fuse signal generating circuits (corresponding to arbitrary two of the fuse signals rfb00x/rfb00z and rfb01x/rfb01z outputted from the fuse signal generating circuits 610-4 and 610-4, for example) or rf0y and rfc1y are inputted to this NOR gate 623, and the NOR gate 623 generates a plurality of kinds of fuse pre-decode signals (rfab#x or rfac#x).

Figure 69:
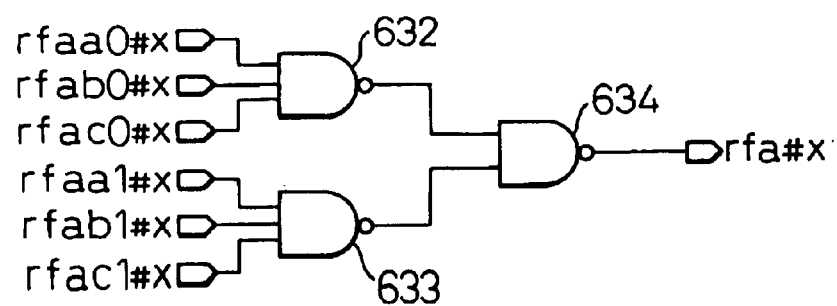
FIG. 69 is a circuit diagram showing the construction of a fuse decoder circuit in the fourth preferred embodiment of the present invention.

FIG. 69 is a circuit diagram showing the construction of the fuse decoder circuit in the fourth preferred embodiment of the present invention. This fuse decoder circuit comprises three NAND gates 632, 633 and 634. Using these three NAND gates, the fuse decoder circuit generates a fuse decode signal (for example, rfa#x) for designating the address of the fuse corresponding to the fault selecting line by combining suitably the fuse pre-decode signals generated by different fuse pre-decoder circuits (for example, rfaa0#x, rfab0#x, rfac0#x, rfaa1#x and rfac0#x).

Figure 70:
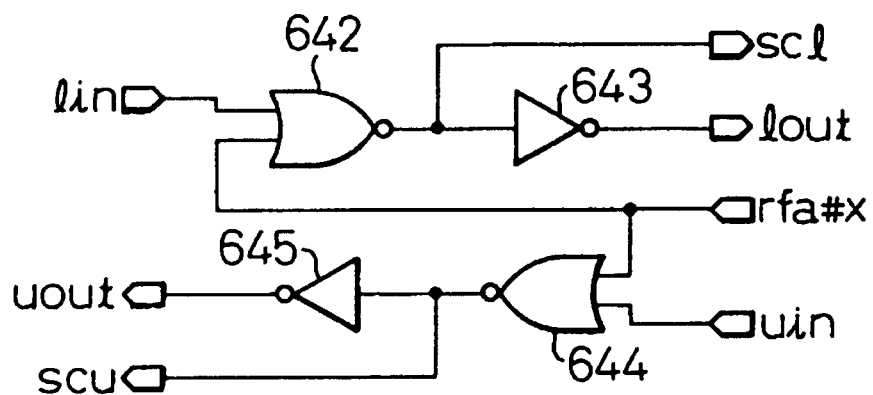
FIG. 70 is a circuit diagram showing the construction of a shift controlling circuit in the fourth preferred embodiment of the present invention.

FIG. 70 is a circuit diagram showing the construction of the shift control circuit in the fourth preferred embodiment of the present invention. Each shift control circuit shown in FIG. 70 comprises a NOR gate and an inverter in the same way as in the second preferred embodiment.

In FIG. 70, symbol rfa#x represents an arbitrary one of the fuse decode signals rfa000x to rfa063x supplied from the fuse decoder circuits. The shift control circuit has substantially the same function as in the second preferred embodiment (FIG. 21). The input signal lin of the shift control circuit is connected to the output signal lout on the left adjacent side and the other input signal uin of the shift control circuit is connected to the output signal uout on the right adjacent side. The "L" level (voltage Vnwl) is inputted to the input signal lin at the left end and the input signal uin at the right end.

The explanation will be given in further detail. A NOR gate 642 is disposed on the side of the input signal lin of the shift control circuit for normal selection shown in FIG. 70 and the inverter 643 is disposed on the side of the output signal lout. On the other hand, the NOR gate 644 is disposed on the side of the input signal uin of the shift control circuit in FIG. 70 and the inverter 645 is disposed on the side of the output signal uout.

The output signal scu outputted from the NOR gate 644 disposed on the side of the input signal uin is used as the other input signal to the selecting line drive circuit (not shown in the fourth preferred embodiment; see FIG. 20 relating to the second preferred embodiment, for example). On the other hand, the output signal scl outputted from the NOR gate 642 disposed on the side of the input signal lin is used as one of the input signals to the selecting line drive circuit. These output signals scu and scl are used for controlling the operation of the three-directional switch device in the switch unit.

Figure 71:
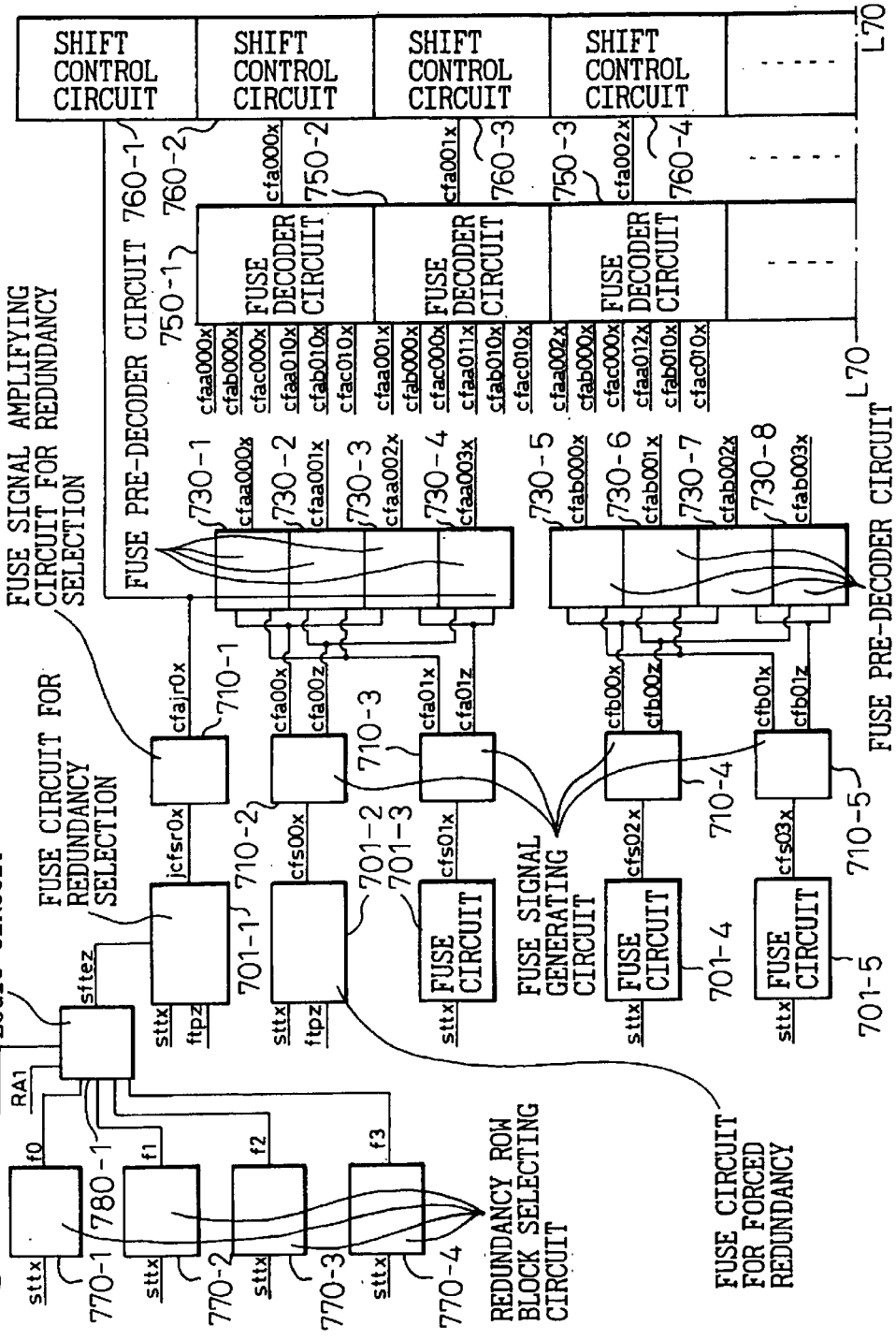
FIG. 71 is a block diagram (No. 1) showing an overall circuit construction of a fifth preferred embodiment of the present invention.
Figure 72:
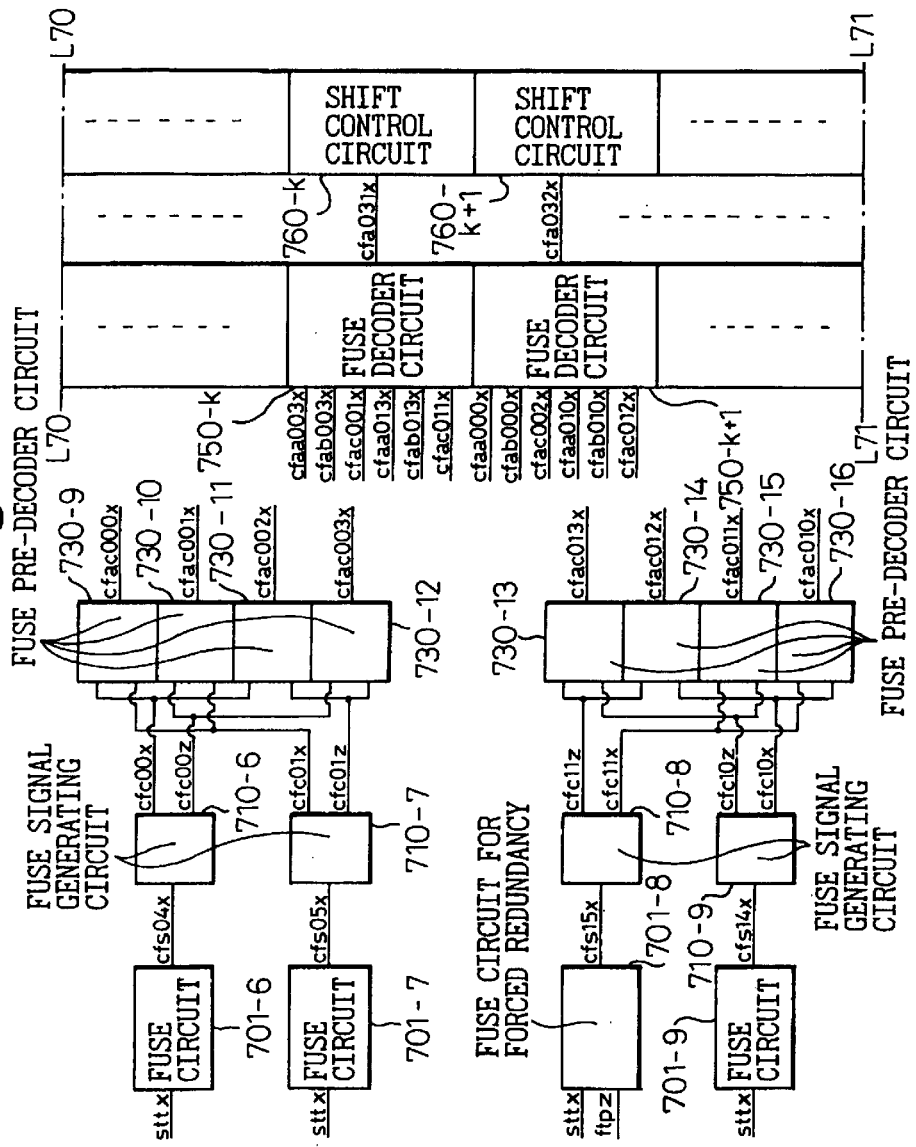
FIG. 72 is a block diagram (No. 2) showing the overall circuit construction of the fifth preferred embodiment of the present invention.
Figure 73:
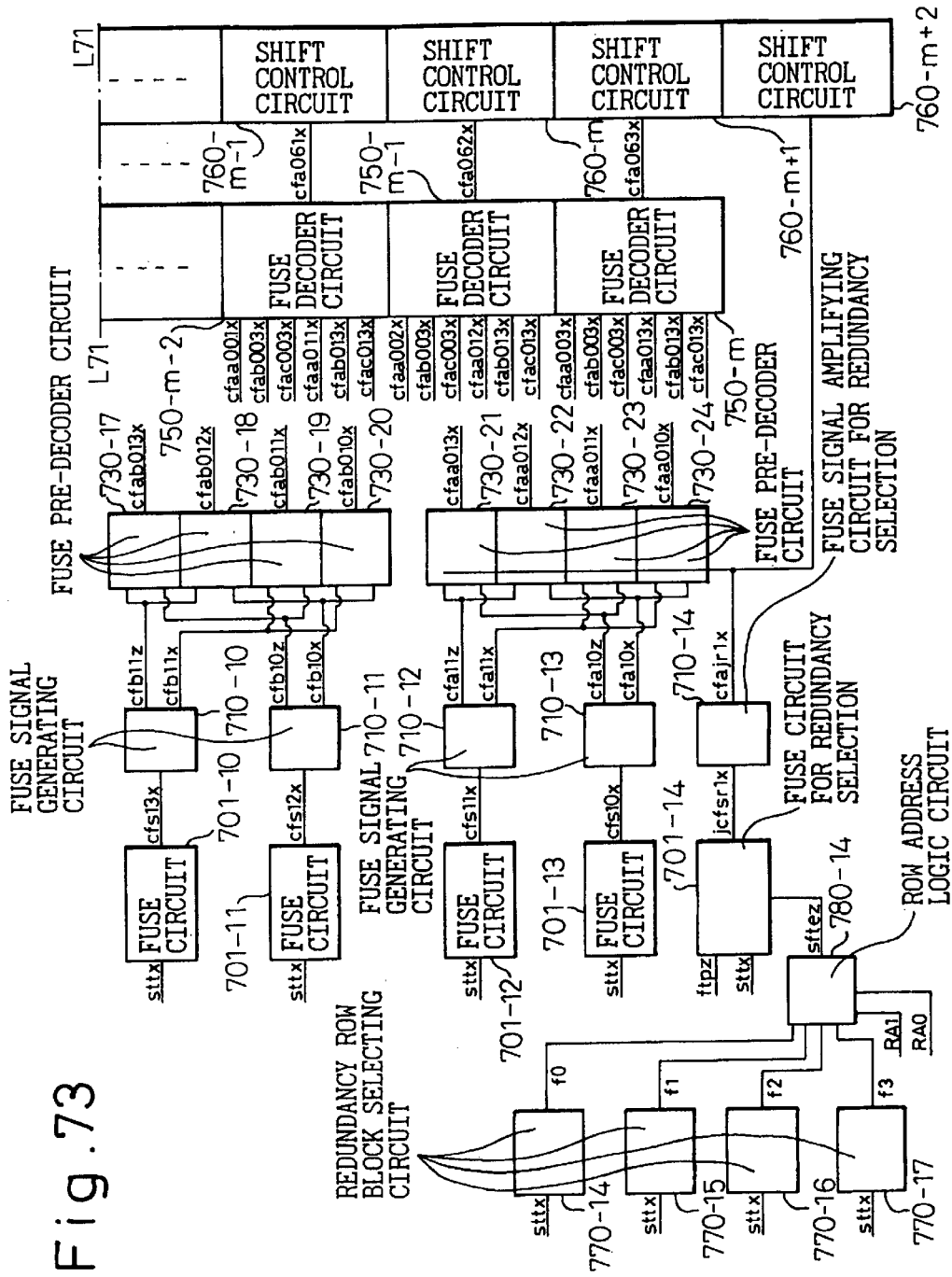
FIG. 73 is a block diagram (No. 3) showing the overall circuit construction of the fifth preferred embodiment of the present invention.

FIGS. 71 to 73 are block diagrams Nos. 1 to 3 showing the overall circuit construction of the fifth preferred embodiment of the present invention, respectively.

The fifth preferred embodiment is directed to relatively improve degree of freedom of redundancy by applying the construction shown in FIG. 55, that is, the construction in which "when the shift redundancy operation is executed for the column selecting lines disposed for a plurality of row blocks, the redundancy operation in the row block is made possible by combining the address of the column selecting line as the object of shift redundancy with the logic of the address of the row block" to the construction of the third preferred embodiment, that is, the construction "which generates the fuse decode signal by designating the address of the fuse corresponding to the fault selecting line by the combination of a plurality of fuses".

The feature of the fifth preferred embodiment resides in the following point. In the semiconductor memory device having the function of executing the shift redundancy operation of the column selecting lines for a plurality of row blocks (explained already in FIG. 53), the semiconductor memory device includes redundancy row block selecting circuits 770-1 to 770-4 for deciding whether or not redundancy is to be executed for each of the row blocks and row address logic circuits 780-1 and 780-14 for generating the logic of the addresses of a plurality of row blocks on the basis of the outputs from these redundancy row block selecting circuits. The main constituent elements other than the redundancy row block selecting circuit and the row address logic circuit, such as the fuse circuit, the fuse pre-decoder circuit, the fuse decoder circuit and the shift control circuit, are substantially the sane as those of the fifth preferred embodiments with only the exception that the logic of the output signal is inverted in comparison with the fifth preferred embodiment.

In the fifth preferred embodiment, too, the number of necessary fuses is reduced by decoding the signal generated by the combination of a plurality of fuses in the same way as in the fourth embodiment. For example, when the fuse decode signals corresponding to sixty-four column selecting lines are generated, sixty-four fuse decode signals can be generated by combining six fuses. Therefore, fourteen fuses inclusive of two fuses for redundancy selection may be prepared. In this case, the later-appearing circuits for generating the fuses for forced redundancy (that is, the fuse circuits for forced redundancy 701-2 and 701-8) have the function of confirming whether or not any fault exists in the redundancy selecting lines without cutting the fuses in practice.

The explanation will be given in further detail. The fifth preferred embodiment described above includes ten fuse circuits 701-3 to 701-7 and 701-9 to 701-13, two fuse circuits for redundancy selection 701-1 and 70-114 and two fuse circuits 701-2 and 701-8 for forced redundancy. Furthermore, this embodiment includes a fuse signal amplifying circuit for redundancy selection 710-1 for inverting the level of the output signal jcfsr0x outputted from one of the fuse circuits for redundancy selection 701-1 and amplifying the signal and a fuse signal amplifying circuit for redundancy selection 710-14 for inverting the level of the signal jcfsr1x outputted from the other fuse circuit for redundancy selection 701-14 and amplifying the signal.

The fifth preferred embodiment further includes fuse signal generating circuits 710-2 to 710-7 for generating complementary fuse signals cfa00x/cfa00z, cfa01x/cfa01z, cfb00x/cfb00z, cfb01x/cfb01z, cfc00x/cfc00z and cfc01x/cfc01z on the basis of the signal cfs00x outputted from one of the fuse circuits for forced redundancy 701-2 and the signals cfs01x to cfs05x outputted from the fuse circuits 701-3 to 701-7.

In the fifth preferred embodiment, there are further disposed fuse pre-decoder circuits 720-1 to 720-12 on the outside of the fuse signal generating circuits 710-2 to 710-7. These fuse pre-decoder circuits output twelve kinds of fuse pre-decode signals cfaa000x to cfaa003x, cfab000x to cfab003x and cfac000x to cfac003x.

The fifth preferred embodiment described above further includes fuse signal generating circuits 7108 to 710-13 for generating complementary fuse signals cfc11x/cfc11z, cfc10x/cfc10z, cfb11x/cb11z, cfb10x/cfb10z, cfa11x/cfa11z and cfa10x/cfa10z on the basis of the signal cfs15x outputted from the other fuse circuit for forced redundancy 701-8 and the signals cfs14x to cfs10x outputted from the fuse circuits 701-9 to 701-13.

In the fifth preferred embodiment described above, fuse pre-decoder circuits 730-13 to 730-24 are disposed on the output side of the fuse signal generating circuits 710-8 to 710-13. These fuse pre-decoder circuits output other twelve kinds of fuse pre-decode signals cfac010x to cfac013x, cfab010x to cfab013x and cfaa010x to cfaa013x by suitably combining the complementary fuse signals generated by the fuse signal generating circuits.

Here, the fuse signal for redundancy selection cfajr0x that represents whether or not the fuse in one of the fuse circuits 701-1 for redundancy selection is cut is supplied from the fuse signal amplifying circuit for redundancy selection 710-1 to the fuse pre-decoder circuits 730-1 to 730-4. The fuse signal for redundancy selection cfajr1x that represents whether or not the fuse in the other fuse circuit for redundancy selection 701-14 is supplied from the fuse signal amplifying circuit for redundancy selection 710-4 to the fuse pre-decoder circuits 730-21 to 730-24.

In the fifth preferred embodiment described above, there are further disposed fuse decoder circuits 750-1 to a 750-$m$ (where m is an arbitrary positive integer of 2 or more than 2, and is 64 in this case) for generating sixty-four fuse decode signals cfa000x to cfa063x corresponding to the total number of the column selecting lines by combining twelve kinds of fuse pre-decode signals outputted from the fuse pre-decoder circuits 730-1 to 730-12 of the first group with twelve kinds of fuse pre-decode signals outputted from the fuse pre-decoder circuits 730-13 to 730-24 of the second group. The fuse decode signals cfa000x to cfa063x generated by these fuse decoder circuits are inputted to shift control circuits 760-2 to 760-$m$+1 having substantially the same construction as those of the first to fourth preferred embodiments, and the shift redundancy operation is executed, whenever necessary. Incidentally, after the levels of the output signals jcfsr0x and jcfsr1x of these two fuse circuits for redundancy selection 701-1 and 701-14 are inverted by the fuse signal amplifying circuits for redundancy selection, respectively, these signals are inputted to the shift control circuits for redundancy selection 760-1 and 760-$m$+2, respectively.

In the fifth preferred embodiment shown in FIGS. 71 to 73, when the shift redundancy operation is executed for the column selecting lines disposed for a plurality of row blocks in one memory cell block, the logic of the addresses RA1 and RA2 of the row blocks is incorporated in the address of the column selecting line as the object of the shift redundancy operation. In this way, the column selecting lines driven for a plurality of row blocks receive the logic of the address of the row block corresponding to the row block, and the redundancy operation can be executed in the row block unit.

Figure 74:
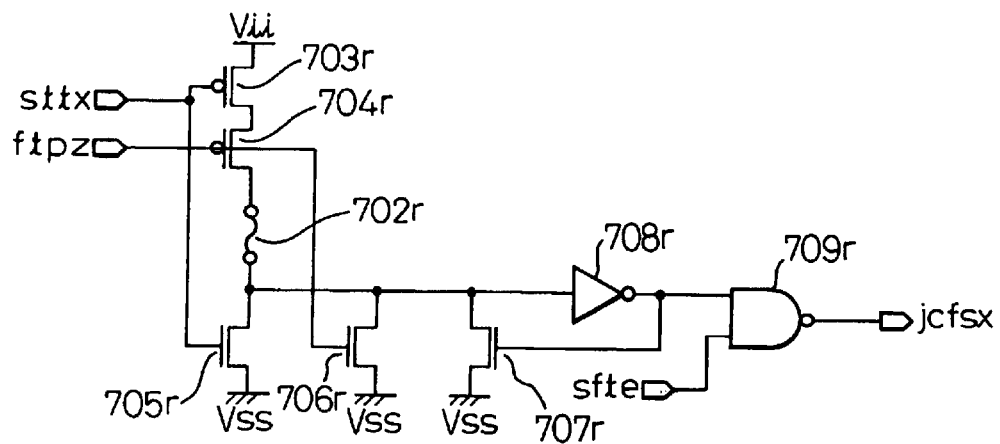
FIG. 74 is a circuit diagram showing the construction of a redundancy selecting fuse circuit in the fifth preferred embodiment of the present invention.
Figure 75:
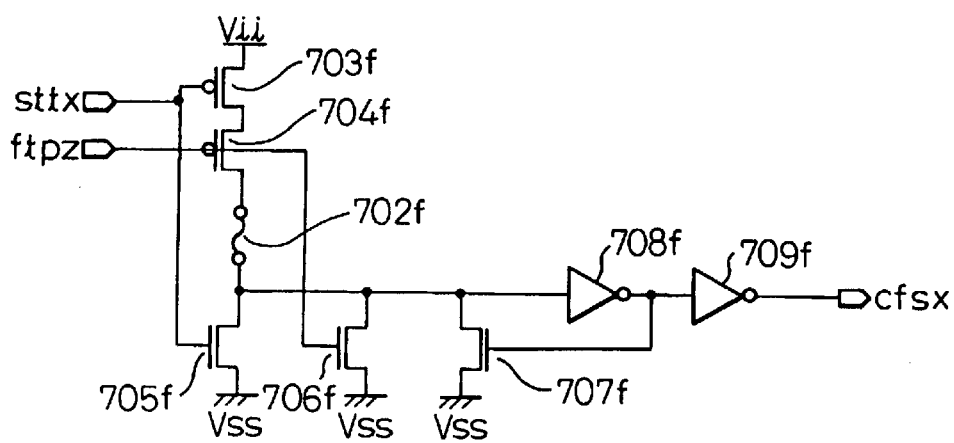
FIG. 75 is a circuit diagram showing the construction of a fuse circuit for forced redundancy in the fifth preferred embodiment of the present invention.
Figure 76:
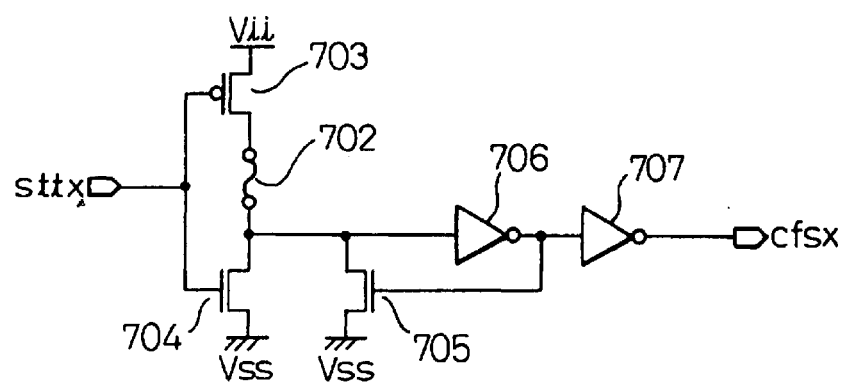
FIG. 76 is a circuit diagram showing the construction of a fuse circuit for normal selection in the fifth preferred embodiment of the present invention.

FIG. 74 is a circuit diagram showing the construction of the fuse circuit for redundancy selection in the fifth preferred embodiment of the present invention; FIG. 75 is a circuit diagram showing the construction of the fuse circuit for forced redundancy in the fifth preferred embodiment; and FIG. 76 is a circuit diagram showing the construction of the fuse circuit for normal selection in the fifth embodiment. In the fuse circuits shown in FIGS. 74 to 76, Vii (internal voltage) is used as the power source voltage of the power source for the "H" level of the selecting lines, and Vss of the earth potential is used as the power source voltage of the power source for the "L" level of the selecting lines.

The construction of each of the fuse circuit for redundancy selection, the fuse circuit for forced redundancy and the fuse circuit for normal selection shown in FIGS. 74 to 76 is substantially the same as the construction in the fourth preferred embodiment with the exceptions that the logic of the output signal is inverted with respect to the fourth embodiment and that a redundancy enable signal sftez (corresponding to sfte in later-appearing FIG. 85) is inputted to each of the two fuse circuits for redundancy selection.

In FIG. 74, symbol sttx represents the control signal which remains at the "H" level until the power source becomes operative after the power source is switched on and then changes to the "L" level after the power source becomes operative. Symbol ftpz represents the control signal which rises to the "H" level when forced redundancy is executed. The fuse circuit for redundancy selection shown in FIG. 74 includes a P channel transistor 703$r$ and an N channel transistor 705$r$ to which the control signal sttx is inputted, a P channel transistor 704$r$ and an N channel transistor 706$r$ to which the control signal ftpz is inputted, an N channel transistor 707$r$, an inverter 708$r$ and a NAND gate 709$r$.

When the fuse 702$r$ is not cut, the N channel transistor 707$r$ is turned OFF and the output signals jcfsx of the fuse circuits for redundancy selection (corresponding to the output signals jcfsr0x and jcfsr1x shown in FIGS. 71 and 73) rise to the "H" level. When the fuse 702$r$ is cut, the N channel transistor is turned ON and if the redundancy enable signal sfte is at the "H" level in this instance, the output signal jcfsx of the fuse circuit for redundancy selection falls to the "L" level. Incidentally, the level of the output signal jcfsx of this fuse circuit for redundancy selection is inverted by the fuse signal amplifying circuit for redundancy selection shown in later-appearing FIG. 77 and the signal is then inputted to the shift control circuit. Therefore, the "L" level output signal is supplied to the shift control circuit when the fuse 702$r$ is not cut, and the "H" level signal is supplied to the shift control circuit when the fuse 702$r$ is cut (with the redundancy enable signal sfte remaining at the "H" level).

When the power source becomes operative and the control signal sttx falls to the "L" level in FIG. 74, the N channel transistor 707$r$ is turned OFF and the output signal jcfsx of the fuse circuit for redundancy selection rises to the "H", level if the forced redundancy process is not executed. When the forced redundancy process is executed, the N channel transistor 707$r$ is turned ON and the output signal from the inverter 708 rises to the "H" level. Here, the output signal jcfsx of the fuse circuit for redundancy selection falls to the "L" level only when the redundancy enable signal sfte is at the "H" level. In other words, when the forced redundancy process is executed under the condition that the redundancy enable signal sfte is at the "H" level, the result becomes the same as when the fuse 702$r$ of the fuse circuit for redundancy selection is cut.

In FIG. 75, symbol ftpz represents the control signal which rises to the "H" level when the forced redundancy process is executed, as already described. The fuse circuit for forced redundancy show in FIG. 76 includes a P channel transistor 703f and an N channel transistor 705f to which the control signal sttx is inputted, a P channel transistor 704f and an N channel transistor 706f to which the control signal ftpz is inputted, an N channel transistor 707f and two inverters 708f and 709f. Here, when the fuse 702f is regarded as the object of forced redundancy and is caused to look as being apparently cut, the output signal cfsx of the fuse circuit for forced redundancy (corresponding to the output signals cfs00x and cfs15x in FIGS. 71 and 72) falls to the "L" level. It is possible to confirm under this state whether or not any fault exists in the redundancy selecting lines.

The fuse circuit shown in FIG. 76 includes a P channel transistor 703 and an N channel transistor 704 to which the control signal sttx is inputted, an N channel transistor 705 and two inverters 706 and 707. When the power source becomes operative and the control signal sttx falls to the "L" level, the N channel transistor 705 is turned OFF and the output signal cfsx (cfs#x) of the fuse circuit rise to the "H" level if the fuse 702 is not cut. When the fuse 702 is cut, the N channel transistor 705 is turned ON and the output signal cfsx of the fuse circuit falls to the "L" level.

Figure 77:
FIG. 77 is a circuit diagram showing the construction of a fuse signal amplifying circuit for redundancy selection in the fifth preferred embodiment of the present invention.
Figure 79:
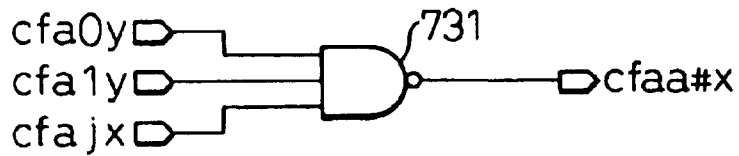
FIG. 79 is a circuit diagram showing the construction of a first fuse pre-decoder circuit in the fifth preferred embodiment of the present invention.

FIG. 77 is a circuit diagram showing the construction of the fuse signal amplifying circuit for redundancy selection in the fifth preferred embodiment, and FIG. 79 is a circuit diagram showing the construction of the fuse signal generating circuit in the fifth preferred embodiment.

The fuse signal amplifying circuit for redundancy selection shown in FIG. 77 comprises an inverter 711. In this fuse signal amplifying circuit for redundancy selection, the level of the output signal jcfsx of the fuse circuit for redundancy selection is inverted and the signal is then amplified by the inverter 711 in order to supply the fuse signal cfajx having the correct logic (corresponding to the fuse signal for redundancy selection cfajr0x and cfajr1x in FIGS. 71 and 73) to the shift control circuit and the fuse pre-decoder circuit.

Figure 78:
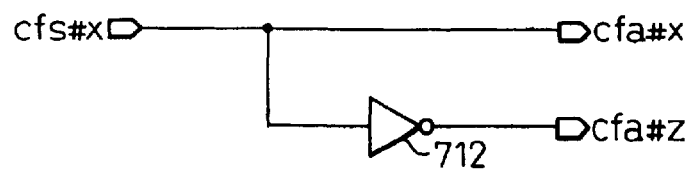
FIG. 78 is a circuit diagram showing the construction of a fuse signal generating circuit in the fifth preferred embodiment of the present invention.

On the other hand, the fuse signal generating circuit shown in FIG. 78 comprises an inverter 712. This fuse signal generating circuit outputs the output signal cfs#x (cfa#x) itself of the fuse circuit for normal selection and the signal (cfa#z) obtained by inverting this output signal cfs#x by the inverter 712. In other words, the fuse signal generating circuit generates the complementary fuse signals cfa#x/cfa#z.

Figure 80:
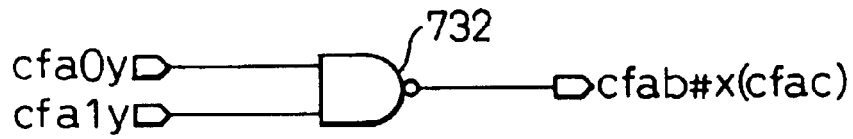
FIG. 80 is a circuit diagram showing the construction of a second fuse pre-decoder circuit in the fifth preferred embodiment of the present invention.

FIG. 79 is a circuit diagram showing the construction of the first fuse pre-decoder circuit in the fifth preferred embodiment of the present invention and FIG. 80 is a circuit diagram showing the construction of the second fuse pre-decoder circuit in the fifth preferred embodiment.

The first fuse pre-decoder circuit shown in FIG. 79 comprises a NAND gate 731. Two fuse signals cfa0y and cfa1y generated by different fuse signal generating circuits (corresponding to arbitrary two of the fuse signals cfa00x/cfa00z and cfa01x/cfa01z outputted from the fuse signal generating circuits 710-2 and 710-3, for example), and a fuse signal cfajx for redundancy selection, that represents whether or not the fuse in the fuse circuits for redundancy selection is cut, are inputted to the NAND gate 731. Furthermore, the NAND gate 731 operates the non-conjunction among the three input signals, that is, the fuse signals cfa0y and cfa1y and the fuse signal cfajx for redundancy selection, and outputs the fuse pre-decode signal cfaa#x.

Here, when the fuse in the fuse circuit for redundancy selection is not cut, the fuse signal for redundancy selection cfajx, that is obtained by inverting the level of the output signal jcfsx of the fuse circuit for redundancy selection, falls to the "L" level as described above. Therefore, the fuse pre-decode signal cfaa#x outputted from the NAND gate 622 rises to the "H" level irrelevantly to the levels of the two fuse signals cfa0y and cfa1y. In this case, the fuse pre-decode signal cfaa#x transfers the report that the shift redundancy process is not executed on the side in which the fuse circuit for redundancy selection inside the memory cell block is disposed.

When the fuse in the fuse circuit for redundancy selection is cut, on the other hand, the fuse signal cfajx for redundancy selection, that is obtained by inverting the level of the output signal jcfsx of the fuse circuit for redundancy selection, rises to the "H" level. In this case, therefore, the shift redundancy process is executed on the side in which the fuse circuit for redundancy selection in the cell array is disposed, and the "H" or "L" level fuse pre-decode signal cfaa#x is outputted on the basis of the combination of the two fuse signals cfa0y and cfa1y.

The fuse pre-decoder circuit shown in FIG. 80 comprises a NAND gate 732. Two fuse signals cfb0y and cfb1y generated by different fuse signal generating circuits (corresponding to arbitrary two of the fuse signals cfb00x/cfb00z and cfb01x/cfb01z outputted from the fuse signal generating circuits 710-4 and 710-5, for example) or cfc0y an cfc1y are inputted to this NAND gate 732, and this NAND gate generates a plurality of kinds of fuse pre-decode signals (cfab#x or cfac#x).

Figure 81:
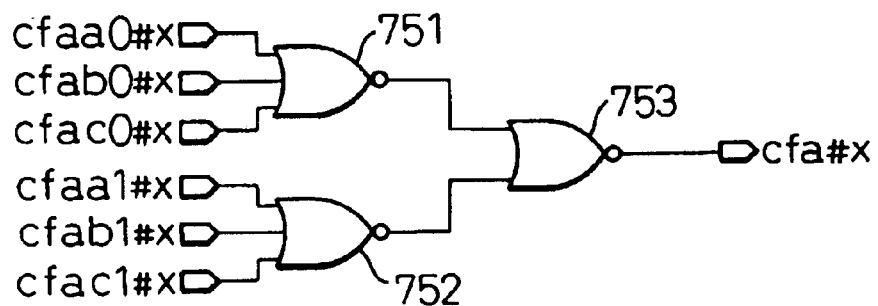
FIG. 81 is a circuit diagram showing the construction of a fuse decoder circuit in the fifth preferred embodiment of the present invention.

FIG. 81 is a circuit diagram showing the construction of the fuse decoder circuit in the fifth preferred embodiment of the present invention. The fuse decoder circuit shown in FIG. 81 comprises three NOR gates 751, 752 and 753. Using these three NOR gates, the fuse decoder circuit generates the fuse decode signal (for example, cfa#x) for designating the address of the fuse corresponding to the fault selecting line by suitably combining the fuse pre-decode signals generated by different fuse pre-decoder circuits (for example, cfaa0#x, cfab0#x, cfac0#x, cfaa1#x and cfac1#x).

Figure 82:
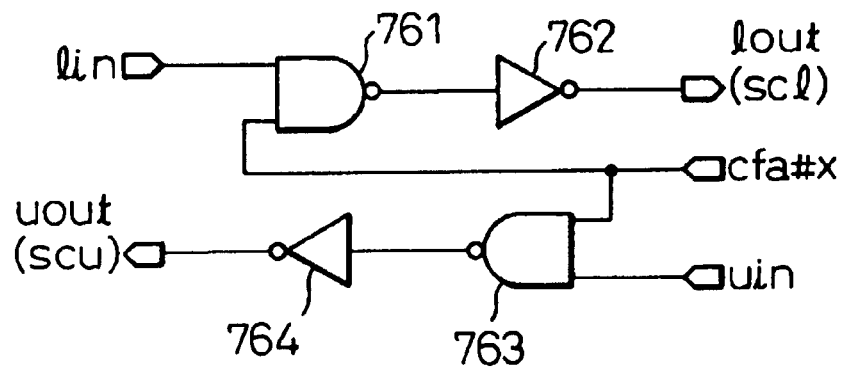
FIG. 82 is a circuit diagram showing the construction of a shift controlling circuit in the fifth preferred embodiment of the present invention.

FIG. 82 is a circuit diagram showing the construction of the shift control circuit in the fifth preferred embodiment of the present invention. Each shift control circuit shown in FIG. 82 comprises a NAND gate and an inverter unlike the fourth preferred embodiment.

In FIG. 82, symbol cfa#x represents an arbitrary one of the fuse decode signals cfa000x to cfa063x supplied from the fuse decoder circuits. The shift control circuit has substantially the same function as that of the first preferred embodiment (FIG. 7). The input signal lin of the shift control circuit is connected to the left adjacent output signal lout, and the other input signal uin of the shift control circuit is connected to the right adjacent output signal uout, The "H" level (voltage Vii) is inputted is inputted to the input signal lin at the left end and to the input signal uin at the right end.

The explanation will be given in further detail. The NAND gate 761 is disposed on the side of the input signal lin of the shift control circuit for normal selection shown in FIG. 82, and the inverter 762 is disposed on the side of the output signal lout. On the other hand, the NAND gate 762 is disposed on the side of the input signal uin of the shift control circuit shown in FIG. 82, and the inverter 764 is disposed on the side of the output signal uout.

The output signal uout outputted from the inverter 764 is used as the other input signal (signal scu in FIG. 6) of the selecting line drive circuit (not shown in the fifth preferred embodiment; refer to FIG. 6 relating to the first preferred embodiment, for example). On the other hand, the output signal lout outputted from the inverter 762 is used as one of the input signals (signal scl in FIG. 6) of the selecting line drive circuit. These output signals uout and lout are used for controlling the operation of the three-directional switch device in the switch unit.

Next, the concrete structural example of the eight redundancy row block selecting circuits 770-1 to 770-4 (FIG. 71) and 770-1 to 770-4 (FIG. 73), two row address logic circuits 780-1 (FIG. 71) and 780-13 (FIG. 73), and their operations, will be explained.

Figure 83:
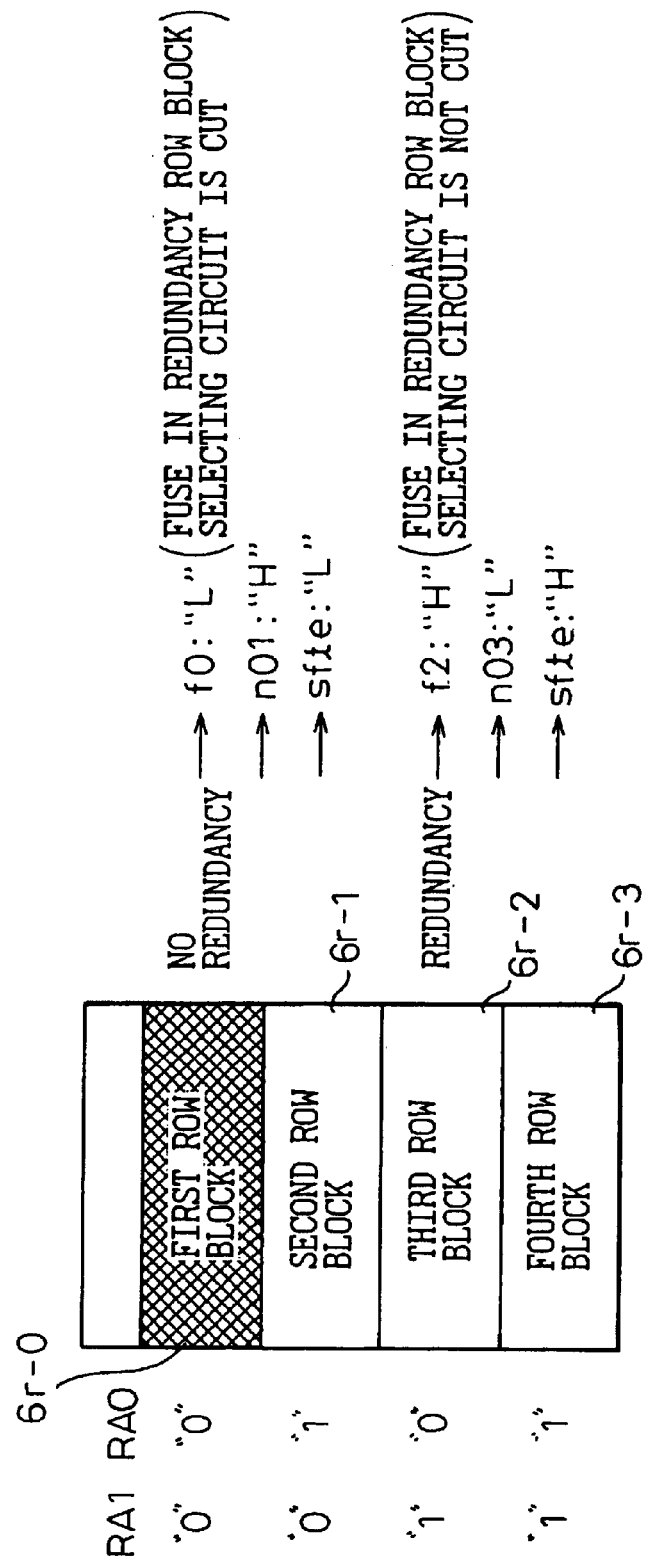
FIG. 83 is a diagram showing an example of a state of four row blocks existing in each memory cell block in the fifth preferred embodiment of the present invention.
Figure 84:
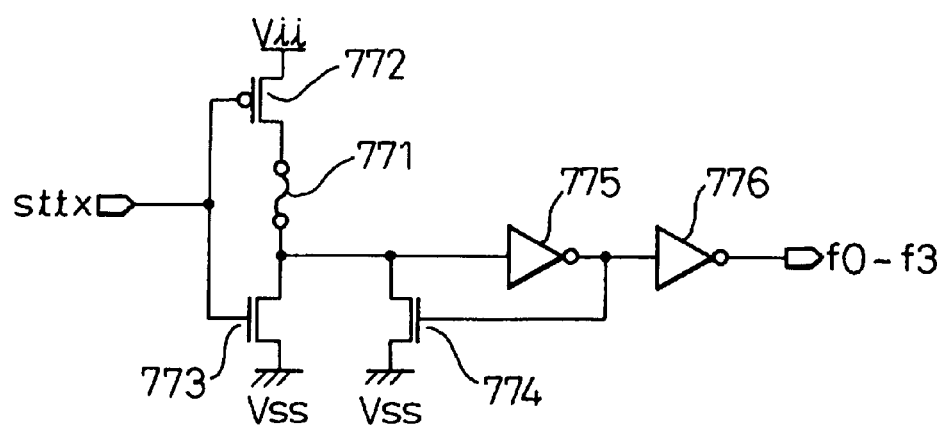
FIG. 84 is a circuit diagram showing the construction of a redundancy row block selecting circuit in the fifth preferred embodiment of the present invention.
Figure 85:
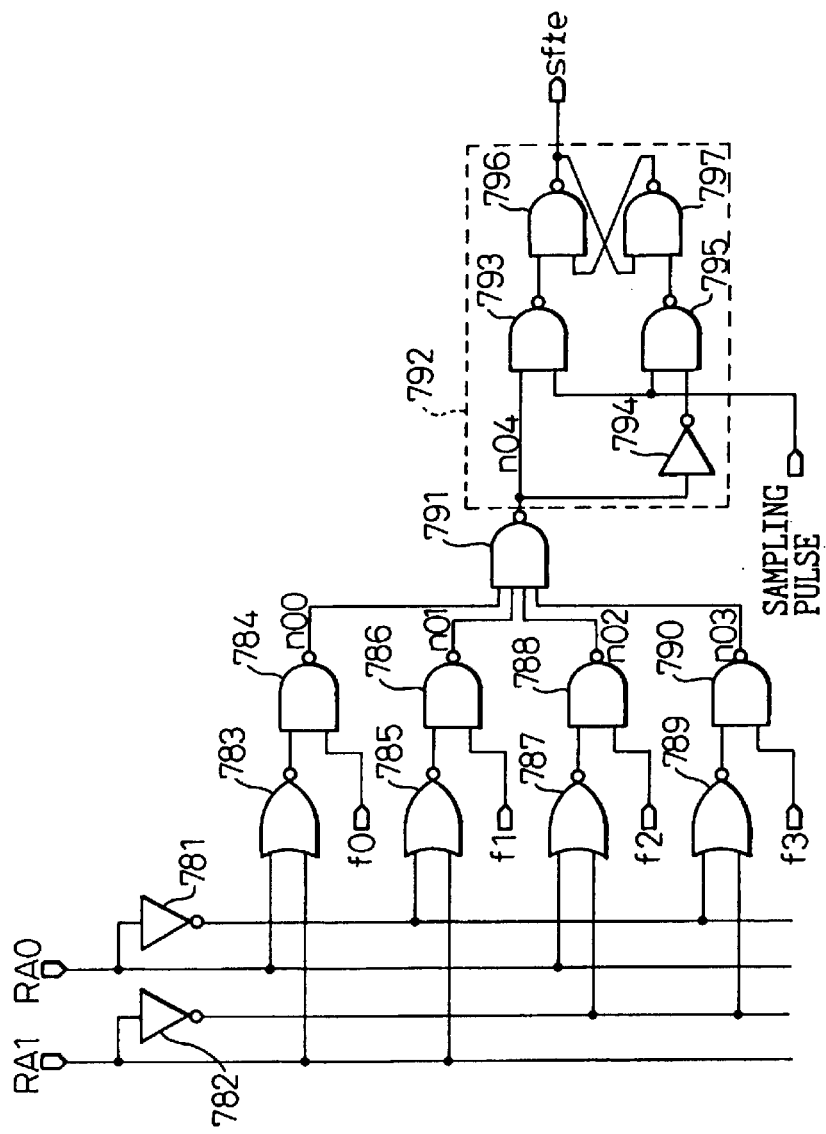
FIG. 85 is a circuit diagram showing the construction of a row address logic circuit in the fifth preferred embodiment of the present invention.
Figure 86:
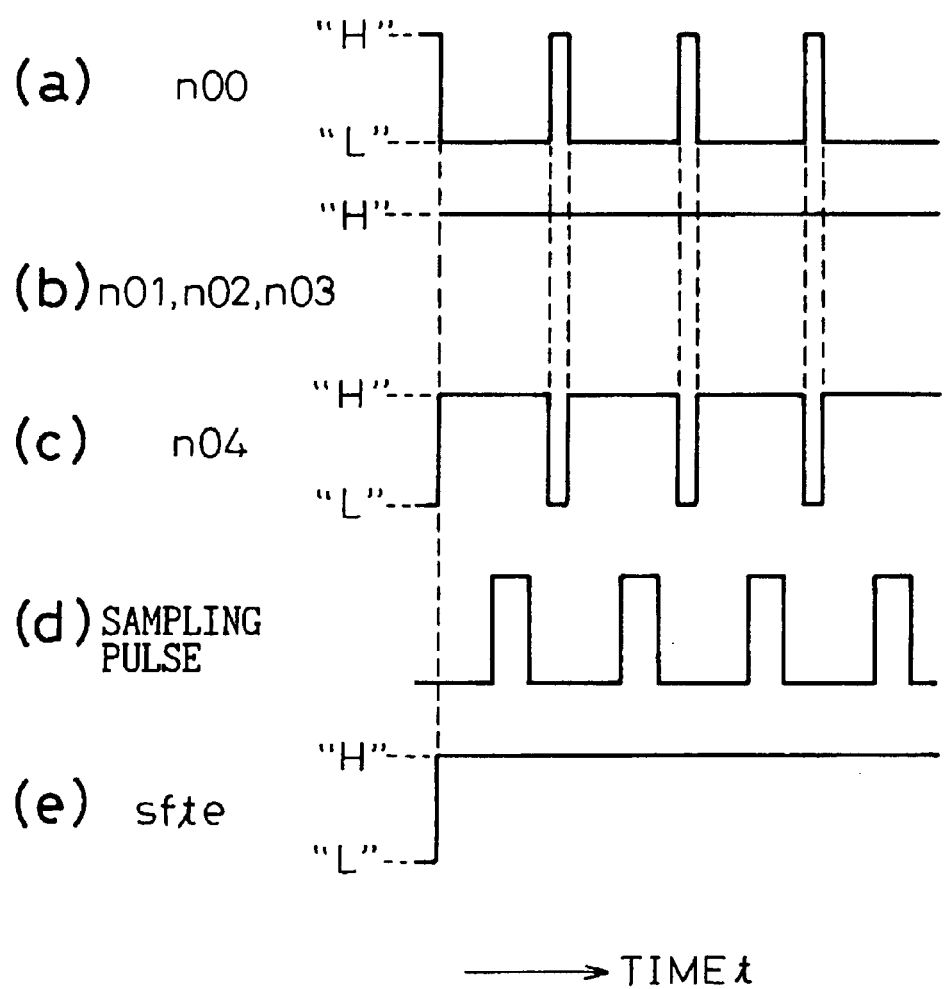
FIG. 86 is a timing chart useful for explaining the operation of the row address logic circuit shown in FIG. 85.

FIG. 83 is a schematic view showing an example of the state of four row blocks existing in each memory cell block in the fifth preferred embodiment of the present invention; FIG. 84 is a circuit diagram showing the construction of the redundancy row block selecting circuit in the fifth preferred embodiment; FIG. 85 is a circuit diagram showing the row address logic circuit in the fifth preferred embodiment; and FIG. 86 is a timing chart useful for explaining the operation of the row address logic circuit shown in FIG. 85.

The explanation will be given hereby on the four row blocks 6r-0 to 6r-3 existing in each memory cell block shown in FIG. 83. The first block 6r-0 is selected when the logic of the addresses RA0 and RA1 of the row block is "0" (for example, the "L" level), and the second row block 6r-1 is selected when the logics of the addresses RA0 and RA1 of the row block are "1" (for example, the "H" level) and "0", respectively. The third row block 6r-2 is selected when the logics of the addresses RA0 and Ra1 of the row block are "0" and "1", respectively, and the fourth row block 6r-3 is selected when the logics of the addresses Ra0 and RA1 of the row block are "1" and "1", respectively.

Each redundancy row block selecting circuit (any one of 770-1 to 770-4 and 770-14 to 770-17) shown in FIG. 84 includes a P channel transistor 772 and an N channel transistor 773 to which the control signal sttx is inputted, an N channel transistor 774 and two inverters 715 and 776. When the power source becomes operative and the control signal sttx falls to the "L" level, the N channel transistor 774 is turned OFF and the output signals f0 to f3 rise to the "H" level if the fuse 771 is not cut. When the fuse 771 is cut, the N channel transistor 774 is turned ON and the output signals f0 to f3 fall to the "L" level.

The row address logic circuit 780-1 or 780-14 shown in FIG. 85 includes four NOR gates 783, 785, 787 and 789 to which four combinations of logics obtained by selecting two kinds of logics from the two kinds of logics of the addresses RA0 and RA1 of the four row blocks and two kinds of logic obtained by inverting the logics of RA0 and RA1 by inverters 781 and 782, respectively, as the input. In this case, any one of the output signals of the four NOR gates 783, 785, 787 and 789 rises to the "H" level in such a manner as to correspond to the row block selected on the basis of the logics of the address RA0 and RA1 of the row block. When the logics of the addresses RA0 and RA1 of the row block are "0" and "0", for example, the output signal of the first NOR gate 783 rises to the "H" level while the output signals of the other NOR gates all change to the "L" level, so that the first row block 6R-0 is selected. Similarly, the output signals of the second to fourth NOR gates rise to the "H" level in accordance with the logics of the addresses of RA0 and RA1 of the row block, and the second to fourth row blocks 6r-1 to 6r-3 are selected.

Four NAND gates 784, 786, 788 and 790 are disposed on the output side of these NOR gates 783, 785, 787 and 789. One of the output signals from the NOR gates 73, 785, 787 and 789 and one of the output signals f0 to f3 from the redundancy row block selecting circuit are inputted to each of these NAND gates 784, 786, 788 and 790. A NAND gate 91 is disposed on the output side of the NAND gates 784, 786, 788 and 790, When the shift redundancy process is executed for the selected row block, the fuse in the redundancy row block selecting circuit corresponding to this selected row block is not cut. Therefore, the output signal (any one of f0 to f3) of the redundancy row block selecting circuit rises to the "H" level. Therefore, the output signal of the NOR gate, to which the "H" level output signal from the redundancy row block selecting circuit and the "H" level output signal of the NAND gate corresponding to the selected row block are applied as the input signals, changes to the "L" level. This "L" level output signal is outputted as the "H" level output signal through the NAND gate 79.

A redundancy row block data latch circuit 792 including a data latch unit for latching the data as to whether or not shift redundancy is to be executed for the selected row block is disposed on the output side of the NAND gate 791 described above. This redundancy row block data latch circuit 792 includes an inverter 794 for inverting the level of the output signal of the NAND gate 791, two NAND gates 793 and 795 for receiving the sampling pulse and the output signals of the NAND gate 791 and the inverter 794 as the input signals thereof, and a data latch unit comprising two NAND gates 796 and 797. This data latch unit outputs the redundancy enable signal sfte which enables to execute shift redundancy for selected row block.

When the shift redundancy process is not executed for only the first row block 6r-0 but is made for the other row blocks as shown in FIG. 83, the fuse in the redundancy row block selecting circuit outputs the output signal f0 so as to bring the output signal f0 to the "L" level. The fuses of the other redundancy row block selecting circuits are not cut (the output signals f1 to f3 rise to the "H" level).

Next, when the first row block 6r-0 is selected (RA0="0", RA1="0"), the Output signal of the fist NOR gate 783 rises to the "H" level and the output signal of the first NAND gate 784 rises to the "H" level (with the node n00 rising to the "H" level). The output signals of the other NOR gates all change to the "L" level. Therefore, the output signals of the second to fourth NAND gates all rise to the "H" level (with nodes n01 to n03 changing to the "H" level). As a result, because the input signals of the NAND gate 791 are all at the "H" level, the NAND gate 791 outputs the "L" level output signal (with the node n04 at the "L" level). The "L" level signal of the node n04 passes through the redundancy row block data latch circuit and is outputted as the same "L" level redundancy enable signal sfte. When the redundancy enable signal sfte is at the "L" level, the output signal of the fuse circuit for redundancy selection becomes the "H" level irrespective of the state of the fuse of the fuse circuit for redundancy selection, and the shift redundancy operation is not executed in the selected first row block 6r-0.

When the third row block 6r-2 is selected (RA0="0", RA1="1"), the output signal of the third NOR gate 787 changes to the "H" level, consequently, the output signal of the third NAND gate 788 changes to the "L" level. On the other hand, since the output signals of the other NOR gates are all at the "L" level, the output signals of the first NAND gate 784, the second NAND gate 786 and the fourth NAND gate 790 all change to the "H" level. In other words, the node n02 is at the "L" level, the nodes n00, n01 and n03 are at the "H" level. Therefore, the NAND gate 791 outputs the "H" level output signal (with n04 at the "H" level) and the redundancy enable signal sfte changes to the "H" level. When the redundancy enable signal sfte is at the "H" level, the level of the output signal of the fuse circuit for redundancy selection is determined in accordance with the state of the fuse of the fuse circuit for redundancy selection. Therefore, the shift redundancy operation for the selected third row block 6r-2 can be executed by cutting the fuse of the fuse circuit for redundancy selection.

Similarly, it is possible to execute the shift redundancy operation for the first and fourth row blocks without executing the shift redundancy operation for the second and third row blocks. In this case, the fuses of the redundancy row block selecting circuits outputting the output signals f1 and f2 are cut so as to bring the output signals f1 and f2 to the "L" level, and the fuses of the redundancy row block selecting circuits outputting the output signals f0 and f3 are not cut, so that the output signals f0 and f3 changes to the "H" level.

Here, when the second or third row block is selected, the output signals of the first to fourth NAND gates 784, 786, 788 and 790 all change to the "H" level (with n00 to n03 being at the "H" level). Therefore, the NAND gate 791 outputs the "L" level output signal (with n04 being at the "L" level), and the redundancy enable signal sfte, too, falls to the "L" level, so that the shift redundancy operation is not executed in the selected row block.

When the first or fourth row block is selected, either one of the first and fourth NAND gates 784 and 790 outputs the "L" level output signal. Therefore, the NAND gate 791 outputs the "H" level output signal (with n04 being at the "H" level). Consequently, the redundancy enable signal sfte, too, changes to the "H" level, and the shift redundancy operation can be executed in the selected row block.

The function of the redundancy row block selecting circuits 770-1 to 770-4 and 770-14 to 770-17 and the function of the row address logic circuits 780-1 and 780-14 can be summarized as follows.

When the fuse in the redundancy row block selecting circuit corresponding to the row block not executing the shift redundancy operation is cut in advance, the redundancy enable signal sfte changes to the "L" level when the row block, that does not execute this shift redundancy operation, is selected, and the shift redundancy operation is not executed in this selected row block. On the contrary, when the fuse in the redundancy row block selecting circuit corresponding to the row block that executes the shift redundancy operation is left uncut, the redundancy enable signal sfte changes to the "H" level when the row block executing this shift redundancy operation is selected, and the shift redundancy operation is executed for the selected row block.

The operation of the redundancy row block data latch circuit 792 in the row address logic circuit 780-1 will be explained with reference to the timing chart of FIG. 86.

When it is desired to leave the node n04 at the "H" level while the node n01 to n03 is left at the "H" level ((b) of FIG. 86) and the node n00 at the "L" level ((a) of FIG. 86), that is, when it is desired to execute the shift redundancy operation, the node n04 will fall temporarily to the "L" level as it is effected by the node n00 if the node n00 rises temporarily to the "H" level.

The redundancy row block data latch circuit 792 is disposed in order to prevent such a problem. Here, the state before the node n00 rises temporarily to the "H" level is latched by the rise of the signal generating the pulse (sampling pulse) at the timing shown in FIG. 86(d), and such a latched state is outputted as the redundancy enable signal sfte (FIG. 86(e)). The level of the redundancy enable signal sfte at this time is the same as the level of the node n04 as described above. Therefore, if the node n04 is at the "H" level, the level of the redundancy enable signal sfte is the "H" level, and if the former is the "L" level, the latter is the "L" as well. Therefore, the selection can be made in such a fashion that when the signal of the address of the row block, that selects a specific row block, is applied, the shift redundancy operation is executed and when the signals of the addresses of other row blocks are applied, the shift redundancy operation is not executed. In this way, the degree of freedom of redundancy can be relatively increased.

Figure 87:
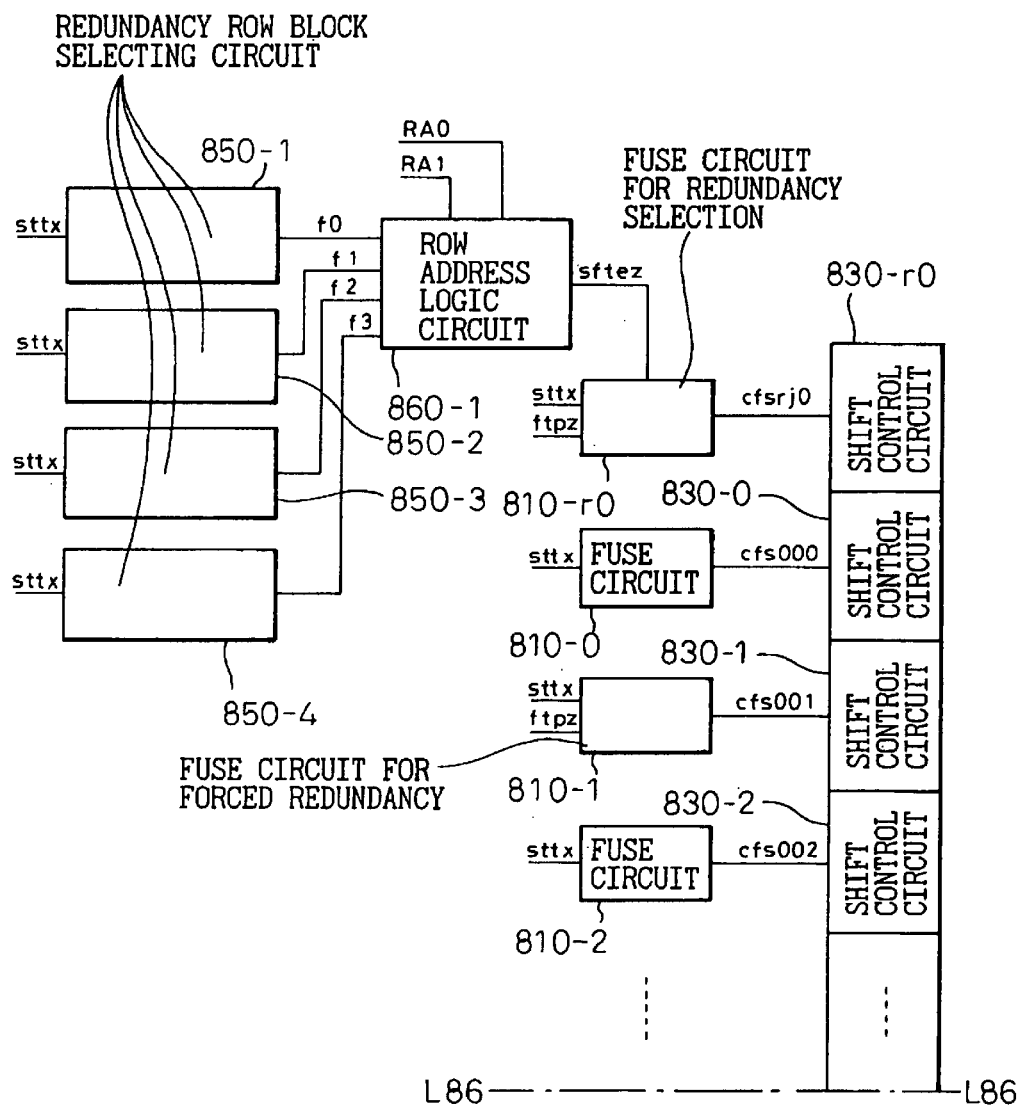
FIG. 87 is a block diagram (No. 1) showing an overall construction of a sixth preferred embodiment of the present invention.
Figure 88:
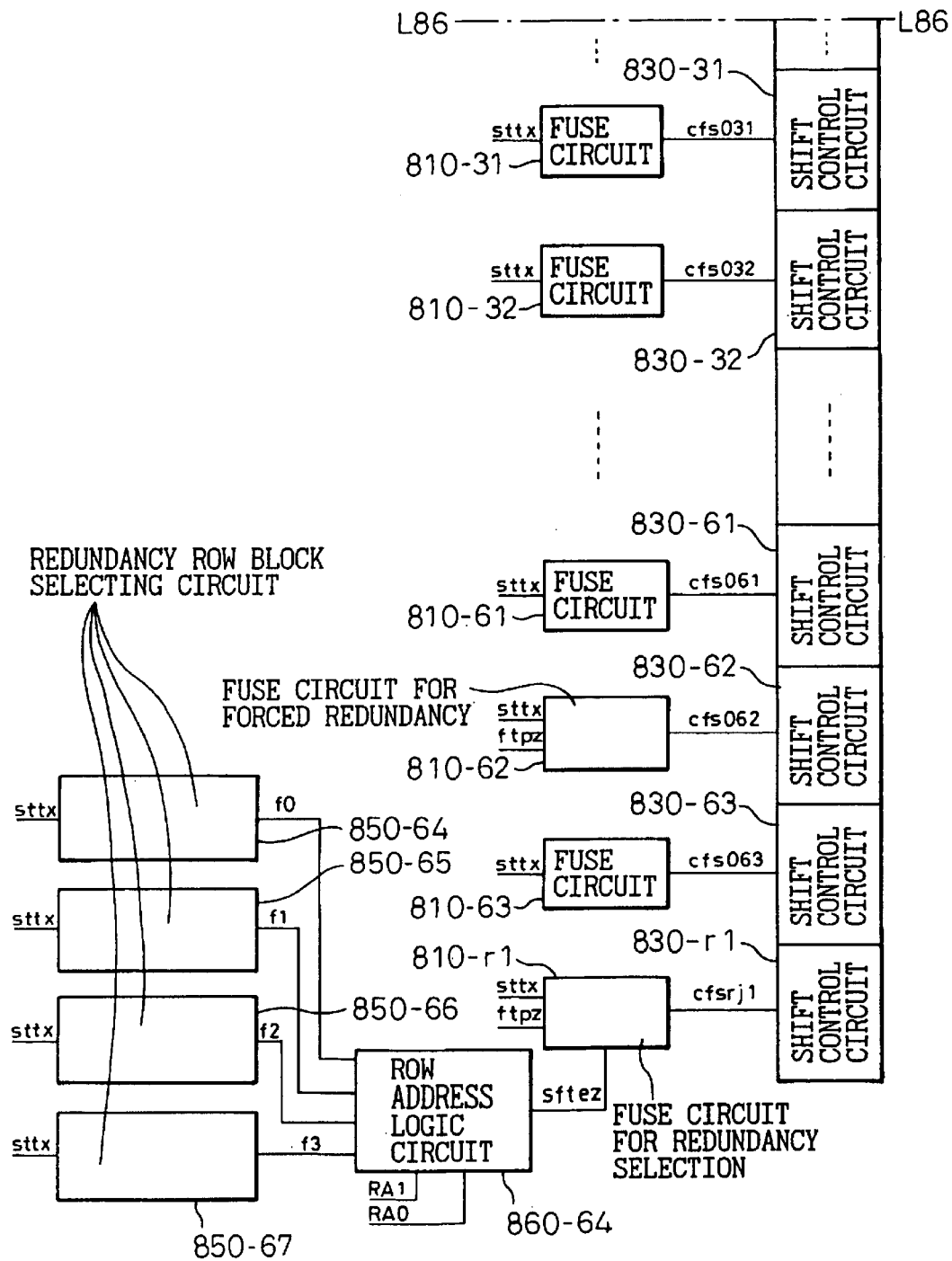
FIG. 88 is a block diagram (No. 2) showing the overall circuit construction of the sixth embodiment of the present invention.

FIGS. 87 and 88 are block diagrams Nos. 1 and 2 showing the overall construction of the sixth preferred embodiment of the present invention, respectively.

The sixth preferred embodiment shown in FIGS. 87 and 88 is directed to relatively increasing the degree of freedom of redundancy by applying the construction of FIG. 5, that is, "the construction which makes it possible to execute the shift redundancy operation in the row block unit by combining the address of the column selecting line as the object of the shift redundancy operation with the logic of the address of the row block when the shift redundancy of the column selecting lines disposed for a plurality of row blocks", to the construction of the firs preferred embodiment, that is, "the construction in which the fuse circuits and the fuse circuits for redundancy selection are disposed so as to correspond on the 1:1 basis to a plurality of selecting lines (here, column selecting lines) and to the redundancy selecting lines".

The feature of the sixth preferred embodiment resides in the following points. In a semiconductor memory device having the function of executing the shift redundancy operation of column selecting lines disposed for a plurality of row blocks in the same way as in the fifth preferred embodiment, this sixth preferred embodiment includes redundancy row block selecting circuits 850-1 to 850-4 (FIG. 87) and 850-64 to 850-67 (FIG. 88) each having a fuse for deciding whether or not execute the redundancy operation for each of the row blocks, row address logic circuits 860-1 (FIG. 87) and 860-64 (FIG. 88) for generating the addresses of a plurality of row blocks on the basis of the outputs from these redundancy row block selecting circuits. The main constituent elements other than the redundancy row block selecting circuit and the row address logic circuit, such as the fuse circuit for redundancy selection, the fuse circuit and the shift control circuit, are substantially the same as those of the first preferred embodiment.

The explanation will be given in further detail. In the sixth preferred embodiment, sixty-two fuse circuits 810-0, 810-2 to 810-61 and 810-63 and two fuse circuits for forced redundancy 810-2 and 810-62, each having a fuse for normal selection, are so disposed as to correspond on the 1:1 basis to the column selecting lines. Two fuse circuits for redundancy selection 810-r0 and 810-r1 are disposed so as to correspond to two redundancy selecting lines.

A plurality (64) of fuse circuits inclusive of the use circuits for forced redundancy are connected on the 1:1 basis to a plurality of shift control circuits (64, in total) 830-0 to 830-63 having substantially the same construction as those of the first preferred embodiment. The output signals cfs000, cfs002 to cfs061 and cfs063 generated by the fuse circuits for normal selection and the output signals cfs001 and cfs062 generated by the fuse circuit for forced redundancy are inputted to a plurality of shift control circuits 830-0 to 830-63, respectively. The output signals cfsrj0 and cfsrj1 of the two fuse circuits for redundancy selection 810-1 and 810-62, too, are inputted to the shift control circuits 830-r0 and 830-r1, respectively.

In the same way as in the fifth preferred embodiment, this sixth preferred embodiment can execute the redundancy operation in the row block unit when the shift redundancy operation is executed for the column selecting lines disposed for a plurality of row blocks inside one memory cell block, by incorporating the logics of the addresses RA0 and RA1 of the row block into the address of the column selecting line as the object of shift redundancy so that the column selecting lines driver for a plurality of rock blocks can receive the logic of the address of the corresponding row block.

Figure 89:
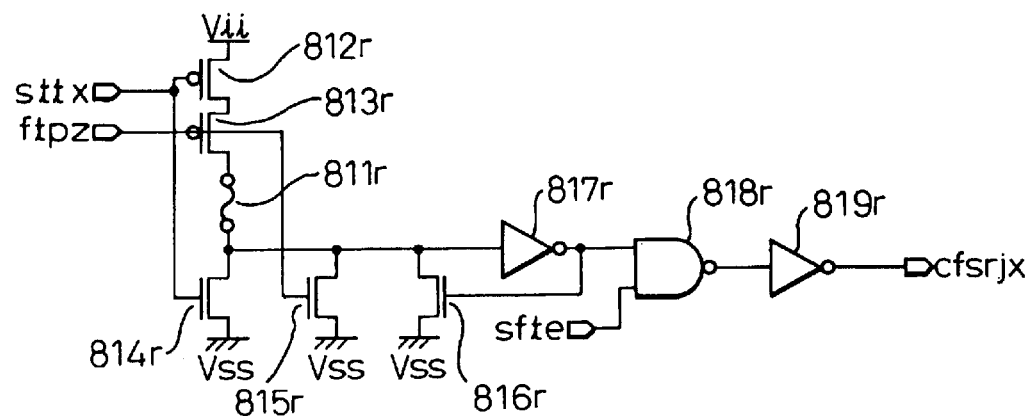
FIG. 89 is a circuit diagram showing the construction of a fuse circuit for redundancy selection in the sixth preferred embodiment of the present invention.
Figure 90:
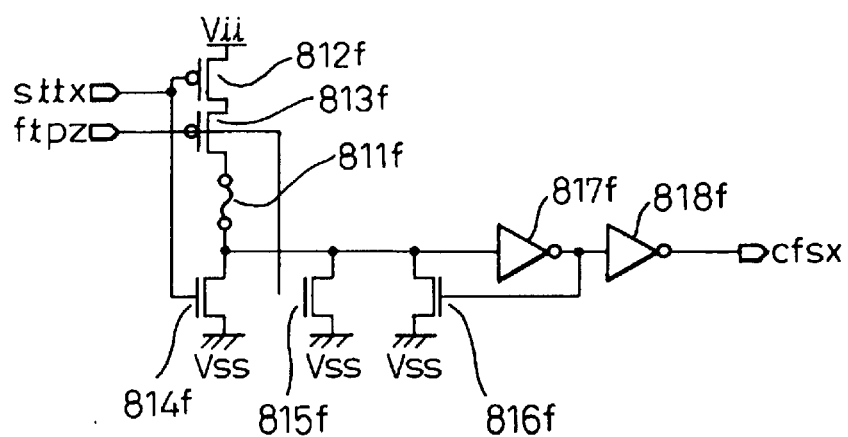
FIG. 90 is a circuit diagram showing the construction of a fuse circuit for forced redundancy in the sixth preferred embodiment of the present invention.
Figure 91:
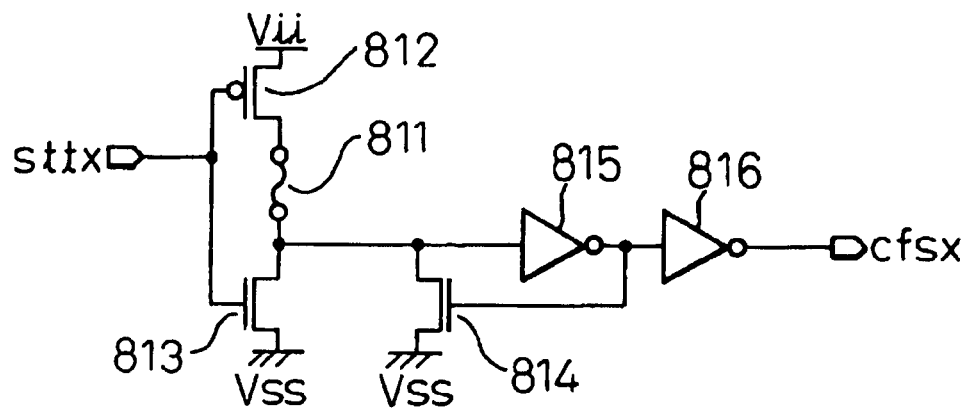
FIG. 91 is a circuit diagram showing the construction of a fuse circuit for normal selection in the sixth preferred embodiment of the present invention.

FIG. 89 is a circuit diagram showing the construction of the fuse circuit for redundancy selection in the sixth preferred embodiment of the present invention; FIG. 90 is a circuit diagram showing the construction of the fuse circuit for forced redundancy; and FIG. 91 is a circuit diagram showing the construction of the fuse circuit for normal selection in the sixth preferred embodiment. In the fuse circuits shown in FIGS. 89 to 91, Vii (internal voltage) is used as the power source voltage of the power source for the "H" level of the selecting lines, and the earth potential Vss is used as the power source voltage of the power source for the "L" level of the selecting lines.

The construction of each of the fuse circuit for redundancy selection, the fuse circuit for forced redundancy and the fuse circuit for normal selection shown in FIGS. 89 to 91 is substantially the same as that of the fifth preferred embodiment with the exceptions that the logic of the output signals is partially inverted with respect to the fifth preferred embodiment, and that the redundancy enable signal sftex (corresponding to later-appearing sfte in FIG. 94) is inputted to each of the two fuse circuits for redundancy selection.

In FIG. 89, symbol sttx represents the control signal which remains at the "H" level until the power source becomes operative after the power source is switched on and changes to the "L" level after the power source becomes operative. Symbol ftpx represents the control signal which attains the "H" level when the forced redundancy operation is executed. The fuse circuit for redundancy selection shown in FIG. 89 includes a P channel transistor 812r and an N channel transistor 814r to which the control signal sttx is inputted, a P channel transistor 813r and an N channel transistor 865r to which the control signal ftpz is inputted, an N channel transistor 816r, an inverter 817r, a NAND gate 818r and an inverter 819 on the output side. When the fuse 811r is not cut, the N channel transistor 816r is turned OFF and the output signal cfsrjx (corresponding to the output signals cfsrj0 and cfsrj1 in FIGS. 87 and 88) of the fuse circuit for redundancy selection falls to the "L" level. When the fuse 881r is cut, the N channel transistor 816r is turned ON and the output signal cfsrjx of the fuse circuit for redundancy selection rises to the "H" level if the redundancy enable signal is at the "H" level. The level of the output signal cfsrjx of this fuse circuit for redundancy selection is transferred as such to the shift control circuit.

When the power source becomes operative and the control signal sttx falls to the "L" level in FIG. 89, the N channel transistor is turned OFF and the output signal cfsrjx of the fuse circuit for redundancy selection falls to the "L" level if the forced redundancy operation is not executed. When the forced redundancy operation is executed, the N channel transistor 816r is turned ON and the output signal from the inverter 817r changes to the "H" level, Here, the output signal from the inverter 817r changes to the "H" level only when the redundancy enable signal sfte is at the "H" level.

Therefore, the output signal cfsrjx of the fuse circuit for redundancy selection rises to the "H" level. In other words, when the forced redundancy operation is executed under the condition that the redundancy enable signal sfte is at the "H" level, the result becomes the same as the result when the fuse 811r of the fuse circuit for redundancy selection is cut.

In FIG. 90, symbol ftpz represents the control signal which attains the "H" level when the forced redundancy operation is executed, as described above. The fuse circuit for forced redundancy shown in FIG. 90 includes a P channel transistor 812f and an N channel transistor 814f so which the control signal sttx is inputted, a P channel transistor 813f and an N channel transistor 815f to which the control signal ftpz is inputted, an N channel transistor 816f and two inverters 817f and 818f. Here, when the fuse 811f is the object of forced redundancy and this fuse 811f is made to look as being apparently cut, the output signal cfsx of the fuse circuit for forced redundancy (corresponding to the output signals cfs001 and cfs062 in FIGS. 87 and 88) changes to the "L" level. It is possible to confirm under this state whether or not any fault exists in the redundancy selecting lines.

The fuse circuit shown in FIG. 91 includes a P channel transistor 812 and an N channel transistor 813 to which the control signal sttx is inputted, an N channel transistor 814, and two inverters 815 and 816. When the power source becomes operative and the control signal sttx falls to the "L" level, the N channel transistor 814 is turned OFF and the output signal cfsx of the fuse circuit (corresponding to the output signals cfs000, cfs002 to cfs061 and cfs063 in FIGS. 87 and 88) rises to the "H" level if the fuse 811 is not cut. When the fuse 811 is cut, the N channel transistor 816 is turned ON and the output signal cfsx of the fuse circuit falls to the "L" level.

Figure 92:
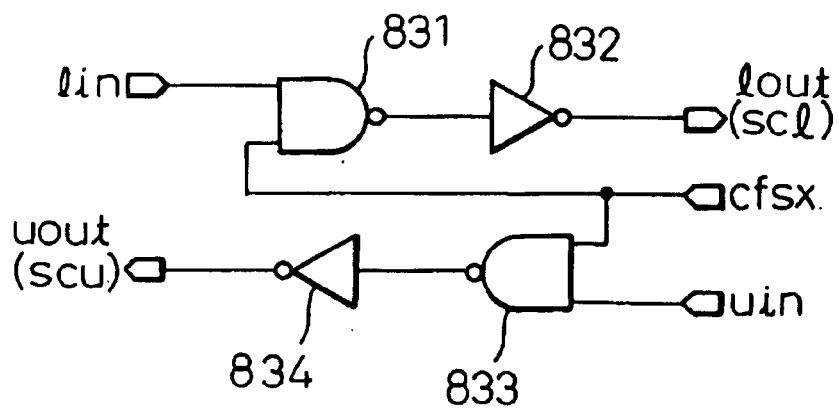
FIG. 92 is a circuit diagram showing the construction of a shift control circuit in the sixth preferred embodiment of the present invention.

FIG. 92 is a circuit diagram showing the construction of the shift control circuit in the sixth preferred embodiment of the present invention. Each shift control circuit shown in FIG. 92 comprises a NAND gate and an inverter in the same way as in the fifth preferred embodiment.

In FIG. 92, symbol cfs represents an arbitrary one of the outputs cfs000 to cfa0063 generated by the fuse circuits as described above. The shift control circuit has substantially the same function as that of the first preferred embodiment (FIG. 7). The input signal lin of the shift control circuit is connected to the left adjacent output signal lout and the other input signal uin is connected to the right adjacent output signal uout. The "H" (voltage Vii) is inputted to the input signal lin at the left and to the input signal uin at the right end.

The explanation will be given in further detail. A NAND gate 831 is disposed on the side of the input signal lin of the shift control circuit for normal selection shown in FIG. 92, and the inverter 832 is disposed on the side of the output signal lout. On the other hand, the NAND gate 833 is disposed on the side of the input signal uin of the shift control circuit shown in FIG. 92 and the inverter 834 is disposed on the side of the output signal uout.

The output signal uout outputted from the inverter 834 is used as the other input signal (signal scu in FIG. 6) of the selecting line drive circuit (not shown in the sixth preferred embodiment; see FIG. 6 relating to the first preferred embodiment). On the other hand, the output signal lout outputted from the inverter 832 is used as one of the input signals (signal scl in FIG. 6) of the selecting line drive circuit. These output signals uout and lout are used for controlling the operation of the three-directional switch device in the switch unit. Incidentally, the construction of each shift control circuit for redundancy selection 830-r0 and 830-r1 is substantially the same as that of the shift control circuit for normal selection. Therefore, the detailed explanation of the shift control circuit for redundancy selection will be hereby omitted.

Next, the concrete structural example of the redundancy row block selecting circuits 850-1 to 850-4 (FIG. 87) and 850-64 to 850-67 (FIG. 88) and the row address logic circuits 860-1 (FIG. 87) and 860-64 (FIG. 88) will be explained.

Figure 93:
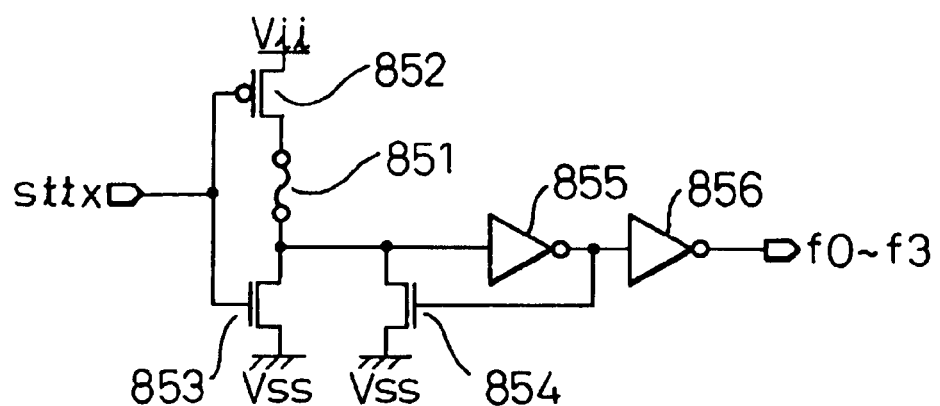
FIG. 93 is a circuit diagram showing the construction of a redundancy row block selecting circuit in the sixth preferred embodiment of the present invention.
Figure 94:
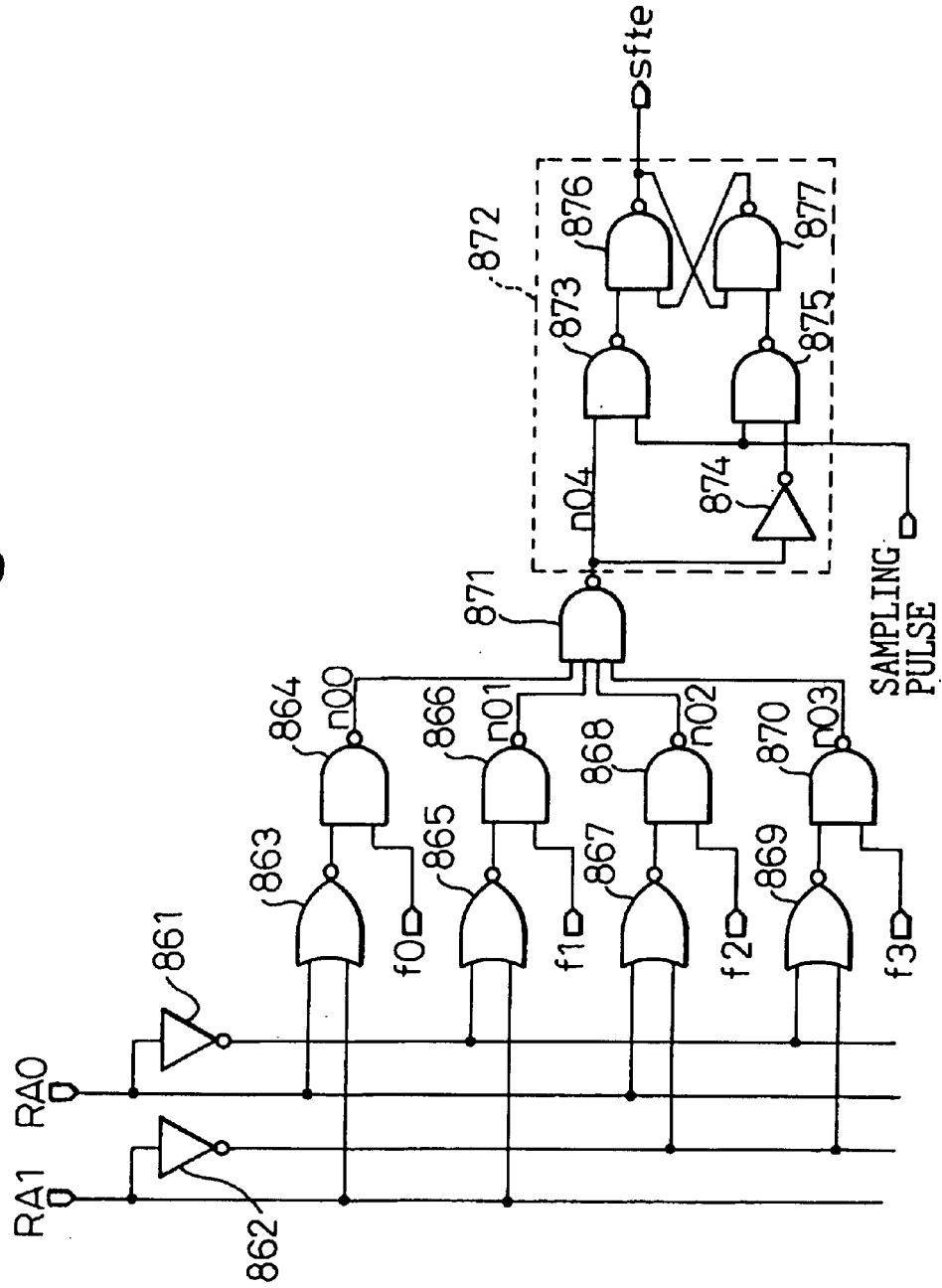
FIG. 94 is a circuit diagram showing the construction of a row address logic circuit in the sixth preferred embodiment of the present invention.

FIG. 93 is a circuit diagram showing the construction of the redundancy row block selecting circuit in the sixth preferred embodiment of the present invention, and FIG. 94 is a circuit diagram showing the construction of the row address logic circuit in the sixth preferred embodiment. The construction of each of these redundancy row block selecting circuit and row address logic circuit is substantially the same as that of the fifth preferred embodiment. Therefore, the explanation will be simplified much more than in the case of the fifth preferred embodiment.

In the sixth preferred embodiment, too, four row blocks 6r-0 to 6r-3 existing in each memory cell block will be explained. When the logics of the addresses RA0 and RA1 of the row block are "0" and "0", respectively, the first row block 6r-0 is selected, and when the logics of the addresses RA0 and RA1 are "1" and "0", respectively, the second row block 6r-1 is selected. Furthermore, when the logics of the addresses RA0 and RA1 are "0" and "1", respectively, the third row block 6r-2 is selected and when the logics of the addresses RA0 and RA1 of the row blocks are "1" and "1", respectively, the fourth row block 6r-3 is selected.

Each redundancy row block selecting circuit shown in FIG. 93 (any one of 850-1 to 850-4, 850-64 to 850-6) includes a P channel transistor 852 and an N channel transistor 853 to which the control signal sttx is inputted, an N channel transistor 854 and two inverters 855 and 856. When the cower source becomes operative and the control signal sttx falls to the "L" level, the N channel transistor 854 is turned OFF and the output signals f0 to f3 rise to the "H" level if the fuse 851 is not cut. When the fuse 851 is cut, the N channel transistor 854 is turned ON and the output signals f0 to f3 fall to the "L" level.

The row address logic circuit 860-1 or 860-64 includes four NOR gates 863, 865, 867 and 869 using, as the input signals thereof, four combinations obtained by selecting two kinds of logics, from among two kinds of logics of the addresses RA0 and RA1 of the four row blocks and two kinds of logics obtained by inverting the former by the inverters 861 and 862, respectively. In this case, the output signal of any one of four NOR gates 463, 865, 867 and 869 rises to the "H" level in such a manner as to correspond to the row block selected on the basis of the logics of the addresses RA0 and RA1 of the row block.

Four NAND gates 864, 866, 868 and 870 are disposed on the output side of these NOR gates 863, 865, 867 and 869, respectively. One of the output signals outputted from the NOR gates 863, 865, 867 and 869 and one of the output signals f0 to f3 from the redundancy row block selecting circuit are inputted to each of these NAND gates 864, 866, 868 and 870. A NAND gate 871 is further disposed on the output side of the NAND gates 864, 866, 868 and 870. When the shift redundancy operation is executed for the selected row block, the fuse in the redundancy row block selecting circuit corresponding to this row block is not cut. Therefore, the output signal (any one of f0 to f3) of this redundancy row block selecting circuit rises to the "H" level. Therefore, the output signal of the NOR gate, that uses the "H" level output signal from the redundancy row block selecting circuit and the "H" level output signal of the NAND gate as the input signals thereof, falls to the "L" level. This "L" level output signal is outputted as the "H" level signal through the NAND gate 871.

On the output side of the NAND gate 871 is disposed the redundancy row block data latch circuit 872 including a data latch unit for latching the data as to whether or not the shift redundancy operation is to be executed for the selected row. This redundancy row block data latch circuit 872 includes an inverter 874 for inverting the level of the output signal of the NAND gate 871, two NAND gates 873 and 875 having the sampling pulse, the output signal of the NAND gate and the output signal of the inverter 874 as the input signals thereof, and a data latch unit comprising two NAND gates 876 and 877. This data latch unit outputs the redundancy enable signal sfte that enables to execute the shift redundancy operation for the selected row block.

First, when the shift redundancy operation is not executed for only the first row block 6r-0 but is executed for the other row blocks, the fuse inside the redundancy row block selecting circuit that outputs the output signal f0 is cut and the output signal f0 is brought to the "L" level. The fuses in other redundancy row block selecting circuits are not cut (with the output signals f1 to f3 rising to the "H" level).

Next, when the first row block 6r-0 is selected (RA0="0" and RA1="0"), the output signal of the first NOR gate 663 rises to the "H" level and the output signal of the first NAND gate 864 rises to the "H" level (with node n0 at the "H" level). Since the output signals of the other NOR gates all change to the "L" level, the output signals of the second to fourth NAND gates all change to the "H" level (with nodes n01 to n03 being at the "H" level), As a result, since the input signal changes to the "H" level, the NAND gate 871 outputs the "L" level output signal (with the node n04 at the "L" level). The "L" level signal of the node n04 passes through the redundancy row block data latch circuit and is outputted as the redundancy enable signal sfte having the same "L" level. When the redundancy enable signal sfte is at the "L" level, the output signal passing through the fuse circuit for redundancy selection changes to the "L" level irrespective of the state of the fuse of the fuse circuit for redundancy selection, and the shift redundancy operation is not executed in the selected first row block 6r-0.

When the third row block 6r-2 is selected (RA0="0", RA1="1"), the output signal of the third NOR gate 867 changes to the "H" level. Therefore, the output signal of the third NAND gate 568 changes to the "L" level. On the other hand, since other NOR gates are all at the "L" level, the output signals of the fist, second and fourth NAND gates 864, 868 and 870 are all at the "H" level. In other words, because the node n02 is at the "L" level and the nodes n00, n01 and n03 are at the "H" level, the NAND gate 871 outputs the "H" level output signal (n04 at the "H" level) and the redundancy enable signal sfte changes to the "H" level. When the redundancy enable signal sfte is at the "H" level, the level of the output signal of the fuse circuit for redundancy selection is determined in accordance with the state of the fuse of the fuse circuit for redundancy selection. Therefore, the shift redundancy operation for the selected third row block 6r-2 can be executed by cutting the fuse of the fuse circuit for redundancy selection.

Similarly, it is possible to execute the shift redundancy operation for the first and fourth row blocks without executing it for the second and third row blocks. In this case, the fuses of the redundancy row block selecting circuits outputting the output signals f1 and f2 are cut, respectively, to change the output signals f1 and f2 to the "L" level, and the fuses of the redundancy row block selecting circuits outputting the output signals f0 and f3 are left uncut so as to bring the output signals f0 and f3 to the "H" level.

When the second or third row block is hereby selected, the output signals of the first to fourth NAND gates 864, 866, 868 and 870 all rise to the "H" level n (with n00 to n03 being at the "H" level). Consequently, the NAND gate 871 outputs the "L" level output (with n04 being at the "L" level), the redundancy enable signal size, too, falls to the "L" level, and the shift redundancy operation is not executed in the selected row block.

When the first or fourth row block is selected, either one of the fist or fourth NAND gate 864 or 870 outputs the "L" level output signal, and the NAND gate 871 outputs the "H" level output signal (with n04 being at the "H" level). Therefore, the redundancy enable signal sfte rises to the "H" level, too, and the shift redundancy operation can be executed in the selected row block.

If the node n00 rises temporarily to the "H" level when it is desired to leave the nodes n01 to n03 at the "H" level and to leave the node n04 at the "H" level while the node n00 is kept at the "L" level, that is, when it is desired to execute the shift redundancy operation, the node n04 is affected by the rise of the level of this node n00 and falls temporarily to the "L" level.

The redundancy row block data latch circuit 872 is disposed so as to prevent such a problem. Here, the state before the node n00 temporarily rises to the "H" level is latched by the rise of the sampling pulse, and such a latch state is outputted as the redundancy enable signal sfte. The level of the redundancy enable signal sfte at this time is the same as the level of the node n04 as described above. If the node n04 is at the "H" level, the redundancy enable signal sfte, too, is at the "H" level, and if the node n04 is at the "L" level, the redundancy enable signal sfte, too, is at the "L" level, Therefore, according to this sixth embodiment, it is possible to selectively execute the shift redundancy operation when the signal of the address of the rock block for selecting a specific row block is inputted, and not to execute the shift redundancy operation when the signal of the addresses of other row blocks are inputted. In consequence, the degree of freedom of redundancy can be relatively increased in the same way as in the fifth preferred embodiment.

When the faults occur in two of a plurality of selecting lines in the semiconductor memory devices having the two-bit shift redundancy function such as those represented by the first to sixth embodiments, the two fault selecting lines (two faults) can be relieved by executing the two-bit shift redundancy operating that shifts the decode signal lines in the direction of one of the redundancy selecting lines and in the direction of the other redundancy selecting line. On the other hand, when the fault occurs in one of a plurality of selecting lines, this fault selecting line (one fault) can be relieved by executing the one-bit shift redundancy operation by shifting the decode signal lines in the direction of either one of the two redundancy selecting lines.

However, when the semiconductor chip is manufactured so as to massproduce DRAMs, SRAMs, flash memories, etc., dust having a size bigger than the pitch of the selecting lines sometimes occurs due to abnormality of the fabrication process, and adheres to the semiconductor chip. In such a case, a group fault in which three or more fault selecting lines (three or more faults) often occurs concentratedly on a certain part on the semiconductor chip. This group fault is likely to occur relatively at the initial stage of mass production, in particular.

Therefore, when at least three faults occur due to the group fault on the semiconductor chip, they cannot be relieved by the conventional two-bit shift redundancy system. As a result, the production yield of the chip production is likely to be impeded particularly at the initial stage of mass production.

The seventh preferred embodiment of the present invention, which follows, is directed to solve this problem and to provide a semiconductor memory device of the shift redundancy system which can drastically improve the production yield of the chips by relieving such fault selecting lines.

Figure 95:
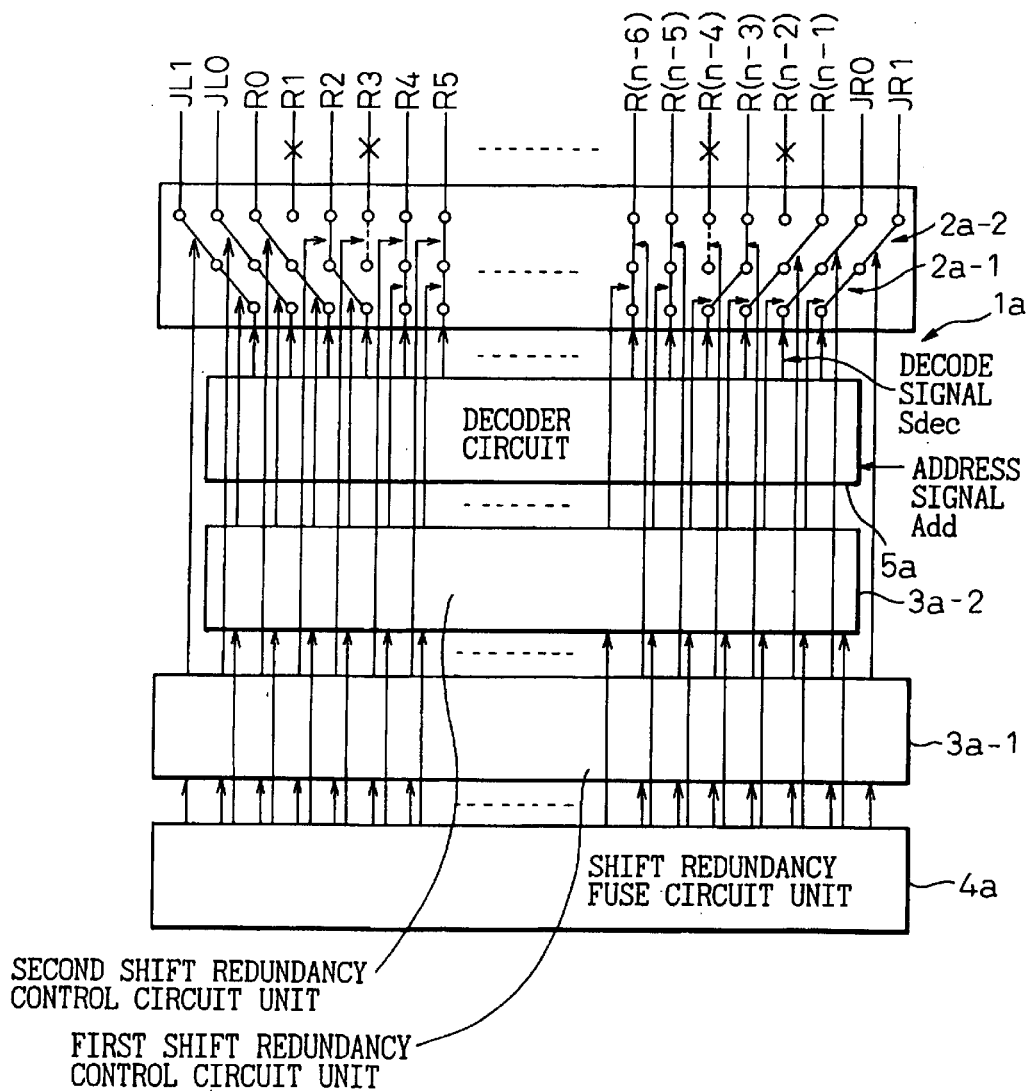
FIG. 95 is a block diagram showing the construction of the basic principle which is deemed as the ground of a seventh preferred embodiment of the present invention.

FIG. 95 is a block diagram showing the construction of the basic principle which is deemed as the ground of the seventh preferred embodiment. Here, the construction of the semiconductor memory device having a plurality of selecting lines R0 to R(n−1) (where n is an arbitrary positive integer of 2 or more than 2 in this case, too) will be schematically illustrated. Furthermore, the switch operation of the switch unit when the faults occur in four selecting lines R1, R3, R(n−4) and R(n−2) occur will be illustrated.

As shown in FIG. 95, the semiconductor memory device according to the basic principle which is deemed as the ground of the seventh preferred embodiment of the present invention includes a plurality of selecting lines R0 to R(n−1) (that is, real selecting lines) for selecting a specific memory cell from among a plurality of memory cells on the basis of the address signal Add supplied from external and executing the write or read operation, at least two first redundancy selecting lines (for example, two redundancy selecting lines JL0 and JL1 at the left end) positioned at one of the ends of a plurality of selecting lines and at least two second redundancy selecting lines (for example, two redundancy selecting lines JR0 and JR1 at the right end) positioned at the other end and first and second switch units 2*a*-1 and 2*a*-2 disposed in at least two stages for changeably connecting a plurality of decode signals obtained by decoding the address signal to the selecting lines and to the redundancy selecting lines. These first and second switch units 2*a*-1 and 2*a*-2 constitute the principal portions of a shift redundancy circuit 1*a* having a four-bit shift redundancy function as will be described later.

When any fault occurs in a plurality of selecting lines in the above-mentioned construction equipped with the first and second switch units 2*a*-1 and 2*a*-2 (faults are shown occurring in four selecting lines in FIG. 95), the first switch unit 2*a*-1 executes the first switch operation for shifting at least one of the decode signal lines in the direction of the first redundancy selecting lines, or the second switch operation for shifting at least one of the decode signal lines in the direction of the second redundancy selecting lines, or both of the first and second switch operations. The second switch unit 2*a*-2 executes the third switch operation for shifting at least one of the decode signal lines, that is subjected to the first switch operation described above, in the direction the direction of the first redundancy selecting line, or the fourth switch operation for shifting at least one of the decode signals, that is subjected to the second switch operation described above, in the direction of the second redundancy selecting line, or both of the third and fourth switch operations, or none of the third and fourth switch operations.

Preferably, when the faults occur in four selecting lines among a plurality of selecting lines, both of the first and second switch operations are executed by the first switch unit and both of the third and fourth switch operations are executed by the second switch unit.

Preferably, further, when the faults occur in the three selecting lines among a plurality of selecting lines, both of the first and second switch operations are executed by the first switch unit, and either one of the third and fourth switch operations is executed by the second switch unit.

Preferably, further, when the faults occur in two selecting lines among a plurality of selecting lines, either one of the first and second switch operations is executed by the first switch unit and either one of the third and fourth switch operations is executed by the second switch unit.

Preferably, further, when the faults occur in two selecting lines among a plurality of selecting lines, both of the first and second switch operations are executed by the first unit and none of the third and fourth switch operations are executed by the second switch unit.

Preferably, further, when the fault occurs in one selecting line among a plurality of selecting lines, either one of the first and second switch operations is executed by the first switch unit and one of the third and fourth switch operations are executed by the second switch unit.

Preferably, further, when at least one of the first and second redundancy selecting lines is connected to the decode signal lines by the switch operation described above, the redundancy selecting lines positioned close to a plurality of selecting lines (for example, the redundancy selecting lines JL0 and JR0 on the internal side) are preferentially used.

The explanation will be given in further detail. The semiconductor memory device shown in FIG. 95 is equipped with the decoder circuit 5a for decoding the address signal Add supplied from outside. This decoder circuit 5a has substantially the same function as that of the decoder circuit shown in FIG. 2. Further, the semiconductor memory device shown in FIG. 95 includes a plurality of selecting lines R0 to R(n−1) (where n is an arbitrary positive integer of 2 or more than 2) for selecting a specific memory cell from among a plurality of memory cells on the basis of the address of the decode signal Sdec outputted from this decoder circuit 5a and for executing the write or read operation of the data. Further, in the semiconductor memory device shown in FIG. 95, two first redundancy selecting lines JL0 and JL1, that are connected to none of the decode signal lines to which the decode signal Sdec is transferred, are positioned at one of the ends among a plurality of selecting lines (for example, a the left end position), and two second redundancy selecting lines JR0 and JR1, that are connected to none of a plurality of decode signal lines, are positioned at the other end among a plurality of selecting lines (for example, at the right end position).

There is further disposed in FIG. 95 a shift redundancy circuit 1a for controlling the connection relation between a plurality of decode signal lines and a plurality of selecting Lines R0 to R(n−1) and the connection relation between a plurality of decode signal lines and the first and second redundancy connecting lines JL0, JL1, JR0 and JR1. This shift redundancy circuit 1a includes first and second switch units 2a-1 and 2a-2 including in turn a plurality of switch devices for changeably connecting a plurality of decode signals to the first and second redundancy selecting lines. Each of these first and second switch units 2a-1 and 2a-2 preferably has a two-bit shift redundancy function, and the shift redundancy operation of maximum four bits can be achieved by connecting a plurality of switch devices of these first and second switch units 2a-1 and 2a-2 in two stages and in series.

The explanation will be given more concretely. The switch unit in which one of the end portions is directly connected to a plurality of decode signal lines is used as the first switch unit 2a-1, and the switch unit which is connected between the other end portion of this first switch unit and a plurality of selecting lines (between a plurality of selecting lines and the first and second redundancy selecting lines when the fault selecting line or lines occur) is used as the second switch unit 2a-2, thereby constituting the two-stage switch circuit. Here, when all, or some, of the first and second redundancy selecting lines are connected to the corresponding decode signals, the redundancy selecting lines positioned closer to a plurality of selecting lines (the inner redundancy selecting lines JL0 and JR0) are first used, and the redundancy selecting lines positioned apart from a plurality of selecting lines (the outer redundancy selecting lines JL1 and JR1) are used next.

The shift redundancy circuit 1a includes a shift redundancy fuse circuit unit 4a having a plurality of fuses so disposed as to correspond to a plurality of selecting lines and to the first and second redundancy selecting lines. When any fault or faults occur in a plurality of selecting lines, this shift redundancy fuse circuit unit 4a cuts the fuse or fuses corresponding to the fault selecting lines in which the faults occur, and the fuses for redundancy selection that correspond to all, or a part, of the first and second redundancy selecting lines. This shift redundancy fuse circuit unit 4a has substantially the same function as that of the shift redundancy fuse circuit unit 4 shown in FIG. 2.

Here, the signal outputted from the shift redundancy fuse circuit unit 4a is inputted to the later-appearing first and second shift redundancy control circuit units 3a-1 and 3a-2. The signal outputted from the first shift redundancy control circuit unit 3a-1 is used as the first shift control signal for controlling the first switch unit 2a-1. On the other hand, the signal outputted from the second shift redundancy control circuit 3a-2 is used as the second shift control signal for controlling the second switch unit 2a-2.

To simplify the explanation, the semiconductor memory device shown in FIG. 95 represents the construction for achieving maximum four-bit shift redundancy (that is, the construction in which a plurality of switch devices in each of the first and second switch units 2a-1 and 2a-2 are connected in series with one another) by disposing in two stages the switch circuits having the two-bit shift redundancy function. It is noteworthy that maximum 2N-bit shift redundancy (shift redundancy of 0, 1 bit, 2 bit, . . . , 2(N−1) bit or 2N bit) can be executed by disposing such switch circuits in N stages (where N is an arbitrary positive integer of 3 or more than 3).

The shift redundancy circuit 1a shown in FIG. 95 further includes first and second shift redundancy control circuit units 3a-1 and 3a-2 for controlling the switch operations of a plurality of switch devices inside the first and second switch units 2a-1 and 2a-2 in accordance with the output result from the shift redundancy fuse circuit unit 4a.

More concretely, the first shift redundancy control circuit unit 3a-1 controls the switch operation of a plurality of switch devices inside the first switch unit 2a-1 having the two-bit shift redundancy function so as to shift a plurality of decode signal lines by one selecting line (that is, by one bit) in the direction of the first redundancy selecting line JL0 positioned at the inside position among the first redundancy selecting lines at the left end, or shifting a plurality of decode signals by one selecting line in the direction of the second redundancy selecting line JR0 positioned at the inside position among the second redundancy selecting lines at the right end, in order to bring the fault selecting line corresponding to at least one fault into the non-selection state, in which it is connected to none of a plurality of decode signals, when such a fault occurs.

On the other hand, the second shift redundancy control circuit unit 3a-2 controls the switch operation of a plurality of switch devices in the second switch unit 2a-2 having the two-bit shift redundancy function by shifting further a plurality of decode signal lines by one selecting line (that is, by one bit) in the direction of the first redundancy selecting line JL1 positioned at the outer position among the first redundancy selecting lines at the left end, or shifting further a plurality of decode signals by one selecting line in the direction of the second redundancy selecting line JR1 positioned at the outer position among the second redundancy selecting lines at the right end, in order to bring the fault selecting lines corresponding to two to four faults into the non-selection state in which they are connected to one of a plurality of decode signal lines when two to four faults occur.

In other words, the first shift redundancy control circuit unit 3a-1 controls the first and second switch operations of the first switch unit 2a-1 used for selecting the two redundancy selecting lines JL0 and JR0 positioned closer to a plurality of selecting lines by a plurality of first shift control circuits. On the other hand, the second shift redundancy control circuit unit 3a-2 controls the third and fourth switch operations of the second switch unit 2a-2 used for selecting the two redundancy selecting lines JL1 and Jr1 positioned apart from a plurality of selecting lines by a plurality of second shift control circuits. The shift redundancy function of one to four bits can be achieved by suitably controlling the first to fourth switch operations of these first and second switch units 2a-1 and 2a-2.

Incidentally, a plurality of selecting lines as the object of such one-bit to four-bit shift redundancy includes the word selecting lines, the column selecting lines, the selecting lines for the data bus, etc., in the semiconductor memory device.

In summary, the present invention disposes the switch units having the shift redundancy function of at least two bits in two stages and in series, and causes each switch unit to execute the switch operation for shifting the decode signals in the direction of one of the redundancy selecting lines, or in the direction of the other redundancy selecting line, or in both directions. When three or more than three fault selecting lines occur on the semiconductor chip, therefore, the fault selecting lines can be relieved by executing the shift redundancy operation of three or more than three bits. On the other hand, the present invention causes at least one of the switch units disposed in two stages to execute the switch operation in the direction of one of the redundancy selecting lines, or in the direction of the other redundancy selecting line or in the directions of both redundancy selecting lines. Therefore, even when one or two fault selecting lines occur on the semiconductor chip, these fault selecting lines can be relieved.

The seventh preferred embodiment of the present invention will be further explained with reference to FIGS. 96 to 114. The explanation will be given first hereby about the concrete switch operations of the first and second switch units 2a-1 and 2a-2 when one to four faults occur in a plurality of selecting lines.

Figure 96:
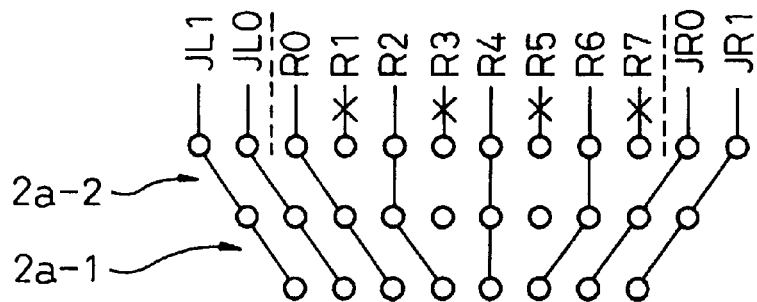
FIG. 96 is a schematic view showing the operation of a switch unit when any fault occurs in four selecting lines.
Figure 97:
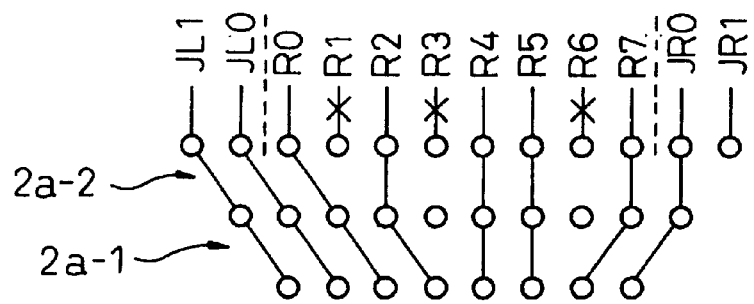
FIG. 97 is a schematic view showing an example of the operation of the switch unit when any fault occurs in three selecting lines.
Figure 98:
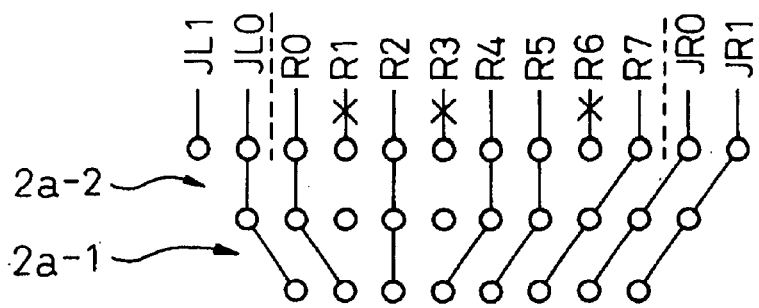
FIG. 98 is a schematic view showing a second example of the operation of the switch unit when any fault occurs in the three selecting lines.

FIG. 96 is a schematic view showing the operation of the switch unit when the faults occur in four selecting lines; FIG. 97 is a schematic view showing a first example of the operation of the switch unit when the faults occur in the three selecting lines; and FIG. 98 is a schematic view showing a second example of the operation of the switch unit when the faults occur in the three selecting lines.

Figure 99:
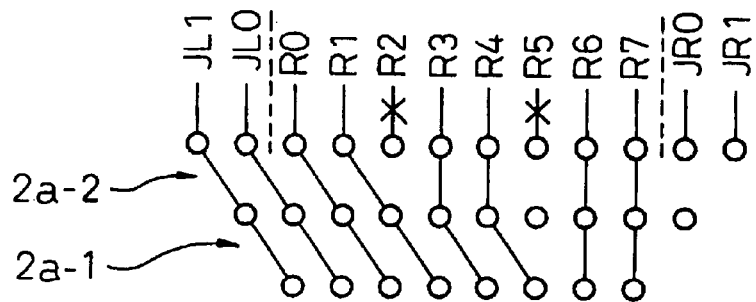
FIG. 99 is a schematic view showing a first example of the operation of the switch unit when any fault occurs in two selecting lines.
Figure 100:
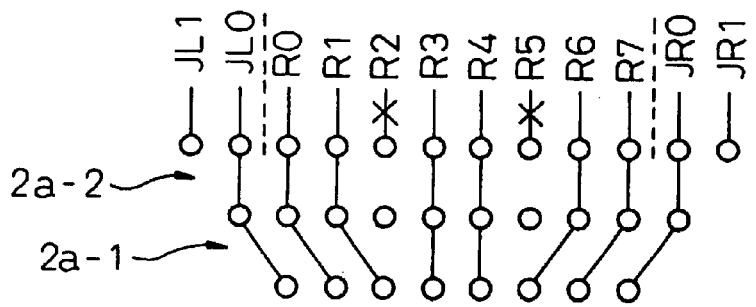
FIG. 100 is a schematic view showing a second example of the operation of the switch unit when any fault occurs in the two selecting lines.
Figure 101:
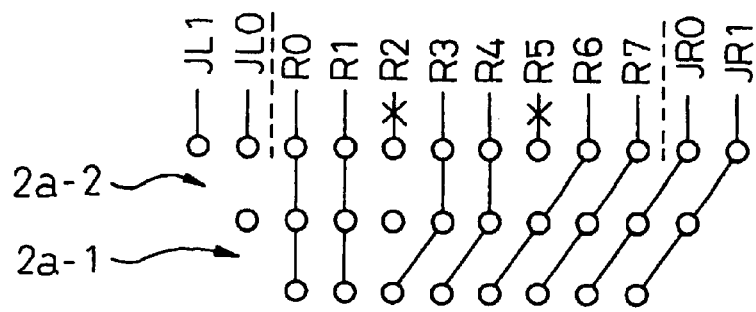
FIG. 101 is a schematic view showing a third example of the operation of the switch unit when any fault occurs in the second selecting lines.

FIG. 99 is a schematic view showing the first example of the switch unit when the faults occur in two selecting lines; FIG. 100 is a schematic view showing the second example of the operation of the switch unit when the faults occur in two selecting lines; and FIG. 101 is a schematic view showing the third example of the operation of the switch unit when the faults occur in two selecting lines.

Figure 102:
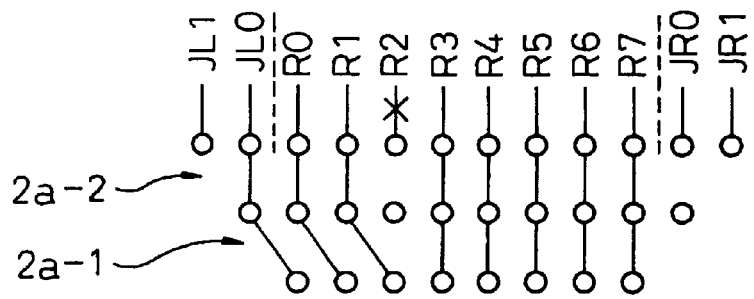
FIG. 102 is a schematic view showing a first example of the operation of the switch unit when any fault occurs in one selecting line.
Figure 103:
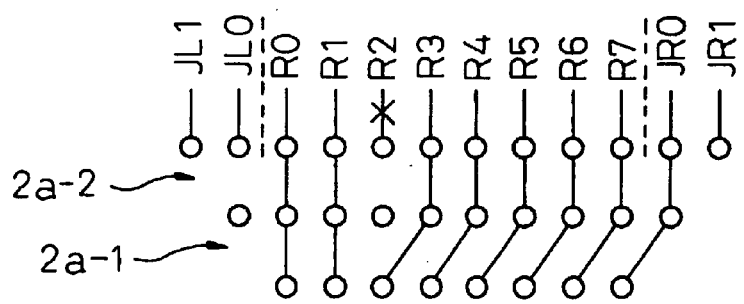
FIG. 103 is a schematic view showing a second example of the operation of the switch unit when any fault occurs in one selecting line.
Figure 104:
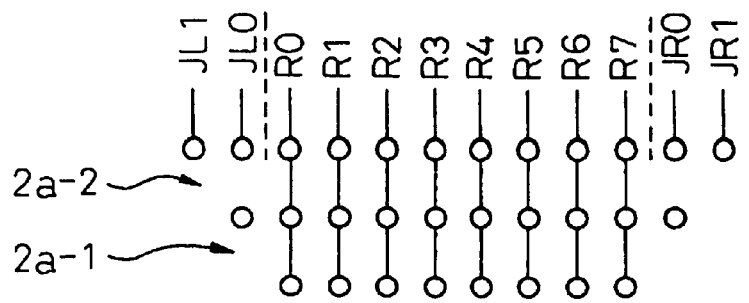
FIG. 104 is a schematic view showing the operation of the switch unit when no fault exists in the selecting lines.

Furthermore, FIG. 102 is a schematic view showing the first example of the operation of the switch unit when the fault occurs in one selecting line, FIG. 103 is a schematic view showing the second example of the operation of the switch unit when the fault occurs in one selecting line, and FIG. 104 is a schematic view showing the operation of the switch unit when no fault exists in the selecting lines. However, FIGS. 96 to 104 show the construction of the switch units and a plurality of selecting lines in a simplified form in order to simplify the explanation of the switch operations by the switch units.

Referring to FIGS. 96 to 104, there are shown disposed eight selecting lines R0 to R7 for normal selection, that are used for the normal operation, two first redundancy selecting lines JL0 and JL1, and two second redundancy selecting lines JR0 and JR1. The selecting lines for normal selection R0 to R7, these selecting lines are connected to a plurality of switch devices of the second switch unit 2a-2 as shown in FIG. 104. These switch devices of the second switch unit 2a-2 are connected to a plurality of switch devices of the first switch unit 2a-1. These switch devices of this first switch unit 2a-1 are connected to eight decode signal lines (not shown) obtained by decoding the address signal supplied from outside the semiconductor chip. Before the shift redundancy process, or when no fault exists in the selecting lines, a plurality of switch devices of the first and second switch units operate in such a manner that the selecting lines R0 to R7 can be connected to the corresponding decode signal lines (no shift). In other words, in the case of FIG. 104, the first and second switch units 2a-1 and 2a-2 do not execute the switch operation for shifting the decode signal lines in the direction of the redundancy selecting lines; hence, four redundancy selecting lines are not connected to the decode signal lines.

FIG. 96 is a schematic view useful for explaining the case in which the faults exist in four selecting lines R1, R3, R5 and R7, and the four-bit shift redundancy operation is executed for these faults. In FIG. 96, the first switch unit 2a-1 executes the switch operation of four switch devices corresponding to fourth decode signals so that the four decode signal lines on the left can be shifted (one-bit shift) in the direction of the first redundancy selecting lines JL0 positioned closer to the selecting line R0 for normal selection (left shift). The first switch unit 2a-1 further executes the switch control of three corresponding switch devices so that three decode signal lines on the right can be shifted (one-bit shift) in the direction of the second redundancy selecting line JR0 positioned closer to the selecting line R7 for normal selection (right shift). Furthermore, the first and second switch units 2a-1 and 2a-2 allow the switch devices to operate so that the decode signal lines and the selecting line R4 can be connected without executing the left shift and the right shift (no shift).

In FIG. 96, the second switch unit 2a-2 executes the switch operation of corresponding three switch devices so that three decode signal lines on the left can be further shifted (one-bit shift) in the direction of the first redundancy selecting line JL1 positioned apart from the selecting line R0 for normal selection (left shift). The second switch unit 2a-2 executes further the switch operation of two corresponding switch devices so that two decode signal lines on the right can be further shifted (one-bit shift) in the direction of the second redundancy selecting line JR1 positioned apart from the selecting line R7 for normal selection (right shift). Furthermore, the second switch unit 2a-2 operates the switch devices so that the switch devices of the first switch unit 2a-1 and the selecting line r2 can be connected without executing the left shift and the right shift (no shift). The second switch unit 2a-2 operates further the switch devices so that the switch devices of the first switch unit can be connected to the selecting line R6 without executing the left shift and the right shift (no shift). In this case, the fault selecting lines R1, R3, R5 and R7 corresponding to the four faults are connected to none of decode signal lines and are always under the selected state.

In other words, the four-bit shift redundancy operation can be executed finally in FIG. 96, by executing first the two-bit shift redundancy operation by using the redundancy selecting lines JL0 and JR0 positioned closer to the selecting lines for normal selection and by executing the two-bit shift operation by using the redundancy selecting lines JL1 and JR1 positioned apart from the selecting lines for normal selection.

FIG. 97 is a schematic view useful for explaining the first example in which the faults exist in three selecting lines R1, R3 and R6 and the three-bit shift redundancy operation is executed for these faults. In FIG. 97, the first switch unit 2a-1 executes the switch operation of corresponding four switch devices so that four decode signal lines on the left can be shifted in the direction of the first redundancy selecting line JL0 positioned closer to the selecting line R0 for normal selection (left shift). The first switch unit 2a-1 executes further the switch operation of two corresponding redundancy selecting lines so that two decode signal lines on the right can be shifted in the direction of the second redundancy selecting line JR0 positioned closer to the selecting line R7 for normal selection (right shift). The first and second switch units 2a-1 and 2a-2 operate the switch devices so that the decode signal lines and the selecting lines R4 and R5 can be connected without executing both the left shift and the right shift (no shift).

Furthermore, the second switch unit 2a-2 in FIG. 97 executes the switch operation of corresponding three switch devices so that three decode signal lines on the left can be further shifted in the direction of the first redundancy selecting line JL1 positioned apart from the selecting line R0 for normal selection (left shift). The second switch unit 2a-2 operates the switch devices so that the switch devices of the first switch unit 2a-1 can be connected to the selecting lines R2 and R7 and to the second redundancy selecting line JR0 without executing both the left shift and the right shift (no shift). In this case, the fault selecting lines R1, R3 and R6 corresponding to the three faults are connected to none of the decode signal lines but are always under the non-selection state. Furthermore, the second redundancy selecting line JR1 positioned apart from the selecting line R7 for normal selection, too, is not connected to the decode signal lines.

FIG. 98 is a schematic view useful for explaining the second example in which the faults exist in three selecting lines R1, R3 and R6 and the three-bit shift redundancy operation is executed for these faults. In FIG. 98, the first switch unit 2a-1 executes the switch operation of corresponding two switch devices so that two decode signal lines on the left can be shifted in the direction of the first redundancy selecting line JL0 positioned close to the selecting line R0 for normal selection (left shift). The first switch unit 2a-1 executes further five corresponding switch devices so that five decode signal lines can be shifted in the direction of the second redundancy selecting line JR0 positioned close to the selecting line R7 for normal selection (right shift). Furthermore, the first and second switch units 2a-1 and 2a-2 operate the switch devices so that the decode signal lines and the selecting line R2 can be connected without executing both the left shift and the right shift (no shift).

In FIG. 98, further, the second switch unit 2a-2 executes the switch operation of three corresponding switch devices so that three decode signal lines on the right can be further shifted in the direction of the second redundancy selecting line JR1 positioned apart from the selecting line R7 for normal selection (right shift). The second switch unit 2a-1 operates the switch devices so that the switch devices of the first switch unit 2a-1 can be connected to the selecting lines R0, R4 and R5 and to the first redundancy selecting line JL0 without executing both the left shift and the right shift (no shift). In this case, the fault selecting lines R1, R3 and R6 corresponding to the three faults are connected to one of the decode signals but are always under the non-selection state. Furthermore, the second redundancy selecting line JL1 positioned apart from the selecting line R0 for normal selection, too, is not connected to the decode signal lines, In other words, the three-bit shift redundancy operation can be executed finally in FIGS. 97 and 98, by executing the two-bit shift redundancy operation by using the redundancy selecting lines Jl0 and JR0 positioned close to the selecting lines for normal selection and by executing the one-bit shift redundancy operation by using either one of the redundancy selecting lines JL1 and JR1 positioned apart from the selecting lines for normal selection.

FIG. 99 is a schematic view useful for explaining the first example in which the faults exist in two selecting lines R2 and R5 and the two-bit shift redundancy operation is executed for these faults. In FIG. 99, the first switch unit 2a-1 executes the switch operation of corresponding six switch devices so that six decode signal lines on the left can be shifted in the direction of the first redundancy selecting line JL0 positioned close to the selecting line R0 for normal selection (left shift). The first and second switch units 2a-1 and 2a-2 operate the switch devices so that the decode signal lines can be connected to the selecting lines R6 and R7 without executing both the left shift and the right shift (no shift).

In FIG. 99, the second switch unit 2a-2 executes four corresponding switch devices so that four decode signal lines on the left can be shifted further in the direction of the first redundancy selecting line JL1 apart from the selecting line for normal selection R0 (left shift). The second switch unit 2a-2 operates the switch devices so that the switch devices of the first switch unit 2a-1 can be connected to the selecting lines R3 and R4 without executing both the left shift and the right shift (no shift). In this case, the fault selecting lines R2 and R5 corresponding to the two faults are connected to none of the decode signal lines but are always under the non-selection state. Furthermore, none of the redundancy selecting lines JR0 and JR1 positioned on the side of the selecting line for normal selection R7 are connected to the decode signal lines.

FIG. 100 is a schematic view useful for explaining the second example in which the faults exist in two selecting lines R2 and R5 and the two-bit shift redundancy operation is executed for these faults. In FIG. 100, the first switch unit 2a-1 executes the switch operation of three corresponding switch devices so that three decode signal lines on the left can be shifted in the direction of the first redundancy selecting line JL0 positioned close to the selecting line for normal selection R0 (left shift). The first switch unit 2a-1 executes three corresponding switch devices so that three decode signal lines on the right can be shifted in the direction of the second redundancy selecting line JR0 positioned close to the selecting line for normal selection R7 (right shift). The first and second switch units 2a-1 and 2a-2 operate the switch devices so that the decode signal lines can be connected to the selecting lines R3 and R4 without executing both the left shift and the right shift (no shift).

On FIG. 100, the second switch unit 2a-2 operates the switch devices so that the switch devices of the first switch unit 2a-1 can be connected to the selecting lines R0, R1, R6 and R7, to the inner first redundancy selecting line JL0, to the inner first redundancy selecting line JL0 and to the inner second redundancy selecting line JR0 without executing both the left shift and the right shift (no shift). In this case, the fault selecting lines R2 and R5 corresponding to the two faults are connected to none of the decode signal lines but are always under the non-selection state. Furthermore, the outer first redundancy selecting line JL1 and the outer second redundancy selecting line JR1 are not connected to the decode signal lines.

FIG. 101 is a schematic view useful for explaining the third example in which the faults exist in two selecting lines R2 and R5 and the two-bit shift redundancy operation is executed for these faults. In FIG. 101, the first switch unit 2a-1 executes the switch operation of corresponding six switch devices so that six decode signal lines on the right can be shifted in the direction of the second redundancy selecting line JR0 positioned close to the selecting line for normal selection R7 (right shift). The first and second switch units 2a-1 and 2a-2 operate the switch devices so that the decode signal lines and the selecting lines R0 and R1 can be connected without executing both the left shift and the right shift (no shift).

In FIG. 101, further, the second switch unit 2a-2 executes the switch operation of corresponding four switch devices so that four decode signal lines on the right can be further shifted in the direction of the second redundancy selecting line JR1 positioned apart from the selecting line for normal selection R7 (right shift). The second switch unit 2a-2 operates the switch devices so that the switch devices of the first switch unit 2a-1 and the selecting lines R3 and R4 can be connected without executing both the left shift and the right shift (no shift). In this case, the fault selecting lines corresponding to the two faults are connected to none of the decode signal lines but are always under the non-selection state. The redundancy selecting lines JL0 and JL1 positioned on the side of the selecting line for normal selection R0 are not connected to the decode signal lines.

In other words, the two-bit shift redundancy operation can be executed by using the inner first redundancy selecting line JL0 and the inner second redundancy selecting line JR0. In this case, only the switch devices of the first switch unit are allowed to execute the switch operation for shifting the decode signal lines in the direction of the redundancy selecting lines. On the other hand, in FIGS. 99 and 101, the two-bit shift redundancy operation can be executed by using two redundancy selecting lines at the left end or two redundancy selecting lines at the right end. In this case, the switch devices of the first switch unit execute the switch operation for shifting the decode signal lines in the direction of the redundancy selecting lines positioned in the left end or the right end, and the switch devices of the second switch unit execute the switch operation for shifting the decode signal lines in the direction of the redundancy selecting lines positioned outside the same end.

FIG. 102 is a schematic view useful for explaining the first example in which the fault exists in one selecting line R2 and the one-bit shift redundancy operation is executed for this fault. In FIG. 102, the first switch unit 2a-1 executes the switch operation of corresponding three switch devices so that three decode signal lines on the left can be shifted in the direction the first redundancy selecting line JL0 positioned close to the selecting line for normal selection R0 (left shift). The first and second switch units 2a-1 and 2a-2 operate the switch devices so that the decode signal lines and the selecting lines R3 to R7 can be connected without executing both the left shift and the right shift (no shift).

In FIG. 102, further, the second switch unit 2a-2 operates the switch devices so that the switch devices of the first switch unit 2a-1, the selecting lines R0 and R1 and the first redundancy selecting line JL0 can be connected without executing both the left shift and the right shift (no shift). In this case, the fault selecting line corresponding to one fault is connected to none of the decode signal lines but is always under the non-selection state. Furthermore, the first redundancy selecting line JL1 positioned on the side of the selecting line R0 for normal selection and the second redundancy selecting lines JR0 and JR1 positioned on the side of the selecting line R7 for normal selection are not connected to the decode signal lines.

FIG. 103 is a schematic view useful for explaining the second example in which the fault exists in one selecting line R2 and the one-bit shift redundancy operation is executed for this fault. In FIG. 103, the first switch unit 2a-1 executes the switch operation of corresponding six switch devices so that six decode signal lines on the right can be shifted in the direction of the second redundancy selecting line JR0 positioned close to the selecting line R7 for normal selection (right shift). The first and second switch units 2a-1 and 2a-2 operates the switch devices so that the decode signal lines and the selecting lines R0 and R1 can be connected without executing both the left shift and the right shift (no shift).

In FIG. 103, the second switch unit 2a-2 operates the switch devices so that the switch devices of the first switch unit 2a-1, the selecting lines R3 to R7 and the second redundancy selecting line JR0 can be connected without executing both the left shift and the right shift (no shift). In this case, the fault selecting line R2 corresponding to one fault is connected to none of the decode signal lines but is always under the non-selection state. Further, the first redundancy selecting lines J10 and JL1 positioned on the side of the selecting line R0 for normal selection and the second redundancy selecting line JR1 positioned on the side of the selecting line R7 for normal selection are not connected to the decode signal lines.

In other words, the one-bit shift redundancy operation can be executed in FIGS. 102 and 103 by using either one of the redundancy selecting lines JL0 and JR0 positioned close to the selecting lines for normal selection. In this case, only the switch devices of the first switch unit execute the switch operation for shifting the decode signal lines in the direction of either one of the redundancy selecting lines.

FIG. 105 is a diagram showing the signal level of each part due to the operations of the switch units when the faults occur in four selecting lines, and FIG. 106 is a diagram showing the signal level of each part due to the operations of the switch units when the faults occur in three selecting lines. Here, the diagrams each show the signal level of each part due to the switch operations of the first and second switch units when the faults occur in four or three selecting lines in a semiconductor memory device including two first redundancy selecting lines JL0 and JL1, two first redundancy selecting lines JR0 and JR1 and eight selecting lines for normal selection R0 to R7. FIG. 105 shows the signal level at each part when the switch operations of the switch units are effected as in FIG. 96, and FIG. 106 shows the signal level at each part when the switch operations of the switch units are effected as in FIG. 97.

The shift redundancy fuse circuit unit 4a shown in FIG. 95 includes fuse circuits for normal selection, that are used during the normal operation, fuse circuits for redundancy selection, that are used at the time of redundancy selection, and fuse circuits for forced redundancy, that are used at the time of forced redundancy in order to confirm whether or not any fault exists in the redundancy selecting lines. The fuse circuits for normal selection output the low voltage level ("L" level) when the corresponding fuses are cut, and also output the high voltage level ("H" level) when the fuses are not cut. On the other hand, the fuse circuits for redundancy selection (and the fuse circuits for forced redundancy) output the "H" level when the fuses (fuses for redundancy selection) are cut and output the "L" level when they are not cut, on the contrary. In this case, two fuses, that is, the fuse of the fuse circuit corresponding to the fault selecting line and the fuse of the fuse circuit for redundancy selection, that corresponds to either one of the first and second redundancy selecting lines, are cut for the one-bit shift redundancy. Therefore, when the four-bit shift redundancy operation is executed as in FIG. 105, eight fuses, that is, four fuses corresponding to the four fault selecting lines and the fuses of the fuse circuits for redundancy selection (redundancy selecting fuses) corresponding to all the four first and second redundancy selecting lines are cut. On the other hand, when the three-bit shift redundancy operation is executed as in FIG. 106, six fuses, that is, three fuses corresponding to the three fault selecting lines, two fuses positioned on the inner side among the first and second redundancy selecting lines, and one fuse positioned outside, are cut.

Figure 113:
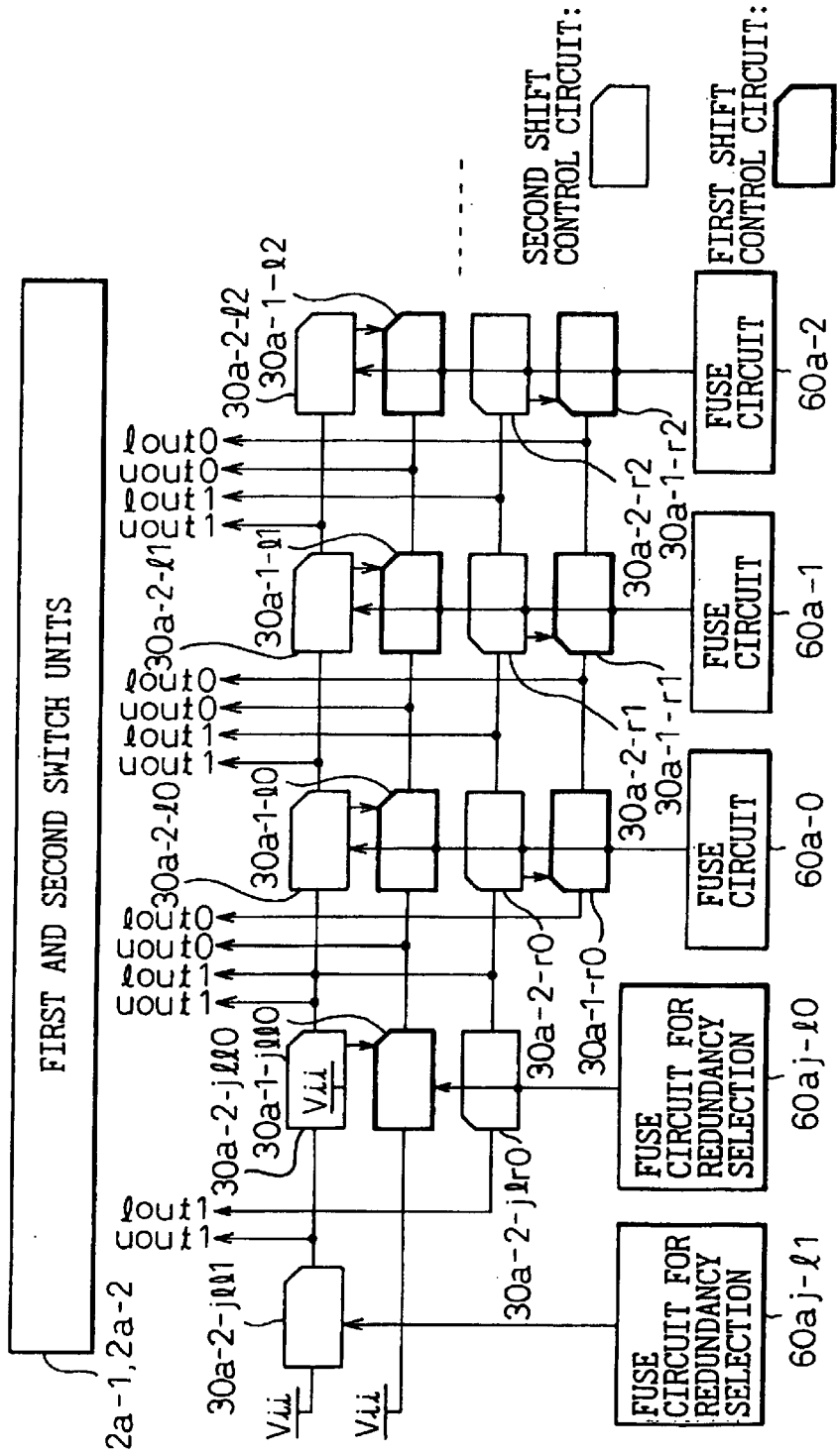
FIG. 113 is a block diagram (No. 1) showing an overall circuit construction of the seventh preferred embodiment of the present invention.

A plurality of shift control circuits in the first shift redundancy control circuit unit 3a-1 connect one of the first input signals uin0 and one of the first output signals lout0, and connect also the other of the first input signals lin0 to the other of the first output signals lout0, as will be described later with reference to FIG. 110, thereby constituting the series circuits in two stages as shown in later-appearing FIG. 113. On the other hand, a plurality of shift control circuits in the second shift redundancy control circuit unit 3a-2, too, connect likewise one of the second input signals uin1 to one of the second output signals uout1 and connect the other of the second input signals lin1 to the other of the second output signals lout1, thereby constituting the series circuits in two stages as shown in FIG. 113.

The switch operation of each switch device in the first switch unit 2a-1 is controlled by the combination of the "H" level and the "L" level of the first output signal uout0 and the first output signal lout0 outputted from the first shift redundancy control circuit unit 3a-1. When the fuses are not cut, the first output signal uout0 and the first output signal lout0 are all at the "L" level. At this time, further, the output of the fuse circuits corresponding to the selecting lines other than the redundancy selecting lines change to the "H" level in the shift redundancy fuse circuit unit 4a, and the output of the fuse circuits for redundancy selection, that correspond to the redundancy selection, change to the "L" level. In this case, the shift redundancy operation is judged as being absent.

On the other hand, the switch operation of each switch device in the second switch unit 2a-2 is controlled by the combination of the "H" level and the "L" level of the second output signal uout1 and the second output signal lout 1 outputted from the second shift redundancy control circuit unit 3a-2. When the fuses are not cut, the second output signal uout1 and the second output signal lout1 are all at the "L" level.

Considering the case in which the fuses corresponding to four fault selecting lines R1, R3, R5 and R7 are cut and four fuses of the fuse circuits for redundancy selection (redundancy selecting fuses) corresponding to four, first and second redundancy selecting lines JL0, JL1, JR0 and JR1 are cut, respectively, the outputs of the fuse circuits corresponding to the four fault selecting lines R1, R3, R5 and R7 that are cut change to the "L" level, while the outputs of the fuse circuits for redundancy selection, that correspond to four redundancy selecting lines JL0, JL1, JR0 and JR1 that are cut, change to the "H" level.

In this case, the first shift redundancy control circuit unit 3a-1 controls the switch operation of the first switch unit 2a-1 so that four decode signal lines on the left side can be shifted in the direction of the first redundancy selecting line JL0 positioned close to the selecting line R0 for normal selection (left shift ←). Furthermore, the first shift redundancy control circuit unit 3a-1 controls the switch operation of the first switch unit 2a-1 so that three decode signal lines On the right side can be shifted in the direction of the second redundancy selecting line JR0 positioned close to the selecting line for normal selection R7 (right shift →). The first shift redundancy control circuit unit 3a-1 and the second shift redundancy control circuit unit 3a-2 control the operations of the first and second switch units 2a-1 and 2a-2 so that the decode signal lines and the selecting line R4 can be connected without executing the right shift and the left shift (no shift ↑). The first shift redundancy control circuit unit 3a-1 and the second shift redundancy control circuit unit 3a-2 control the operation of the first and second switch units 2a-1 and 2a-2 so that the fault selecting lines R3 and R5 are brought into the non-selection state in which they are not connected to the decode signal lines (corresponding to "X" in the column of the first and second shift redundancy control circuit units 3-1 and 3a-2 in FIG. 105 (with the proviso of the portions that associate with the fault selecting lines R3 and R5)).

As shown in FIG. 105, the second shift redundancy control circuit unit 3a-2 controls the switch operation of the second switch unit 2a-2 so that three decode signal lines on the left can be further shifted in the direction of the first redundancy selecting line JL1 positioned apart from the selecting line R0 for normal selection (left direction ←). The second shift redundancy control circuit 3a-2 controls the switch operation of the second switch unit 2a-2 so that two decode signal lines on the right side can be further shifted in the direction of the second redundancy selecting line JR1 positioned apart form the selecting line R7 for normal selection (right shift →). The second shift redundancy control circuit unit 3a-2 controls the switch operation of the second switch unit 2a-2 so that the decode signal lines and the selecting lines R2 and R6 can be connected without executing both the left shift and the right shift (non shift ↑). The second shift redundancy control circuit unit 3a-2 controls the operation of the second switch unit 2a-2 so that two fault selecting lines R1 and R7 can be brought into the non-selection state in which they are not connected to the decode signal lines (corresponding to "X" in the column of the shift redundancy control circuit unit 3a-2 (with the proviso that the portions associated with the fault selecting lines R1 and R7). Since four fault selecting lines R1, R3, R5 and R7 are brought into the non-selection state in which they are not connected to any decode signal lines in this way, these fault selecting lines can be relieved.

At this time, only the first output signal uout at the position to which the signals from the fuse for normal selection and the fuse for redundancy selection are inputted and for which the left shift is executed in the first shift redundancy control circuit unit 3a-1 is at the "H" level, and the first output signals uout0 at other positions are all at the "L" level. Therefore, the state in which one of the first output signals uout0="H" and the other first output signal lout0="L" may be judged as the left shift. On the other hand, only the second output signal uout1 at the position to which the signals from the fuse for normal selection and from the fuses for redundancy selection are inputted and at which the left shift is executed in the second shift redundancy control circuit unit 3a-2 remains at the "H" level, and the second output signals at other positions are all at the "L" level. Therefore, the state where one of the second output signals uout1="H" and the other of the second output signals lout1="L" may be judged as the left shift.

Furthermore, only the first output signal lout0 at the position to which the signals from the fuses for normal selection and the fuses for redundancy selection are inputted and at which the right shift is executed in the first shift redundancy control circuit unit 3a-1 remains at the "H" level, and the first output signals lout0 at other positions are all remain at the "L" level. Therefore, the state in which one of the first output signals uout0="L" and the other of the fist output signal lout0="H" may be judged as the right shift. On the other hand, only the second output signal lout1 at the positions to which the fuses for normal selection and the fuses for redundancy selection are inputted and at which the right shift is executed in the second shift redundancy control circuit unit 3a-2 remains at the "H" level and the second output signals lout1 at other positions are all at the "L" level. Therefore, the state where one of the second output signals uout1="L" and the other of the second output signals lout1="H" may be judged as the right shift.

On the other hand, considering the case shown in FIG. 106 in which the fuses corresponding respectively to three fault selecting lines R1, R3 and R6 are cut and three fuses of the fuse circuits for redundancy selection (redundancy selecting fuses) corresponding respectively to two first redundancy selecting lines JL0 and JL1 and one second redundancy selecting line JR0 (that is, three redundancy selecting lines) are cut, the outputs of the fuse circuits corresponding to the four fault selecting lines R1, R3 and R6 that are cut change to the "L" level, and the outputs of the fuse circuits for redundancy selection that correspond to the three redundancy selecting lines JL0, JL1 and JR0 that are cut change to the "H" level.

In this case, the first shift redundancy control circuit unit 3a-1 controls the switch operation of the first switch unit 2a-1 so that four decode signal lines on the left can be shifted in the direction of the first redundancy selecting line JL0 positioned close to the selecting line R0 for normal selection (left shift ←). The first shift redundancy control circuit unit 3a-1 controls the switch operation of the first switch unit 2a-1 so that two decode signal lines on the right can be shifted in the direction of the second redundancy selecting line JR0 positioned close to the selecting line R7 for normal selection (right shift →).

Furthermore, the first shift redundancy control circuit unit 3a-1 and the second shift redundancy control circuit unit 3a-2 control the operations of the first and second switch units 2a-1 and 2a-2 so that the decode signal lines and the selecting lines R4 and R5 can be connected without executing the left shift and the right shift (no shift ↑). the first shift redundancy control circuit unit 3a-1 and the second shift redundancy control circuit unit 3a-2 control the operations of the first and second switch units 2a-1 and 2a-2 so that the fault selecting lines R3 and R6 can be brought into the non-selection state in which they are not connected to the decode signal lines (corresponding to "X" in the columns of the first and second shift redundancy control circuit units 3a-1 and 3a-2 (with the proviso that the portions associated with the fault selecting lines R3 and R6)).

As shown in FIG. 106, further, the second shift redundancy control circuit unit 3a-2 controls the switch operation of three decode signal lines on the left can be shifted further In the direction of the first redundancy selecting line JL1 positioned apart from the selecting line R0 for normal selection (left shift ←). The second shift redundancy control circuit unit 3a-2 operates the switch devices so that the decode signal lines, the selecting lines R2 and R7 and the second redundancy selecting lines JR0 can be connected without executing the left shift and the right shift (no shift →).

Furthermore, the second shift redundancy control circuit unit 3a-2 controls the operation of the second switch unit 2a-2 so that one fault selecting line R1 can be brought into the non-selection state in which it is not connected to any of the decode signal lines (corresponding to "X" in the column of the second shift redundancy control circuit unit 3a-2 (with the proviso that the portions associated with the fault selecting line). In this way, the three fault selecting lines R, R3 and R6 can be relieved by bringing them into the non-selection state in which they are not connected to any of the decode signal lines.

At this time, only the first output signal uout0 at the position to which the signals from the fuses for normal selection and the fuses for redundancy selection and at which the left shift is executed in the first shift redundancy control circuit unit 3a-1 in the same way as in FIG. 105 are at the "H" level, and the first output signals uout0 at other positions are all at the "L" level. Therefore, the state in which one of the first output signals uout0="H" and the other of the first output signals lout0="L" may be judged as the left shift. On the other hand, in the second shift redundancy control circuit unit 3a-2, too, only the second output signal uout1 at the position to which the signals from the fuses for normal selection and the fuses for redundancy selection are inputted and at which the left shift is executed remains at the "H" level, and the second output signals at other positions change to the "L" level, in he same way as in FIG. 105. Therefore, the state in which one of the second output signals uout1="H" and the other second output signal lout1="L" may be judged as the left shift.

Next, the constructions of the principal portions of the seventh preferred embodiment of the present invention having the one-bit to four-bit shift redundancy functions will be serially explained.

Figure 107:
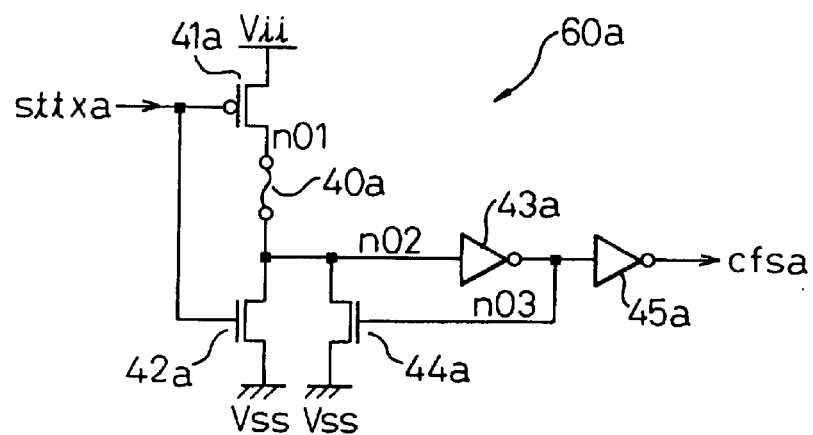
FIG. 107 is a circuit diagram showing the construction of a fuse circuit for normal selection in the seventh preferred embodiment of the present invention.

FIG. 107 is a circuit diagram showing the construction of the fuse circuit for normal selection in the seventh preferred embodiment. The fuse circuit for normal selection (with the exception of the fuse circuits for selection that are subjected to redundancy at the time of forced redundancy) 60a represents one of a plurality of fuse circuits in the shift redundancy fuse circuit unit 4a that are disposed so as to correspond on the 1:1 basis to the selecting lines R0 to R3, R6 to R(n−7) and R(n−4) to R(n−1).

In FIG. 107, symbol sttxa represents the control signal which is at the "H" level until the power source becomes operative after the power source is switched on and falls to the "L" level after the power source becomes operative. Symbol cfsa represents the output signal of the fuse circuit 60a. The fuse circuit 60a shown in FIG. 107 includes a P channel transistor 41a and an N channel transistor 42a to which the control signal sttxa is inputted, an N channel transistor 44a and two inverters 43a and 45a. When the fuse 40a is not cut, the output signal cfsa of the fuse circuit rises to the "H" level after the power source becomes operative. When the fuse 40a is cut, the output signal cfsa of the fuse circuit falls to the "L" level.

Figure 108:
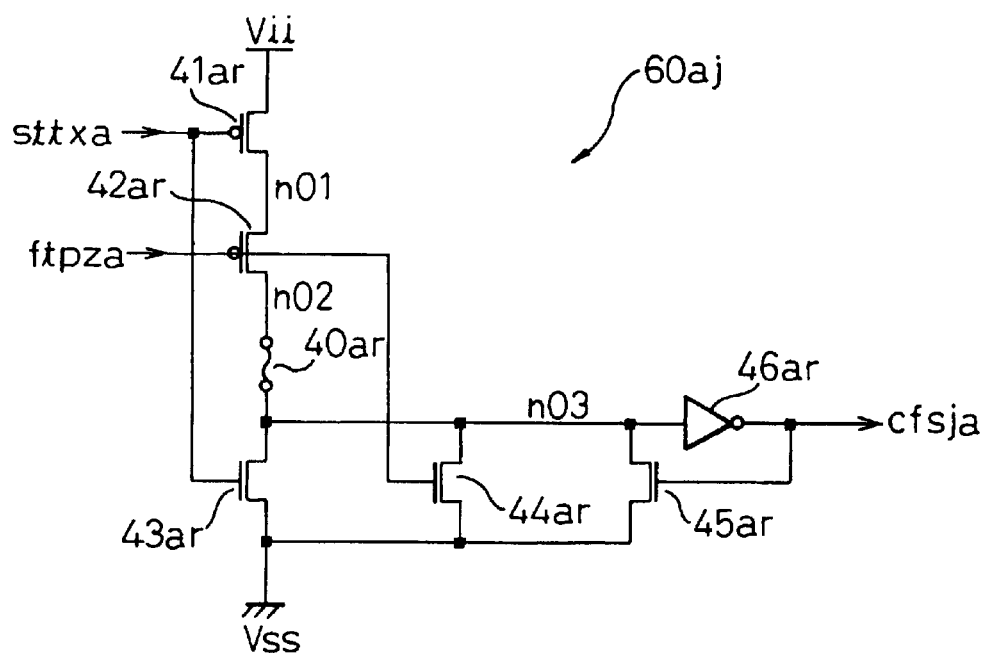
FIG. 108 is a circuit diagram showing the construction of a fuse circuit for redundancy selection in the seventh preferred embodiment.

FIG. 108 is a circuit diagram showing the construction of the fuse circuit for redundancy selection in the seventh preferred embodiment of the present invention. The fuse circuit 60aj for redundancy selection shown in FIG. 108 corresponds to each of the fuse circuits for redundancy selection that are used for the first and second redundancy selecting lines JL0, JL1, JR0 and JR1 in the shift redundancy fuse circuit unit 4a shown in FIG. 95.

In FIG. 108, symbol ftpza represents the control signal that rises to the "H" level when the forced redundancy operation is executed in order to confirm whether or not any fault exists in the redundancy selecting lines. The fuse circuit 60aj for redundancy selection shown in FIG. 108 includes a P channel transistor 41ar and an N channel transistor 43ar to which the control signal sttxa is inputted, a P channel transistor 42ar and an N channel transistor 44ar to which the control signal ftpza is inputted, an N channel transistor 45ar and an inverter 46ra. When the fuse (fuse for redundancy selection) 40ar is not cut and moreover, when the forced redundancy operation is not executed (with the control signal ftpza="L"), the output signal cfsja of the fuse circuit for redundancy selection falls to the "L" level. When the fuse 40ar is actually cut, on the other hand, the output signal cfsja of the fuse circuit for redundancy selection rises to the "H" level.

In FIG. 108, when the fuse 40r is not cut and moreover, when the forced operation is executed (control signal ftpza= "H"), the P channel transistor 42ra is turned OFF and the N channel transistor 44ar is turned ON, so that the node n03 falls to the "L" level. As a result, the output signal cfsja of the fuse circuit for redundancy selection rises to the "H" level. In this case, the fuse 40ar is apparently cut, and it becomes possible to confirm whether or not any fault exists in the redundancy selecting lines by executing the forced redundancy operation with the fuse circuit for forced redundancy selection shown in later-appearing FIG. 109.

In both of the fuse circuit for normal selection shown in FIG. 107 and the fuse circuit for redundancy selection shown in FIG. 108, the fuse of the fuse circuit corresponding to the selecting line as the object of redundancy and the fuse of the fuse circuit for redundancy selection corresponding to the redundancy selecting line are cut.

Figure 109:
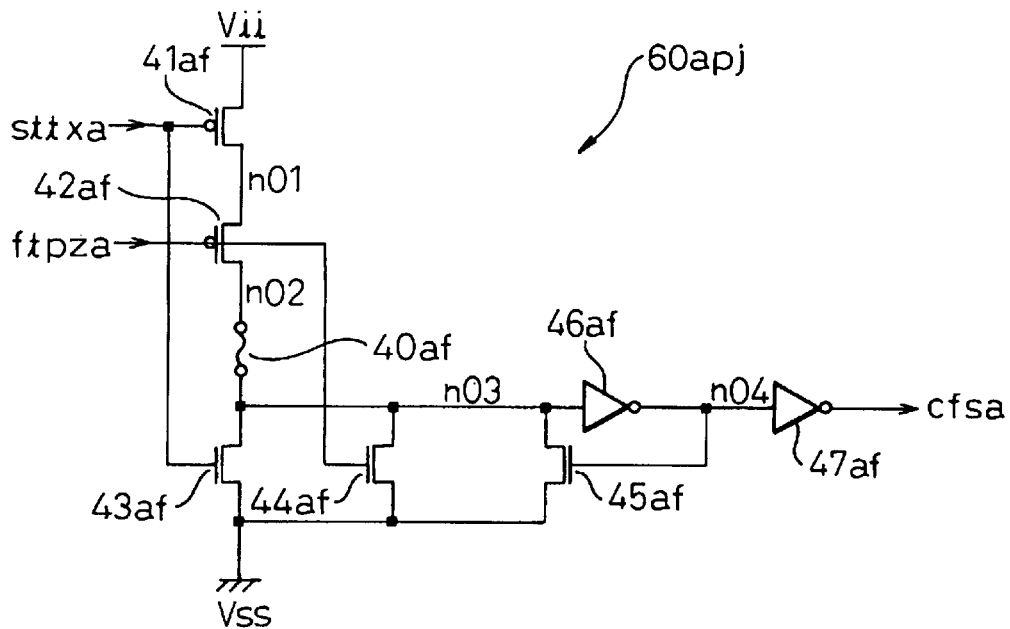
FIG. 109 is a circuit diagram showing the construction of a fuse circuit for forced redundancy in the seventh preferred embodiment of the present invention.

FIG. 109 is a circuit diagram showing the construction of the fuse circuit for forced redundancy selection in the seventh preferred embodiment of the present invention. The fuse circuit 60apj for forced redundancy selection shown in FIG. 109 corresponds to each of the fuse circuits for forced redundancy used for the four forced redundancy selecting lines inside the shift redundancy selecting lines inside the shift redundancy fuse circuit unit 4a shown in FIG. 95 (for example, those selecting lines which are not adjacent to, but close to, the redundancy selecting lines the redundancy selecting lines, such as the selecting lines R4, R5, R(n−6) and R(n−5).

In FIG. 109, symbol ftpza represents the control signal which rises to the "H" level when the forced redundancy operation is executed, as described already. The fuse circuit 60apj for forced redundancy shown in FIG. 109 includes a P channel transistor 41fa and an N channel transistor 43af to which the control signal sttxa is inputted, a P channel transistor 42af and an N channel transistor 44af to which the control signal ftpza is inputted, an N channel transistor 45af, and two inverters 46af and 47af. When the fuse 40af is caused to look as being apparently cut at the time of forced redundancy, the output signal cfsa of the fuse circuit for forced redundancy falls to the "L" level. It is possible under this state to confirm whether or not any fault exists in the redundancy selecting lines before the fuse corresponding to the selecting line as the object of shift redundancy is cut.

The explanation will be given in further detail. When the forced redundancy operation is executed, the "H" level control signal ftpza is inputted to the gate of each of the P and N channel transistors 42af and 44af. At this time, the P channel transistor 42fa is turned OFF, the N channel transistor 44af is turned ON and the input level of the inverter 46af falls to the "L" level. As a result, the output level of the inverter 47af changes to the "L" level, and the "L" level output signal cfsa is generated.

When the forced redundancy operation is not executed (control signal ftpza="L"), on the other hand, the P channel transistor 42af is turned ON, the N channel transistor 44af is turned OFF, and the input level of the inverter 46af rises to the "H" level. As a result, the output level of the inverter 47af rises to the "H" level, and the "H" level output signal cfsa is generated. When the fuse 40af is cut actually, the N channel transistor 45af is turned OFF and the input level of the inverter 46af falls to the "L" level. As a result, the output level of the inverter 47af changes to the "L" level, and the "L" level output signal cfsa is generated.

Figure 110:
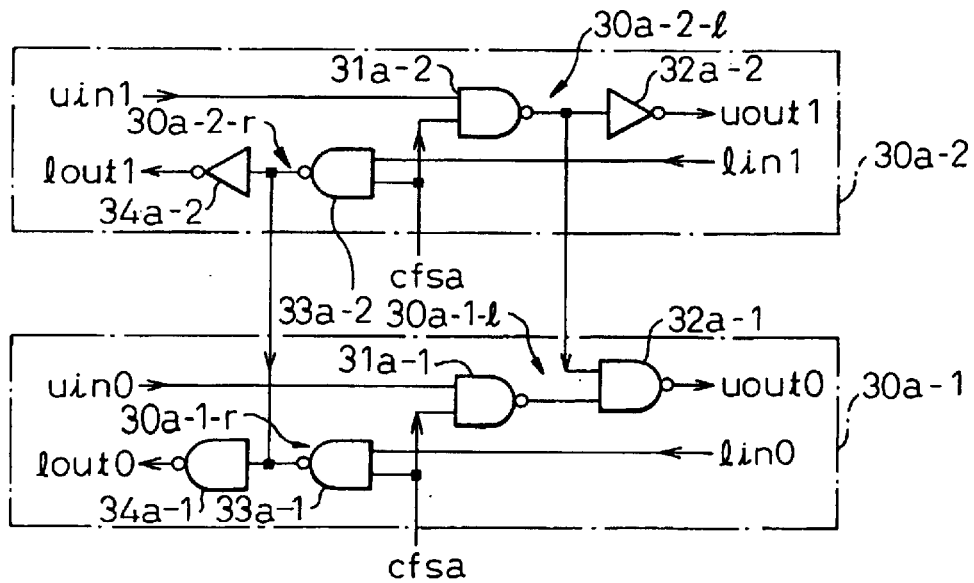
FIG. 110 is a circuit diagram showing the constructions of first and second shift control circuits in the seventh preferred embodiment of the present invention.

FIG. 110 is a circuit diagram showing the construction of the first and second shift control circuits in the seventh preferred embodiment of the present invention. The drawing shows each of a plurality of first shift control circuits that constitutes the first shift redundancy control circuit unit 3a-1 (see FIG. 95) for controlling the change operation of the first switch unit 2a-1 (see FIG. 95), and each of a plurality of second shift control circuits constituting the second shift redundancy control circuit unit 3a-2 (see FIG. 95) for controlling the change operation of the second switch unit 2a-2 (see FIG. 95)

FIG. 110, symbol uout0 represents one of the output signals in each first shift control circuit of the first shift redundancy control circuit unit 3a-1, and symbol lout0 represents the other output signal in the first shift control circuit. Symbol uout1 represents one of the output signals in each second shift control circuit of the second shift redundancy control circuit unit 3a-2 and symbol lout1 represents the other output signal in the second shift control circuit. Symbol cfsa represents the output signal of the fuse circuit 60a shown in FIGS. 107 and 108 (also the fuse circuit 60aj for redundancy selection).

In FIG. 110, further, each first shift control circuit 30a-1 is the one that controls each switch device of the first switch unit 2a-1 upon receiving the output signal cfsa of the fuse circuit, and includes a first shift control circuit 30a-1-l for the left shift and a first shift control circuit 30a-1-r for the right shift. The first shift control circuit 30a-1-l for the left shift comprises a circuit formed by connecting two NAND gates 31a-1 and 32a-1 as shown in FIG. 110. The first shift control circuit 30a-1-r similarly comprises a circuit formed by connecting two NAND gates 33a-1 and 34a-1 as shown in FIG. 110.

Here, a plurality of shift control circuits inside the first shift redundancy control circuit unit 3a-1 comprises two series circuits formed by connecting one of the first input signals uin0 in the first shift control circuit 30a-1-l for the left shift to one of the first output signals uout0 and connecting the other of the first input signals lin0 in the first shift control circuit 30a-1 for the right shift to the other of the first output signals lout0, and disposed in two stages. In the first shift redundancy control circuit unit 3-1 described above, the input signal uin0 of the first shift control circuit for the left shift, that is positioned at one of the ends, and the input signal uin0 of the first shift control circuit for the left shift, that is positioned at one of the ends, are connected to the power source (power source voltage Vii) on the high voltage side, and the "H" level voltage is inputted to them, respectively.

In FIG. 110, further, each of the second shift control circuits 30a-2 is the circuit that controls each switch device of the second switch unit 2a-2 upon receiving the output signal cfsa of the fuse circuit 60a for normal selection (and the fuse circuit 60aj for redundancy selection), and includes the second shift control circuit 30a-2-l for the left shift and the second shift control circuit 30a-2-r for the right shift. The second shift control circuit 30a-2-l for the left shift comprises a NAND gate 31a-2 and an inverter 32a-2 that are connected as shown in FIG. 110. The shift control circuit 30a-2-r for the right shift, too, comprises a NAND gate 33a-2 and an inverter 34a-2 that are connected as shown in FIG. 110.

Here, each of the shift control circuits in the second shift redundancy control circuit unit 3a-2 comprises two series circuits that are formed by connecting one of the second input signals uin1 in the second shift control circuit 30a-2-l for the left shift and one of the second output signals uout1 and connecting the other second input signal lin1 in the second shift control circuit 30a-2 for the right shift and the other second output signal lout1, and that are disposed in two stages. The input signal uin1 of the second shift control circuit for the left shift, that is positioned at one of the ends, and the input signal lin1 of the second shift control circuit for the right end, that is positioned at the other end, are connected to the power source (power source voltage Vii) on the high voltage side, and the "H" level voltage is inputted to them.

The switch operation of each switch device inside the first switch unit 2a-1 is controlled by the combination of the "H" level and the "L" level of the first output signal uout0 and the first output signal lout0 outputted from the first shift redundancy control circuit unit 3a-1. Further, the switch operation of each switch device in the second switch unit 2a-2 is controlled by the combination of the "H" level and the "L" level of the second output signal uout1 and the second output signal lout1 outputted from the second shift redundancy control circuit unit 3a-2.

In FIG. 110, further, the output terminal of the NAND gate 31a-2 of the second shift control circuit 30a-2-l for the left shift is connected to one of the input terminals of the NAND gate 32a-1 of the first shift control circuit 30a-1-l for the left shift. Similarly, the second output terminal of the NAND gate 33a-2 of the second shift control circuit 30a-r-2 for the right shift is connected to one of the input terminals of the NAND gate 34a-1 of the first shift control circuit 30a-1-r for the right shift. When the right shift operation or the left direction shift operation of the switch devices of the second switch unit 2a-2 by the second shift control circuit is executed in such a circuit construction, the shift operation of the switch devices of the first switch unit 2a-1 in the same direction is always executed by the first shift control circuit. Therefore, the switch operation for shift redundancy by the first and second switch units 2a-1 and 2a-2 can be executed without error.

Figure 111:
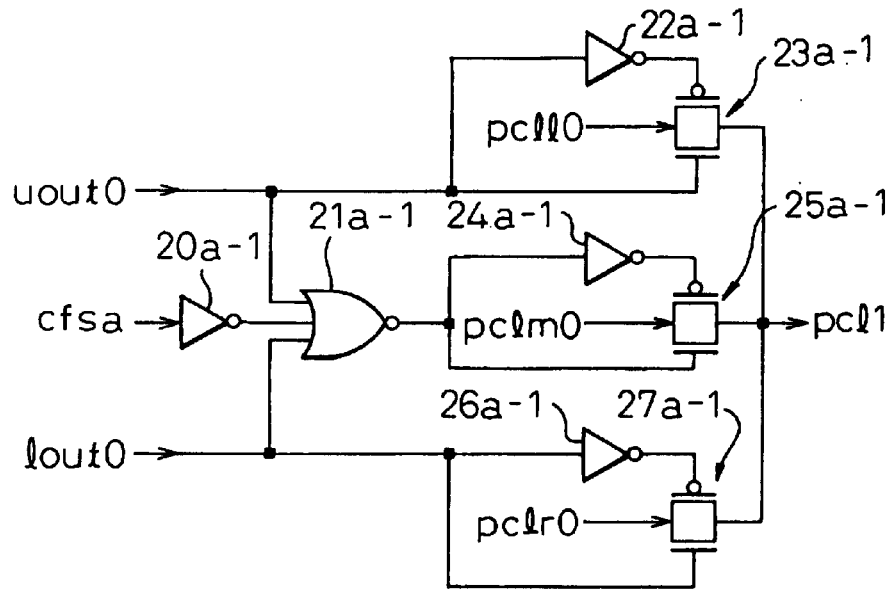
FIG. 111 is a circuit diagram showing the construction of a first switch unit in the seventh preferred embodiment of the present invention.
Figure 112:
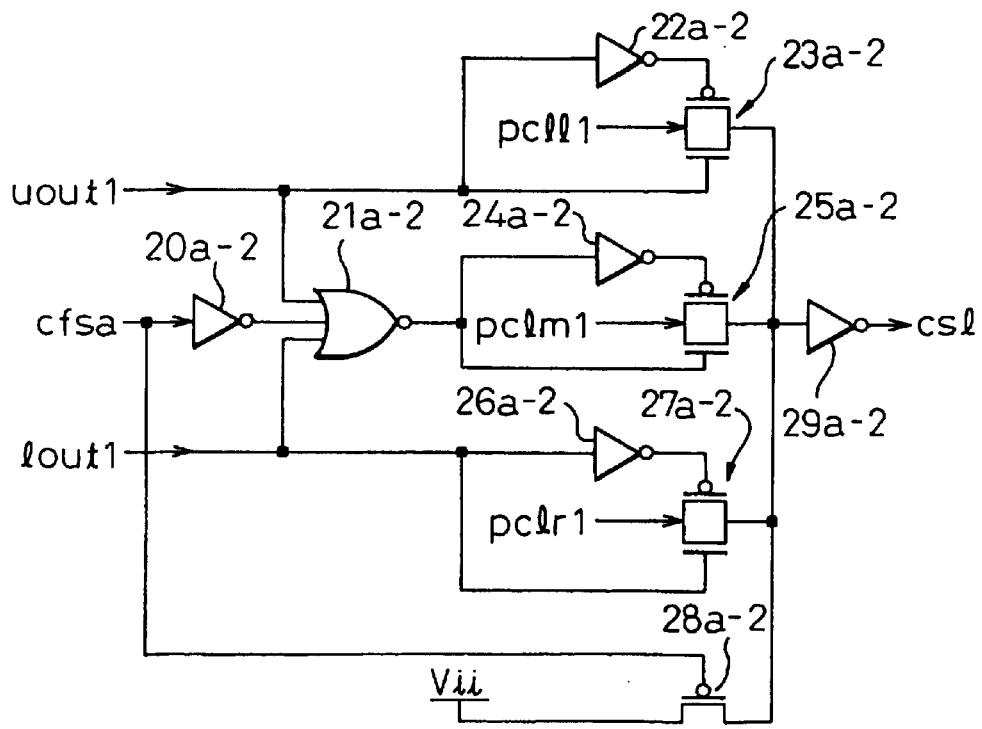
FIG. 112 is a circuit diagram showing the construction of a second switch unit in the seventh preferred embodiment of the present invention.

FIG. 111 is a circuit diagram showing the construction of the first switch unit in the seventh preferred embodiment of the present invention, and FIG. 112 is a circuit diagram showing the construction of the second switch unit in the seventh preferred embodiment. These drawings show the circuit construction of each of a plurality of switch devices in the first and second switch units 2a-1 and 2a-2. In this case, a plurality of switch devices of the first and second switch units 2a-1 and 2a-2 are disposed in two stages and in series, as 41 described already. The first and second switch units 2a-1 and 2a-2 include the circuit element corresponding to each switch device, and have also the function of supplying a predetermined output voltage by driving the selecting line when the load of this selecting line becomes great.

As shown in FIG. 111, the first output signal uout0 in each of the first shift control circuits in the first shift redundancy control circuit unit 3a-1 is inputted to each switch device of the first switch unit 2a-1 of the first stage, and the first output signal lout0 in the first shift control circuit is also inputted. Symbol cfsa represents the output signal of the aforementioned fuse circuit 60a (see FIG. 107), and symbols pcll0, pclm0 and pclr0 correspond to three adjacent decode signal lines d(#−1), d# and d(#+1) in a plurality of decode signal lines, respectively. Here, symbol # represents the number of a predetermined decode signal line. Symbol pcll represents the output signal of an arbitrary switch device of the first switch unit 2a-1, and this signal is supplied to any one of the switch devices of the second switch unit 2a-2 of the second stage.

Preferably, each switch device of the first switch unit 2a-1 shown in FIG. 111 can select the mode for executing the shift operation in the direction of the first redundancy selecting line JL0 (that is, the left shift), the mode for executing the shift operation in the direction of the second redundancy selecting line JR0 (that is, the right shift) and the node for not executing the shift operation (that is, no shift), in accordance with the combination of the first output signals uout0 and lout0 in each first shift control circuit of the first shift redundancy control circuit unit 3a-1.

Each switch device in the first switch unit 2a-1 shown in FIG. 111 includes a NOR gate (NOR disjunction gate) 21a-1 using, as three input signals thereof, the signal obtained by inverting the output signal cfsa of the fuse circuit by an inverter 20a-1, one of the output signals uout1 of the first shift control circuit and the other output signal lout 1 of the first shift control circuit, and a three-directional switch device comprising three inverters 2a-1, 24a-1 and 26a-1 and three transfer gates 23a-1, 25a-1 and 27a-1.

The explanation will be given in further detail, When both of the output signals uout0 and lout0 of the first shift control circuit are at the "L" level and the output signal cfsa of the fuse circuit is at the "H" level, the mode for not executing the shift redundancy operation is selected, and the second transfer gate 25a-1 turned ON. When the output signals uout0 and lout0 of the first shift control circuit are at the "H" and "L" levels, respectively, and when the output signal cfsa of the fuse circuit is at the "H" level, the mode for executing the shift redundancy operation in one direction is selected, and the first transfer gate 23a-1 is turned ON. When the output signals uout0 and lout0 of the first shift control circuit are at the "L" and "H" levels, respectively, and when the output signal cfsa of the fuse circuit is at the "H" level, the mode for executing the shift redundancy operation in the other direction is selected, and the third transfer gate 27a-1 is turned ON.

On the other hand, as shown in FIG. 112, the second output signal uout1 of each shift control circuit of the second redundancy control circuit unit 3a-2 is inputted to each switch device in the second switch unit 2a-2 of the second stage, and the second output signal lout1 in the second shift control circuit is also inputted. Symbol cfsa represents the output signal of the fuse circuit 60a (see FIG. 107), and symbols pcll1, pclm1 and pcl41 correspond to the output signals from three adjacent switch devices (poll in FIG. 111) among a plurality of switch devices of the first switch unit 2a-1, respectively. Symbol csl represents the output signal of arbitrary switch device of the second switch unit 2a-2, which is supplied to arbitrary one of the selecting lines.

Each switch device of the second switch unit 2a-2 shown in FIG. 112 can preferably select the mode for executing the shift operation in the direction of the second redundancy selecting line JL1 (that is, the left shift), the mode for executing the shift operation in the direction of the second redundancy selecting line JL0 (that is, the right shift) and the mode for not executing the shift operation (that is, no shift), in accordance with the combination of the second output signals in each of the second shift control circuits of the second shift redundancy control circuit unit 3a-2.

Each switch device of the second switch unit 2a-2 shown in FIG. 112 includes a NOR gate (nondisjunction gate) using, as three input signals thereof, the signal obtained by inverting the output signal cfsa of the fuse circuit by an inverter 20a-2, one of the output signals uout1 of the second shift control circuit and the other output signal lout1 of the second shift control circuit, and a three-directional switch device comprising three inverters 22a-2, 24a-2 and 26a-2 and three transfer gates 23a-2, 25a-2 and 27a-2.

The explanation will be given in further detail. When both of the output signals uout1 and lout of the second shift control circuit are at the "L" level and the output signal cfsa of the fuse circuit is at the "H" level, the mode for not executing the shift redundancy operation is selected, and the second transfer gate 25a-2 is turned ON. When the output signals uout1 and lout1 of the second shift control circuit are at the "H" and "L" levels, respectively, and when the output signal cfsa of the fuse circuit is at the "H" level, the mode for executing the shift redundancy operation in one direction is selected, and the first transfer gate 23a-2 is turned ON. When the output signals uout1 and lout1 are at the "L" and "H" levels, respectively, and when the output signal cfsa of the fuse circuit is at the "H" level, the mode for executing the shift redundancy operation in the other direction as selected, and the third transfer gate 27a-2 is turned ON.

Further, when both of the output signals uout1 and lout 1 of the second shift control circuit are at the "L" level and the output signal cfsa of the fuse circuit is at the "L" level, three transfer gates 23a-1, 25a-1 and 27a-1 are all turned OFF. At this time, the P channel transistor 28a02 is turned ON and the "H" level voltage is inputted to the inverter 29a-2. This inverter 29a-2 functions as an output driver, and the output voltage of this output driver changes to the "L" level. In other words, when the selecting line connected to this output driver 29a-2 is the fault selecting line, this fault selecting line can be brought always into the non-selection state.

Figure 114:
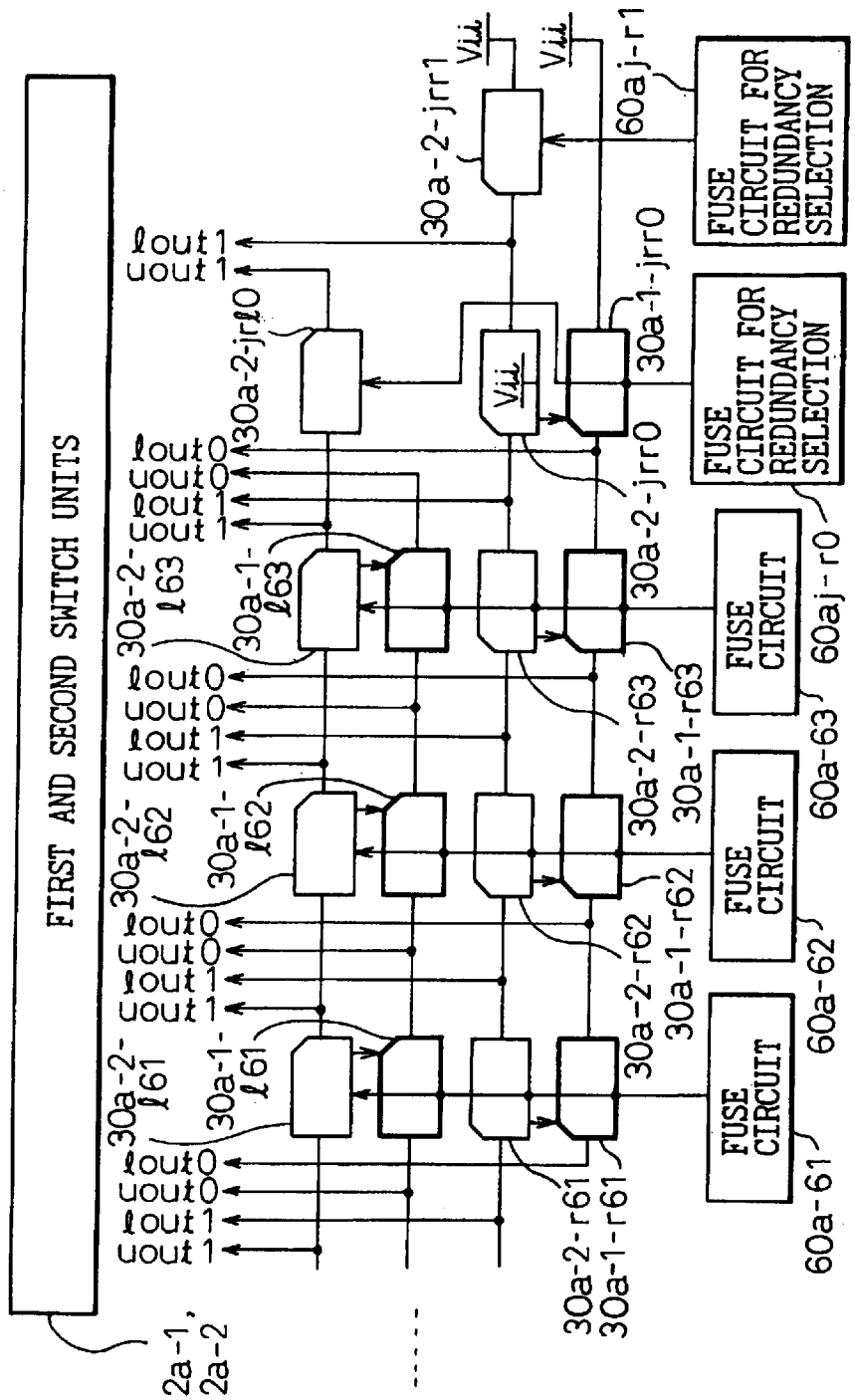
FIG. 114 is a block diagram (No. 2) showing the overall circuit construction of the seventh preferred embodiment of the present invention.

FIGS. 113 and 114 are block diagrams Nos. 1 and 2 each showing the overall circuit construction of the seventh preferred embodiment of the present invention, respectively. These drawings illustrate the case in which the semiconductor memory device (parent circuit) having sixty-four selecting lines R0 to R63 and four, first and second redundancy selecting lines JL0, JL1, JR0 and JR1 is constituted by connecting a plurality of children circuits such as the fuse circuits for normal selection showing in FIG. 107, the fuse circuits for redundancy selection shown in FIG. 108, the first and second shift control circuits shown in FIG. 110 and the first and second switch units shown in FIGS. 111 and 112, with each other.

FIG. 113 shows the left end portion of such a parent circuit and FIG. 114 shows its right end portion. In FIGS. 113 and 114, a plurality of fuse circuits for normal selection (such as first to 64-th fuse circuits 60a to 63a) are shown connected to a plurality of first shift control circuits, respectively. These first shift control circuits include the 1st first shift control circuit 30a-1-l0 for the left shift positioned at the extreme left to the 64-th first shift control circuit 30a-1-l63 for the left shift, and the 1st first shift control circuit 30a-1-r0 for the right shift to the 64-th first shift control circuit 30a-1-r63 for the right shift.

The output signals (uout0 and lout0) from these shift control circuits are used for controlling the switch operation of a plurality of switch devices of the first switch unit 2a-1. The decode signal lines of the decoder circuits shown in FIG. 95 are connected to a plurality of switch devices of the first switch unit 2a-1, and the decode signals sdec outputted from the decode circuits are supplied to a plurality of switch devices of the first switch unit 2a-1. Incidentally, each of the switch devices of the first switch unit 2a-1 includes the circuit elements corresponding thereto, as described already.

In FIGS. 113 to 114, a plurality of fuse circuits for normal selection are connected to a plurality of second shift control circuits, too, respectively. These second shift control circuit includes the 1st second shift control circuit 30a-2-l0 for the left shift to the 64-th second shift control circuit 30a-2-l63 for the left shift, and the 1st second shift control circuit 30a-2-r0 for the right shift to the 64-th second shift control circuit 30a-2-r63 for the right shift.

The output signals (uout1 and lout1) of these second shift control circuits are used for controlling the switch operation of a plurality of switch devices of the second switch unit 2a-2. A plurality of switch devices of the first switch unit 2a-1 shown in FIG. 95 are connected to a plurality of switch devices of the second switch unit 2a-2, and the decode signals sdec outputted from the decode circuits are supplied to a plurality of switch devices of the second switch unit 2a-2 through a plurality of switch devices of the first switch unit 2a-1. Incidentally, each of these switch devices of the second switch unit 2a-2 includes the circuit elements corresponding thereto.

In FIGS. 113 and 114, further, the fuse circuit 60aj-l0 for redundancy selection that is positioned close to the selecting line R0 of the extreme left is connected to the first shift control circuit 30a-1-jll0 for redundancy selection for the left shift. On the other hand, the fuse circuit 60aj-r0 for redundancy selection that is positioned close to the selecting line R6 at the extreme right is connected to the first shift control circuit 30a-1-jrr0 for redundancy selection for the right shift.

In FIGS. 113 and 114, further, the fuse circuit 60*aj-l*0 for redundancy selection that is positioned close to the selecting line R0 at the extreme left is connected to the second shift control circuit 30-2-*jll*0 for the left shift and to the second shift control circuit 30*a*-2-*jlr*0 for redundancy selection for the right shift. Further, the fuse circuit 60*aj-l*1 for redundancy selection that is positioned apart from the selecting line R0 at the extreme left is connected to the second shift control circuit 30*a*-2-*jll*1 for redundancy selection for the left shift. On the other hand, the fuse circuit 60*aj-r*0 for redundancy selection that is positioned close to the selecting line R63 at the extreme right is connected to the second shift control circuit 30*a*-2-*jrl*0 for redundancy selection for the left shift and to the second shift control circuit 30*a*-2-*jrr*0 for the right shift. Furthermore, the fuse circuit 60*aj-r*1 for redundancy selection that is positioned apart from the selecting line R63 for the extreme right is connected to the second shift control circuit 30*a*-2-*jrr*1 for redundancy selection for the right shift.

Furthermore, each shift control circuit shown in FIGS. 113 and 114 comprises the series circuits that are formed by connecting one of the fist input signal uin0 of the mutually left adjacent, first shift control circuits for the left shift to one of the first output signals uout0 and connecting the other first input signal lin0 of the mutually right adjacent first shift control circuits for the right shift to the other first output signal lout0, and that are disposed in two stages. The "H" level voltage from the power source (power source voltage Vii) on the high voltage side is inputted to the input signal uin0 of the first shift control circuit 30*a*-1-*jll*0 for the left shift, that is positioned at the left end, and to the input signal lin0 of the second shift control circuit 30*a*-1-*jrr*0 for redundancy selection for the right shift that is positioned at the right end.

Each shift control circuit shown in rigs. 113 and 114 comprises series circuits that are formed by connecting one of the second input signals uin1 in the mutually adjacent second shift control circuits for the left shift to one of the second output signals uout1, and connecting the other of the second input signals lin1 in the second shift control circuit for the right shift to the other of the second output signals lout 1, and that are disposed in two stages. The "H" level voltage is inputted from the power source (power source voltage Vii) on the high voltage side to the input signal uin1 of the second shift control circuit 30*a*-2-*jll*1 that is positioned at the extreme left and to the input signal lin1 of the second shift control circuit 30*a*-2-*jrr*1 for the redundancy selection for the right shift that is positioned at the extreme right.

In the seventh preferred embodiment, the fuses must be disposed on the 1:1 basis for a plurality of selecting lines in order to execute the one-bit to four-bit shift redundancy process. Therefore, when the number of selecting lines increases, the number of fuses increases, too. In a semiconductor memory device having sixty-four selecting lines, for example, sixty-eight, in total, fuses must be laid out on the semiconductor chip in such a manner as to correspond to the sixty-four selecting lines and the four redundancy selecting lines.

In view of the problem described above, it is possible to generate the fuse decode signals by decoding the signals generated by the combinations of a plurality of fuses in order to minimize the necessary number of fuses. When the fuse decode signals corresponding to the sixty-four selecting lines are generated, for example, sixty-four fuse decode signals can be generated by combining six fuses ($2^6$=64). Therefore, sixteen fuses, inclusive of four fuses for redundancy selecting fuses, may be prepared.

As explained above, the semiconductor memory device according to the typical embodiments of the present invention first controls the switch operation of the switches, when the faults occur in two selecting lines among a plurality of selecting lines, so that a plurality of decode signal lines can be shifted by one bit in the direction of the first redundancy selecting line positioned at one of the ends among a plurality of selecting lines and a plurality of decode signal lines can be shifted by one bit in the direction of the second redundancy selecting line positioned at the other end among a plurality of selecting lines. Therefore, when two or more than two fault selecting lines occur due to mutual short-circuit among a plurality of selecting lines, etc., the shift operation is executed in the direction of one of the redundancy selecting lines and in the direction of the other. In this way, the two-bit shift redundancy operation is executed with low power consumption and by high-speed access, and the fault selecting lines can be relieved efficiently.

Second, when the fault occurs in one of the selecting lines among a plurality of selecting lines, the semiconductor memory device according to the typical embodiments of the present invention controls the switch operation of the switch devices so that a plurality of decode signal lines can be shifted by one bit in the direction of the redundancy selecting line positioned at either of the ends among a plurality of selecting lines. Therefore, when one fault selecting line occurs, the shift operation is executed in the direction of either one of the two redundancy selecting lines in the same way as in the conventional shift redundancy system. In this way, the one-bit shift redundancy operation is executed and the fault selecting line can be relieved.

Third, in the semiconductor memory device according to the typical embodiments of the present invention, the DC voltage level representing whether or not the fuse is cut is outputted from the shift redundancy fuse circuit unit. Therefore, the high-speed operation of the signal processing is not necessary, the circuit layout on the semiconductor chip can be relatively simplified, and the occupying area of the semiconductor chip can be reduced.

Fourth, in the semiconductor memory device according to the typical embodiments of the present invention, the shift redundancy control circuit unit can be constituted by the NAND gate or NOR gate for outputting the shift control, signal for executing shift redundancy upon receiving the output result of the fuse circuit and the inverter. Therefore, the shift redundancy control circuit can be constituted by a simple circuit construction.

Fifth, in the semiconductor memory device according to the typical embodiments of the present invention, each of the switch devices connected to a plurality of selecting lines comprises a three-directional switch device capable of selecting the mode for executing shift redundancy to the left, the mode for executing shift redundancy to the right and the mode for not executing shift redundancy. Therefore, the switch device can be constituted by a simple circuit construction.

Sixth, the semiconductor memory device according to the typical embodiments of the present invention includes the forced redundancy fuse circuit which causes the fuse, that corresponds to a predetermined selecting line, to look as being apparently cut. Therefore, it becomes possible before cutting the redundancy selecting line to confirm whether or not any fault exists in the redundancy selecting lines, and the influences of adjacent selecting lines on the redundancy selecting line can be tested simply.

Seventh, the semiconductor memory device according to the typical embodiments of the present invention judges whether or not the shift redundancy process is executed by evaluating the output level of the fuse circuit for redundancy judgement and judging whether or not a part of the fuses is cut, inside a plurality of memory cell blocks. Therefore, the block in which the shift redundancy process is executed can be easily detected even after the manufacture of the package, etc, by mounting the semiconductor memory device on the chip.

Eighth, in the semiconductor memory device according to the typical embodiments of the present invention, the data write or read operation is carried out by selecting the memory cell in each block in such a manner that the sequence of a plurality of memory cell blocks does not change, when the shift redundancy process is executed.

Ninth, in the semiconductor memory device according to the typical embodiments of the present invention, a plurality of selecting lines and a plurality of fuses are laid out in the same pitch in the semiconductor chip. Therefore, the selecting line for which the shift redundancy process is executed can be confirmed at a glance.

Tenth, when the faults occur in two selecting lines among a plurality of selecting lines in the semiconductor memory device according to the typical embodiments of the present invention, the addresses of the fuses corresponding to these two fault selecting lines are designated and the fuse decode signals are generated by the combination of a smaller number of fuses than the total number of the selecting lines. Therefore, the number of fuses mounted on the semiconductor chip can be decreased, and the occupying area of the fuses on the semiconductor chip can be saved.

Eleventh, when the fault occurs in one of a plurality of selecting lines, the semiconductor memory device according to the typical embodiments of the present invention designates the address of the fuse corresponding to this one fault selecting line and generates the fuse decode signal by the combination of a smaller number of fuses than the total number of selecting lines. Therefore, the semiconductor memory device can execute the one-bit shift redundancy operation by using a smaller number of fuses than in the prior art devices and can relieve the fault selecting line.

Twelfth, the semiconductor memory device according to the typical embodiments of the present invention allows two adjacent cell arrays inside the semiconductor chip to share the fuse circuit for normal selection and the fuse circuit for forced redundancy, and disposes independently the fuse circuits for redundancy selection in such a manner as to correspond to the cell arrays, respectively. In this way, the semiconductor memory device can execute the two-bit or one-bit shift redundancy operation for the total number of selecting lines of the two adjacent cell arrays, and can therefore increase the degree of freedom of redundancy for the fuses for redundancy selection.

Thirteenth, the semiconductor memory device according to the typical embodiments of the present invention allows two adjacent cell arrays in the semiconductor chip to share the fuse circuit for normal selection and the fuse circuit for forced redundancy, and disposes independently the fuse circuits for redundancy selection in such a manner as to correspond to the cell arrays, respectively. Therefore, the semiconductor memory device can execute the two-bit or one-bit shift redundancy operation for the selecting lines of either one of the two adjacent cells, can also execute the two-bit or one-bit shift redundancy operation for the selecting lines of both cell arrays, and can increase the degree of freedom of redundancy in comparison with the system in which the shift redundancy operation is executed for each cell array.

Fourteenth, when the shift redundancy operation is executed for the column selecting lines disposed for a plurality of row blocks, the semiconductor memory device according to the typical embodiments of the present invention incorporates the logic of the address of the row block into the address of the column selecting line as the object of the shift redundancy operation. In this way, each of the column selecting lines receives the logic of the address of the row block corresponding to the row block of its own, and the degree of freedom of redundancy can be increased relatively by executing the shift redundancy operation in the row block unit.

Fifteenth, the semiconductor memory device according to the typical embodiments of the present invention disposes the switch units having the shift redundancy function of at least two bits in two stages and in series, and causes each switch unit to execute the switch operation for shifting the decode signal lines in the direction of the redundancy selecting line positioned at one of the ends or in the direction of the redundancy selecting line at the other end, or in the directions of both redundancy selecting lines. In this way, when three or more than three fault selecting lines occur on the semiconductor chip due to group defects, etc., these fault selecting lines can be relieved by executing the shift redundancy operation or three or more than three bits. Therefore, the production yield of the chips can be improved.

Sixteenth, the semiconductor memory device according to the typical embodiments of the present invention causes at least one of the switch units disposed in two stages to execute the switch operation in the direction of one of the redundancy selecting lines or in the direction of the other redundancy selecting line or in the directions of both redundancy selecting lines. Even it when one or two fault selecting lines occur on the semiconductor chip, therefore, these fault selecting lines can be relieved.

What is claimed is:

1. A semiconductor memory device including a plurality of selecting lines for writing or reading data by selecting a specific memory cell from among a plurality of memory cells on the basis of the address signal supplied from external, comprising:
    at least one first redundancy selecting line positioned at one of the ends in a plurality of said selecting lines and at least one second redundancy selecting line positioned at the other end; and
    a switch circuit for changeably connecting a plurality of decode signal lines decoding said address signal to a plurality of said selecting lines and said redundancy selecting lines;
    wherein, when any fault occurs in a plurality of said selecting lines, a first switch operation for shifting at least one of said decode signal lines in the direction of said first redundancy selecting line is executed, or a second switch operation for shifting at least one of said decode signal lines in the direction of said second redundancy selecting line is executed, or both of said first and second switch operations are executed.

2. A semiconductor memory device according to claim 1, wherein, when the faults occur in two of a plurality of said selecting lines, both of said first and second switch operations are executed.

3. A semiconductor memory device according to claim 2, wherein, when a plurality of said selecting lines are disposed in alignment in the transverse direction and when the faults occur in two of said selecting lines, said first switch operation is executed by shifting at least one of said decode signal lines in the left direction and said second switch operation is executed by shifting at least one of said decode signal lines in the right direction.

4. A semiconductor memory device according to claim 1, wherein, when a fault occurs in one of a plurality of said selecting lines, either one of said first and second switch operations is executed.

5. A semiconductor memory device according to claim 4, wherein, when a plurality of said selecting lines are disposed in alignment in the transverse direction and when a fault occurs in one of said selecting lines, said first switch operation is executed by shifting at least one of said decode signal lines in the left direction, or said second switch operation is executed by shifting at least one of said decode signal lines in the right direction.

6. A semiconductor memory device including a plurality of selecting lines for writing or reading data by selecting a specific memory cell from among a plurality of memory cells on the basis of an address signal supplied from external, comprising:
  at least one first redundancy selecting line positioned at one of the ends among a plurality of said selecting lines and at least one second redundancy selecting line positioned at the other end;
  a switch unit including a plurality of switch devices for changeably connecting a plurality of decode signal lines decoding said address signal to a plurality of said selecting lines and to said redundancy selecting lines;
  a shift redundancy fuse circuit unit having a plurality of fuses disposed so as to correspond to a plurality of said selecting lines and to said redundancy selecting lines, and cutting said fuses corresponding to fault selecting lines when faults occur in a plurality of said selecting lines, and fuses for redundancy selection, corresponding to said redundancy selecting lines; and
  a shift redundancy control circuit unit for controlling a plurality of said switch devices in such a manner as to execute a first switch operation for shifting at least one of said decode signal lines in the direction of said first redundancy selecting line, or a second switch operation for shifting at least one of said decode signal lines in the direction of said second redundancy selecting line or both of said first and second operations, in accordance with the output result from said shift redundancy fuse circuit unit.

7. A semiconductor memory device according to claim 6, wherein, when faults occur in two of a plurality of said selecting lines, said shift redundancy fuse circuit unit cuts said fuses corresponding to two fault selecting lines in which the faults occur and said redundancy selecting fuses corresponding to said redundancy selecting line, and said shift redundancy control circuit unit controls a plurality of said switch devices in such a manner as to execute both or said first and second switch operations.

8. A semiconductor memory device according to claim 7, wherein, when a plurality of said selecting lines are disposed in alignment in the transverse direction and when faults occur in two of said selecting lines, said first switch operation is executed by shifting at least one of said decode signal lines in the left direction and said second switch operation is executed by shifting at least one of said decode signal lines in the right direction.

9. A semiconductor memory device according to claim 7, wherein the output result from said shift redundancy fuse circuit unit is outputted by a level of a DC voltage representing whether or not said fuses corresponding to said fault selecting lines and said redundancy selecting fuses are cut.

10. A semiconductor memory device according to claim 7, wherein said shift redundancy control circuit unit includes a NAND gate for outputting a shift control signal for shifting a plurality of said selecting lines in either direction upon receiving the output result from said shift redundancy fuse circuit unit, and an inverter for inverting said shift control signal from said NAND gate.

11. A semiconductor memory device according to claim 7, wherein said shift redundancy control circuit unit includes a NOR gate for outputting a shift control signal for shifting a plurality of said selecting lines in either direction upon receiving the output result from said shift redundancy fuse circuit unit, and an inverter for inverting said shift control signal from said NOR gate.

12. A semiconductor memory device according to claim 7, wherein each of a plurality of said switch devices inside said switch unit is a three-directional switch device capable of selecting a mode for executing the shift operation in the direction of said first redundancy selecting line, a mode for executing the shift operation in the direction of said second redundancy selecting line or a mode for not executing said shift operations.

13. A semiconductor memory device according to claim 12, wherein each of a plurality of said switch devices can select a non-selection mode for not connecting said decode signal line to said fault selecting line.

14. A semiconductor memory device according to claim 7, wherein said shift redundancy fuse circuit unit includes a fuse circuit for normal selection that is used for a normal operation, a fuse circuit for redundancy selection that is used for redundancy selection, and a fuse circuit for forced redundancy that is used for forced redundancy.

15. A semiconductor memory device according to claim 7, wherein said shift redundancy fuse circuit unit includes a fuse circuit for forced redundancy for causing a fuse corresponding to a predetermined selecting line to look as being apparently cut at the time of forced redundancy in order to confirm whether or not any fault exists in said redundancy selecting lines.

16. A semiconductor memory device according to claim 15, wherein said selecting line connected to said fuse circuit for forced redundancy is disposed at a position other than the adjacent position of said redundancy selecting line.

17. A semiconductor memory device according to claim 6, wherein, when any fault occurs in one of a plurality of said selecting lines, said shift redundancy fuse circuit unit cuts the fuse corresponding to said fault selecting line in which said fault occurs and said redundancy selecting fuse corresponding to said redundancy selecting line, and said shift redundancy control circuit unit controls a plurality of said switch devices in such a manner as to execute either one of said first and second switch operations.

18. A semiconductor memory device according to claim 17, wherein, when a plurality of said selecting lines are disposed in alignment in the transverse direction and when a fault occurs in one of a plurality of said selecting lines, said first switch operation is executed by shifting at least one of said decode signal lines in the left direction or said second switch operation is executed by shifting at least one of said decode signal lines in the right direction.

19. A semiconductor memory device according to claim 17, wherein the output result from said shift redundancy fuse circuit unit is outputted by a level of DC voltage representing whether or not said fuse corresponding to said fault selecting line and said redundancy selecting fuse are cut.

20. A semiconductor memory device according to claim 17, wherein said shift redundancy control circuit unit includes a NAND gate for outputting a shift control signal for shifting a plurality of said selecting lines in either direction upon receiving the output result from said shift redundancy fuse circuit unit, and an inverter for inverting said shift control signal from said NAND gate.

21. A semiconductor memory device according to claim 17, wherein said shift redundancy control circuit unit includes a NOR gate for outputting a shift control signal for shifting a plurality of said selecting lines in either direction upon receiving the output result from said shift redundancy fuse circuit unit, and an inverter for inverting said shift control signal from said NOR gate.

22. A semiconductor memory device according to claim 17, wherein each of a plurality of said switch devices inside said switch unit is a three-directional switch device capable of selecting a mode for executing a shift operation in one of the directions of said redundancy selecting lines, a mode for executing said shift operation in the other direction of said redundancy to selecting lines, and a mode for not executing said shift operations.

23. A semiconductor memory device according to claim 22, wherein each of a plurality of said switch devices can select a non-selection mode in which said decode signal lines and said fault selecting lines are not connected.

24. A semiconductor memory device according to claim 17, wherein said shift redundancy fuse circuit unit includes a fuse circuit for normal selection that is used for normal selection, a fuse circuit for redundancy selection that is used for redundancy selection and a fuse circuit for forced redundancy that is used for forced redundancy.

25. A semiconductor memory device according to claim 17, wherein said shift redundancy fuse circuit unit includes a fuse circuit for forced redundancy for causing a fuse corresponding to a predetermined selecting line to look as being apparently cut at the time of forced redundancy, and confirms whether or not any fault exists in said redundancy selecting line.

26. A semiconductor memory device according to claim 25, wherein said selecting line connected to said fuse circuit for forced redundancy is disposed at a position other than the adjacent position to said redundancy selecting lines.

27. A semiconductor memory device according to claim 6, which detects whether or not said redundancy selecting lines are used by evaluating the output level of said shift redundancy fuse circuit unit and judging whether or not at least one of said fuses is cut in the block of a plurality of said memory cells.

28. A semiconductor memory device according to claim 6, wherein the data write or read operation is executed in such a manner that periodicity of a plurality of said memory cells is in conformity with periodicity of said memory cell block selected by said selecting lines.

29. A semiconductor memory device according to claim 6, wherein a plurality of said selecting lines and a plurality of said fuses are laid out in the same pitch in the semiconductor chip.

30. A semiconductor memory device according to claim 7, which detects whether or not said redundancy selecting lines are used by evaluating the output level of said shift redundancy fuse circuit unit and judging whether or not at least one of said fuses is cut in the block of a plurality of said memory cells.

31. A semiconductor memory device according to claim 1, wherein the data write or read operation is executed in such a manner that that periodicity of a plurality of said memory cells is in conformity with periodicity of said memory cell block selected by said selecting lines.

32. A semiconductor memory device according to claim 7, wherein a plurality of said selecting lines and a plurality of said fuses are laid out in the same pitch in the semiconductor chip.

33. A semiconductor memory device according to claim 8, which detects whether or not said redundancy selecting lines are used by evaluating the output level of said shift redundancy fuse circuit unit and judging whether or not at least one of said fuses is cut in the block of a plurality of said memory cells.

34. A semiconductor memory device according to claim 8, wherein the data write or read operation is executed in such a manner that periodicity of a plurality of said memory cells is in conformity with periodicity of said memory cells selected by said selecting lines.

35. A semiconductor memory device according to claim 8, wherein a plurality of said selecting lines and a plurality of said fuses are laid out in the same pitch in the semiconductor chip.

36. A semiconductor memory device according to claim 9, which detects whether or nor said redundancy selecting lines are used by evaluating the output level of said shift redundancy fuse circuit unit and judging whether or not at least one fuse is cut in the block of a plurality of said memory cells.

37. A semiconductor memory device according to claim 9, wherein the data write or read operation is executed in such a manner that periodicity of a plurality of said memory cells is in conformity with periodicity of said memory cell block selected by said selecting lines.

38. A semiconductor memory device according to claim 9, wherein a plurality of said selecting lines and a plurality of said fuses are laid out in the same pitch in the semiconductor chip.

39. A semiconductor memory device according to claim 10, which detects whether or not said redundancy selecting lines are used by evaluating the output level of said shift redundancy fuse circuit unit and judging whether or not at least one fuse is cut in the block of a plurality of said memory cells.

40. A semiconductor memory device according to claim 10, wherein the data write or read operation is executed in such a manner that periodicity of a plurality of said memory cells is in conformity with periodicity of said memory cell block selected by said selecting lines.

41. A semiconductor memory device according to claim 10, wherein a plurality of selecting lines and a plurality of said fuses are laid out in the same pitch in the semiconductor chip.

42. A semiconductor memory device according to claim 11, which detects whether or not said redundancy selecting lines are used by evaluating the output level of said shift redundancy fuse circuit unit and judging whether or not at least one of said fuses is cut in the block of a plurality of memory cells.

43. A semiconductor memory device according to claim 11, wherein the data write or read operation is executed in such a manner that periodicity of a plurality of said memory cells is in conformity with periodicity of said memory cell block selected by said selecting lines.

44. A semiconductor memory device according to claim 11, wherein a plurality of said selecting lines and a plurality of said fuses are laid out in the same pitch in the semiconductor chip.

45. A semiconductor memory device according to claim 12, which detects whether or not said redundancy selecting lines are used by evaluating the output level of said shift redundancy fuse circuit unit and judging whether or not at least one of said fuses is cut in the block of a plurality of said memory cells.

46. A semiconductor memory device according to claim 12, wherein the data write or read operation is executed in such a manner that periodicity of a plurality of said memory cells is in conformity with periodicity of said memory cell block selected by said selecting lines.

47. A semiconductor memory device according to claim 12, wherein a plurality of said selecting lines and a plurality of said fuses are laid out in the same pitch in the semiconductor chip.

48. A semiconductor memory device according to claim 13, which detects whether or not said redundancy selecting lines are used by evaluating the output level of said shift redundancy fuse circuit unit and judging whether or not at least one of said fuses is cut in the block of a plurality of said memory cells.

49. A semiconductor memory device according to claim 13, wherein the data write or read operation is executed in such a manner that periodicity of a plurality of said memory cells is in conformity with periodicity of said memory cell block selected by said selecting lines.

50. A semiconductor memory device according to claim 13, wherein a plurality of said selecting lines and plurality of fuses are laid out in the same pitch in the semiconductor chip.

51. A semiconductor memory device according to claim 14, which detects whether or not said redundancy selecting lines are used by evaluating the output level of said shift redundancy fuse circuit unit and judging whether or not at least one of said fuses is cut in the block of a plurality of said memory cells.

52. A semiconductor memory device according to claim 14, wherein the data write or read operation is executed in such a manner that periodicity of a plurality of said memory cells is in conformity with periodicity of said memory cell block selected by said selecting lines.

53. A semiconductor memory device according to claim 14, wherein a plurality of selecting lines and a plurality of said fuses are laid out in the same pitch in the semiconductor chip.

54. A semiconductor memory device according to claim 15, which detects whether or not said redundancy selecting lines are used by evaluating the output level of said shift redundancy fuse circuit unit and judging whether or not at least one of said fuses is cut in the block of a plurality of memory cells.

55. A semiconductor memory device according to claim 15, wherein the data write or read operation is executed in such a manner that periodicity of a plurality of said memory cells is in conformity with periodicity of said memory cell block selected by said selecting lines.

56. A semiconductor memory device according to claim 15, wherein a plurality of said selecting lines and a plurality of said fuses are laid out in the same pitch in the semiconductor chip.

57. A semiconductor memory device according to claim 16, which detects whether or not said redundancy selecting lines are used by evaluating the output level of said shift redundancy fuse circuit unit and judging whether or not at least one of said fuses is cut in the block of a plurality of said memory cells.

58. A semiconductor memory device according to claim 16, wherein periodicity of a plurality of memory cells is in conformity with periodicity of said memory cell block selected by said selecting lines.

59. A semiconductor memory device according to claim 16, wherein a plurality of said selecting lines and a plurality of said fuses are laid out in the same pitch in the semiconductor chip.

60. A semiconductor memory device according to claim 17, which detects whether or not said redundancy selecting lines are used by evaluating the output level of said shift redundancy fuse circuit unit and judging whether or not at least one of said fuses is cut in the block of a plurality of said memory cells.

61. A semiconductor memory device according to claim 17, wherein the data write or read operation is executed so that periodicity of a plurality of said memory cells is in conformity with periodicity of said memory cell block selected by said selecting lines.

62. A semiconductor memory device according to claim 17, wherein a plurality of said selecting lines and a plurality of said fuses are laid out in the same pitch in the semiconductor chip.

63. A semiconductor memory device including a plurality of selecting lines for writing or reading data by selecting a specific memory cell from among a plurality of memory cells on the basis of the address signal supplied from external, comprising:

at least one first redundancy selecting line positioned at one of the ends among a plurality of said selecting line and at least one second redundancy selecting line positioned at the other end;

a switch unit including a plurality of switch devices for changeably connecting a plurality of decode signal lines decoding said address signal to a plurality of said selecting lines and to said redundancy selecting lines;

a fuse decoder circuit for designating the address of said fuse corresponding to a fault selecting line, in which a fault occurs, when the fault occurs in a plurality of said selecting lines, and generating a fuse decode signal; and a shift redundancy control circuit unit for controlling a plurality of said switch devices in such a manner as to execute a first switch operation for shifting at least one of said decode signal lines in the direction of said first redundancy selecting line or a second switch operation for shifting at least one of said decode signal lines in the direction of said second redundancy selecting line or both of said first and second switch operations in accordance with a fuse decode signal from said fuse decode circuit.

64. A semiconductor memory device according to claim 63, wherein, when faults occur in two of a plurality of said selecting lines, said fuse decode circuit designates the addresses of said fuses corresponding to said two fault selecting lines in which the faults occur, and generates said fuse decode signal, and said shift redundancy control circuit unit controls a plurality of said switch devices in such a manner as to execute both of said first and second switch operations.

65. A semiconductor memory device according to claim 64, wherein designation of the address of said fuse corresponding to each of said fault selecting lines by said fuse decoder circuit is made by the combination of a smaller number of a plurality of said fuses than the total number of a plurality of said selecting lines.

66. A semiconductor memory device according to claim 64, wherein said fuse decoder circuit includes two fuse decoder units for decoding signals generated by the combinations of a plurality of said fuses that are mutually different.

67. A semiconductor memory device according to claim 63, wherein, when a fault occurs in one of a plurality of said selecting lines, said fuse decoder circuit designates the address of said fuse corresponding to said fault selecting line in which the fault occurs, and generates a fuse-decode signal, and said shift redundancy control circuit unit controls a plurality of said switch devices in such a manner as to execute either one of said first and second switch operations.

68. A semiconductor memory device according to claim 67, wherein designation of the address of said fuse corresponding to said fault selecting line by said fuse decoder circuit is made by a smaller number of a plurality of said fuses than the total number of a plurality of said selecting lines.

69. A semiconductor .memory device according to claim 67, wherein said fuse decoder circuit includes two fuse decoder units for decoding signals generated by the combinations of a plurality of said fuses that are mutually different.

70. A semiconductor memory device including a plurality of selecting lines for writing or reading data by selecting a specific memory cell, from among a plurality of memory cells provided to each of a plurality of cell arrays on the basis of the address signal supplied from external, including, for each of a plurality of said cell arrays:
- at least one first redundancy selecting line positioned at one of the ends among a plurality of said selecting lines and at least one second redundancy selecting line positioned at the other end;
- a switch unit including a plurality of switch devices for connecting changeably a plurality of decode signal lines decoding said address signal to a plurality of said selecting lines and to said redundancy selecting lines;
- a fuse decoder circuit for designating the address of said fuse corresponding to a fault selecting line, in which a fault occurs, and generating a fuse decode signal on the basis of the combination of a smaller number of a plurality of said fuses than the total number of a plurality of said selecting lines; and
- a shift redundancy control circuit unit for controlling a plurality of said switch devices in such a manner as to execute a first switch operation for shifting at least one of said decode signal lines in the direction of said first redundancy selecting line or a second switch operation for shifting at lest one of said decode signal lines in the direction of said second redundancy selecting lines or both of said first and second switch operations, in accordance with the fuse decode signal from said fuse decoder circuit; wherein:
  - said shift redundancy fuse circuit unit having a plurality of said fuses is shared by said cell arrays adjacent to one another.

71. A semiconductor memory device according to claim 70, wherein said shift redundancy fuse circuit unit includes a fuse circuit for normal selection that is used for normal operation, a fuse circuit for redundancy selection that is used for redundancy selection and a fuse circuit for forced redundancy that is used for forced redundancy.

72. A semiconductor memory device according to claim 70, wherein said fuse circuit for normal selection and said fuse circuit for forced redundancy are shared by said cell arrays adjacent to one another.

73. A semiconductor memory device according to claim 71, wherein said fuse circuits for redundancy selection are independently provided to said adjacent cell arrays.

74. A semiconductor memory device according to claim 70, which can execute said first switch operation or said second switch operation or both of said first and second operations for a plurality of said selecting lines of either one of said adjacent cell arrays, or can execute said first switch operation or said second switch operation or both of said first and second switch operations for a plurality of said selecting lines of both of said adjacent cell arrays.

75. A semiconductor memory device according to claim 71, which can execute said first switch operation or said second switch operation or both of said first and second switch operations for a plurality of selecting lines of either one of said adjacent cell arrays, or can execute said first switch operation or said second switch operation or both of said first and second switch operations for a plurality of selecting lines of both of said adjacent cell arrays.

76. A semiconductor memory device according to claim 72, which can execute said first switch operation or said second switch operation or both of said first and second switch operations for a plurality of said selecting lines of either one of said adjacent cell arrays, or can execute said first switch operation or said second switch operation or both of said first and second switch operations for a plurality of said selecting lines of both of said adjacent cell arrays.

77. A semiconductor memory device according to claim 73, which can execute said first switch operation or said second switch operation or both of said first and second switch operations for a plurality of said selecting lines of either one of said adjacent cell arrays, or can execute said first switch operation or said second switch operation or both of said first and second switch operations for a plurality of said selecting lines of both of said adjacent cell arrays.

78. A semiconductor memory device including a plurality of column selecting lines for writing or reading data by selecting a specific memory cell, from among a plurality of memory cells constituting each of a plurality of memory cell blocks on the basis of the address signal supplied from external, wherein each of said memory cell blocks is divided into a plurality of row blocks and each of said memory cell blocks comprises:
- at least one first redundancy selecting line positioned at one of the ends in a plurality of said column selecting lines and at least one second redundancy selecting line positioned at the other end;
- a switch unit including a plurality of switch devices for changeably connecting a plurality of decode signal lines decoding said address signal to a plurality of said column selecting lines and to said redundancy selecting lines;
- a redundancy fuse circuit unit including a smaller number of a plurality of fuses than the total number of a plurality of said column selecting lines and a plurality of redundancy selecting fuses disposed so as to correspond to said redundancy selecting lines, respectively;
- a fuse decoder circuit for designating the address of a fuse corresponding to a fault selecting line in which a fault occurs, when said fault occurs in a plurality of said column selecting lines, and generating a fuse decode signal on the basis of the combination of a plurality of said fuses; and
- a shift redundancy control circuit unit for controlling a plurality of switch devices in such a manner as to execute a first switch operation for shifting at least one of said decode signal lines in the direction of said first redundancy selecting line or a second switch operation for shifting at least one of said decode signal lines in the direction of said second redundancy selecting line or both of said first and second operations in accordance with said fuse decode signal from said fuse decoder circuit; and wherein
said first switch operation, or said second switch operation, or both of said first and second switch operations, are executed, or both of said first and second switch operations are not executed, for each of a plurality of said row blocks, on the basis of the logical addresses of a plurality of said row blocks.

79. A semiconductor memory device according to claim 78, wherein said fuse decode signal from said fuse decoder circuit is generated on the basis of said logical address.

80. A semiconductor memory device according to claim 78, wherein said shift redundancy fuse circuit unit includes a fuse circuit for normal selection that is used for a normal operation, a fuse circuit for redundancy selection that is used for redundancy selection and a fuse circuit for forced redundancy that is used for forced redundancy.

81. A semiconductor memory device according to claim 79, wherein said shift redundancy fuse circuit unit includes a fuse circuit for normal selection that is used for a normal operation, a fuse circuit for redundancy selection that is used for redundancy selection and a fuse circuit for forced redundancy that is used for forced redundancy.

82. A semiconductor memory device including a plurality of column selecting lines for writing or reading data by selecting a specific memory cell, from among a plurality of memory cells constituting each of a plurality of memory cell blocks, on the basis of the address signal supplied from external, wherein each of a plurality of said memory cell blocks is divided into a plurality of row blocks, and each of a plurality of said memory cell blocks comprises:

at least one first redundancy selecting line positioned at one of the ends among a plurality of said column selecting lines and at least one second redundancy selecting line positioned at the other end;

a switch unit including a plurality of switch devices for changeably connecting a plurality of decode signal lines decoding said address signal to a plurality of said column selecting lines and to a plurality of said redundancy selecting lines;

a shift redundancy fuse circuit unit including a plurality of fuses disposed so as to correspond to a plurality of said column selecting lines and to said redundancy selecting lines, respectively, and cutting a fuse corresponding to a fault selecting line in which a fault occurs, when the fault occurs in a plurality of said column selecting lines, and a redundancy selecting fuse corresponding to said redundancy selecting line; and a shift redundancy control circuit unit for controlling a plurality of said switch devices in such a manner as to execute a first switch operation for shifting at least one of said decode signal lines in the direction of said first redundancy selecting line or a second switch operation for shifting at least one of said decode signals in the direction of said second redundancy selecting line or both of said first and second switch operations, in accordance with the output result from said shift redundancy fuse circuit unit; and wherein:
said first switch operation or said second switch operation or both of said first and second switch operations are executed, or both of said first and second switch operations are not executed, on the basis of the logical addresses of a plurality of said row blocks.

83. A semiconductor memory device according to claim 82, wherein the output result of said shift redundancy fuse circuit unit is generated on the basis of said logical address.

84. A semiconductor memory device according to claim 83, wherein said shift redundancy fuse circuit unit includes a fuse circuit for normal selection that is used for a normal operation, a fuse circuit for redundancy selection that is used for redundancy selection and a fuse circuit for forced redundancy that is used for forced redundancy.

85. A method for executing a shift redundancy operation comprising the steps of:

arranging a plurality of selecting lines for writing or reading data by selecting a specific memory cell from among a plurality of memory cells on the basis of the address signal supplied from external, using said selecting line positioned at one of the ends among a plurality of said selecting lines as at least one first redundancy selecting line and using said selecting line positioned at the other end as at least one second redundancy selecting line;

connecting changeably a plurality of decode signal lines decoding said address signal to a plurality of said selecting lines and to said redundancy selecting lines; and executing a first switch operation for shifting at least one of said decode signal lines in the direction of said first redundancy selecting line or a second switch operation for shifting at least one of said decode signal lines in the direction of said second redundancy selecting line or both of said first and second switch operations, when faults occur in a plurality of said selecting lines.

86. A method for executing a shift redundancy operation according to claim 85, wherein both of said first and second switch operations are executed when the faults occur in two selecting lines among a plurality of said selecting lines.

87. A method for executing a shift redundancy operation according to claim 85, wherein either one of said first and second switch operations is executed when the fault occurs in one selecting line among a plurality of said selecting lines.

88. A method for executing a shift redundancy operation comprising the steps of:

arranging a plurality of selecting lines for writing or reading data by selecting a specific memory cell from among a plurality of memory cells on the basis of the address signal supplied from external, using a selecting line positioned at one of the ends among a plurality of said selecting lines as at least one first redundancy selecting line and using a selecting line positioned at the other end as at least one second redundancy selecting line;

connecting changeably a plurality of decode signal lines decoding said address signal to a plurality of said selecting lines and to said redundancy selecting lines;

cutting a fuse corresponding to a fault selecting line in which a fault occurs, when the fault occurs in a plurality of selecting lines, and redundancy selecting fuses corresponding to said redundancy selecting lines, in a shift redundancy fuse circuit unit having a plurality of fuses; and executing a first switch operation for shifting at least one of said decode signal lines in the direction of said first redundancy selecting line or a second switch operation for shifting at least one of said decode signal lines in the direction of said second redundancy selecting line or both of said first and second switch operations, in accordance with the output result from said shift redundancy fuse circuit unit.

89. A method for executing a shift redundancy operation comprising the steps of:

arranging a plurality of selecting lines for writing or reading data by selecting a specific memory cell from among a plurality of memory cells on the basis of the address signal supplied from external, using a selecting line positioned at one of the ends among a plurality of said selecting lines as at least one first redundancy selecting line and using a selecting line positioned at the other end as at least one second redundancy selecting line;

connecting changeably a plurality of decode signal lines decoding said address signal to a plurality of said selecting lines and to said redundancy selecting lines;

designating the address of a fuse corresponding to a fault selecting line in which a fault occurs and generating a fuse decode signal when the fault occurs in a plurality of said selecting lines; and executing a first switch operation for shifting at least one of said decode signal lines in the direction of said first redundancy selecting line or a second switch operation for shifting at least one of said decode signal lines in the direction of said second redundancy selecting line or both of said first and second switch operations, in accordance with said fuse decode signal.

90. A method for executing a shift redundancy operation comprising the steps of;

arranging a plurality of selecting lines for writing or reading data by selecting a specific memory cell, from among a plurality of memory cells provided to each of a plurality of cell arrays on the basis of the address signal from external, using a selecting line positioned at one of the ends among a plurality of said selecting lines as at least one first redundancy selecting line and using a selecting line positioned at the other end as at least one second redundancy selecting line;

connecting changeably a plurality of decode signal lines decoding said address signal to a plurality of said selecting lines and to said redundancy selecting lines;

causing said cell arrays adjacent to one another to share a shift redundancy circuit unit having a plurality of fuses;

designating the address of a fuse corresponding to a fault selecting line in which a fault occurs and generating a fuse decode signal when the fault occurs in a plurality of said selecting lines; and executing a first switch operation for shifting at least one of said decode signal lines in the in direction or said first redundancy selecting line or a second switch operation for shifting at least one of said decode signal lines in the direction of said second redundancy selecting line or both of said first and second switch operations in accordance with said fuse decode signal from said fuse decoder circuit.

91. A method for executing a shift redundancy operation comprising the steps of:

arranging a plurality of column selecting lines for writing or reading data by selecting a specific memory cell, from among a plurality of memory cells constituting each of a plurality of memory cell blocks on the basis of the address signal supplied from external, each of said memory cell blocks being divided into a plurality of row blocks, using a column selecting line positioned at one of the ends among a plurality of said column selecting lines as at least one first redundancy selecting line and using a column selecting line positioned at the other end as at least one second redundancy selecting line;

connecting changeably a plurality of decode signal lines decoding said address signal to a plurality of said column selecting lines and to said redundancy selecting lines;

designating the address of a fuse corresponding to a fault selecting line in which a fault occurs, and generating a fuse decode signal on the basis of the combination of a plurality of fuses in a shift redundancy fuse circuit unit having a plurality of said fuses when any fault occurs in a plurality of said column selecting lines; and executing a first switch operation for shifting at leas: one of said decode signal lines in the direction of said firs: redundancy selecting line or a second switch operation for shifting at least one of said decode signal: lines in the direction of said second redundancy selecting line or both of said first and second switch operations or none of said first and second switch operations, independently for each of a plurality of said row blocks on the basis of the logical addresses of a plurality of said row blocks.

92. A method for executing a shift redundancy operation comprising the steps of;

arranging a plurality of column selecting lines for writing or reading data by selecting a specific memory cell, from among a plurality of memory cells constituting each of a plurality of memory cell blocks on the basis of the address signal supplied from external, each of said memory cell blocks being divided into a plurality of row blocks, using a column selecting line positioned at one of the ends among a plurality of column selecting lines as at least one first redundancy selecting line and using a column selecting line positioned at the other end as at least one second redundancy selecting lines;

connecting changeably a plurality of decode signal lines decoding said address signal to a plurality of said selecting lines and to said redundancy selecting lines;

cutting a fuse corresponding to a fault selecting line in which a fault occurs and a redundancy selecting fuse corresponding to said redundancy selecting lines in a shift redundancy fuse circuit unit having a plurality of said fuses when any fault occurs in a plurality of said column selecting lines; and executing a first switch operation for shifting at least one of said decode signal lines in the direction of said first redundancy selecting line or a second switch operation for shifting at least one of said decode signal lines in the direction of said second redundancy selecting line or both of said first and second switch operations or none of said first and second switch operations, independently for each of a plurality of row blocks on the basis of the logical addresses of a plurality of said row blocks.

93. A semiconductor memory device including a plurality of selecting lines for writing or reading data by selecting a specific memory cell from among a plurality of memory cells on the basis of the address signal supplied from external, comprising:

at least two first redundancy selecting lines positioned at one of the ends among a plurality of selecting lines and at least two second redundancy selecting lines positioned at the other end; and a first switch unit and a second switch unit disposed in at least two stages, for changeably connecting a plurality of decode signals decoding said address signal to a plurality of said selecting lines and to said redundancy selecting lines;

wherein:
   when any fault occurs in a plurality of said selecting lines, said first switch unit executes a first switch operation for shifting at least one of said decode signal lines in the direction of said first redundancy selecting line or a second switch operation for shifting at least one of said decode signal lines in the direction of said second redundancy selecting lines or both of said first and second switch operations; and
   said second switch unit executes a third switch operation for shifting further at least one of said decode signals after said first switch operation in the direction of said first redundancy selecting line or a fourth switch operation for shifting further at least one of said decode signal lines after said second switch operation in the direction of said second redundancy selecting lines or both of said third and fourth switch operations or none of said third and fourth switch operations.

94. A semiconductor memory device according to claim 93, wherein, when faults occur in four of a plurality of sad selecting lines, said first switch unit executes both of said first and second switch operations and said second switch unit executes both of said third and fourth switch operations.

95. A semiconductor memory device according to claim 93, wherein, when faults occur in three of a plurality of said selecting lines, said first switch unit executes both of said first and second switch operations and said second switch unit executes either one of said third and fourth switch operations.

96. A semiconductor memory device according to claim 93, wherein, when faults occur in two of a plurality of said selecting lines, said first switch unit executes either one of said first and second switch operations and said second switch unit executes either one of said third and fourth switch operations.

97. A semiconductor memory device according to claim 93, wherein, when faults occur in two of a plurality of said selecting lines, said first switch unit executes both of said first and second switch operations and said second switch unit executes none of said third and fourth switch operations.

98. A semiconductor memory device according to claim 93, wherein, when a fault occurs in one of a plurality of said selecting lines, said first switch unit executes either one of said first and second switch operations and said second switch unit executes none of said third and fourth switch operations.

* * * * *